US012694908B2

(12) United States Patent
Masuda et al.

(10) Patent No.: US 12,694,908 B2
(45) Date of Patent: Jul. 28, 2026

(54) SEMICONDUCTOR MEMORY DEVICE

(71) Applicant: Kioxia Corporation, Tokyo (JP)

(72) Inventors: Takafumi Masuda, Kawasaki Kanagawa (JP); Mutsumi Okajima, Yokkaichi Mie (JP); Nobuyoshi Saito, Tokyo (JP); Keiji Ikeda, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 139 days.

(21) Appl. No.: 18/884,849

(22) Filed: Sep. 13, 2024

(65) Prior Publication Data

US 2025/0095692 A1     Mar. 20, 2025

(30) Foreign Application Priority Data

Sep. 20, 2023   (JP) ................................. 2023-152515

(51) Int. Cl.
| | |
|---|---|
| *G11C 5/06* | (2006.01) |
| *G11C 11/22* | (2006.01) |
| *H10B 51/10* | (2023.01) |
| *H10B 51/20* | (2023.01) |

(52) U.S. Cl.
CPC ............ *G11C 5/06* (2013.01); *G11C 11/2273* (2013.01); *H10B 51/10* (2023.02); *H10B 51/20* (2023.02)

(58) Field of Classification Search
CPC ....... G11C 5/06; G11C 11/2273; H10B 51/20; H10B 51/10
See application file for complete search history.

(56) References Cited

U.S. PATENT DOCUMENTS

| | | | |
|---|---|---|---|
| 10,727,276 | B1 | 7/2020 | Lien et al. |
| 12,052,854 | B2 | 7/2024 | Okajima |
| 2014/0085961 | A1 | 3/2014 | Kanamori et al. |
| 2018/0323199 | A1 | 11/2018 | Roberts |
| 2019/0103407 | A1 | 4/2019 | Kim et al. |
| 2020/0211631 | A1 | 7/2020 | Karda et al. |
| 2020/0227416 | A1 | 7/2020 | Lilak et al. |
| 2020/0227418 | A1 | 7/2020 | Kim et al. |

(Continued)

FOREIGN PATENT DOCUMENTS

| | | |
|---|---|---|
| JP | 2022-147872 A | 10/2022 |
| JP | 2023-043305 A | 3/2023 |

*Primary Examiner* — Han Yang
(74) *Attorney, Agent, or Firm* — Foley & Lardner LLP

(57) ABSTRACT

A semiconductor memory device includes: a first via-wiring extending in a first direction; first semiconductor layers arranged in the first direction and electrically connected to the first via-wiring; memory portions arranged in the first direction and electrically connected to the first semiconductor layers; first gate electrodes arranged in the first direction and opposed to the plurality of first semiconductor layers; first wirings arranged in the first direction and electrically connected to the plurality of first gate electrodes; second semiconductor layers arranged in the first direction and electrically connected to the first wirings; second gate electrodes arranged in the first direction and opposed to the second semiconductor layers; a second via-wiring extending in the first direction and electrically connected to the plurality of second gate electrodes; and second wirings arranged in the first direction and electrically connected to the second semiconductor layers.

16 Claims, 83 Drawing Sheets

(56) References Cited

U.S. PATENT DOCUMENTS

| | | |
|---|---|---|
| 2020/0251151 A1 | 8/2020 | Kang et al. |
| 2022/0005810 A1 | 1/2022 | Kang et al. |
| 2022/0102394 A1 | 3/2022 | Liu et al. |
| 2022/0122974 A1 | 4/2022 | Ryu et al. |
| 2022/0130830 A1 | 4/2022 | Yokoyama |
| 2022/0130831 A1 | 4/2022 | Lee et al. |
| 2022/0130834 A1 | 4/2022 | Lee et al. |
| 2022/0199621 A1 | 6/2022 | Lee et al. |
| 2022/0310612 A1 | 9/2022 | Okajima |
| 2022/0352169 A1 | 11/2022 | Kim |
| 2022/0399340 A1 | 12/2022 | Kim |
| 2022/0406363 A1 | 12/2022 | Okajima et al. |
| 2023/0083392 A1 | 3/2023 | Hosomura et al. |
| 2024/0038280 A1 | 2/2024 | Masuda et al. |
| 2024/0081042 A1 | 3/2024 | Masuda et al. |
| 2024/0087616 A1 | 3/2024 | Masuda et al. |
| 2024/0260253 A1 | 8/2024 | Okajima et al. |
| 2025/0159899 A1* | 5/2025 | Lee ........................ H10B 53/20 |

* cited by examiner

202A 401  201A $R_{MC}$  $R_{CL1}$  $R_{TrR}$  $R_{CL2}$  $R_{LL}$

SEMICONDUCTOR MEMORY DEVICE

CROSS-REFERENCE TO RELATED APPLICATIONS

This application is based upon and claims the benefit of Japanese Patent Application No. 2023-152515, filed on Sep. 20, 2023, the entire contents of which are incorporated herein by reference.

BACKGROUND

Field

Embodiments described herein relate generally to a semiconductor memory device.

Description of the Related Art

In accordance with an increasing high integration of a semiconductor memory device, an examination for converting the semiconductor memory device into a three-dimensional form has been in progress.

BRIEF DESCRIPTION OF THE DRAWINGS

FIG. 25 is a schematic cross-sectional view for describing the manufacturing method;

FIG. 120 is a schematic cross-sectional view for describing the manufacturing method;

FIG. 121 is a schematic cross-sectional view for describing the manufacturing method;

FIG. 122 is a schematic cross-sectional view for describing the manufacturing method;

FIG. 123 is a schematic circuit diagram illustrating a part of a configuration of a semiconductor memory device according to a comparative example;

FIG. 124 is a schematic circuit diagram for describing a read operation of the semiconductor memory device according to the comparative example;

FIG. 125 is a schematic XY cross-sectional view illustrating a part of a configuration of a semiconductor memory device according to a second embodiment;

FIG. 126 is a schematic XY cross-sectional view illustrating a part of the configuration of the semiconductor memory device;

FIG. 127 is a schematic cross-sectional view illustrating a part of the configuration of the semiconductor memory device;

FIG. 128 is a schematic cross-sectional view for describing a method for manufacturing the semiconductor memory device;

FIG. 129 is a schematic cross-sectional view for describing the manufacturing method;

FIG. 130 is a schematic cross-sectional view for describing the manufacturing method;

FIG. 131 is a schematic cross-sectional view for describing the manufacturing method;

Figure 132:
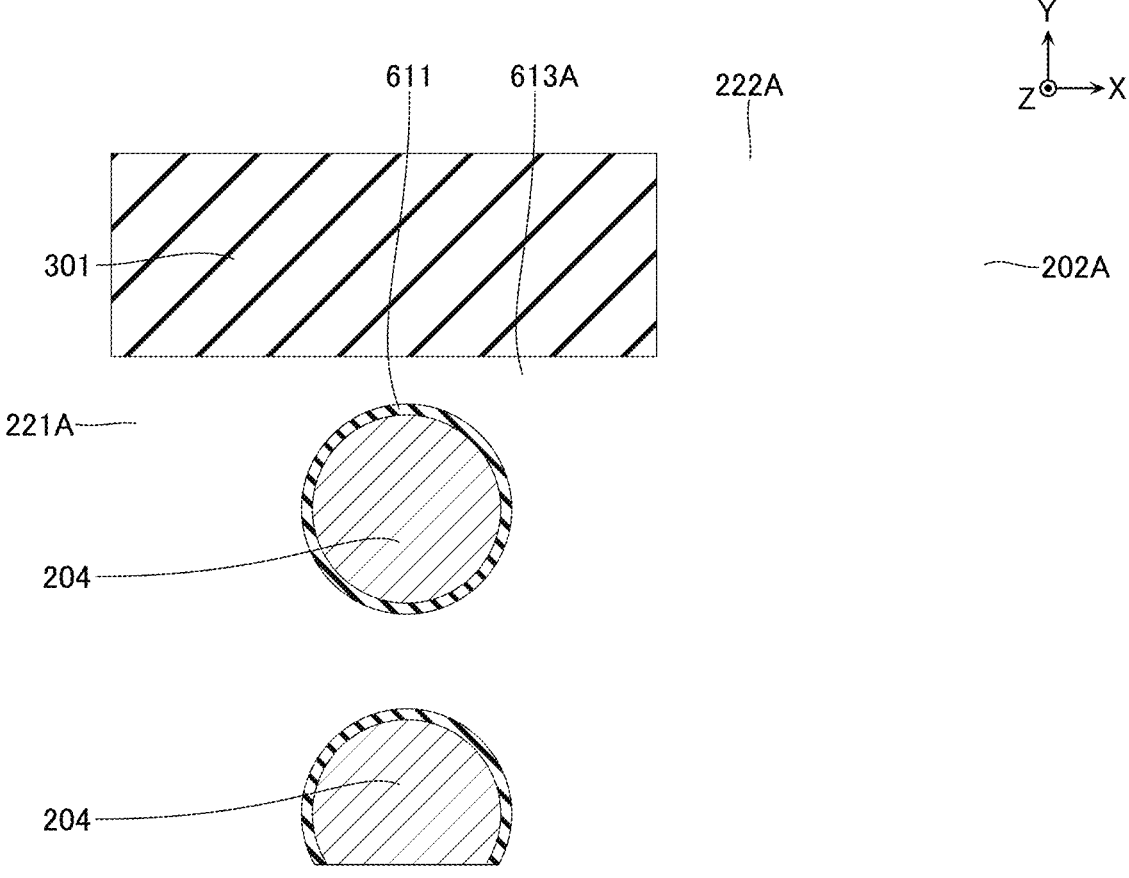
Figure 133:
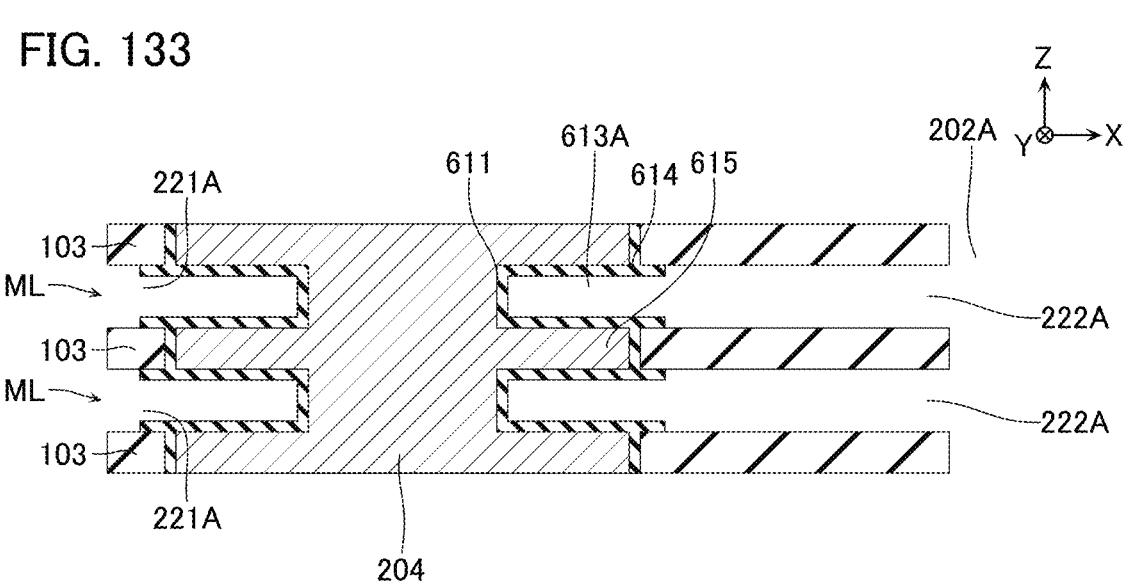
Figure 134:
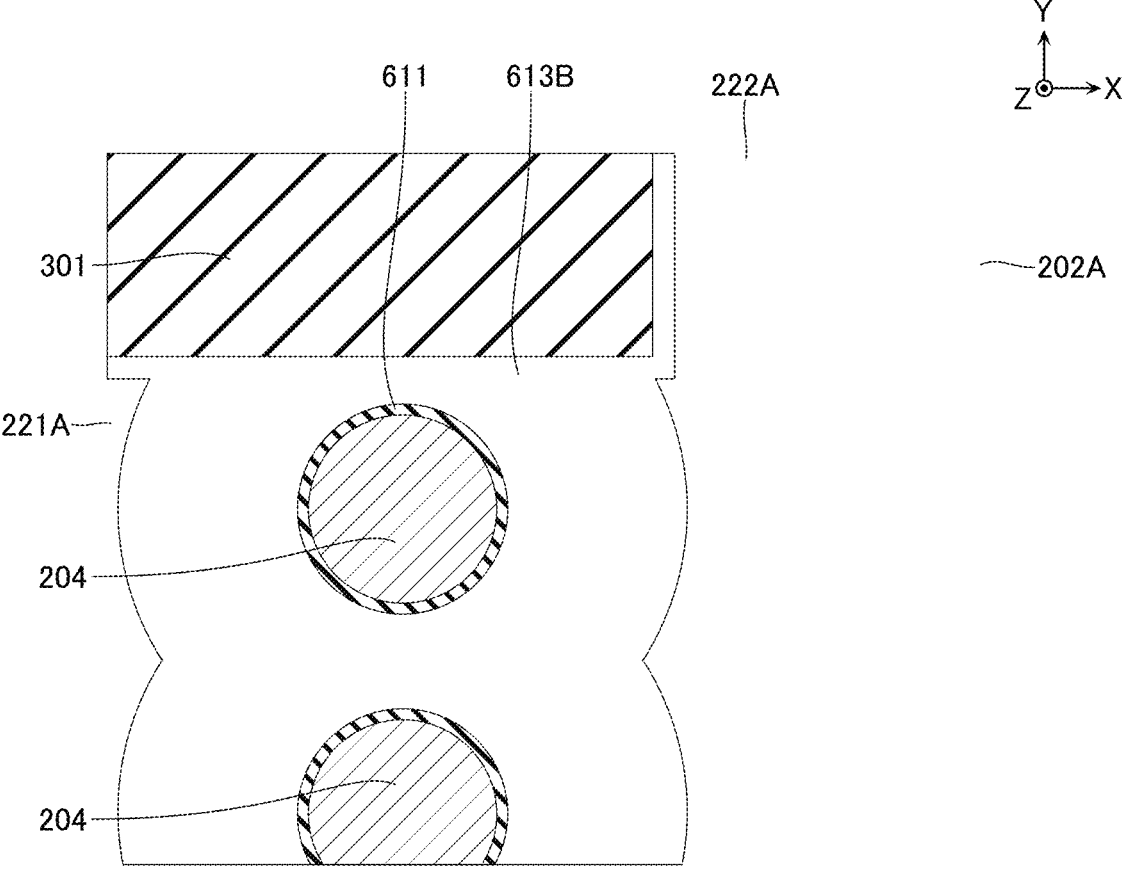
Figure 135:
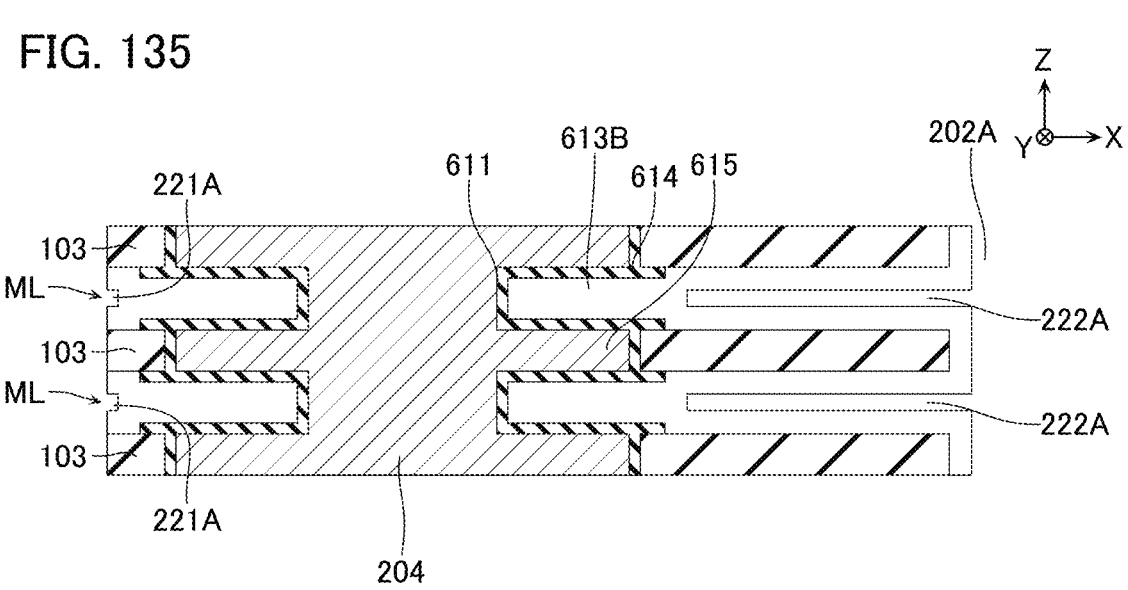
Figure 136:
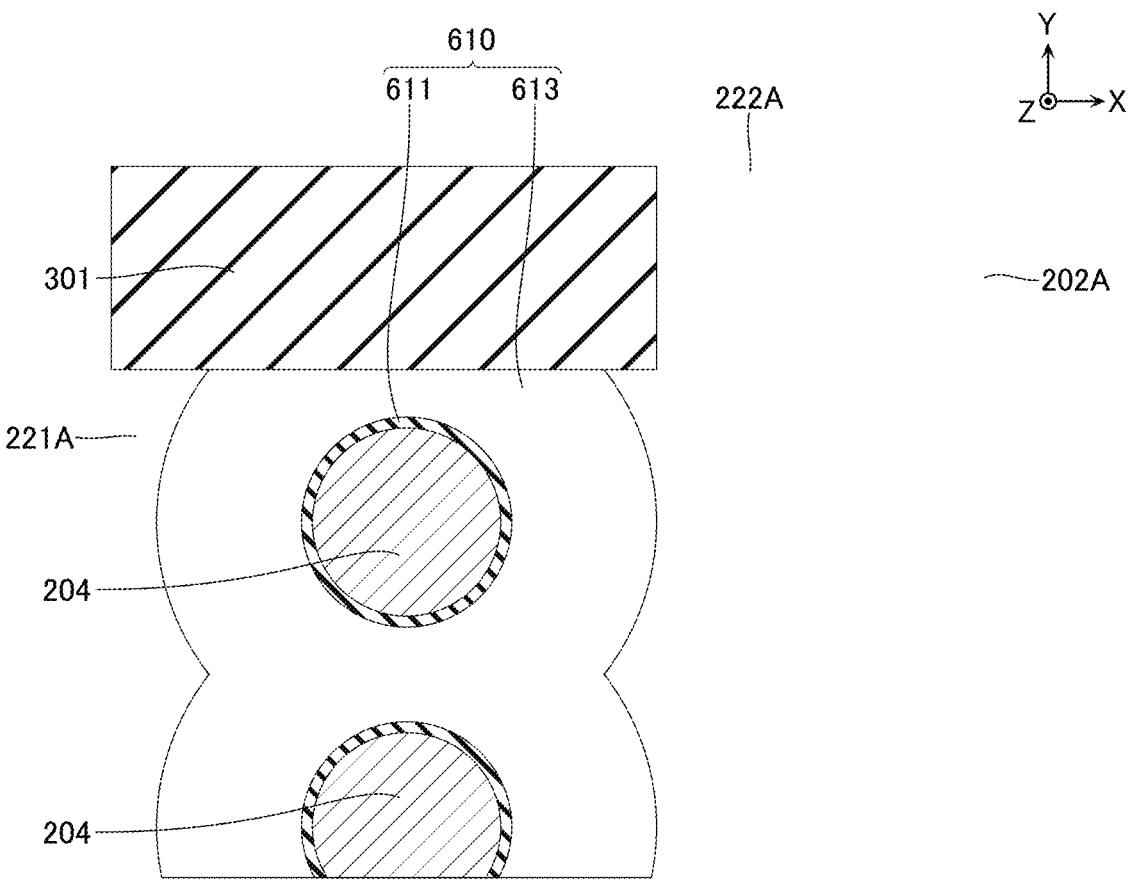
Figure 137:
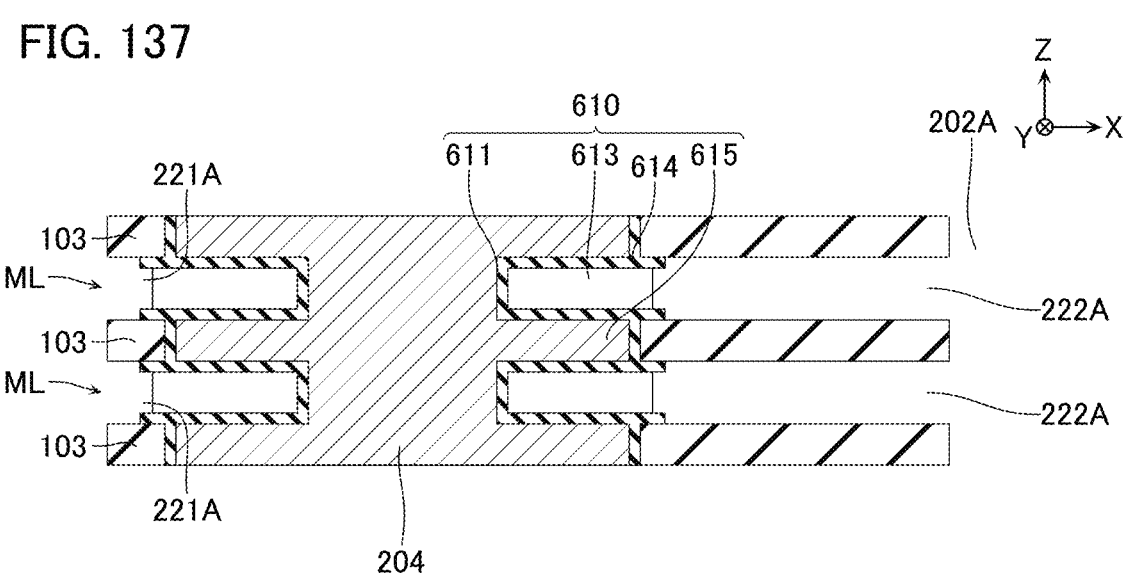
Figure 138:
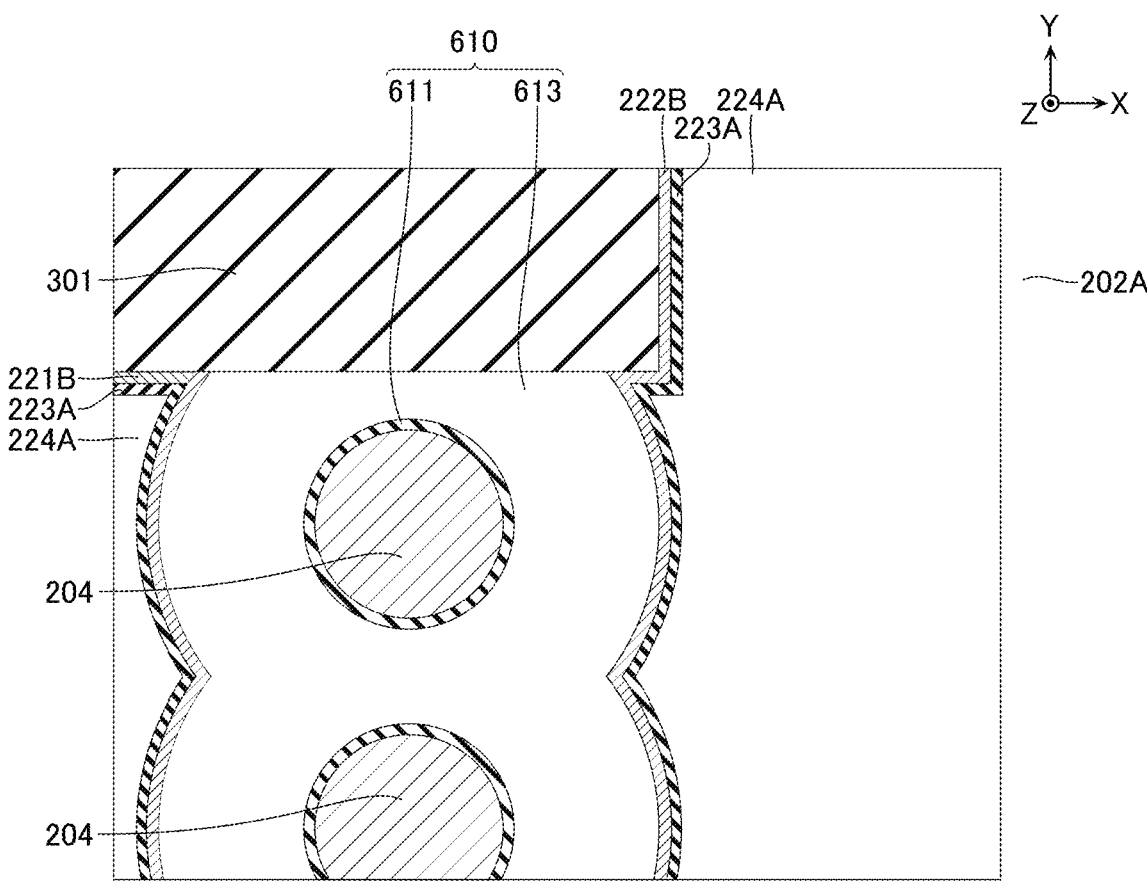
Figure 139:
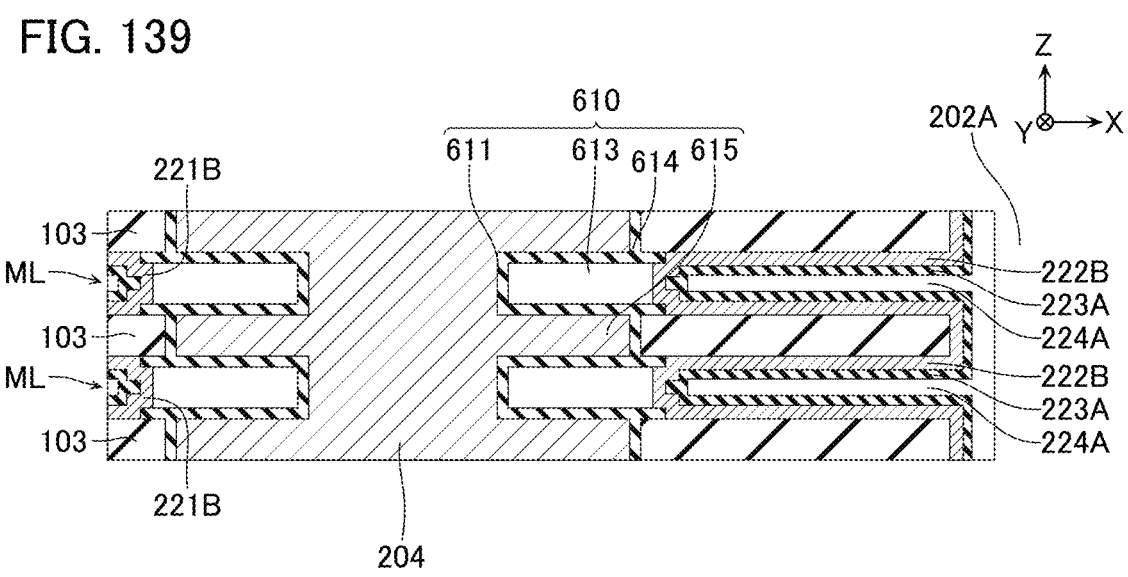
Figure 140:
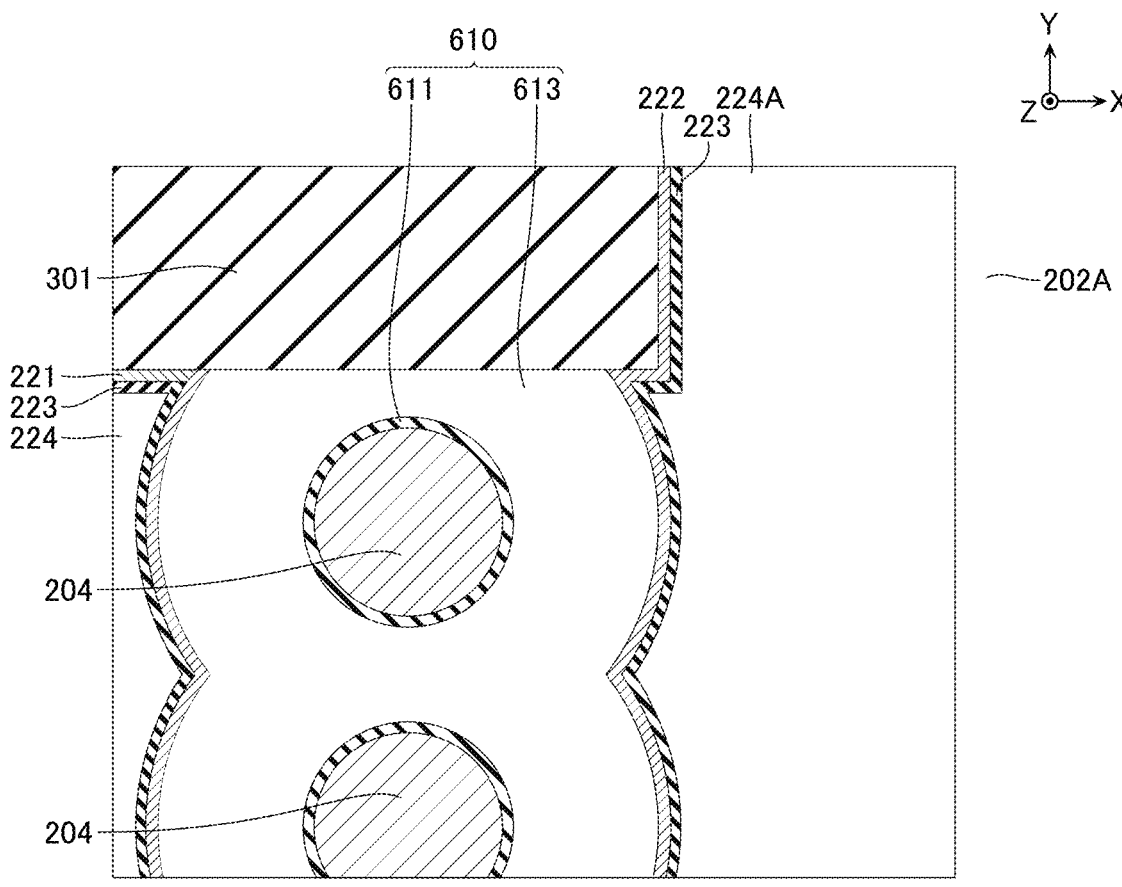
Figure 141:
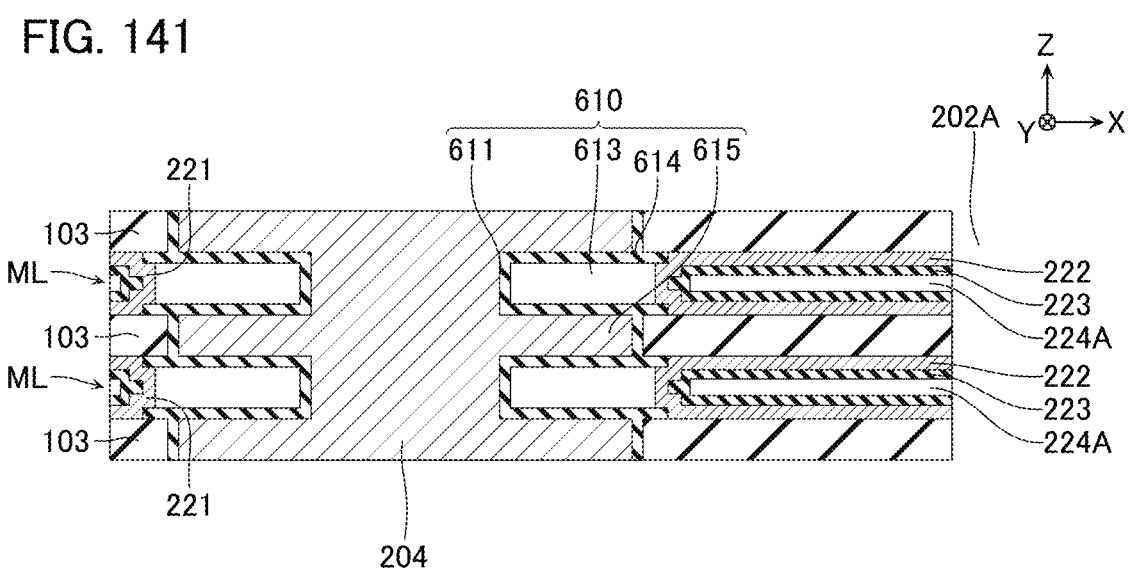
Figure 142:
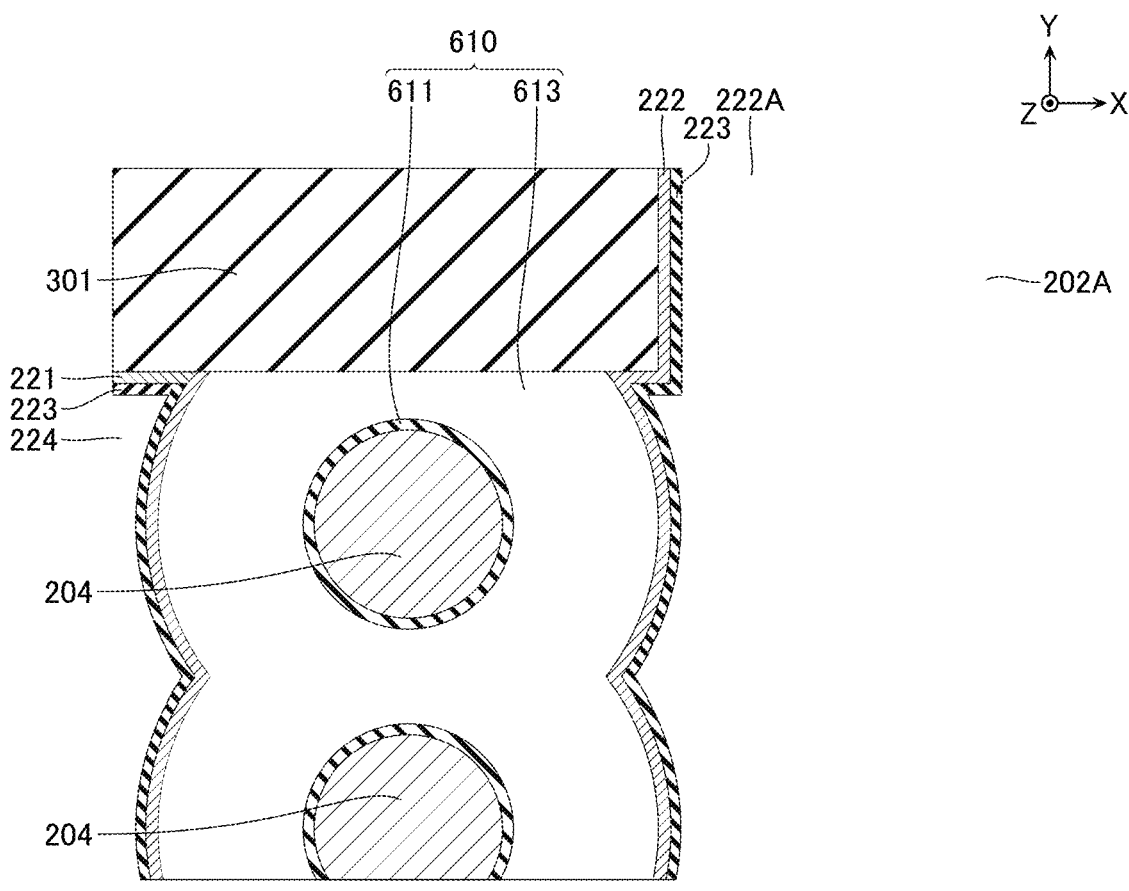
Figure 143:
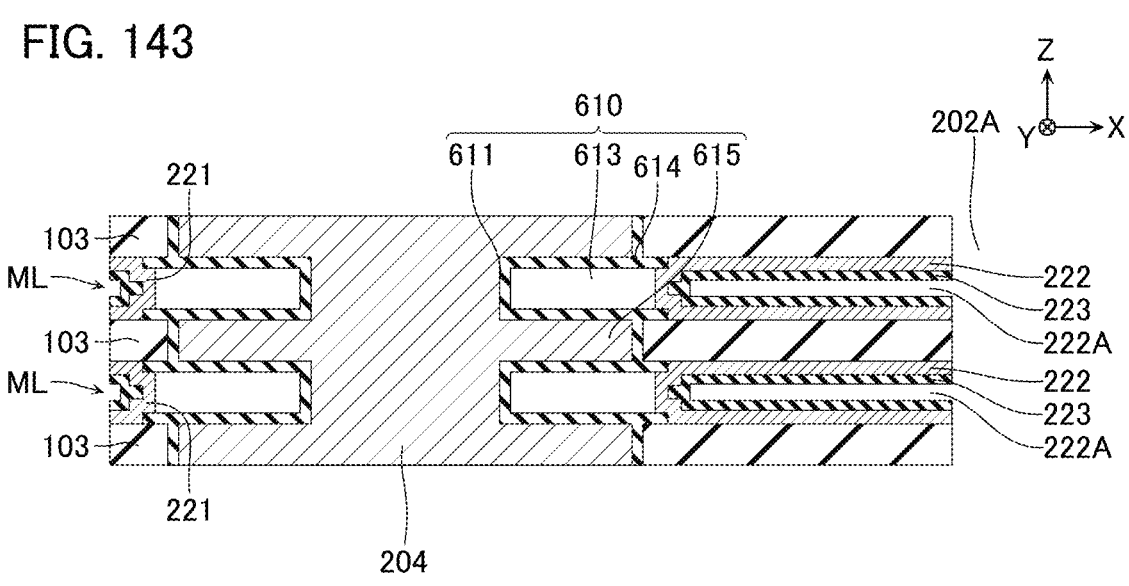
Figure 144:
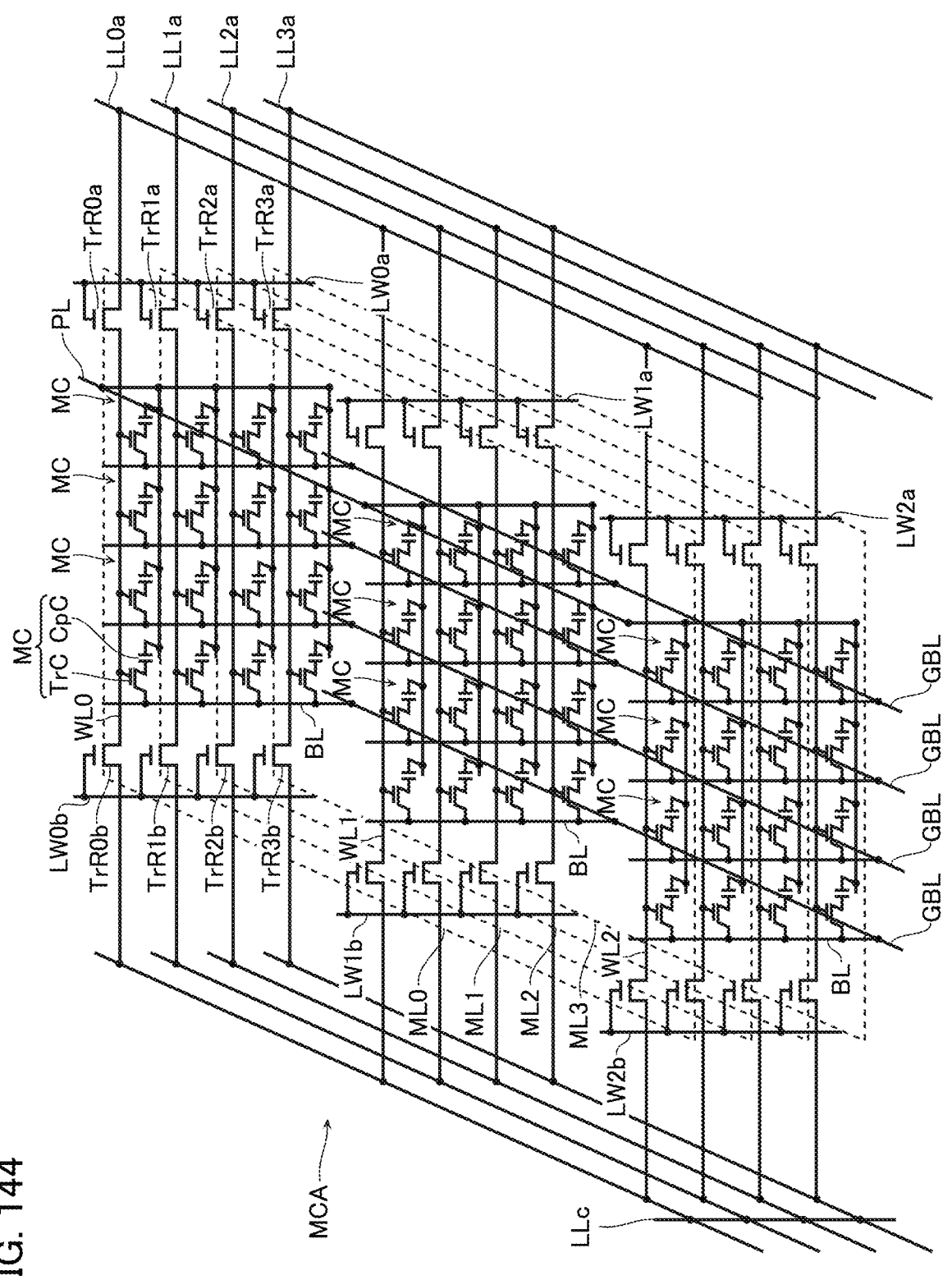
Figure 145:
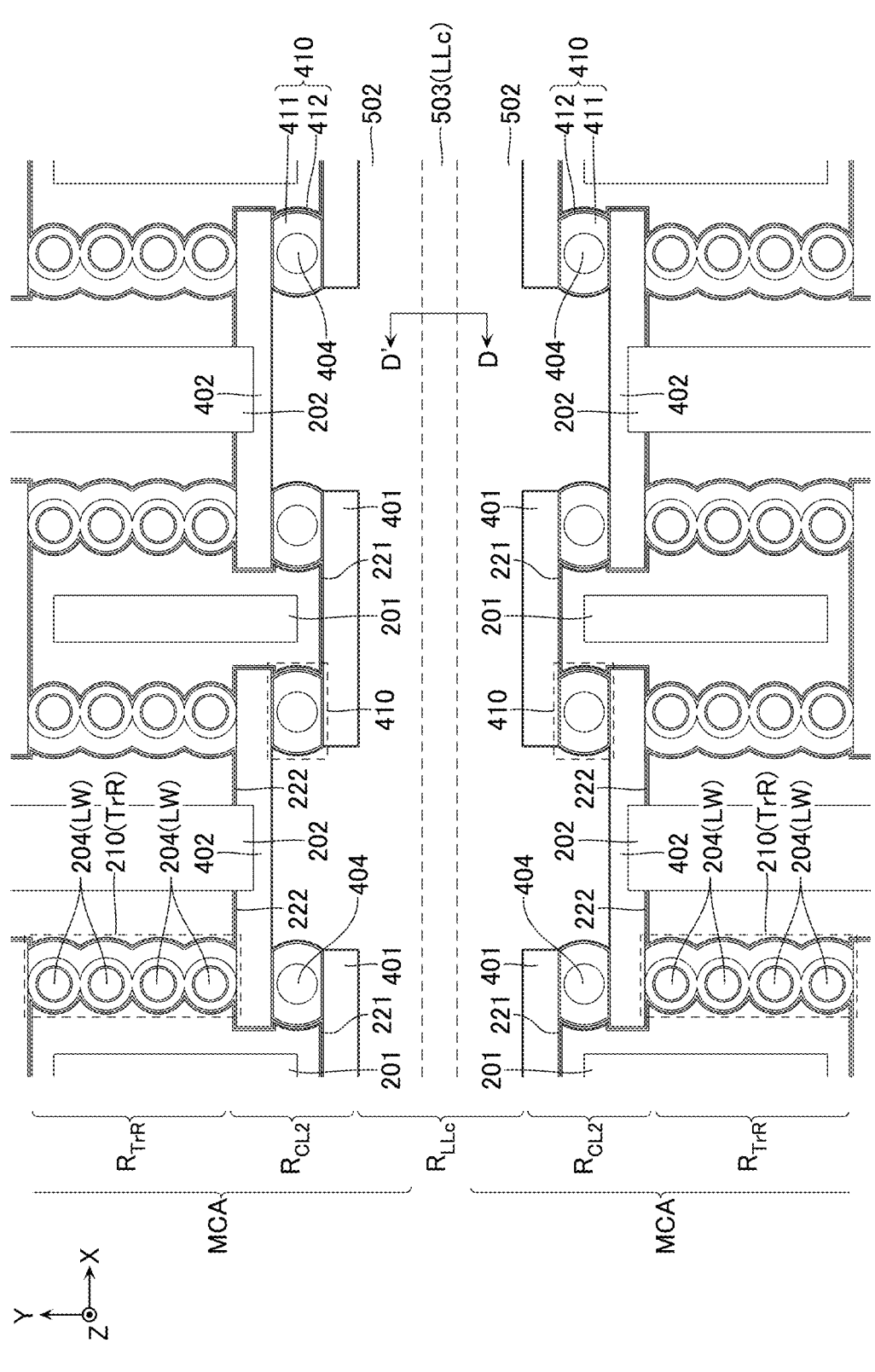
Figure 146:
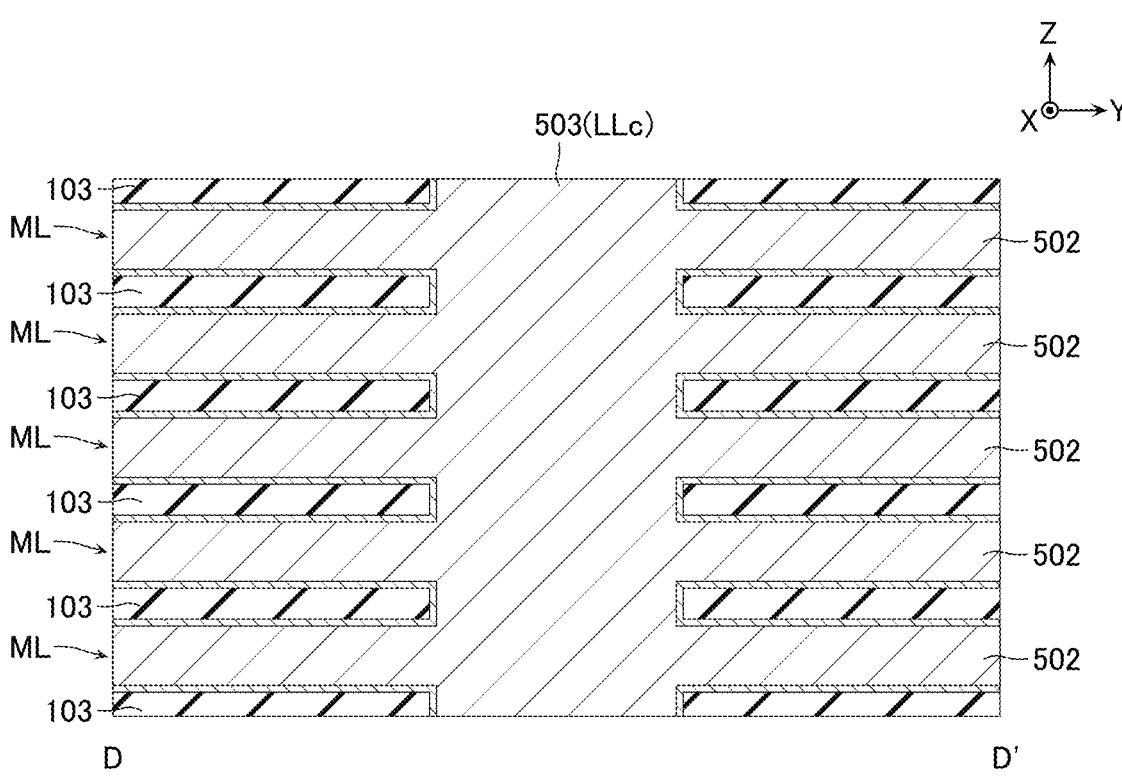
Figure 147:
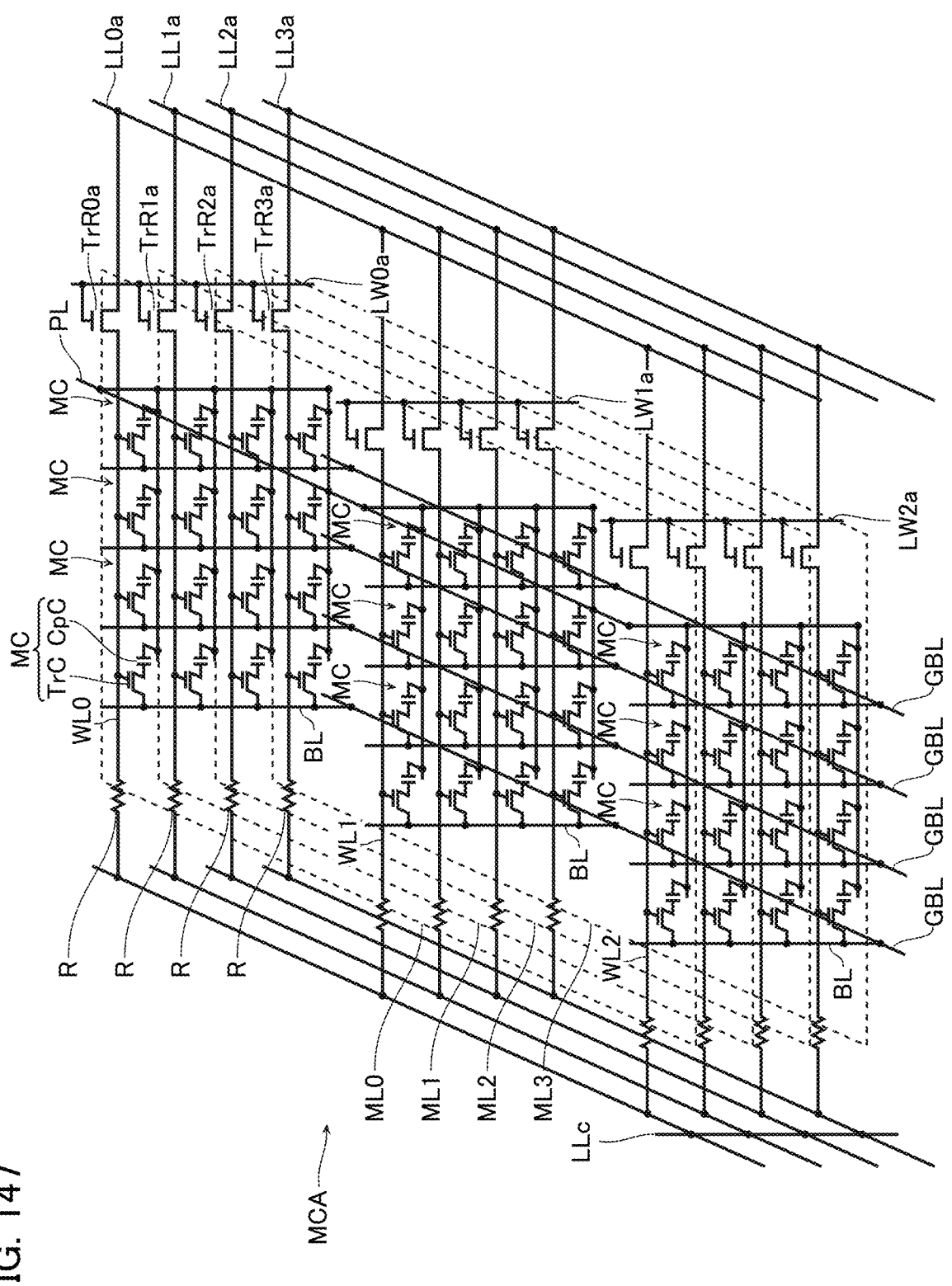
Figure 148:
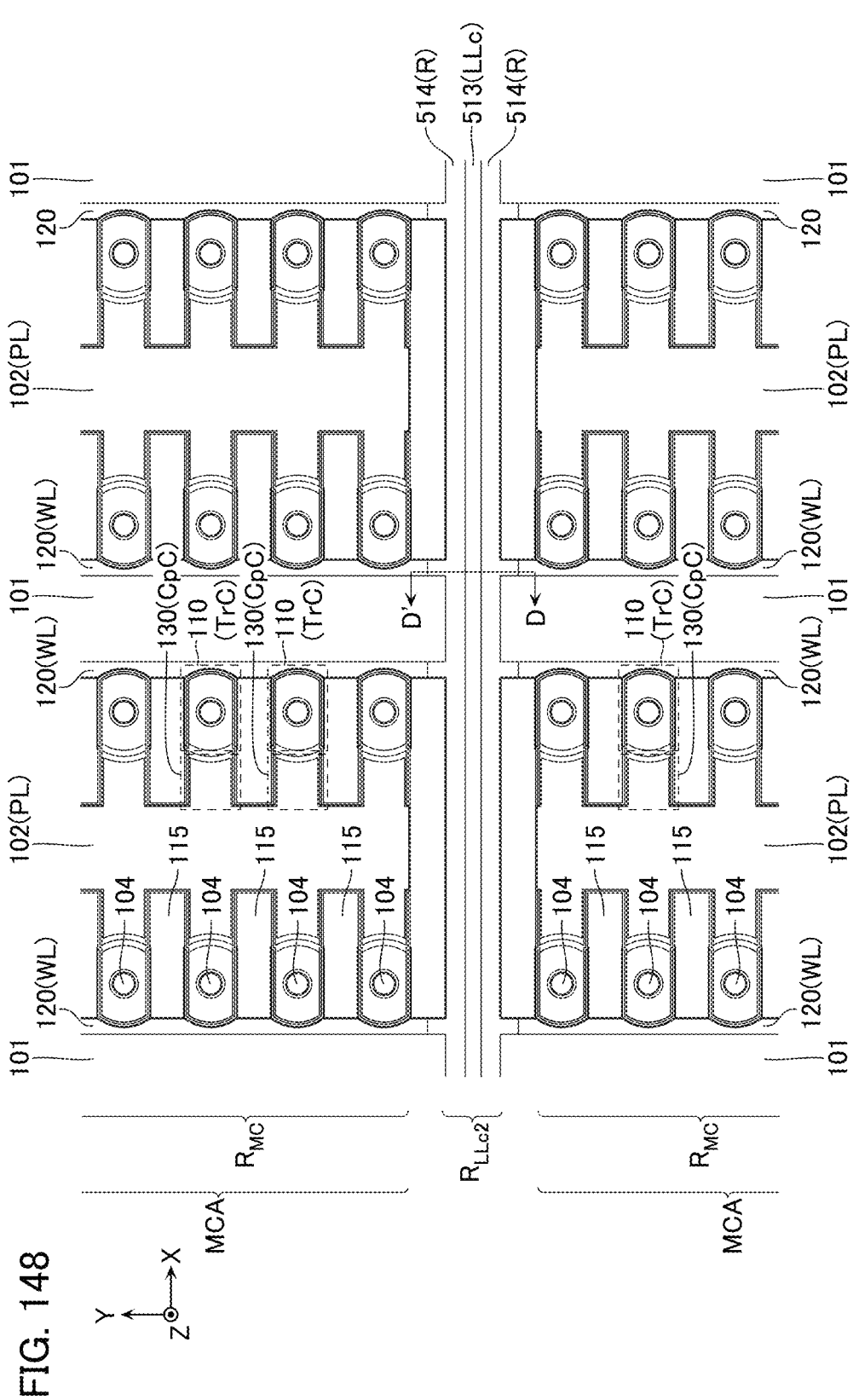
Figure 149:
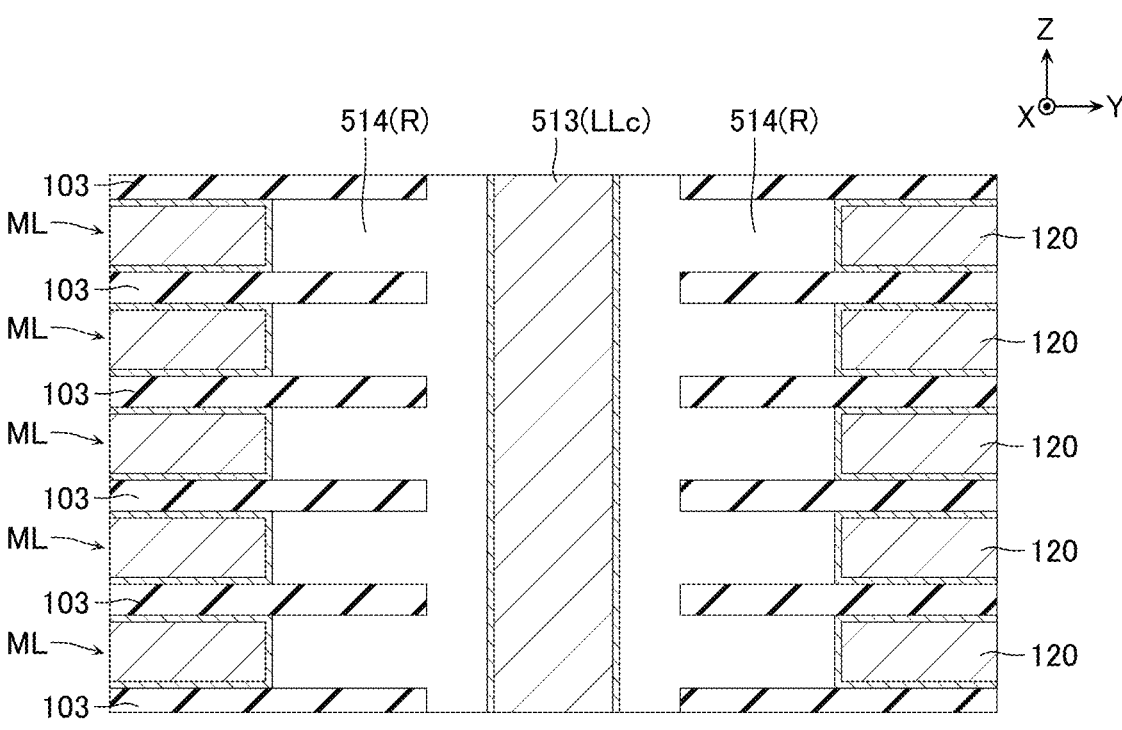

FIG. 132 is a schematic cross-sectional view for describing the manufacturing method;

FIG. 133 is a schematic cross-sectional view for describing the manufacturing method;

FIG. 134 is a schematic cross-sectional view for describing the manufacturing method;

FIG. 135 is a schematic cross-sectional view for describing the manufacturing method;

FIG. 136 is a schematic cross-sectional view for describing the manufacturing method;

FIG. 137 is a schematic cross-sectional view for describing the manufacturing method;

FIG. 138 is a schematic cross-sectional view for describing the manufacturing method;

FIG. 139 is a schematic cross-sectional view for describing the manufacturing method;

FIG. 140 is a schematic cross-sectional view for describing the manufacturing method;

FIG. 141 is a schematic cross-sectional view for describing the manufacturing method;

FIG. 142 is a schematic cross-sectional view for describing the manufacturing method;

FIG. 143 is a schematic cross-sectional view for describing the manufacturing method;

FIG. 144 is a schematic circuit diagram illustrating a part of a configuration of a semiconductor memory device according to a third embodiment;

FIG. 145 is a schematic XY cross-sectional view illustrating a part of the configuration of the semiconductor memory device;

FIG. 146 is a schematic cross-sectional view illustrating a part of the configuration of the semiconductor memory device;

FIG. 147 is a schematic circuit diagram illustrating a part of a configuration of a semiconductor memory device according to a fourth embodiment;

FIG. 148 is a schematic XY cross-sectional view illustrating a part of the configuration of the semiconductor memory device; and FIG. 149 is a schematic cross-sectional view illustrating a part of the configuration of the semiconductor memory device.

DETAILED DESCRIPTION

A semiconductor memory device according to one embodiment comprises: a substrate; a first via-wiring extending in a first direction intersecting with a surface of the substrate; a plurality of first semiconductor layers arranged in the first direction and electrically connected to the first via-wiring; a plurality of memory portions arranged in the first direction and electrically connected to the plurality of first semiconductor layers; a plurality of first gate electrodes arranged in the first direction and opposed to the plurality of first semiconductor layers; a plurality of first wirings arranged in the first direction, extending in a second direction intersecting with the first direction, and electrically connected to the plurality of first gate electrodes; a plurality of second semiconductor layers arranged in the first direction and electrically connected to the plurality of first wirings; a plurality of second gate electrodes arranged in the first direction and opposed to the plurality of second semiconductor layers; a second via-wiring extending in the first direction and electrically connected to the plurality of second gate electrodes; and a plurality of second wirings arranged in the first direction, extending in a third direction intersecting with the first direction and the second direction, and electrically connected to the plurality of second semiconductor layers.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in an OFF state, the first transistor is "electrically connected" to the third transistor.

In this specification, when it is referred that the first configuration "is electrically connected between" the second configuration and a third configuration, it may mean that the first configuration, the second configuration, and the third configuration are connected in series and the second configuration is electrically connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion on a side opposite to the substrate of this configuration. A surface intersecting with the X-direction or the Y-direction is referred to as a side surface and the like.

In this specification, a "center position" of a certain configuration may mean, for example, a position of the center of a circumscribed circle of this configuration, and may mean the centroid on an image of this configuration on a predetermined plane.

First Embodiment

[Circuit Configuration]

Figure 1:
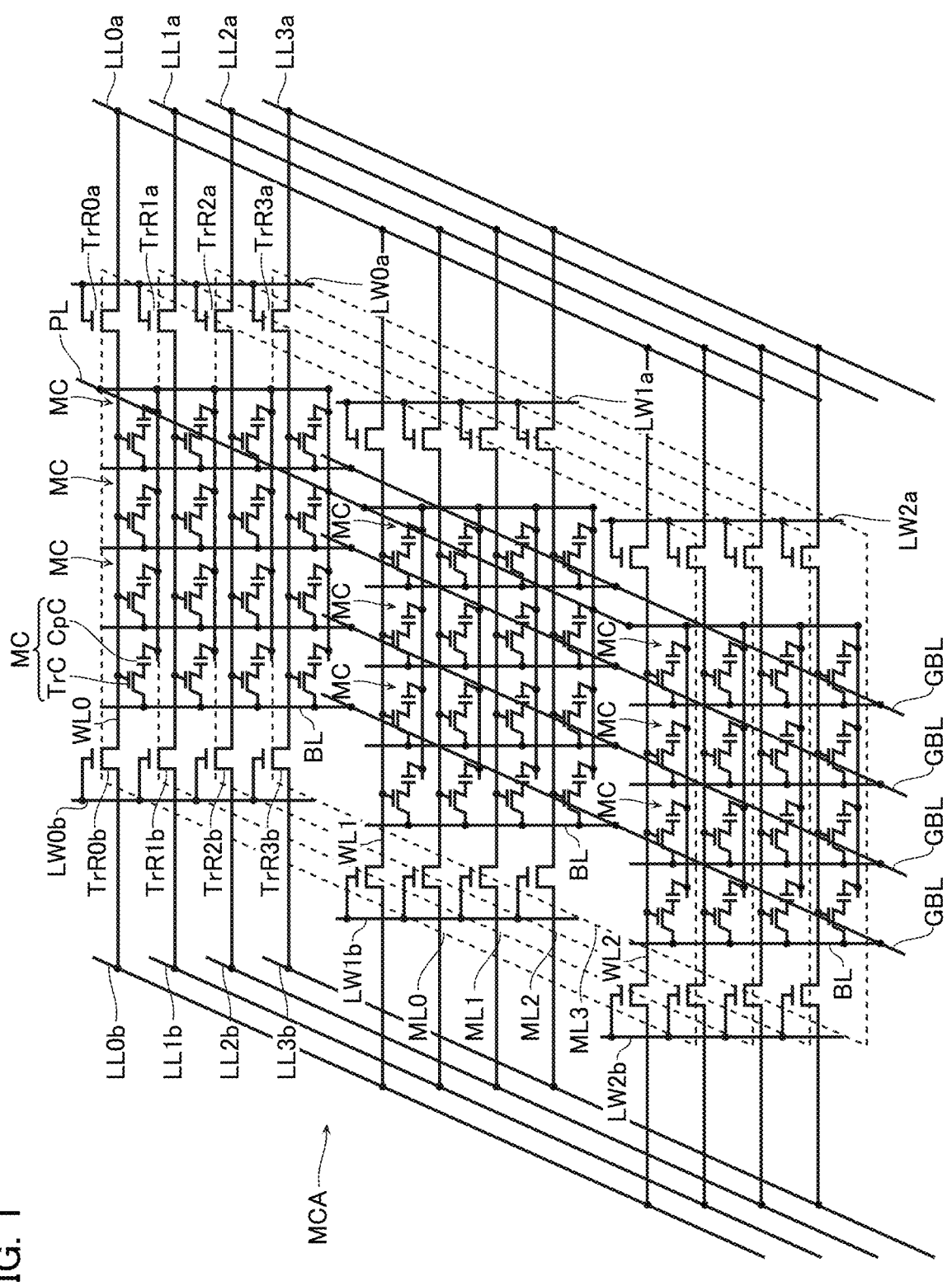
FIG. 1 is a schematic circuit diagram illustrating a part of a configuration of a semiconductor memory device according to a first embodiment.

FIG. 1 is a schematic circuit diagram illustrating a part of a configuration of a semiconductor memory device according to the first embodiment. As illustrated in FIG. 1, the semiconductor memory device according to the embodiment includes a memory cell array MCA. The memory cell array MCA includes a plurality of memory layers ML0 to ML3 (hereinafter referred to as "memory layers ML" in some cases), a plurality of bit lines BL connected to these plurality of memory layers ML0 to ML3, a plurality of global bit lines GBL electrically connected to the plurality of bit lines BL, and a plate line PL connected to the plurality of memory layers ML0 to ML3.

Each of the memory layers ML0 to ML3 includes a plurality of word lines WL0 to WL2 (hereinafter referred to as "word lines WL" in some cases) and a plurality of memory cells MC connected to these plurality of word lines WL0 to WL2. Each of the memory cells MC includes a transistor TrC and a capacitor CpC. One electrode of the transistor TrC is connected to a bit line BL. The other electrode of the transistor TrC is connected to the capacitor CpC. The one and the other electrodes of the transistor TrC function as a source electrode or a drain electrode corresponding to a voltage applied to the transistor TrC. A gate electrode of the transistor TrC is connected to any of the word lines WL0 to WL2. One electrode of the capacitor CpC is connected to the other electrode of the transistor TrC. The other electrode of the capacitor CpC is connected to the plate line PL.

Each of the bit lines BL is connected to a plurality of memory cells MC corresponding to the plurality of memory layers ML0 to ML3. In addition, each of the bit lines BL is connected to a global bit line GBL.

The respective memory layers ML0 to ML3 include a plurality of transistors TrR0a, TrR0b, TrR1a, TrR1b, TrR2a, TrR2b, TrR3a, TrR3b (hereinafter referred to as "transistors TrR" in some cases) disposed corresponding to the plurality of word lines WL0 to WL2. One electrodes of the transistors TrR are connected to any of the word lines WL0 to WL2. The other electrodes of the transistors TrR are connected to respective layer select lines LL0a, LL0b, LL1a, LL1b, LL2a, LL2b, LL3a, LL3b (hereinafter referred to as "layer select lines LL" in some cases). The one and the other electrodes of the transistor TrR function as a source electrode or a drain electrode corresponding to a voltage applied to the transistor TrR. Gate electrodes of the transistors TrR are connected to respective word line select lines LW0a, LW0b, LW1a, LW1b, LW2a, LW2b (hereinafter referred to as "word line select lines LW" in some cases).

The word line select lines LW are connected to the plurality of transistors TrR corresponding to the plurality of memory layers ML0 to ML3. Furthermore, the layer select lines LL0a, LL1a, LL2a, LL3a are connected in common to all the transistors TrR0a, TrR1a, TrR2a, TrR3a corresponding to the memory layers ML0 to ML3, respectively. Similarly, the layer select lines LL0b, LL1b, LL2b, LL3b are connected in common to all the transistors TrR0b, TrR1b, TrR2b, TrR3b corresponding to the memory layers ML0 to ML3, respectively.

[Read Operation]

Figure 2:
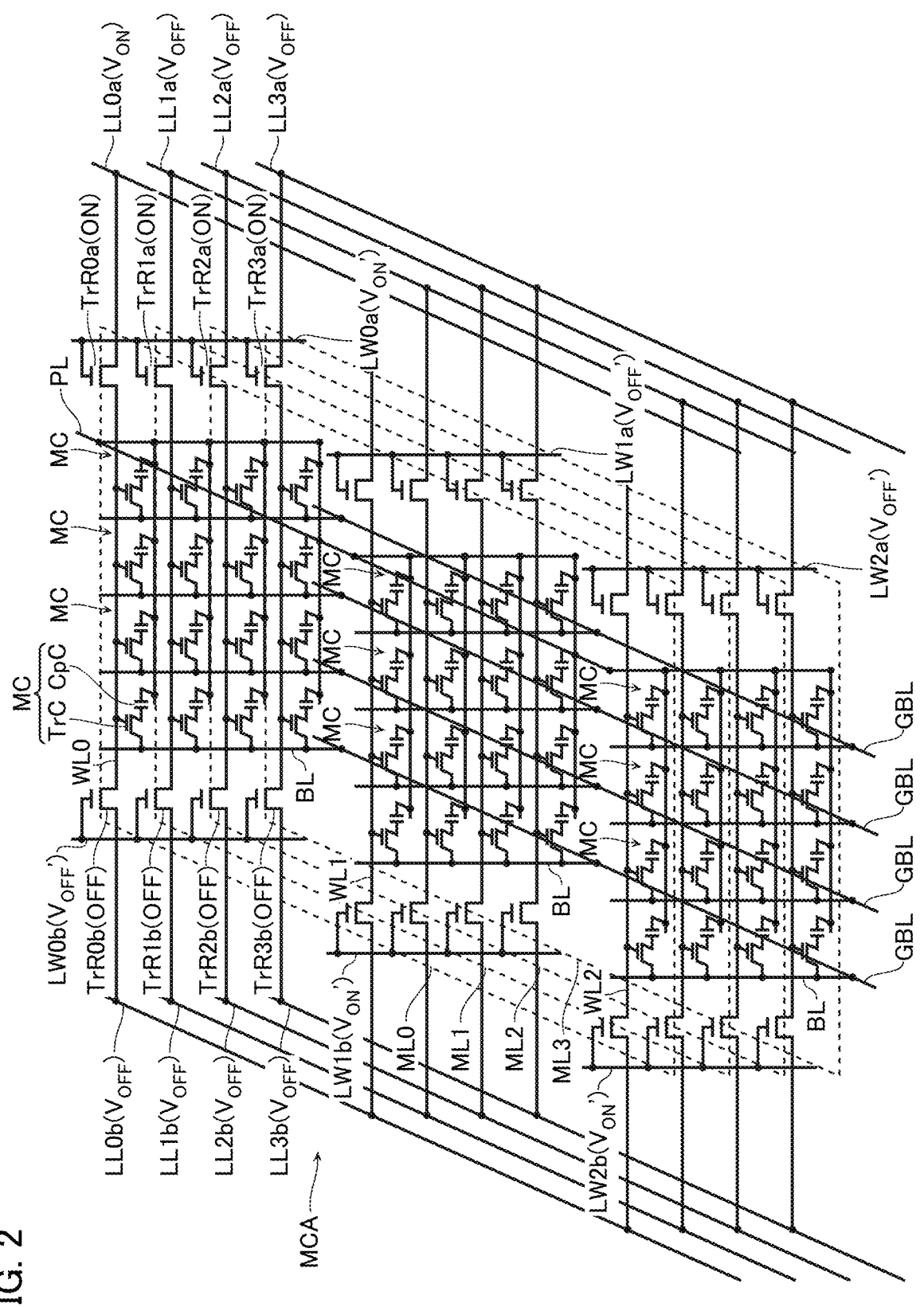
FIG. 2 is a schematic circuit diagram for describing a read operation of the semiconductor memory device.

FIG. 2 is a schematic circuit diagram for describing a read operation of the semiconductor memory device according to the first embodiment.

In the read operation, one of the plurality of memory layers ML0 to ML3 is selected. In the example of the drawing, the memory layer ML0 is selected. In the selection of the memory layers ML0 to ML3, for example, a voltage $V_{ON}$ is applied to the layer select line LL0a corresponding to the memory layer ML0 as a target of the read operation among the plurality of layer select lines LL0a, LL1a, LL2a, LL3a, and a voltage $V_{OFF}$ is applied to other layer select lines LL1a, LL2a, LL3a. Further, for example, the voltage $V_{OFF}$ is applied to the layer select lines LL0b, LL1b, LL2b, LL3b.

The voltage $V_{ON}$ has, for example, a magnitude sufficient to turn ON the transistor TrC. The voltage $V_{OFF}$ has, for example, a magnitude sufficient to turn OFF the transistor TrC. For example, when the transistor TrC is an NMOS transistor, the voltage $V_{ON}$ is larger than the voltage $V_{OFF}$. For example, when the transistor TrC is a PMOS transistor, the voltage $V_{ON}$ is smaller than the voltage $V_{OFF}$.

In the read operation, one of the plurality of word lines WL0 to WL2 is selected. In the example of the drawing, the word line WL0 is selected. In the selection of the word lines WL0 to WL2, for example, a voltage $V_{ON}'$ is applied to the word line select line LW0a corresponding to the word lines WL0 as a target of the read operation among the plurality of word line select lines LW0a, LW1a, LW2a, and a voltage $V_{OFF}'$ is applied to other word line select lines LW1a, LW2a. Further, the voltage $V_{OFF}'$ is applied to the word line select line LW0b corresponding to the word lines WL0 as a target of the read operation among the plurality of word line select lines LW0b, LW1b, LW2b, and the voltage $V_{ON}'$ is applied to other word line select lines LW1b, LW2b.

The voltage $V_{ON}'$ has, for example, a magnitude sufficient to turn ON the transistor TrR. The voltage $V_{OFF}'$ has, for example, a magnitude sufficient to turn OFF the transistor TrR. For example, when the transistor TrR is an NMOS transistor, the voltage $V_{ON}'$ is larger than the voltage $V_{OFF}'$. For example, when the transistor TrR is a PMOS transistor, the voltage $V_{ON}'$ is smaller than the voltage $V_{OFF}'$.

Here, the voltage $V_{ON}$ is applied to the word line WL0 (hereinafter referred to as a "selected word line WL0") connected to the memory cell MC as a target of the read operation (hereinafter referred to as a "selected memory cell MC") via the transistor TrR0a. Consequently, the transistor TrC in the selected memory cell MC turns ON. Accordingly, a voltage of the global bit line GBL varies, or a current flows through the global bit line GBL. By detecting the voltage variation or the current, data stored in the selected memory cell MC can be read out.

The voltage $V_{OFF}$ is applied to unselected word lines WL0 corresponding to the memory layers ML1, ML2, ML3 different from the selected memory cell MC via the transistors TrR1a, TrR2a, TrR3a. Consequently, the transistors TrC in the memory cells MC turn OFF.

The voltage $V_{OFF}$ is applied to unselected word lines WL1, WL2 corresponding to the memory layers ML0, ML1, ML2, ML3 via the transistors TrR connected to the word line select lines LW1b, LW2b. Consequently, the transistors TrC in the memory cells MC turn OFF.

In the following explanation, an example in which both the transistors TrC, TrR are NMOS transistors is described.
[Structure]

Figure 3:
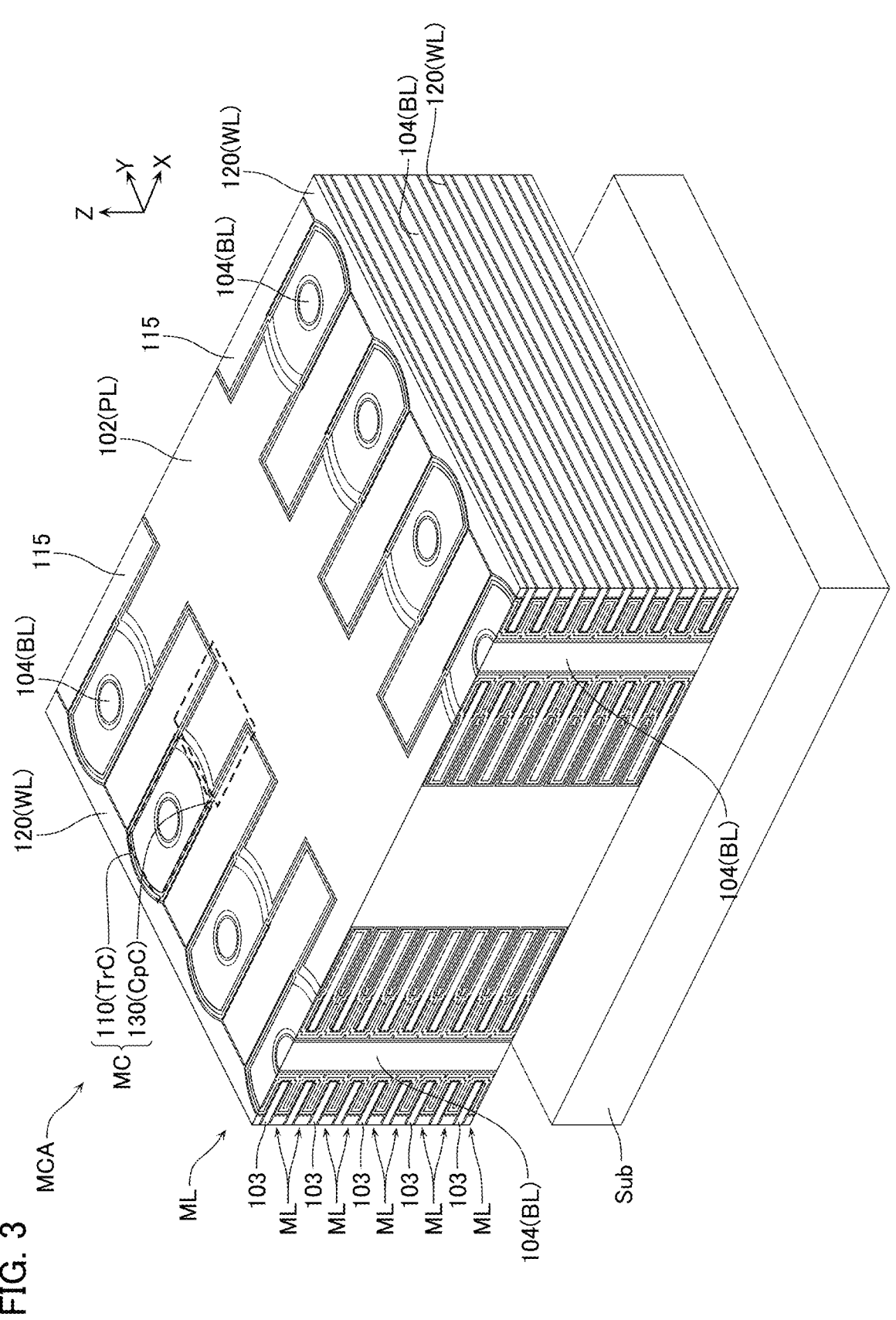
FIG. 3 is a schematic perspective view illustrating a part of the configuration of the semiconductor memory device.
Figure 4:
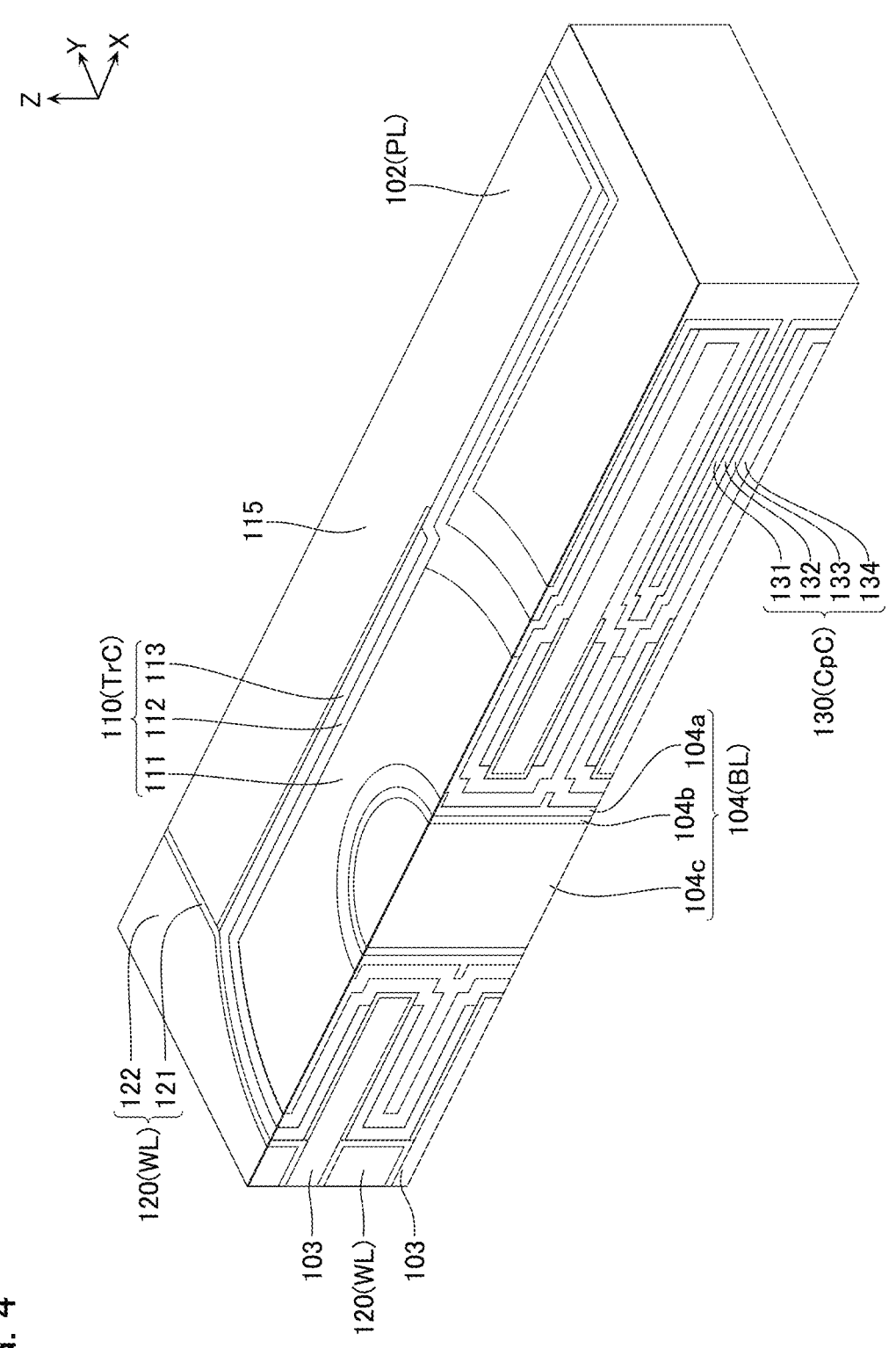
FIG. 4 is a schematic perspective view illustrating a part of the configuration of the semiconductor memory device.
Figure 5:
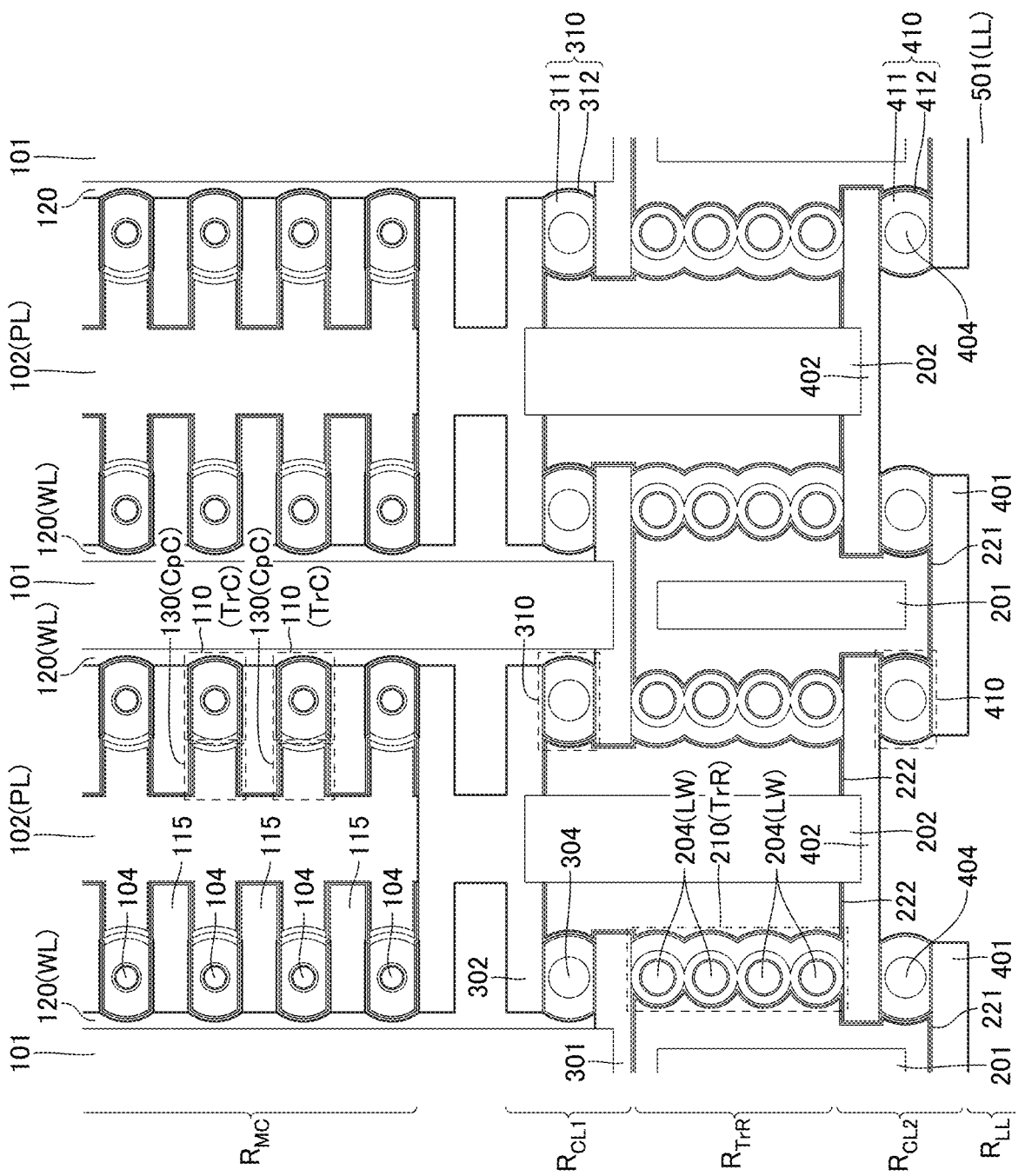
FIG. 5 is a schematic XY cross-sectional view illustrating a part of the configuration of the semiconductor memory device.
Figure 6:
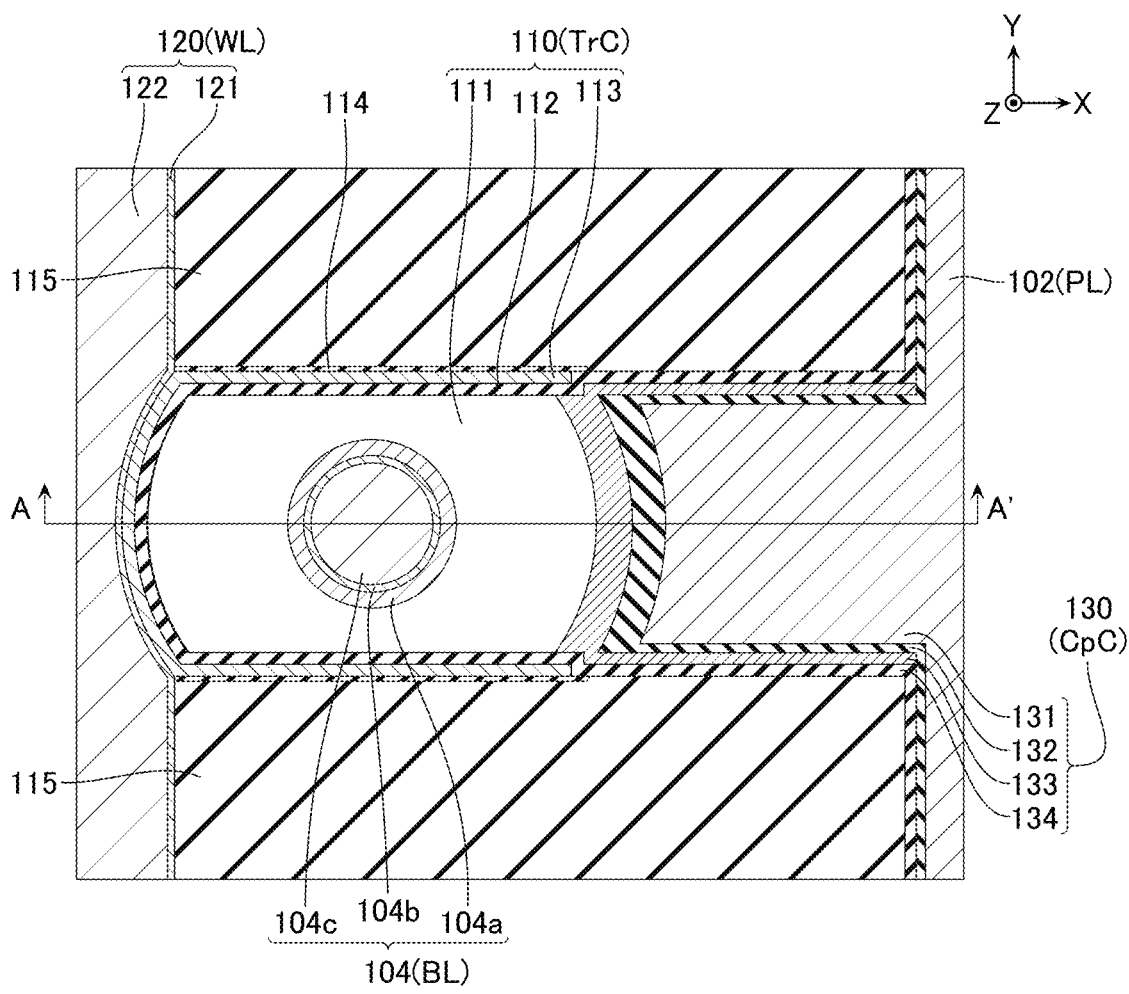
FIG. 6 is a schematic XY cross-sectional view illustrating a part of the configuration of the semiconductor memory device.
Figure 7:
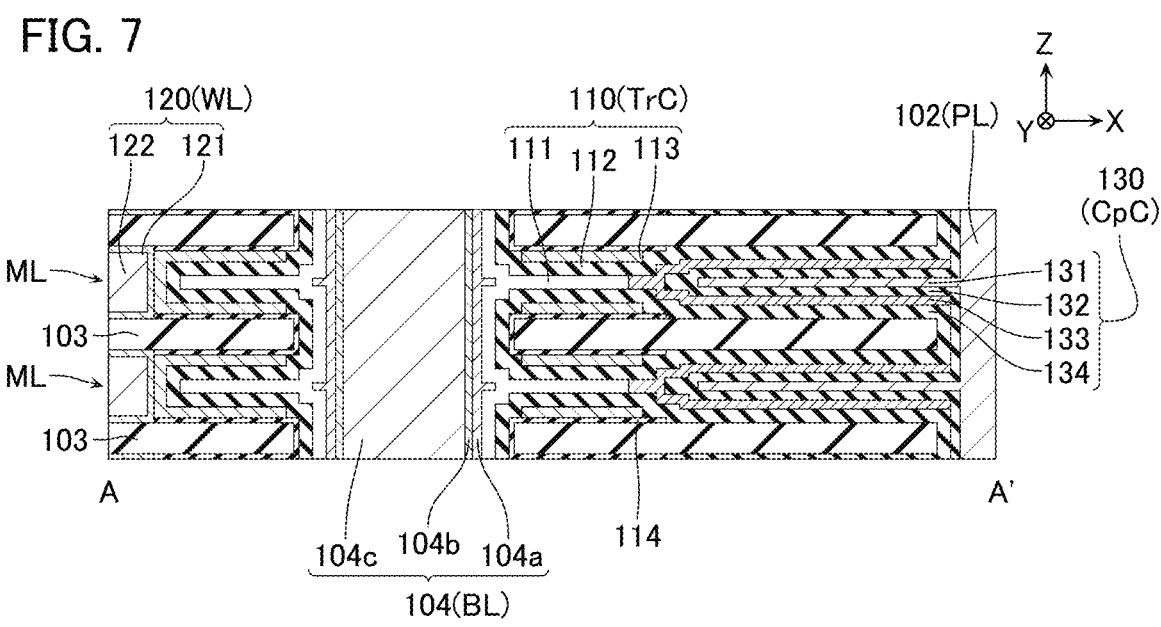
FIG. 7 is a schematic cross-sectional view illustrating a part of the configuration of the semiconductor memory device.
Figure 8:
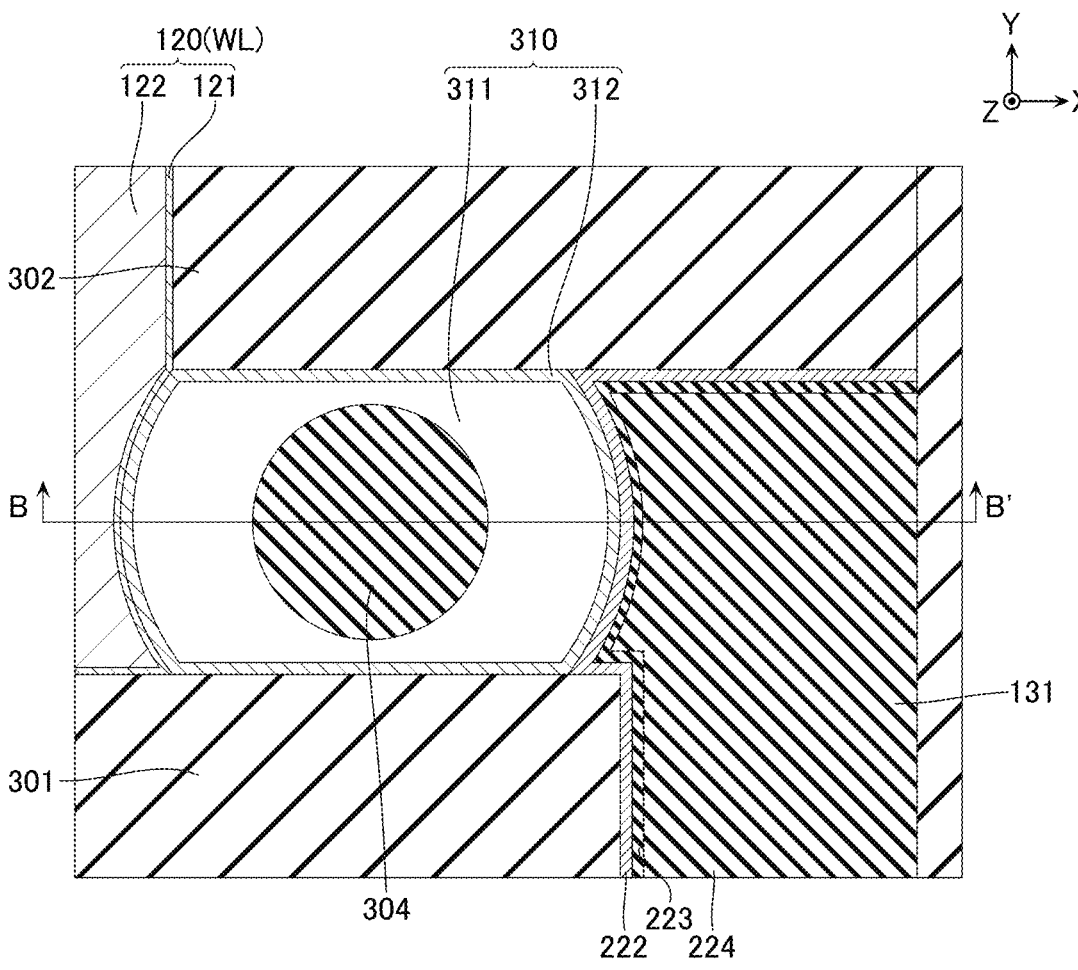
FIG. 8 is a schematic XY cross-sectional view illustrating a part of the configuration of the semiconductor memory device.
Figure 9:
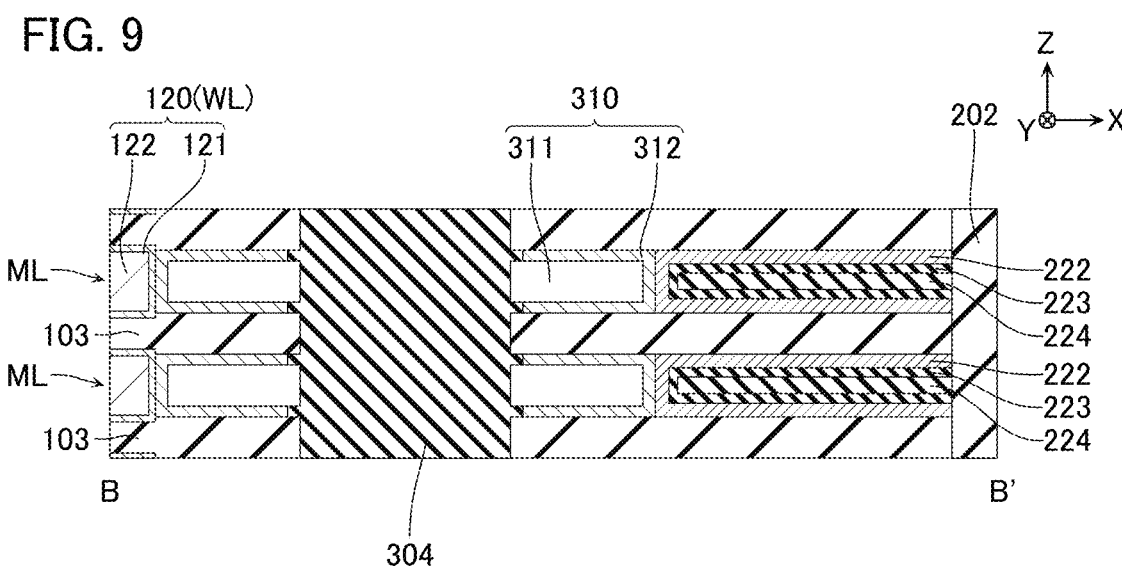
FIG. 9 is a schematic cross-sectional view illustrating a part of the configuration of the semiconductor memory device.
Figure 10:
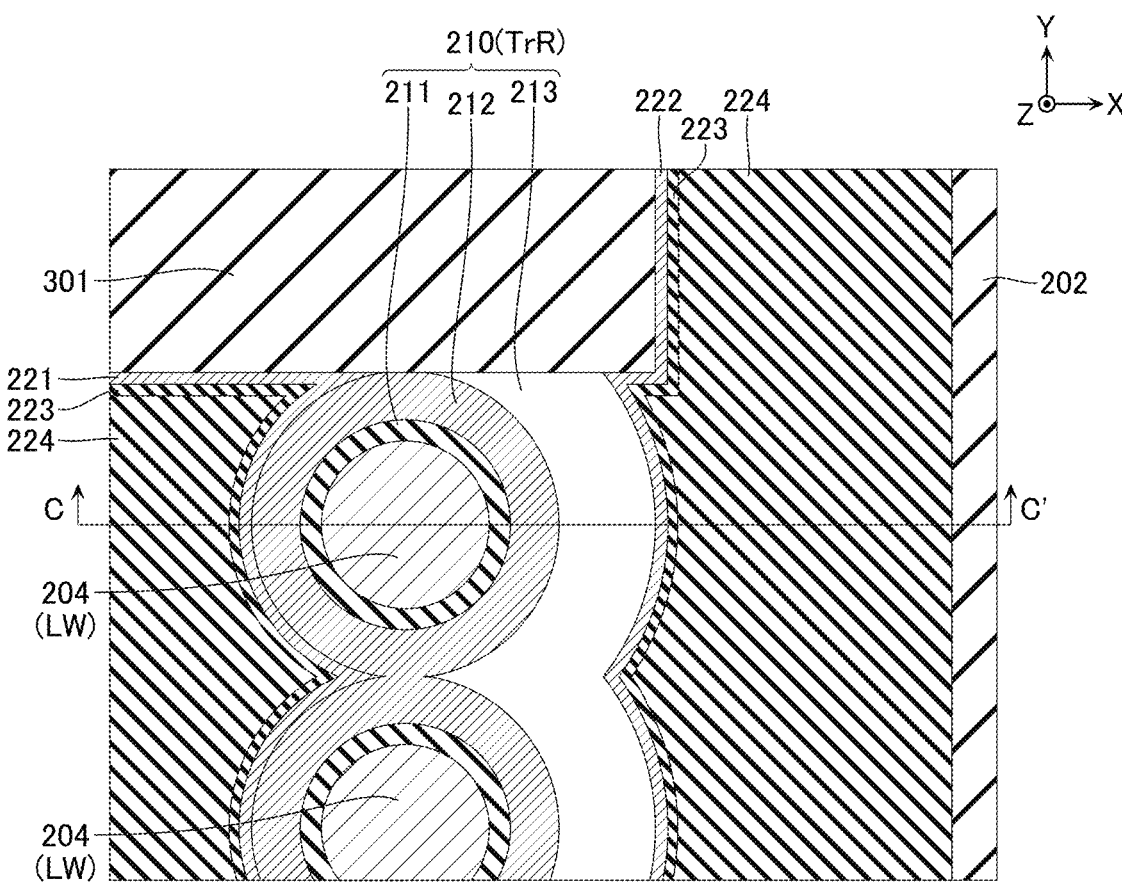
FIG. 10 is a schematic XY cross-sectional view illustrating a part of the configuration of the semiconductor memory device.
Figure 11:
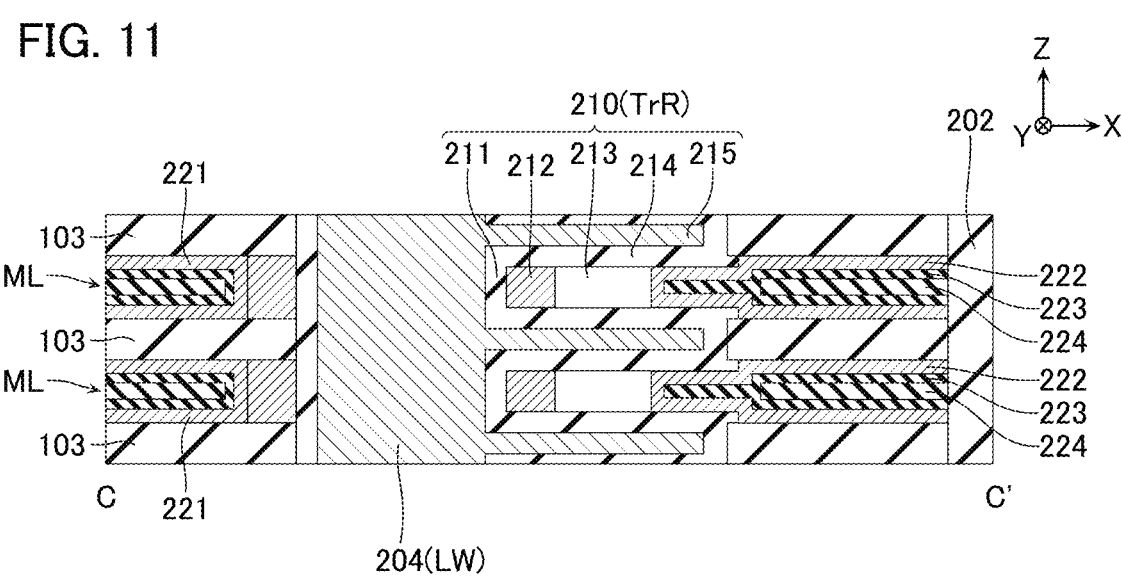
FIG. 11 is a schematic cross-sectional view illustrating a part of the configuration of the semiconductor memory device.

FIG. 3 is a schematic perspective view illustrating a part of the configuration of the semiconductor memory device according to the first embodiment. FIG. 4 is a schematic perspective view illustrating a part of the configuration of the semiconductor memory device, and illustrates an enlarged part of FIG. 3. FIG. 5 is a schematic XY cross-sectional view illustrating a part of the configuration of the semiconductor memory device. FIG. 6, FIG. 8, and FIG. 10 are schematic XY cross-sectional views illustrating a part of the configuration of the semiconductor memory device, and each illustrate an enlarged part of FIG. 5. FIG. 7 is a schematic cross-sectional view illustrating a part of the configuration of the semiconductor memory device, and illustrates the structure of FIG. 6 taken along the line A-A' and viewed in the arrow direction. FIG. 9 is a schematic cross-sectional view illustrating a part of the configuration of the semiconductor memory device, and illustrates the structure of FIG. 8 taken along the line B-B' and viewed in the arrow direction. FIG. 11 is a schematic cross-sectional view illustrating a part of the configuration of the semiconductor memory device, and illustrates the structure of FIG. 10 taken along the line C-C' and viewed in the arrow direction.

FIG. 3 illustrates a part of a semiconductor substrate Sub and a memory cell array MCA disposed above the semiconductor substrate Sub.

The semiconductor substrate Sub is, for example, a semiconductor substrate of silicon (Si) or the like containing P-type impurities, such as boron (B). An insulating layer and an electrode layer (not illustrated in FIG. 3) are disposed on an upper surface of the semiconductor substrate Sub. The upper surface of the semiconductor substrate Sub and the insulating layer and electrode layer (not illustrated in FIG. 3) constitute a peripheral circuit for controlling the semiconductor memory device according to the first embodiment. For example, a sense amplifier circuit is disposed in a region immediately below the memory cell array MCA. The sense amplifier circuit is electrically connected to the global bit lines GBL. The sense amplifier circuit can read the data stored in the selected memory cell MC by detecting the voltage variation or the current of the bit line BL in a read operation. The peripheral circuit includes a sequencer that applies a predetermined voltage to the respective wirings in the memory cell array MCA and respective configurations in the sense amplifier circuit at a predetermined timing, thereby executing the read operation or the like.

The memory cell array MCA includes a plurality of memory layers ML arranged in the Z-direction. An insulating layer 103 of, for example, silicon oxide (SiO$_2$) is disposed between the respective plurality of memory layers ML.

As illustrated in FIG. 5, the memory cell array MCA includes a memory cell region $R_{MC}$, a transistor region $R_{TrR}$ provided on one side in the Y-direction with respect to the memory cell region $R_{MC}$, and a wiring region Ru provided on one side in the Y-direction with respect to the transistor region $R_{TrR}$. The memory cell array MCA includes a connection wiring region $R_{CL1}$ provided between the memory cell region $R_{MC}$ and the transistor region $R_{TrR}$, and a connection wiring region $R_{CL2}$ provided between the transistor region $R_{TrR}$ and the wiring region $R_{LL}$. Although not illustrated, the transistor region Rrrr, the wiring region $R_{LL}$, the connection wiring region Row, and the connection wiring region $R_{CL2}$ are provided on both sides of the memory cell region $R_{MC}$ in the Y-direction.
[Structure of Memory Cell Region $R_{MC}$]

As illustrated in FIG. 5, in the memory cell region $R_{MC}$, a plurality of insulating layers 101 arranged in the X-direction and conductive layers 102 disposed between two insulating layers 101 adjacent in the X-direction are disposed. The insulating layers 101 and the conductive layers 102 extend in the Y-direction and the Z-direction, and separate the plurality of memory layers ML in the X-direction.

The insulating layer 101 contains, for example, silicon oxide (SiO$_2$).

The conductive layer 102 includes, for example, a stacked structure of titanium nitride (TiN) and silicon-germanium (SiGe). The conductive layer 102 functions as, for example, the plate line PL (FIG. 1).

In the memory cell region $R_{MC}$, a plurality of via-wirings 104 arranged in the Y-direction are disposed in regions between the insulating layer 101 and the conductive layer 102. For example, as illustrated in FIG. 3, each of these plurality of via-wirings 104 penetrates the plurality of memory layers ML and extends in the Z-direction.

As illustrated in FIG. 4, for example, the via-wiring 104 includes a conductive oxide film 104a containing a conductive oxide, a barrier conductive film 104b of, for example, titanium nitride (TiN), and a conductive member 104c of, for example, tungsten (W). The via-wiring 104 may contain ruthenium (Ru), iridium (Ir), or another metal instead of the conductive oxide film 104a. Furthermore, the via-wiring 104 may contain only a conductive oxide or may contain only ruthenium (Ru), iridium (Ir), or another metal.

Note that in the present specification, the "conductive oxide" is assumed to include indium tin oxide (ITO), indium zinc oxide (IZO), ruthenium oxide ($RuO_2$), iridium oxide ($IrO_2$), or another conductive material containing oxygen, for example.

The conductive member 104c has an approximately columnar shape extending in the Z-direction. The barrier conductive film 104b has an approximately cylindrical shape extending in the Z-direction along an outer peripheral surface of the conductive member 104c. The conductive oxide film 104a has an approximately cylindrical shape extending in the Z-direction along an outer peripheral surface of the barrier conductive film 104b. The via wiring 104 functions as, for example, the bit line BL (FIG. 1).

For example, as illustrated in FIG. 5, the memory layer ML includes a conductive layer 120 disposed between the insulating layer 101 and the plurality of via-wirings 104 and extending in the Y-direction, a plurality of transistor structures 110 arranged in the Y-direction corresponding to the plurality of via-wirings 104, and a plurality of capacitor structures 130 disposed between the conductive layer 102 and the plurality of transistor structures 110 and arranged in the Y-direction corresponding to the plurality of via-wirings 104.

As illustrated in FIG. 4, for example, the transistor structure 110 includes a semiconductor layer 111 connected to an outer peripheral surface of the via-wiring 104 and extending in the X-direction, an insulating layer 112 disposed on an upper surface, a lower surface, both side surfaces in the Y-direction, and a side surface on one side (a conductive layer 120 side) in the X-direction of the semiconductor layer 111, and a conductive layer 113 disposed on an upper surface, a lower surface, both side surfaces in the Y-direction, and a side surface on one side (the conductive layer 120 side) in the X-direction of the insulating layer 112.

In the XY cross-sectional surface exemplarily illustrated in FIG. 6, each of both side surfaces of the semiconductor layer 111 in the X-direction may be formed along a circle around a center position of the via-wiring 104. In addition, each of the side surfaces of the insulating layer 112 and the conductive layer 113 on one side (the conductive layer 120 side) in the X-direction may be similarly formed along the circle around the center position of the via-wiring 104. Furthermore, both side surfaces of the semiconductor layer 111, the insulating layer 112, and the conductive layer 113 in the Y-direction may be linearly formed along the side surfaces of insulating layers 115.

Note that both side surfaces of the semiconductor layer 111 in the X-direction need not be formed along a circle. Even in such a case, for example, both side surfaces of the semiconductor layer 111 in the X-direction may form curved lines when viewed in the Z-direction. For example, the semiconductor layer 111 may have a length in the X-direction that differs depending on the position in the Y-direction. For example, the length of the semiconductor layer 111 in the X-direction at a position close to the insulating layer 115 may be shorter than the length of the semiconductor layer 111 in the X-direction at a position far from the insulating layer 115.

The semiconductor layer 111 functions as, for example, a channel region of the transistor TrC (FIG. 1). The semiconductor layer 111 may be, for example, a semiconductor containing at least one element of gallium (Ga) or aluminum (Al), and containing indium (In), zinc (Zn), and oxygen (O), or may be another oxide semiconductor. A plurality of semiconductor layers 111 arranged in the Z-direction are connected in common to the via wiring 104 extending in the Z-direction.

The insulating layer 112 functions as, for example, a gate insulating film of the transistor TrC (FIG. 1). The insulating layer 112 contains, for example, silicon oxide ($SiO_2$) or the like.

The conductive layer 113 functions as, for example, a gate electrode of the transistor TrC (FIG. 1). The conductive layer 113 contains, for example, a conductive oxide, such as titanium nitride (TiN) and indium tin oxide (ITO). As illustrated in FIG. 5, a plurality of conductive layers 113 arranged in the Y-direction are connected in common to the conductive layer 120 extending in the Y-direction. As illustrated in FIG. 6 and FIG. 7, the conductive layer 113 is opposed to the upper surface, the lower surface, both side surfaces in the Y-direction, and the side surface on one side (the conductive layer 120 side) in the X-direction of the semiconductor layer 111 via the insulating layer 112.

As illustrated in FIG. 5, the insulating layer 115 of, for example, silicon oxide ($SiO_2$) is disposed between two semiconductor layers 111 adjacent in the Y-direction. The insulating layer 115 penetrates the plurality of memory layers ML and extends in the Z-direction.

The conductive layer 120 functions as, for example, the word line WL (FIG. 1). The conductive layer 120 extends in the Y-direction as described above. Each of the side surfaces of the conductive layer 120 on one side in the X-direction is connected to a plurality of conductive layers 113 arranged in the Y-direction. As illustrated in FIG. 6 and FIG. 7, the conductive layer 120 includes, for example, a barrier conductive film 121 of titanium nitride (TiN) or the like and a conductive film 122 of tungsten (W).

As illustrated in FIG. 6 and FIG. 7, for example, the capacitor structure 130 includes a conductive layer 131, an insulating layer 132 disposed on an upper surface, a lower surface, both side surfaces in the Y-direction, and a side surface on one side (a transistor structure 110 side) in the X-direction of the conductive layer 131, a conductive layer 133 disposed on an upper surface, a lower surface, both side surfaces in the Y-direction, and a side surface on one side (the transistor structure 110 side) in the X-direction of the insulating layer 132, and an insulating layer 134 disposed on an upper surface, a lower surface, and both side surfaces in the Y-direction of the conductive layer 133.

The conductive layer 131 functions as one electrode of the capacitor CpC (FIG. 1). The conductive layer 131 includes, for example, a stacked structure of titanium nitride (TiN) and silicon-germanium (SiGe). The conductive layer 131 is connected to the conductive layer 102.

The insulating layer 132 functions as an insulating layer of the capacitor CpC (FIG. 1). The insulating layer 132 may be, for example, zirconia ($Zro_2$), alumina ($Al_2O_3$), or another insulating metal oxide. The insulating layer 132 may be, for example, a stacked film of a plurality of insulating metal oxides (for example, a stacked film of zirconia and alumina).

The conductive layer 133 functions as, for example, the other electrode of the capacitor CpC (FIG. 1). The conductive layer 133 contains, for example, a conductive oxide, such as indium tin oxide (ITO). The conductive layer 133 is insulated from the conductive layer 131 via the insulating layer 132. The conductive layer 133 is connected to the side surface of the semiconductor layer 111 on one side (a conductive layer 102 side) in the X-direction.

The insulating layer 134 contains, for example, silicon oxide ($SiO_2$). In the example of the drawing, the insulating layer 134 is continuous with the insulating layer 112.

[Structure of Transistor Region $R_{TrR}$]

As illustrated in FIG. 5, in the transistor region $R_{TrR}$, a plurality of insulating layers 201 arranged in the X-direction corresponding to the plurality of insulating layers 101, and insulating layers 202 disposed between two insulating layers 201 adjacent in the X-direction are disposed. The insulating layers 201, 202 extend in the Y-direction and the Z-direction, and separate the plurality of memory layers ML in the X-direction. The insulating layer 201 and the insulating layer 202 contain, for example, silicon oxide ($SiO_2$).

In the transistor region $R_{TrR}$, a plurality of via-wirings 204 are disposed in a region between the insulating layer 201 and the insulating layer 202. The plurality of via-wirings 204 are arranged in the Y-direction, and for example, as illustrated in FIG. 11, penetrate the plurality of memory layers ML and extend in the Z-direction.

The via-wiring 204 includes, for example, a stacked structure of titanium nitride (TiN) and tungsten (W). The via-wiring 204 has an approximately columnar shape extending in the Z-direction.

The plurality of via-wirings 204 arranged in the Y-direction function as, for example, one word line select line LW (FIG. 1). For example, as illustrated in FIG. 1, a plurality of the word line select lines LW are disposed corresponding to the plurality of word lines WL included in the memory layer ML.

The memory layer ML includes a plurality of part of transistor structures 210 disposed corresponding to the plurality of conductive layers 120, conductive layers 221 disposed between the transistor structures 210 and the insulating layers 201, and conductive layers 222 disposed between the transistor structures 210 and insulating layers 202.

As illustrated in FIG. 11, the transistor structure 210 has a part provided in the memory layer ML and a part provided at a height position corresponding to the insulating layer 103. Among them, the part provided in the memory layer ML includes, as illustrated in FIG. 10, a plurality of insulating layers 211 disposed on outer peripheral surfaces of the plurality of via-wirings 204, a conductive layer 212 disposed on outer peripheral surfaces of these plurality of insulating layers 211 and extending in the Y-direction, and a semiconductor layer 213 extending in the Y-direction along a side surface of the conductive layer 212 on one side (an insulating layer 202 side) in the X-direction. The part provided at the height position corresponding to the insulating layer 103 includes, as illustrated in FIG. 11, an insulating layer 214 disposed on upper surfaces and lower surfaces of the conductive layer 212 and the semiconductor layer 213, and a conductive layer 215 disposed on an upper surface and a lower surface of the insulating layer 214.

In the XY cross-sectional surface exemplarily illustrated in FIG. 10, side surfaces of the conductive layer 212 on both sides in the X-direction may be formed along a plurality of mutually overlapping circles around a plurality of center positions of the plurality of via-wirings 204. Side surfaces of the semiconductor layer 213 on both sides in the X-direction also may be formed along a plurality of mutually overlapping circles around the plurality of center positions of the plurality of via-wirings 204.

The insulating layer 211 contains, for example, silicon oxide ($SiO_2$). The insulating layer 211 has an approximately cylindrical shape extending in the Z-direction along a part of the outer peripheral surface of the via-wiring 204. The insulating layer 211 is continuous with the insulating layer 214 (FIG. 11).

The conductive layer 212 contains, for example, a conductive oxide. The conductive layer 212 may contain ruthenium (Ru), iridium (Ir), or another metal instead of the conductive oxide. The conductive layer 212 may contain only a conductive oxide or may contain only ruthenium (Ru), iridium (Ir), or another metal.

The semiconductor layer 213 functions as, for example, a channel region of the transistor TrR (FIG. 1). The semiconductor layer 213 may be, for example, a semiconductor containing at least one element of gallium (Ga) or aluminum (Al), and containing indium (In), zinc (Zn), and oxygen (O), or may be another oxide semiconductor.

The insulating layer 214 functions as, for example, a gate insulating film of the transistor TrR (FIG. 1). The insulating layer 214 contains, for example, silicon oxide ($SiO_2$) or the like.

The conductive layer 215 functions as, for example, a gate electrode of the transistor TrR (FIG. 1). The conductive layer 215 includes, for example, a stacked structure of titanium nitride (TiN) and tungsten (W). The conductive layer 215 has a side surface on one side (an insulating layer 201 side) in the X-direction connected to the plurality of via-wirings 204 arranged in the Y-direction. With a focus on two semiconductor layers 213 adjacent in the Z-direction, one conductive layer 215 disposed between the two semiconductor layers 213 is opposed to a lower surface of the semiconductor layer 213 disposed above the conductive layer 215 and an upper surface of the semiconductor layer 213 disposed below the conductive layer 215 via the insulating layer 214. A plurality of the conductive layers 215 arranged in the Z-direction are connected to a via-wiring 204 extending in the Z-direction in common.

With a focus on two conductive layers 215 adjacent in the Z-direction, these conductive layers 215 are connected only via the via-wiring 204. That is, both end portions of these two conductive layers 215 in the Y-direction are spaced in the Z-direction. Similarly, end portions of these two conductive layers 215 at an opposite side of the via-wiring 204 are also spaced in the Z-direction.

The conductive layer 221 is connected to a side surface of the conductive layer 212 on one side (the insulating layer 201 side) in the X-direction. As illustrated in FIG. 5, the conductive layer 221 extends in the Y-direction from the transistor region $R_{TrR}$ toward the connection wiring region $R_{CL2}$, and has a function of electrically connecting the other electrode of the transistor TrR (FIG. 1) to the layer select line LL (FIG. 1). The conductive layer 221 contains, for example, a conductive oxide. The conductive layer 221 may contain ruthenium (Ru), iridium (Ir), or another metal instead of the conductive oxide. The conductive layer 221 may contain only a conductive oxide or may contain only ruthenium (Ru), iridium (Ir), or another metal.

The conductive layer 221 may include, for example, as illustrated in FIG. 11, a part formed on a lower surface of the insulating layer 103, a part formed on an upper surface of the insulating layer 103, and a part formed on a side surface of the conductive layer 212 on one side (the insulating layer 201 side) in the X-direction. In a region surrounded by the conductive layer 221, insulating layers 223, 224 of silicon oxide ($SiO_2$) or the like may be disposed.

The conductive layer 222 is connected to the semiconductor layer 213. As illustrated in FIG. 5, the conductive layer 222 extends in the Y-direction from the transistor region $R_{TrR}$ toward the connection wiring region $R_{CL1}$, and has a function of electrically connecting the one electrode of the transistor TrR (FIG. 1) to the word line WL (FIG. 1). The conductive layer 222 contains, for example, a conductive oxide. The conductive layer 222 may contain ruthenium (Ru), iridium (Ir), or another metal instead of the conductive oxide. The conductive layer 222 may contain only a conductive oxide or may contain only ruthenium (Ru), iridium (Ir), or another metal.

The conductive layer 222 may include, for example, as illustrated in FIG. 11, a part formed on lower surfaces of the insulating layers 103, 214, a part formed on upper surfaces of the insulating layers 103, 214, and a part formed on a side surface of the semiconductor layer 213 on the other side (the insulating layer 202 side) in the X-direction. In a region surrounded by the conductive layer 222, insulating layers 223, 224 of silicon oxide ($SiO_2$) or the like may be disposed.

[Structure of Connection Wiring Region $R_{CL1}$]

As illustrated in FIG. 5, in the connection wiring region $R_{CL1}$, insulating layers 301, 302 arranged in the Y-direction are disposed. The insulating layer 301 is connected to an end portion of the insulating layer 101 in the Y-direction. The insulating layer 302 is disposed at a memory cell region $R_{MC}$ side with respect to the insulating layer 301. The insulating layer 302 is connected to an end portion of the insulating layer 202 in the Y-direction. The insulating layers 301, 302 extend in the X-direction and the Z-direction, and separate the plurality of memory layers ML in the Y-direction. The insulating layer 301 and the insulating layer 302 contain, for example, a silicon oxide ($SiO_2$).

In the connection wiring region $R_{CL1}$, an insulating layer 304 of silicon oxide ($SiO_2$) or the like is disposed in a region between the insulating layer 301 and the insulating layer 302. For example, as illustrated in FIG. 9, the insulating layer 304 penetrates the plurality of memory layers ML and extends in the Z-direction.

The memory layer ML includes a plurality of connection wiring portions 310 provided corresponding to the plurality of conductive layers 120.

For example, as illustrated in FIG. 8, the connection wiring portion 310 includes a semiconductor layer 311 of silicon (Si) or the like disposed on an outer peripheral surface of the insulating layer 304, and a conductive layer 312 disposed on an upper surface, a lower surface, and an outer peripheral surface of the semiconductor layer 311.

In the XY cross-sectional surface exemplarily illustrated in FIG. 8, side surfaces of the semiconductor layer 311 and the conductive layer 312 on both sides in the X-direction may be formed along a circle around a center position of the insulating layer 304. Side surfaces of the semiconductor layer 311 and the conductive layer 312 on both sides in the Y-direction may be linearly formed along side surfaces of the insulating layers 301, 302 in the Y-direction.

The conductive layer 312 has a side surface on one side in the X-direction connected to the conductive layer 120. The conductive layer 312 has a side surface on the other side in the X-direction connected to the conductive layer 222. The conductive layer 312 has a function of electrically connecting the one electrode of the transistor TrR (FIG. 1) to the word line WL (FIG. 1).

[Structure of Connection Wiring Region $R_{CL2}$]

As illustrated in FIG. 5, in the connection wiring region $R_{CL2}$, insulating layers 401, 402 arranged in the Y-direction are disposed. The insulating layer 402 is disposed at the memory cell region $R_{MC}$ side with respect to the insulating layer 401. The insulating layer 402 is connected to an end portion of the insulating layer 202 in the Y-direction. The insulating layers 401, 402 extend in the X-direction and the Z-direction, and separate the plurality of memory layers ML in the Y-direction. The insulating layer 401 and the insulating layer 402 contain, for example, a silicon oxide ($SiO_2$).

In the connection wiring region $R_{CL2}$, an insulating layer 404 of silicon oxide ($SiO_2$) or the like is disposed in a region between the insulating layer 401 and the insulating layer 402. The insulating layer 404 penetrates the plurality of memory layers ML and extends in the Z-direction.

The memory layer ML includes a plurality of connection wiring portions 410 provided corresponding to the plurality of conductive layers 120.

The connection wiring portion 410 includes a semiconductor layer 411 of silicon (Si) or the like disposed on an outer peripheral surface of the insulating layer 404, and a conductive layer 412 disposed on an upper surface, a lower surface, and an outer peripheral surface of the semiconductor layer 411.

In the XY cross-sectional surface exemplarily illustrated in FIG. 5, side surfaces of the semiconductor layer 411 and the conductive layer 412 on both sides in the X-direction may be formed along a circle around a center position of the insulating layer 404. Side surfaces of the semiconductor layer 411 and the conductive layer 412 on both sides in the Y-direction may be linearly formed along side surfaces of the insulating layers 401, 402 in the Y-direction.

The conductive layer 412 has a side surface on one side in the X-direction connected to the conductive layer 221. The conductive layer 412 has a side surface on the other side in the X-direction connected to a conductive layer 501 in the wiring region $R_{LL}$. The conductive layer 412 has a function of electrically connecting the other electrode of the transistor TrR (FIG. 1) to the layer select line LL (FIG. 1).

[Structure of Wiring Region $R_{LL}$]

The memory layer ML includes the conductive layer 501 extending in the X-direction. The conductive layer 501 functions as, for example, the layer select line LL (FIG. 1). The conductive layer 501 extends in the X-direction. The conductive layers 501 are each connected to a plurality of conductive layers 412 arranged in the X-direction. The conductive layer 501 includes, for example, a stacked structure of titanium nitride (TiN) and tungsten (W).

[Manufacturing Method]

Figure 12:
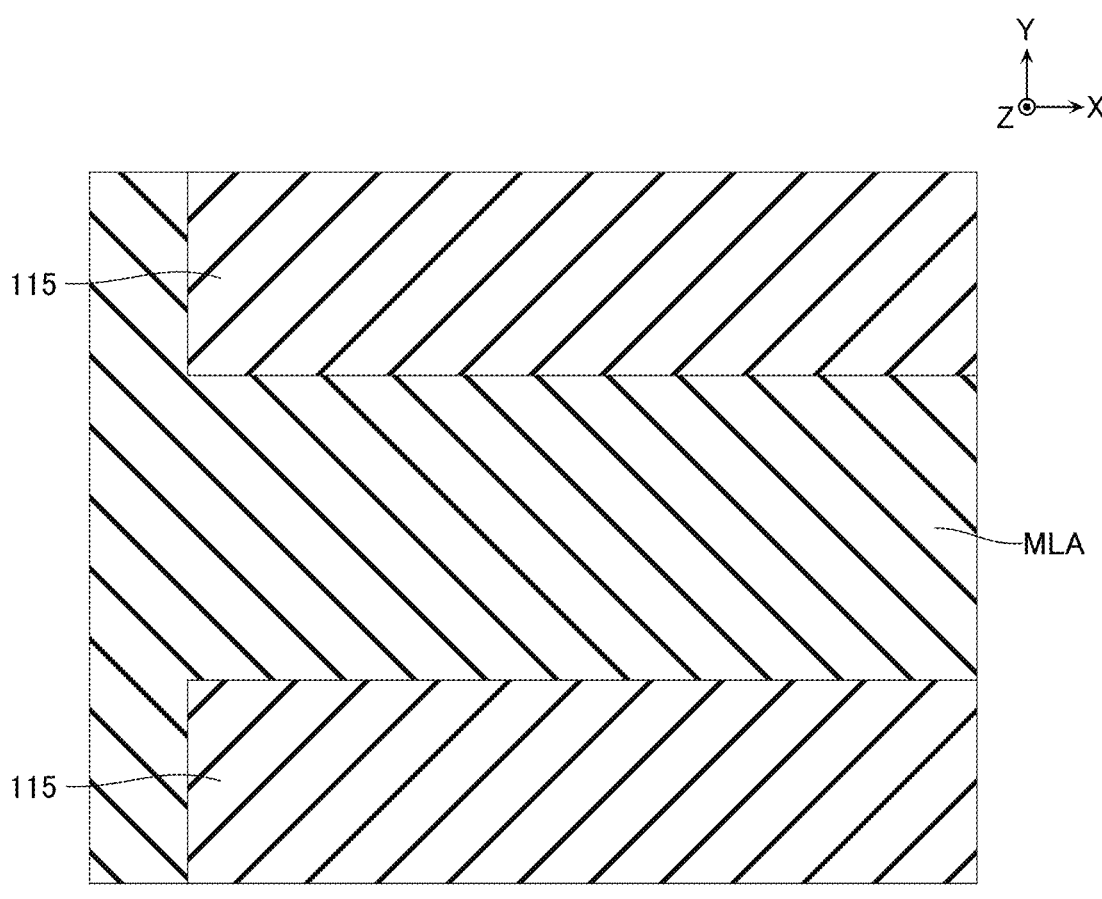
FIG. 12 is a schematic cross-sectional view for describing a method for manufacturing the semiconductor memory device.
Figure 121:
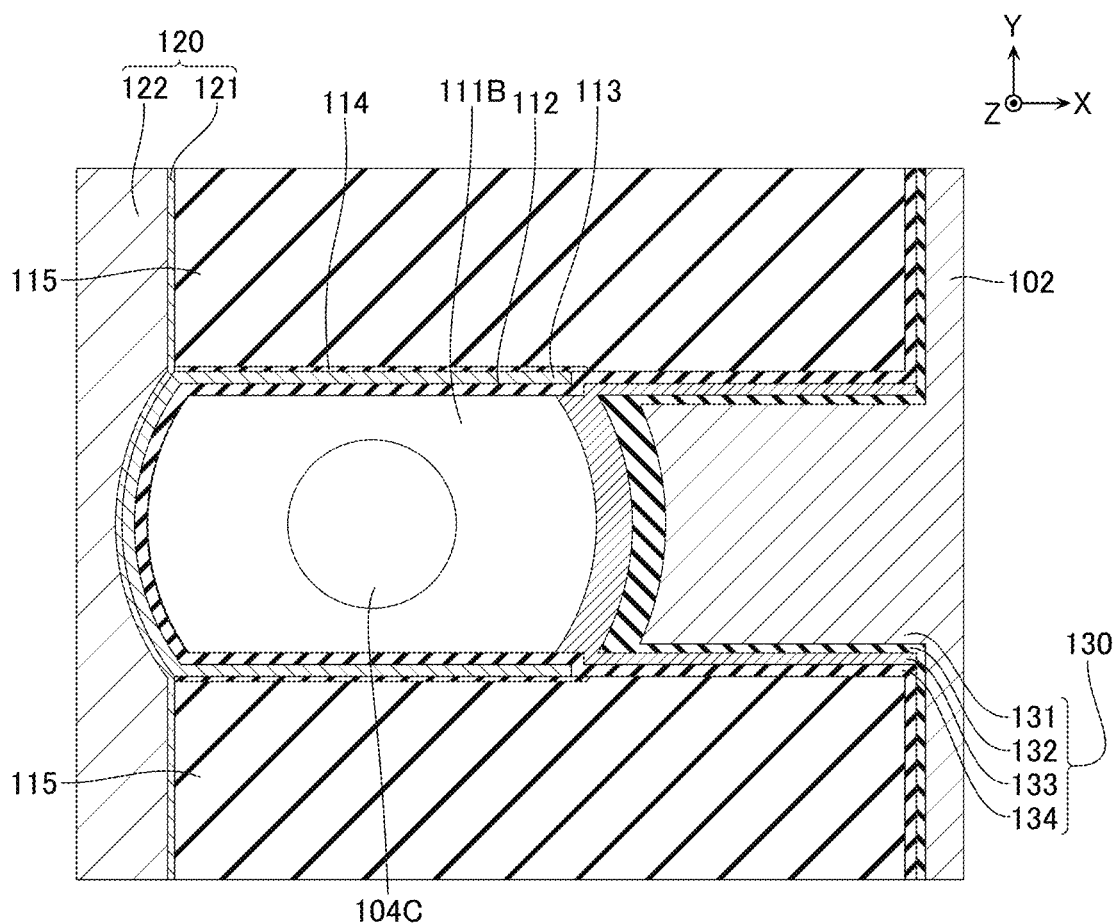
Figure 122:
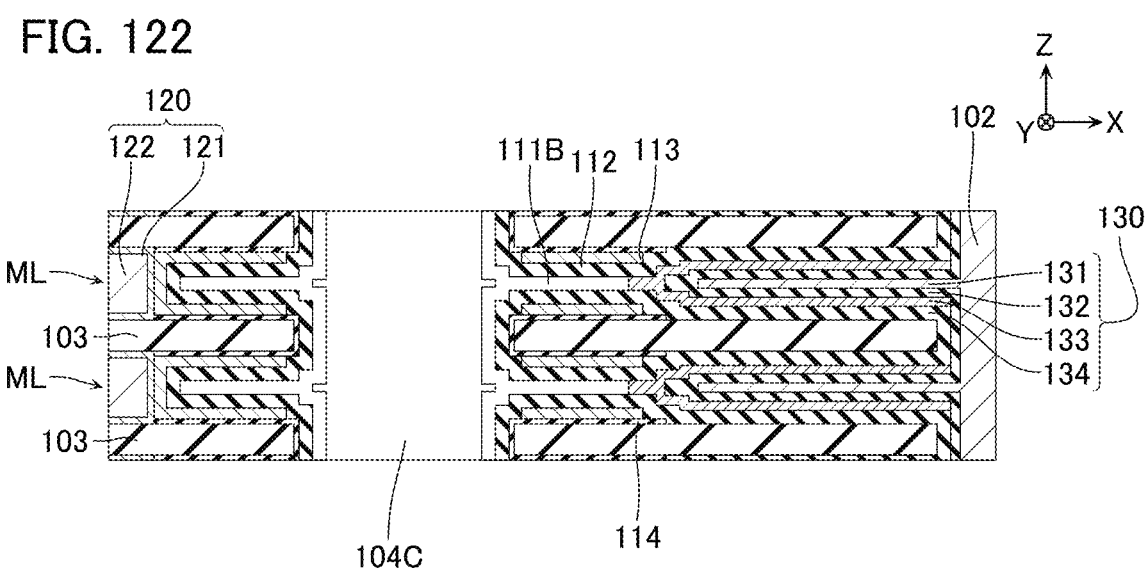

FIG. 12 to FIG. 122 are schematic cross-sectional views for describing a method for manufacturing the semiconductor memory device according to the first embodiment. FIG. 12, FIG. 21, FIG. 23, FIG. 26, FIG. 28, FIG. 30, FIG. 33, FIG. 35, FIG. 38, FIG. 40, FIG. 42, FIG. 45, FIG. 47, FIG. 49, FIG. 51, FIG. 53, FIG. 55, FIG. 57, FIG. 107, FIG. 109, FIG. 111, FIG. 113, FIG. 115, FIG. 117, FIG. 119, and FIG. 121 illustrate cross-sectional surfaces corresponding to FIG. 6. FIG. 13, FIG. 22, FIG. 24, FIG. 25, FIG. 27, FIG. 29, FIG. 31, FIG. 32, FIG. 34, FIG. 36, FIG. 39, FIG. 41, FIG. 43, FIG. 46, FIG. 48, FIG. 50, FIG. 52, FIG. 54, FIG. 56, FIG. 58, FIG. 108, FIG. 110, FIG. 112, FIG. 114, FIG. 116, FIG. 118, FIG. 120, and FIG. 122 illustrate cross-sectional surfaces corresponding to FIG. 7. FIG. 14, FIG. 37, FIG. 44, and FIG. 75 illustrate cross-sectional surfaces corresponding to FIG. 5. FIG. 15, FIG. 17, FIG. 19, FIG. 76, FIG. 80, FIG. 88, FIG. 92, FIG. 96, FIG. 100, FIG. 102, and FIG. 104 illustrate cross-sectional surfaces corresponding to FIG. 8. FIG. 16, FIG. 18, FIG. 20, FIG. 77, FIG. 81, FIG. 89, FIG. 93, FIG. 97, FIG. 101, FIG. 103, FIG. 105, and FIG. 106 illustrate cross-sectional surfaces corresponding to FIG. 9. FIG. 59, FIG. 70, FIG. 78, FIG. 82, FIG. 84, FIG. 86, FIG. 90, FIG. 94, and FIG. 98 illustrate cross-sectional surfaces corresponding to FIG. 10. FIG. 60, FIG. 66, FIG. 67, FIG. 68, FIG. 69, FIG. 71, FIG. 72, FIG. 73, FIG. 74, FIG. 79, FIG. 83, FIG. 85, FIG. 87, FIG. 91, FIG. 95, and FIG. 99 illustrate cross-sectional surfaces corresponding to FIG. 11. FIG. 61, FIG. 62, FIG. 63, FIG. 64, and FIG. 65 illustrate cross-sectional surfaces including the via-wiring 204 and the insulating layer 201.

Figure 13:
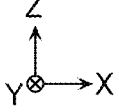
FIG. 13 is a schematic cross-sectional view for describing the manufacturing method.
Figure 13:
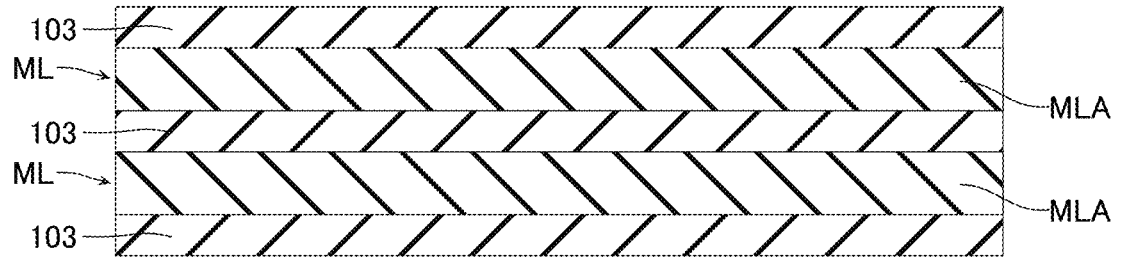

In the manufacturing method, for example, as illustrated in FIG. 13, a plurality of insulating layers 103 and a plurality of sacrifice layers MLA are alternately formed. The sacrifice layer MLA contains, for example, silicon nitride (Si₃N₄). This process is performed by, for example, Chemical Vapor Deposition (CVD).

Figure 14:
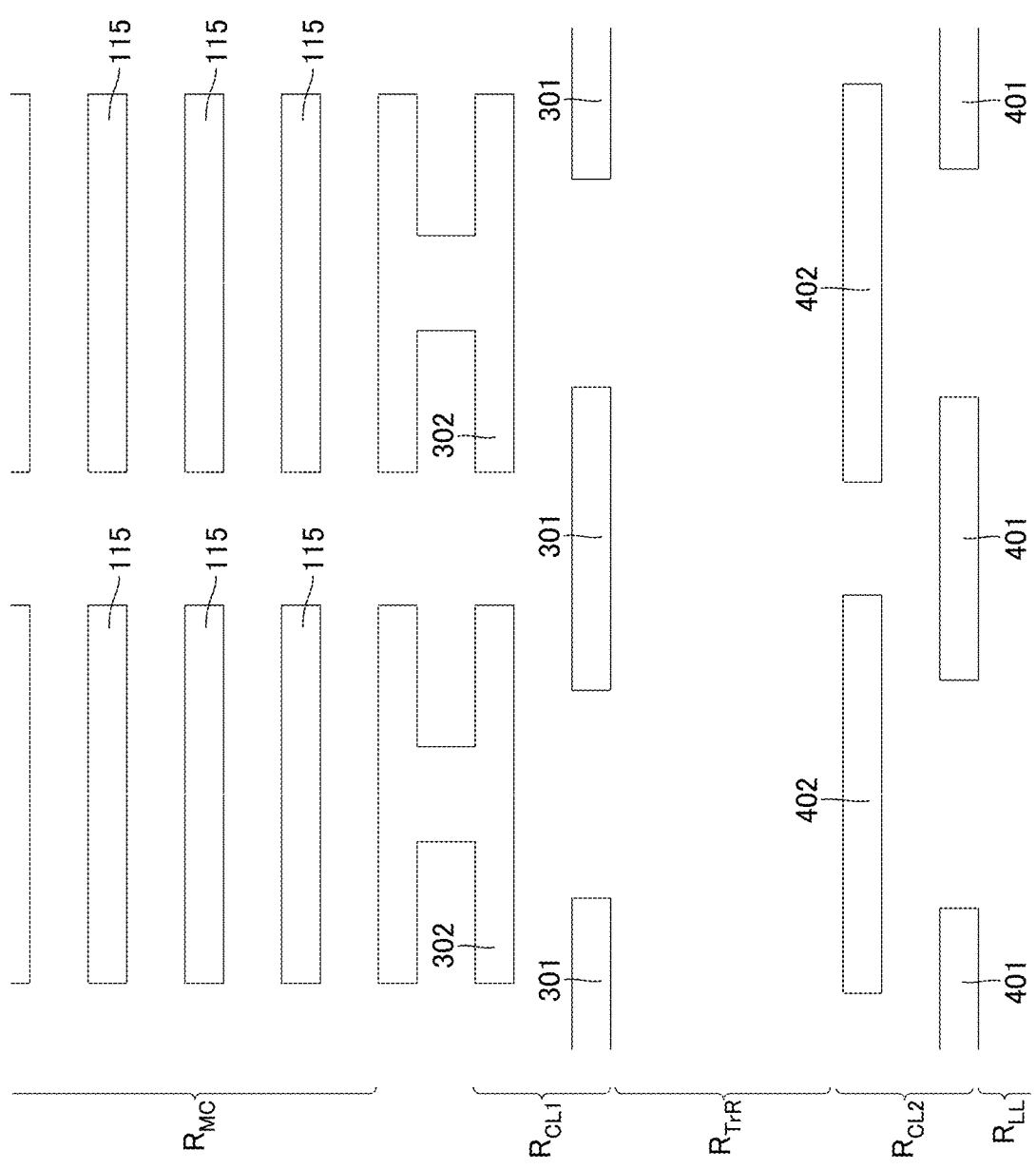
FIG. 14 is a schematic cross-sectional view for describing the manufacturing method.

Next, for example, as illustrated in FIG. 12 and FIG. 14, the insulating layers 115, 301, 302, 401, 402 are formed. In this process, for example, openings are formed at positions corresponding to the insulating layers 115, 301, 302, 401, 402. The openings extend in the X-direction and the Z-direction, and separate the plurality of insulating layers 103 and the plurality of sacrifice layers MLA arranged in the Z-direction in the Y-direction. This process is performed by, for example, RIE. After forming the openings, the insulating layers 115, 301, 302, 401, 402 are formed. This process is performed by, for example, CVD.

Figures 15, 16:
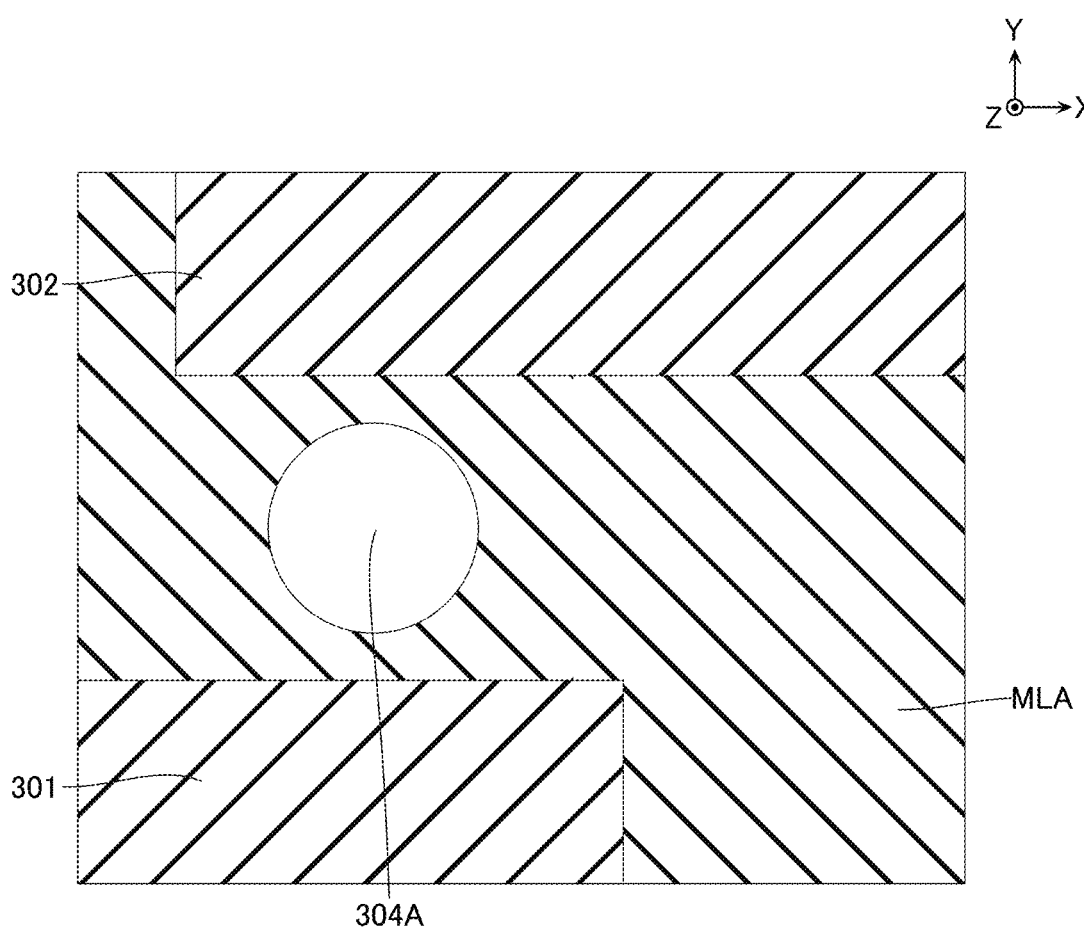
FIG. 15 is a schematic cross-sectional view for describing the manufacturing method.
FIG. 16 is a schematic cross-sectional view for describing the manufacturing method.

Next, for example, as illustrated in FIG. 15 and FIG. 16, an opening 304A is formed at a position corresponding to the insulating layer 304. The opening 304A extends in the Z-direction as illustrated in FIG. 16, and penetrates the plurality of insulating layers 103 and the plurality of sacrifice layers MLA arranged in the Z-direction. This process is performed by, for example, RIE.

Although not illustrated, the connection wiring portion 410 (FIG. 5) is formed similarly to the connection wiring portion 310. For example, in this process, an opening similar to the opening 304A is also formed at a position corresponding to the insulating layer 404 (FIG. 5). In the following processes, the process corresponding to the connection wiring portion 310 is performed at the position corresponding to the connection wiring portion 410 as well.

Figure 17:
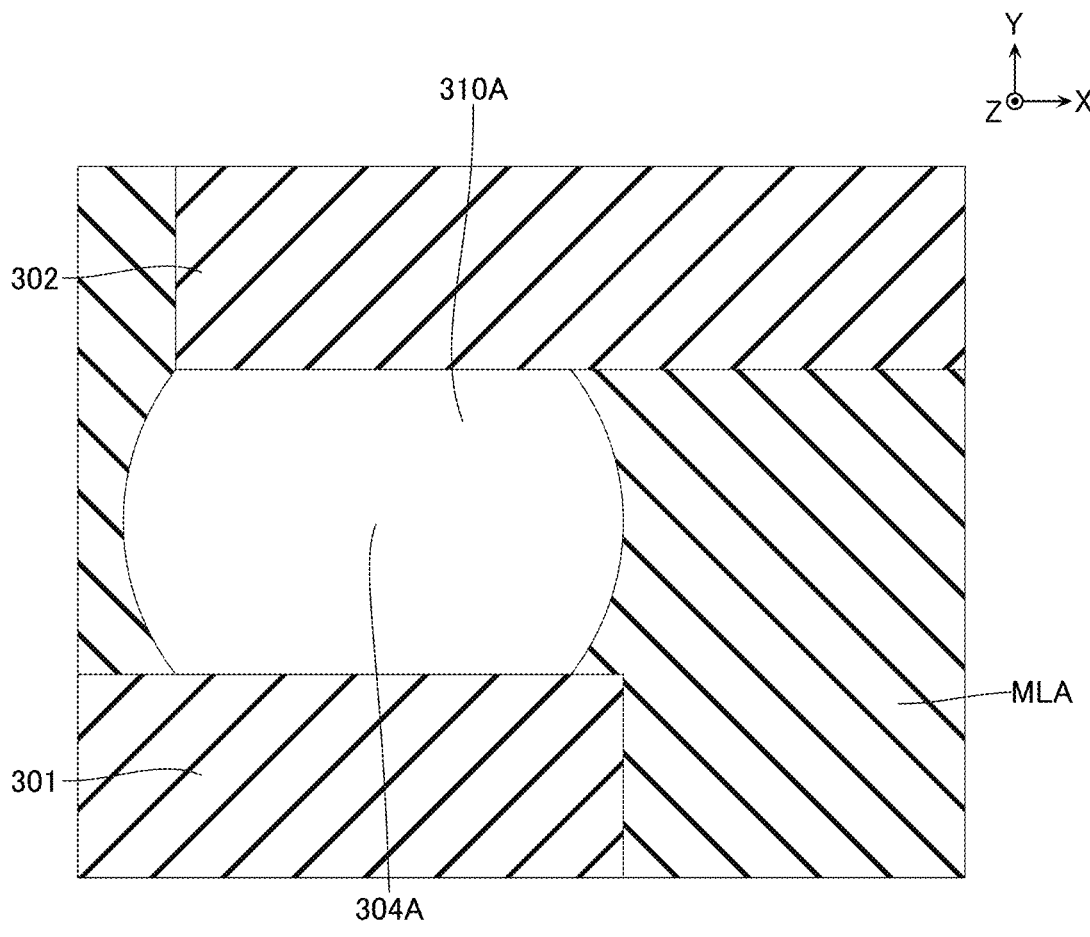
FIG. 17 is a schematic cross-sectional view for describing the manufacturing method.
Figure 18:
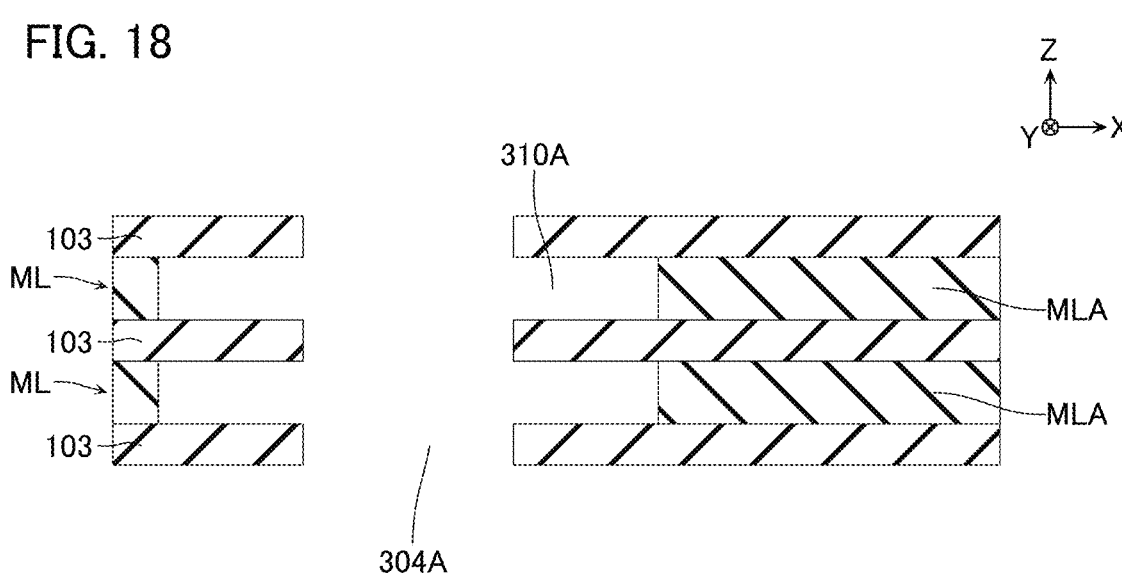
FIG. 18 is a schematic cross-sectional view for describing the manufacturing method.

Next, for example, as illustrated in FIG. 17 and FIG. 18, an opening 310A is formed at a position corresponding to the connection wiring portion 310. A part of an upper surface and a part of a lower surface of the insulating layer 103, a part of a side surface of the sacrifice layer MLA in the X-direction, and a part of side surfaces of the insulating layers 301, 302 in the Y-direction are exposed inside the opening 310A. In this process, for example, a part of the sacrifice layer MLA is selectively removed via the opening 304A. This process is performed by, for example, wet etching.

Figures 19, 20:
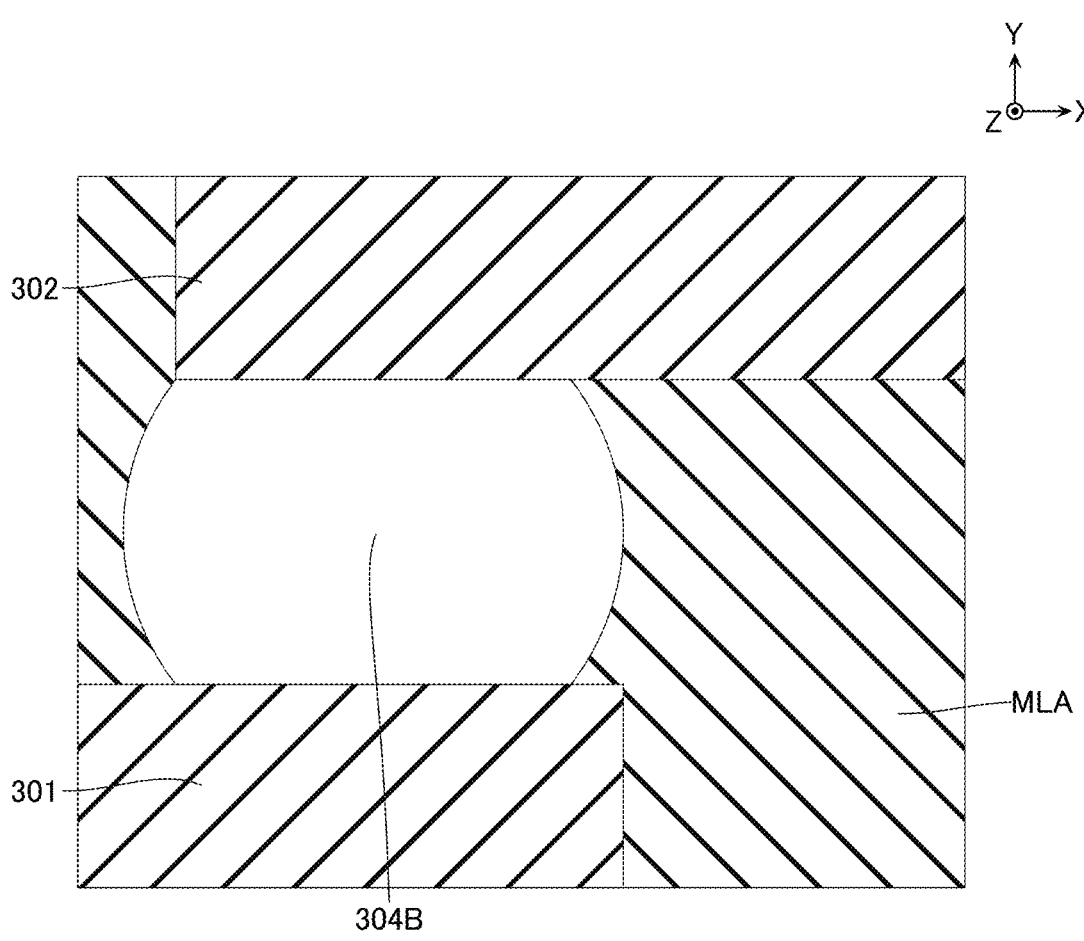
FIG. 19 is a schematic cross-sectional view for describing the manufacturing method.
FIG. 20 is a schematic cross-sectional view for describing the manufacturing method.

Next, for example, as illustrated in FIG. 19 and FIG. 20, a sacrifice layer 304B of silicon (Si) or the like is formed inside the opening 310A and the opening 304A. This process is performed by, for example, CVD.

Figures 21, 22:
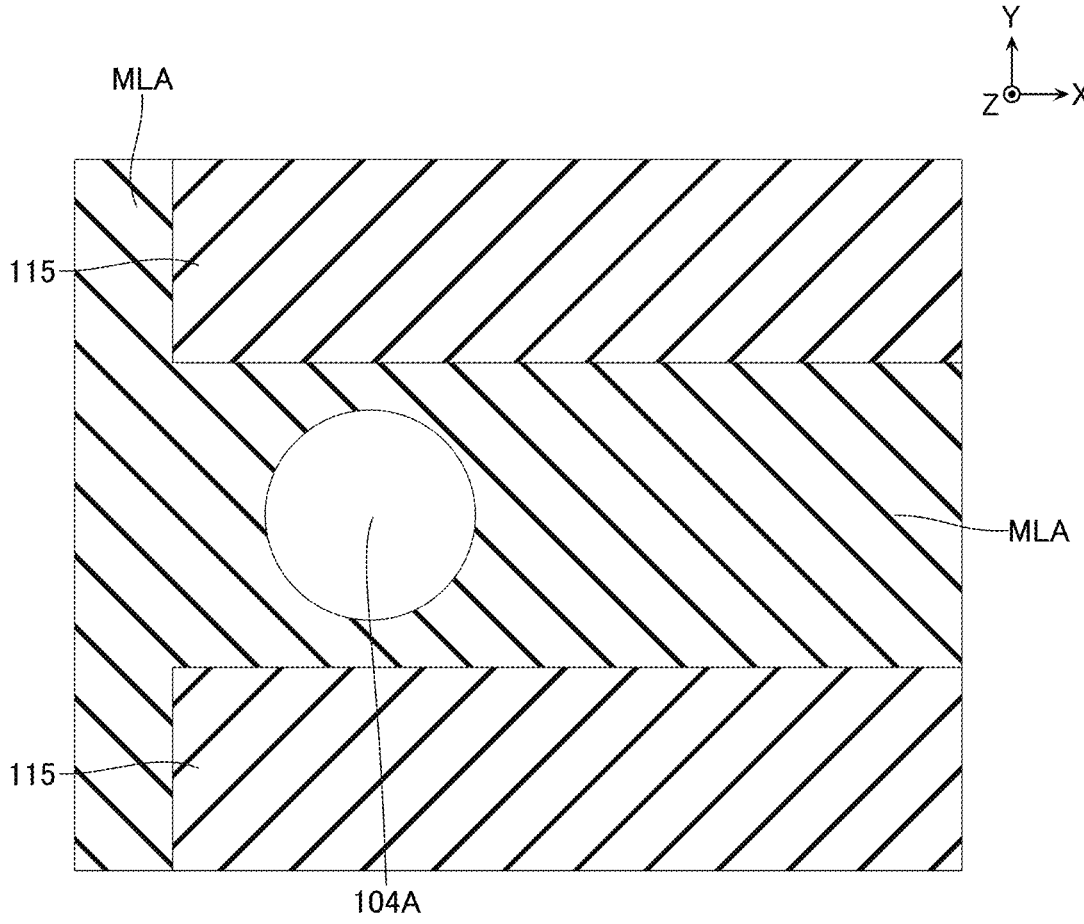
FIG. 21 is a schematic cross-sectional view for describing the manufacturing method.
FIG. 22 is a schematic cross-sectional view for describing the manufacturing method.

Next, for example, as illustrated in FIG. 21 and FIG. 22, an opening 104A is formed at a position corresponding to the via-wiring 104. The opening 104A extends in the Z-direction as illustrated in FIG. 22, and penetrates the plurality of insulating layers 103 and the plurality of sacrifice layers MLA arranged in the Z-direction. This process is performed by, for example, RIE.

Figures 23, 24:
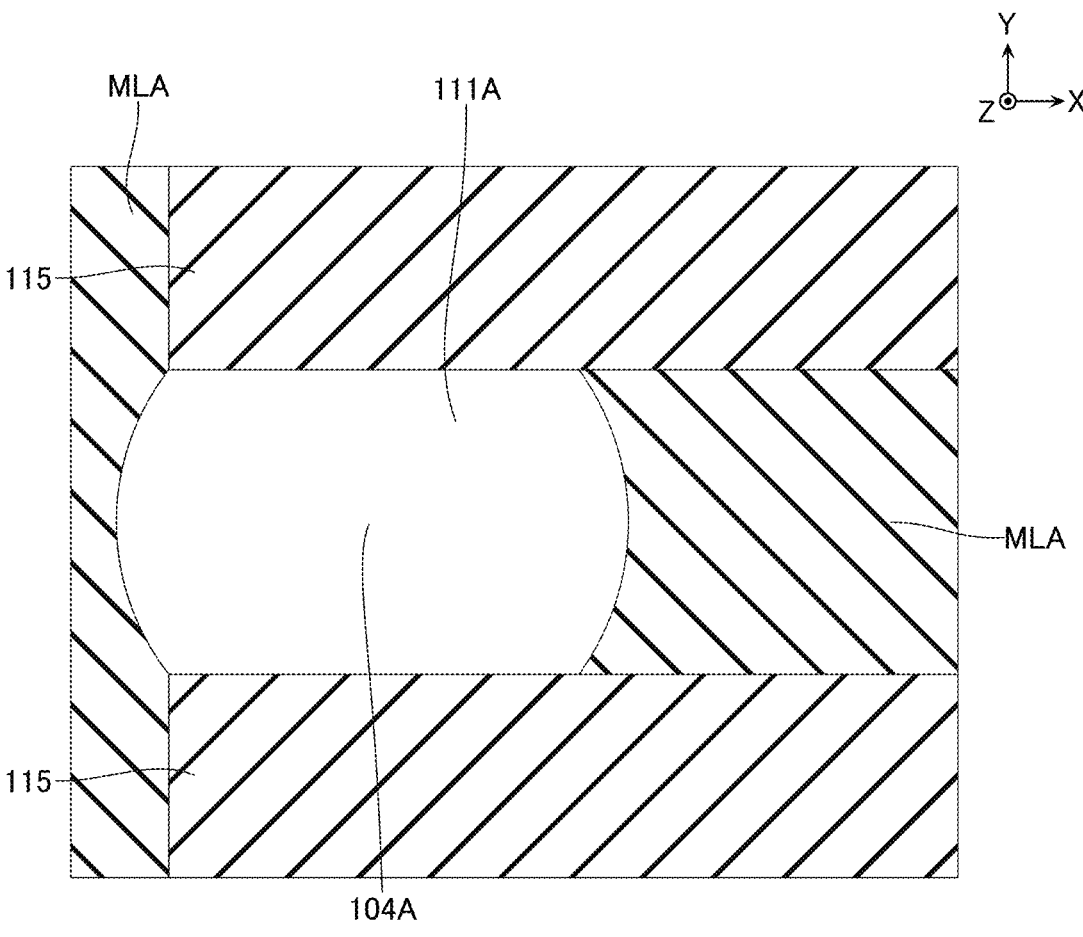
FIG. 23 is a schematic cross-sectional view for describing the manufacturing method.
FIG. 24 is a schematic cross-sectional view for describing the manufacturing method.

Next, for example, as illustrated in FIG. 23 and FIG. 24, an opening 111A is formed at a position corresponding to the semiconductor layer 111. A part of an upper surface and a part of a lower surface of the insulating layer 103, a part of a side surface of the sacrifice layer MLA in the X-direction, and a part of a side surface of the insulating layer 115 in the Y-direction are exposed inside the opening 111A. In this process, for example, a part of the sacrifice layer MLA is selectively removed via the opening 104A. This process is performed by, for example, wet etching.

Figure 25:
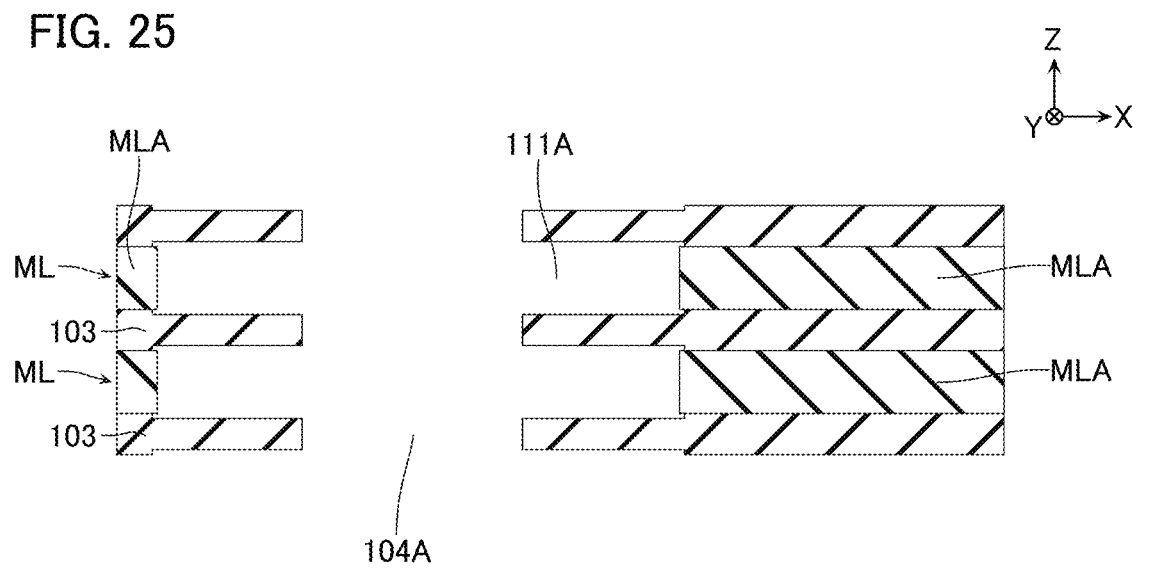

Next, for example, as illustrated in FIG. 25, the insulating layer 103 is partially removed. In this process, a width of the opening 111A in the Z-direction is widened. This process is performed by, for example, wet etching.

Figure 26:
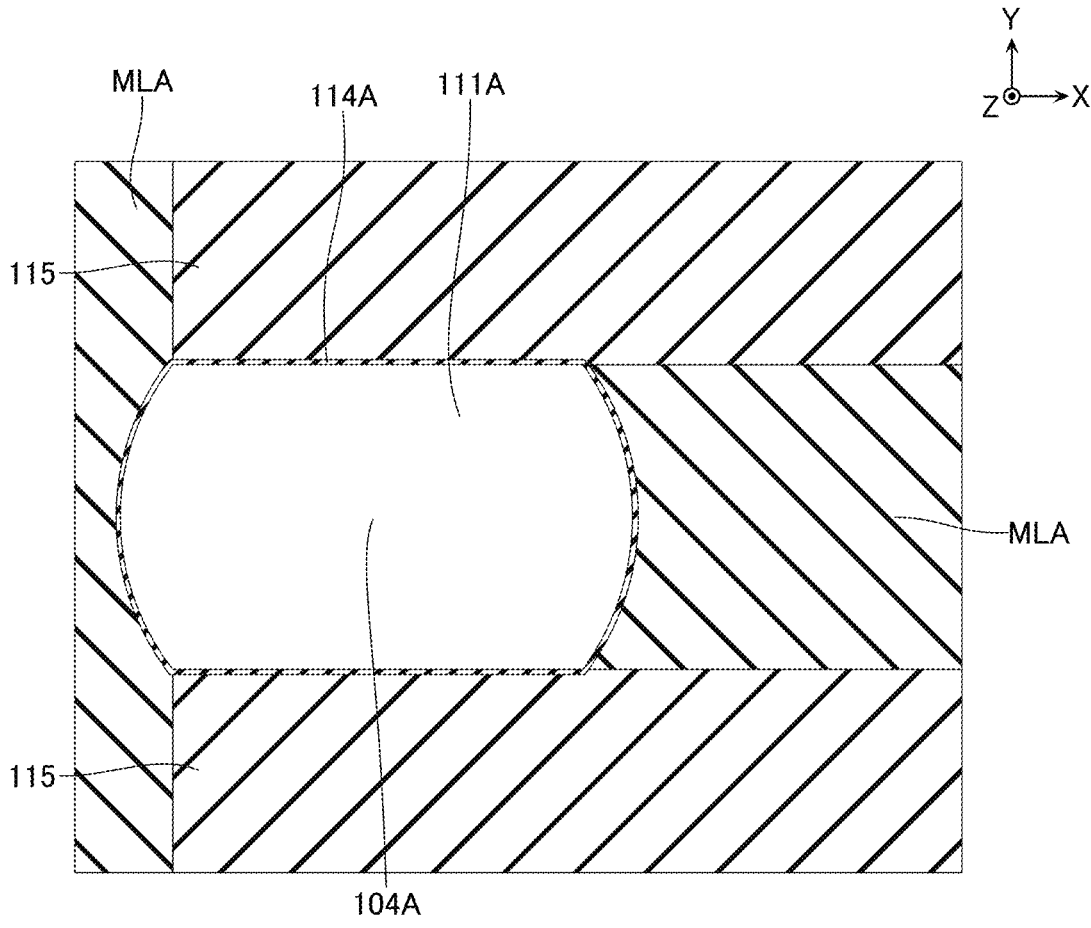
FIG. 26 is a schematic cross-sectional view for describing the manufacturing method.
Figure 27:
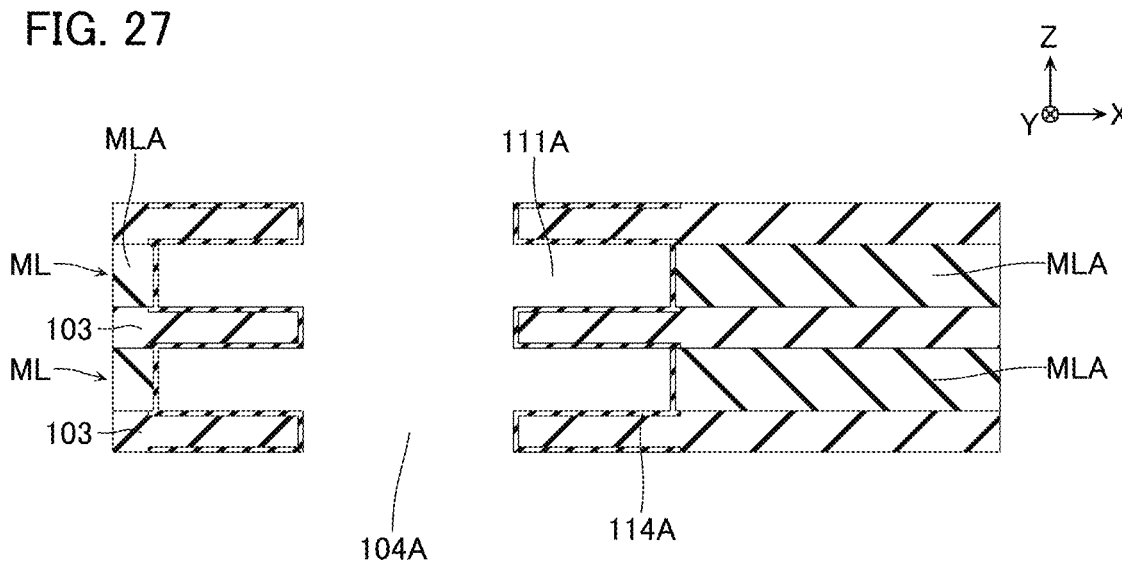
FIG. 27 is a schematic cross-sectional view for describing the manufacturing method.

Next, for example, as illustrated in FIG. 26 and FIG. 27, an insulating layer 114A is formed on an inner peripheral surface of the opening 104A, an inner peripheral surface of the opening 111A, and an upper surface and a lower surface of the insulating layer 103. The insulating layer 114A contains, for example, a silicon oxide (SiO₂) containing boron (B). This process is performed by, for example, CVD.

Figure 28:
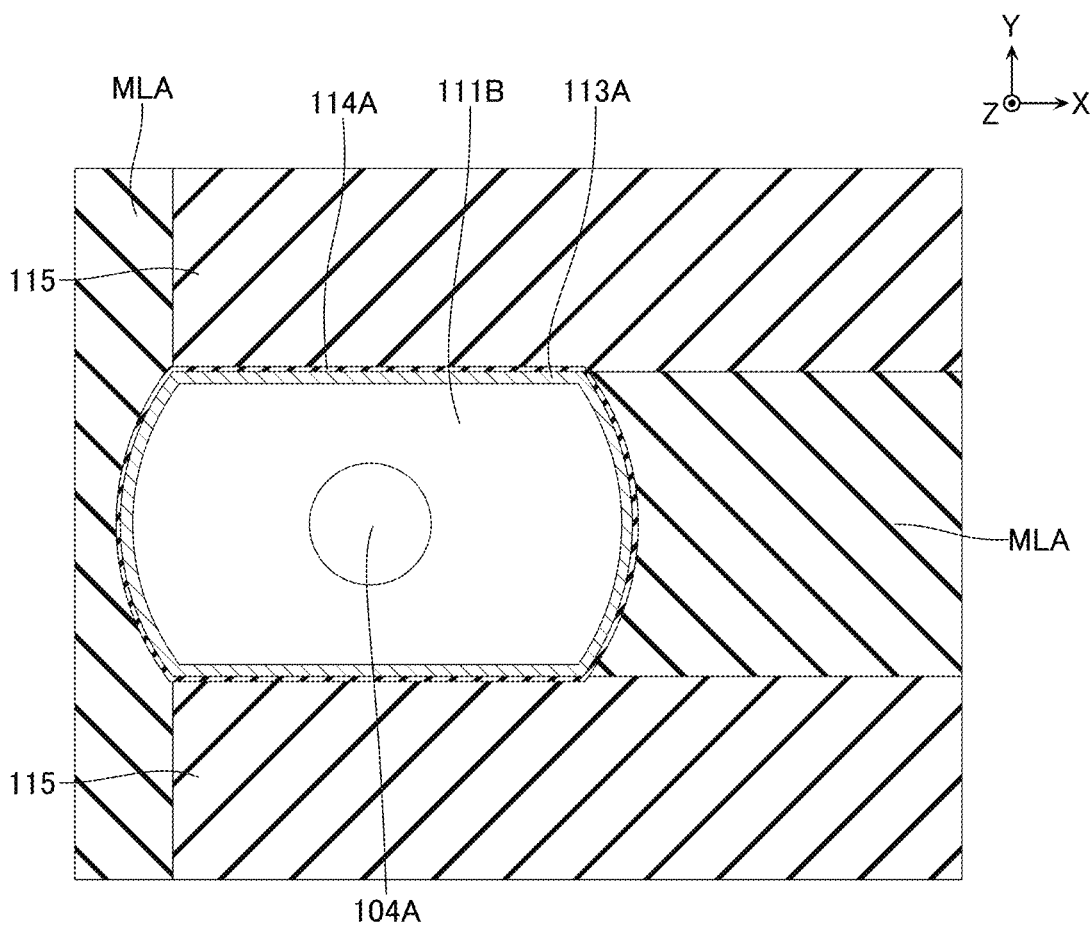
FIG. 28 is a schematic cross-sectional view for describing the manufacturing method.
Figure 29:
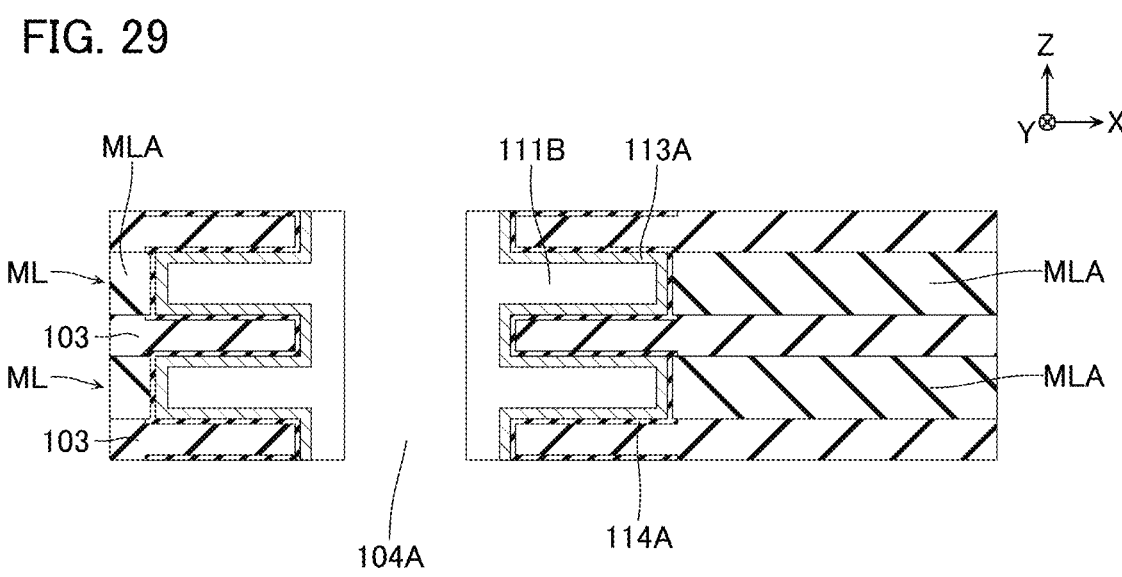
FIG. 29 is a schematic cross-sectional view for describing the manufacturing method.

Next, for example, as illustrated in FIG. 28 and FIG. 29, a conductive layer 113A and a sacrifice layer 111B of silicon (Si) or the like are formed inside the opening 111A and the opening 104A. The conductive layer 113A is formed on an upper surface, a lower surface, an exposed surface to the opening 104A, an exposed surface to the opening 111A, and both side surfaces in the Y-direction of the insulating layer 114A. The opening 111A is filled with the sacrifice layer 111B, and the opening 104A is not filled with the sacrifice layer 111B. This process is performed by, for example, CVD.

Figure 30:
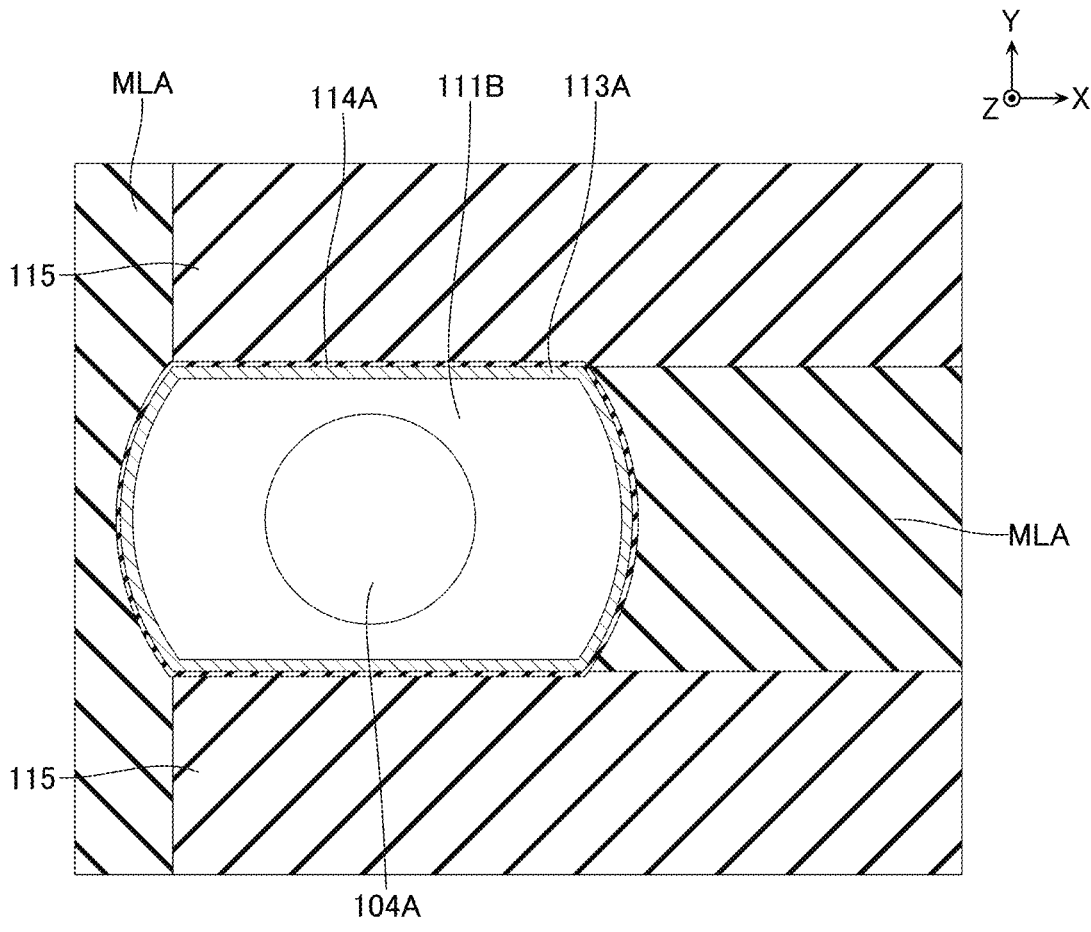
FIG. 30 is a schematic cross-sectional view for describing the manufacturing method.
Figure 31:
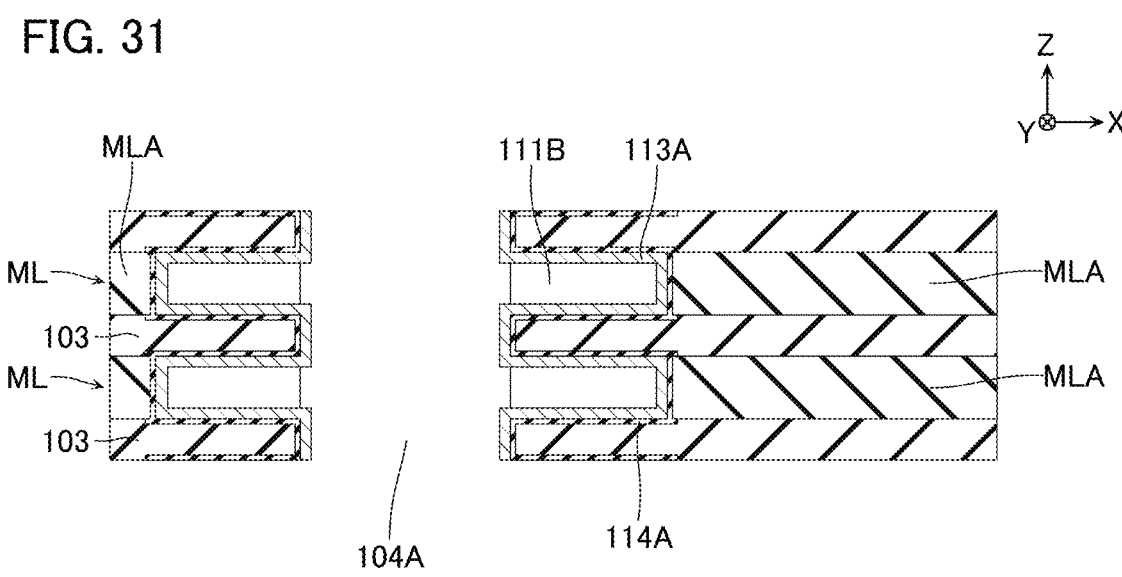
FIG. 31 is a schematic cross-sectional view for describing the manufacturing method.

Next, for example, as illustrated in FIG. 30 and FIG. 31, the sacrifice layer 111B is partially removed to expose parts of the conductive layer 113A provided at height positions corresponding to the insulating layers 103. This process is performed by, for example, wet etching.

Figure 32:
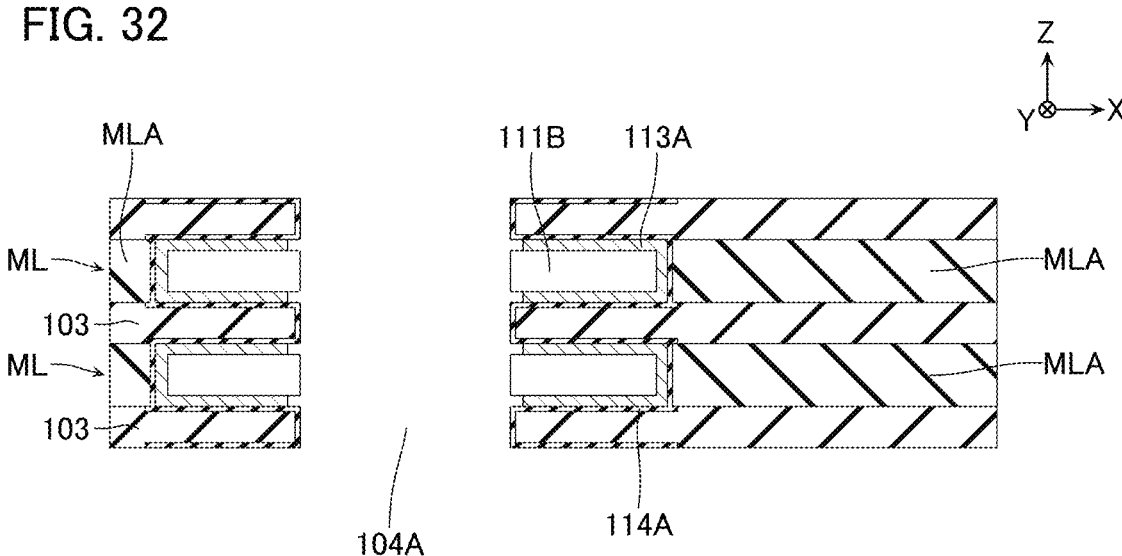
FIG. 32 is a schematic cross-sectional view for describing the manufacturing method.

Next, for example, as illustrated in FIG. 32, the parts of the conductive layer 113A provided at height positions corresponding to the insulating layers 103 are removed. This process is performed by, for example, wet etching.

Figure 33:
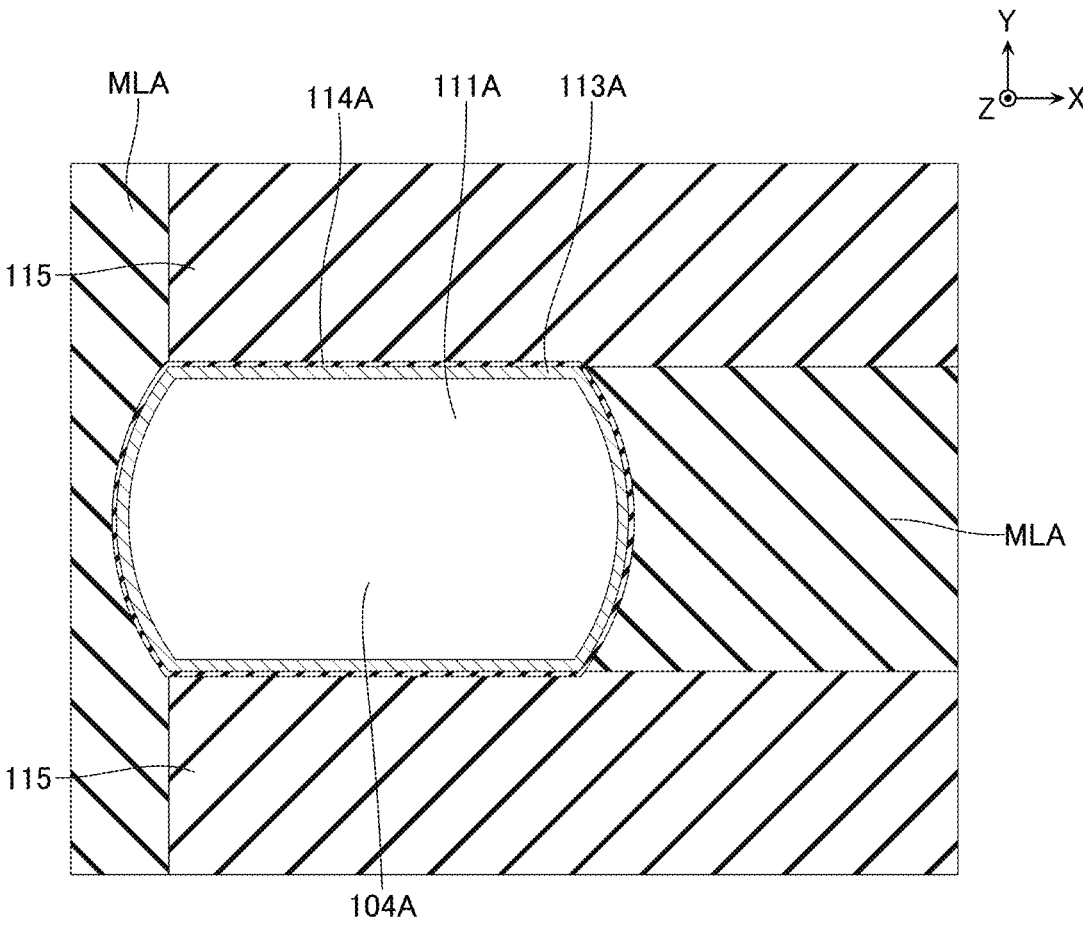
FIG. 33 is a schematic cross-sectional view for describing the manufacturing method.
Figure 34:
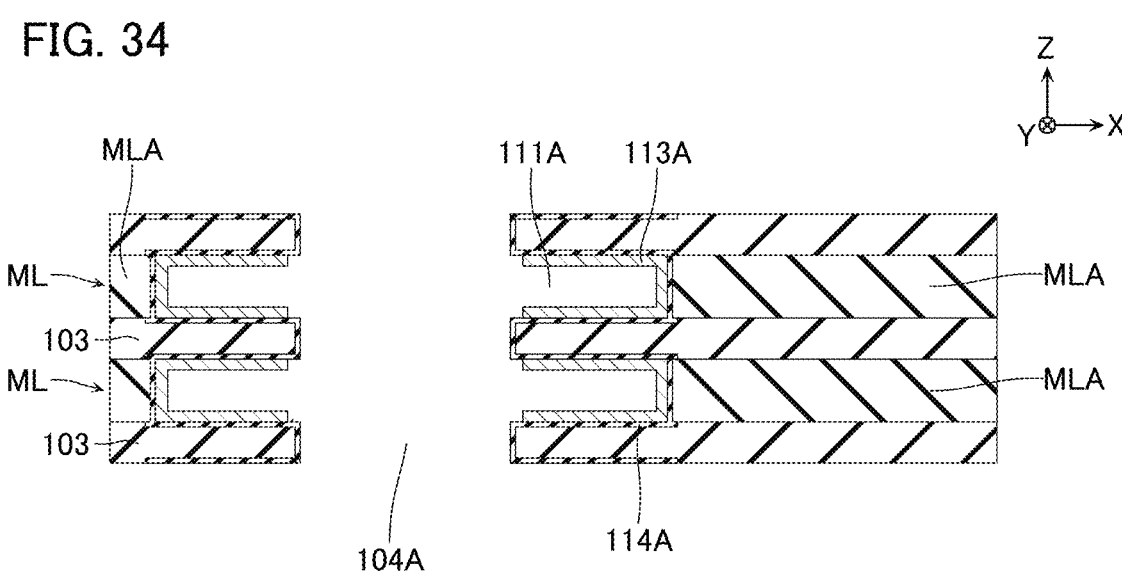
FIG. 34 is a schematic cross-sectional view for describing the manufacturing method.

Next, for example, as illustrated in FIG. 33 and FIG. 34, the sacrifice layer 111B is removed. This process is performed by, for example, wet etching.

Figure 35:
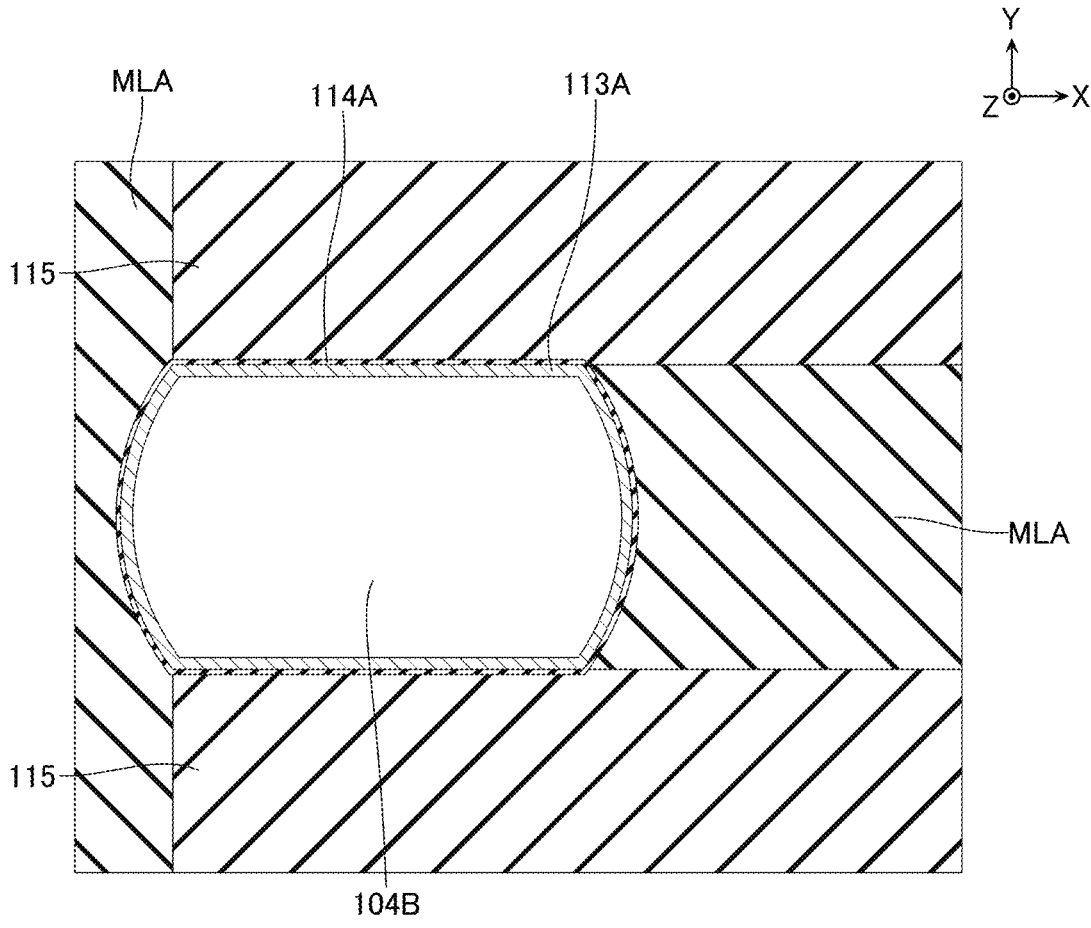
FIG. 35 is a schematic cross-sectional view for describing the manufacturing method.
Figure 36:
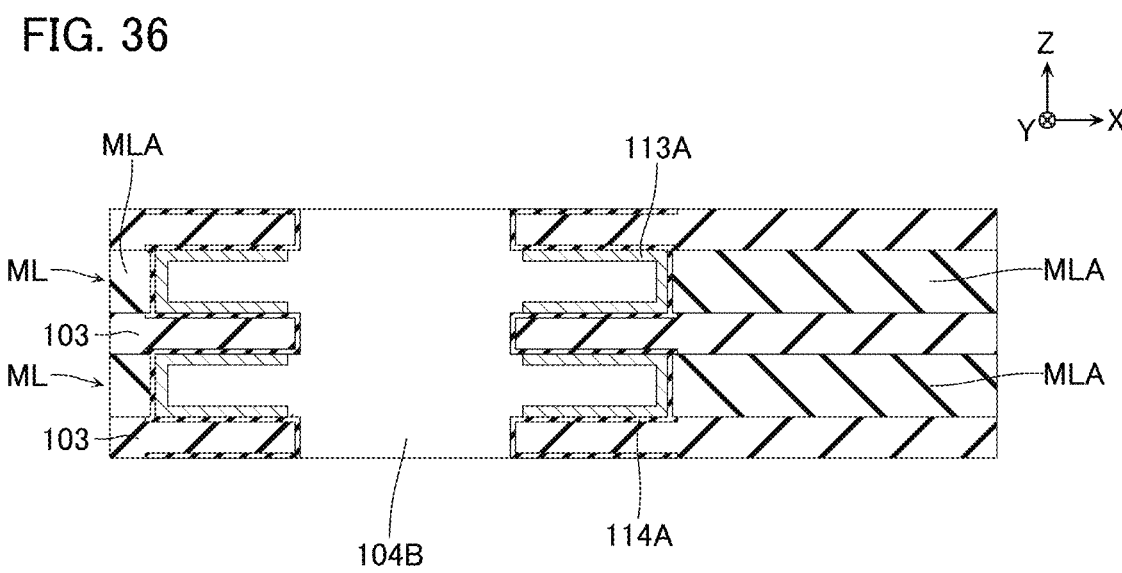
FIG. 36 is a schematic cross-sectional view for describing the manufacturing method.

Next, for example, as illustrated in FIG. 35 and FIG. 36, a sacrifice layer 104B of silicon (Si) or the like is formed inside the opening 111A and the opening 104A. This process is performed by, for example, CVD.

Figure 37:
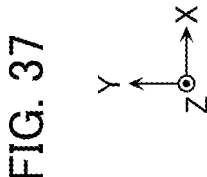
FIG. 37 is a schematic cross-sectional view for describing the manufacturing method.

Next, for example, as illustrated in FIG. 37, openings 101A are formed at positions corresponding to the insulating layers 101. The opening 101A extends in the Y-direction and the Z-direction, penetrates the plurality of insulating layers 103 and the plurality of sacrifice layers MLA arranged in the Z-direction, and separates these configurations in the X-direction. This process is performed by, for example, RIE.

Although not illustrated, the conductive layer 501 (FIG. 5) is formed similarly to the conductive layer 120. For example, in this process, an opening is formed at the proximity of the conductive layer 501 (FIG. 5). The opening extends in the X-direction and the Z-direction, penetrates the plurality of insulating layers 103 and the plurality of sacrifice layers MLA arranged in the Z-direction, and separates these configurations in the Y-direction. In the following processes, the process corresponding to the conductive layer 120 is performed at the position corresponding to the conductive layer 501 as well.

Figure 38:
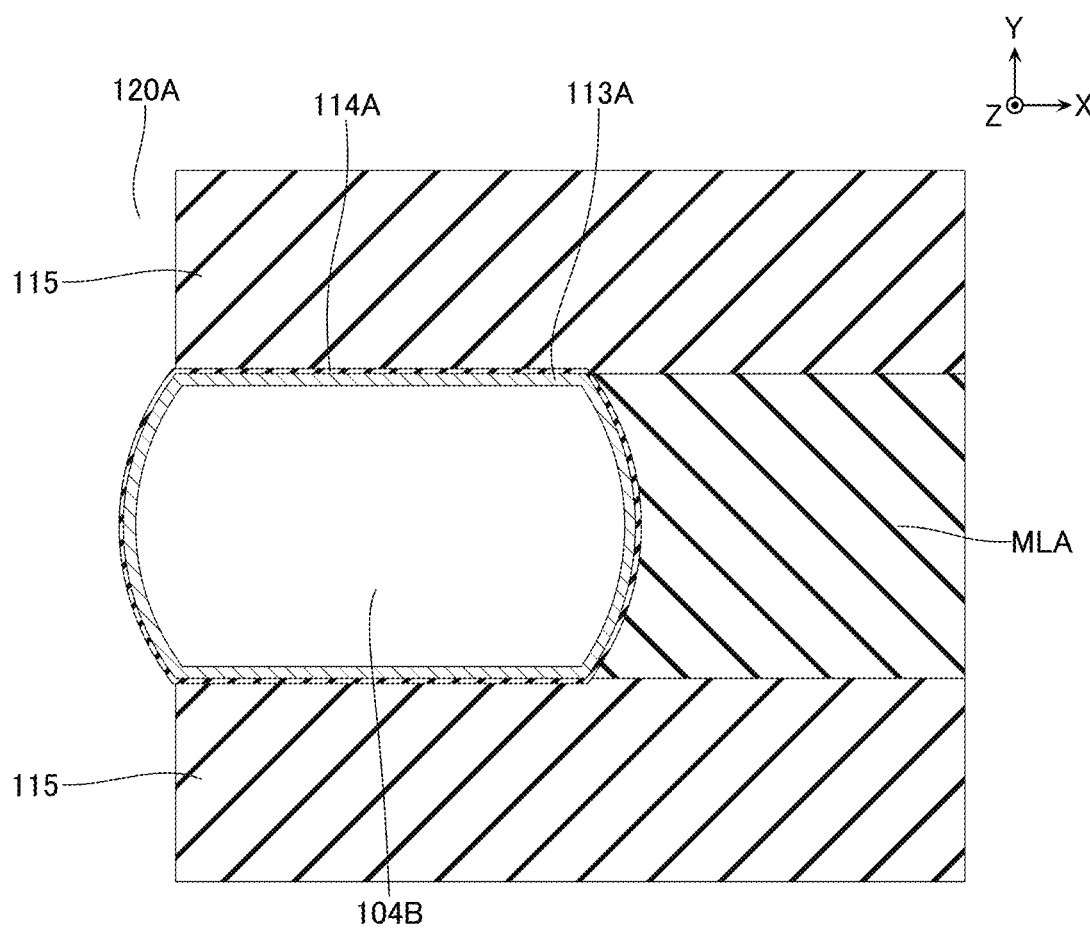
FIG. 38 is a schematic cross-sectional view for describing the manufacturing method.
Figure 39:
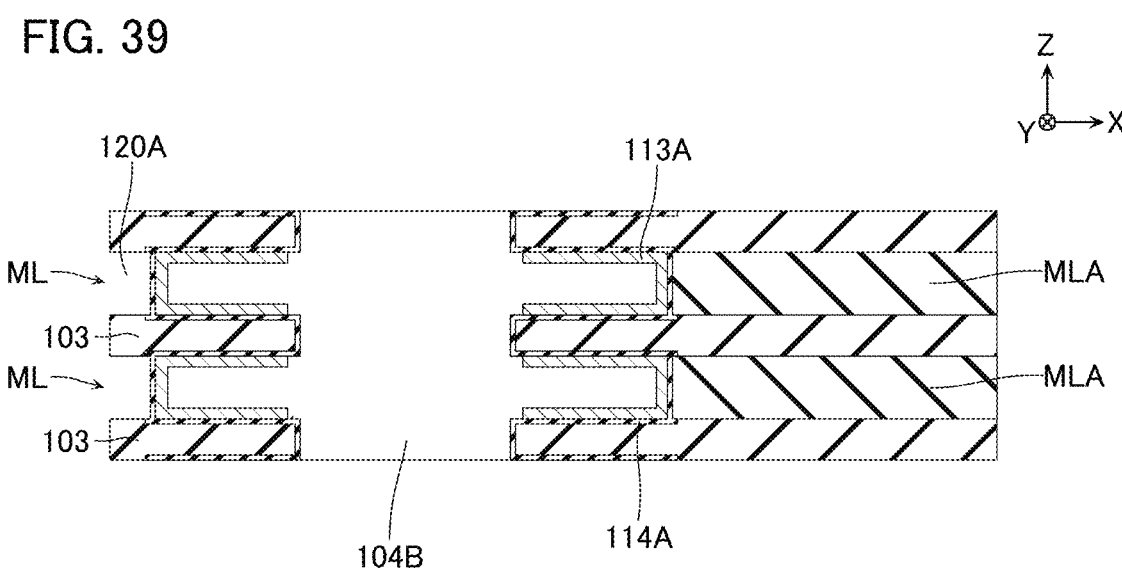
FIG. 39 is a schematic cross-sectional view for describing the manufacturing method.

Next, for example, as illustrated in FIG. 38 and FIG. 39, an opening 120A is formed at a position corresponding to the conductive layer 120. A part of the upper surface and a part of the lower surface of the insulating layer 103, a side surface of the insulating layer 114A in the X-direction, and a side surface of the insulating layer 115 in the X-direction are exposed inside the opening 120A. In this process, for example, the sacrifice layer MLA is removed via the opening 101A. This process is performed by, for example, wet etching.

Figure 40:
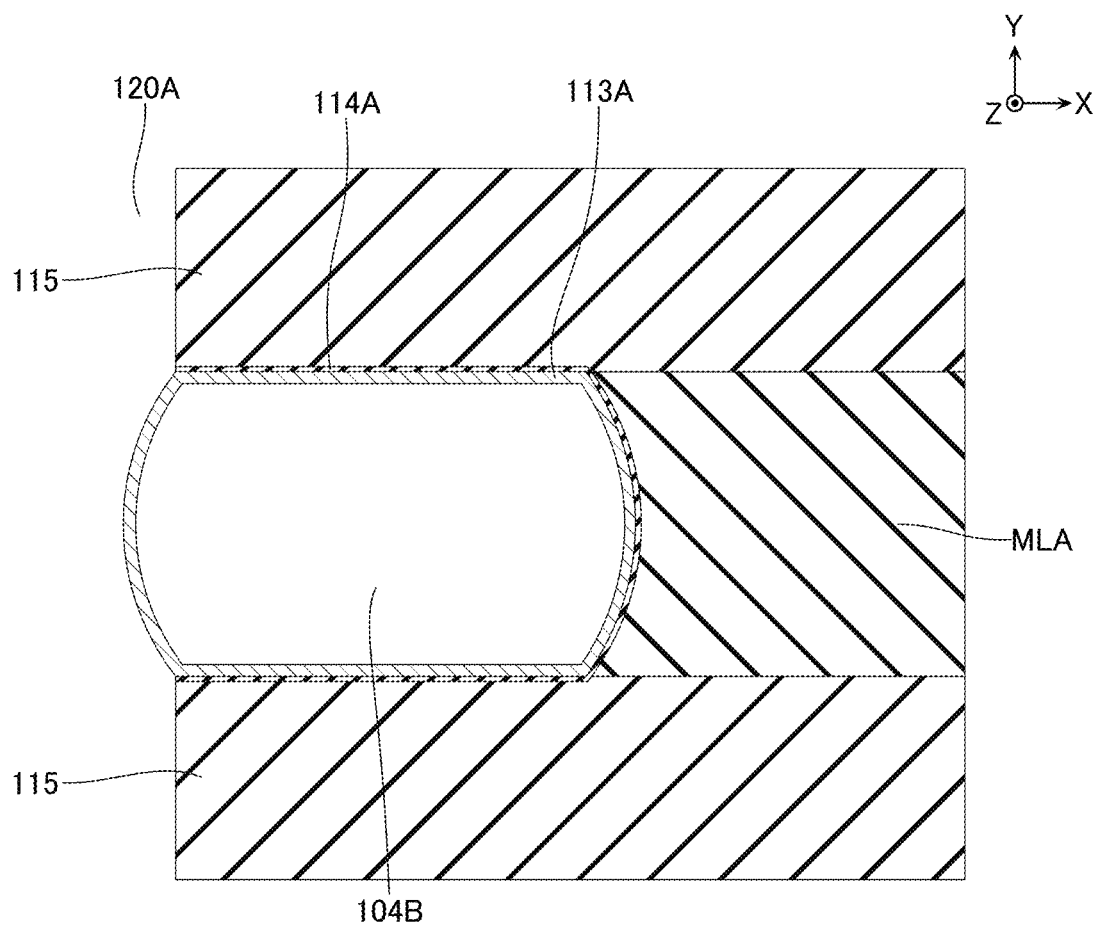
FIG. 40 is a schematic cross-sectional view for describing the manufacturing method.
Figure 41:
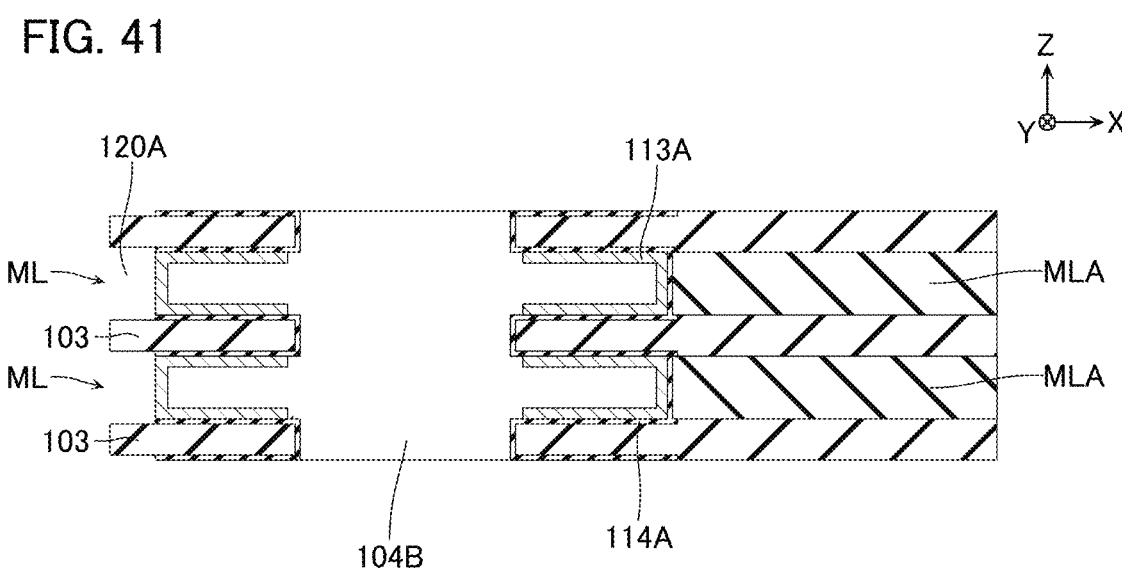
FIG. 41 is a schematic cross-sectional view for describing the manufacturing method.

Next, for example, as illustrated in FIG. 40 and FIG. 41, a part of the insulating layer 114A disposed on the exposed surface of the conductive layer 113A to the openings 120A, 101A in the X-direction is removed via the openings 120A, 101A. This process is performed by, for example, wet etching.

Figure 42:
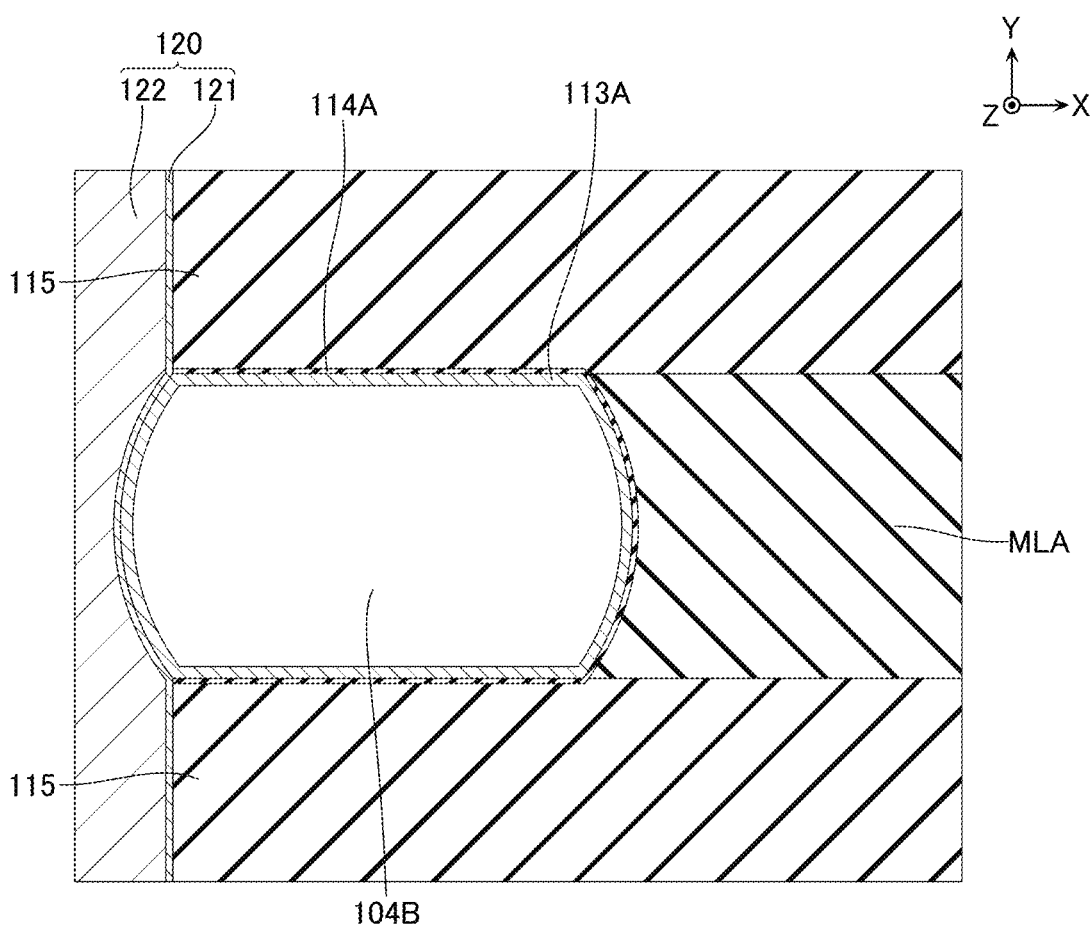
FIG. 42 is a schematic cross-sectional view for describing the manufacturing method.
Figure 43:
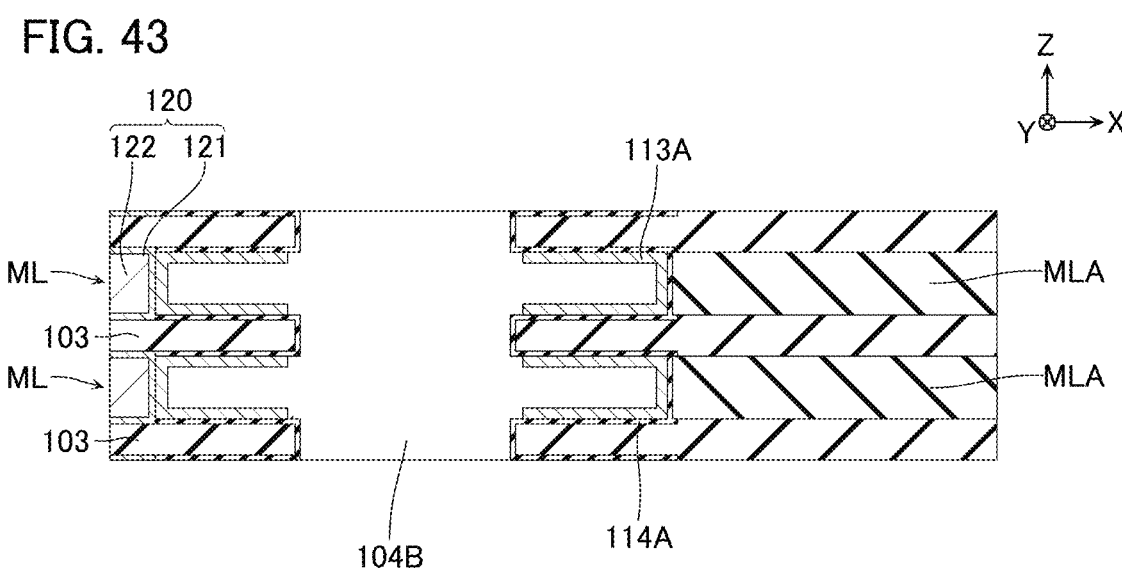
FIG. 43 is a schematic cross-sectional view for describing the manufacturing method.

Next, for example, as illustrated in FIG. 42 and FIG. 43, the conductive layer 120 is formed. In this process, the barrier conductive film 121 and the conductive film 122 are formed inside the openings 120A, 101A by a method, such as CVD. In this process, the opening 120A is filled with the barrier conductive film 121 and the conductive film 122, and the opening 101A is not filled. Next, the barrier conductive film 121 and the conductive film 122 formed inside the opening 101A are partially removed by a method, such as wet etching. Although not illustrated, after performing this process, the insulating layer 101 is formed inside the opening 101A.

Figure 44:
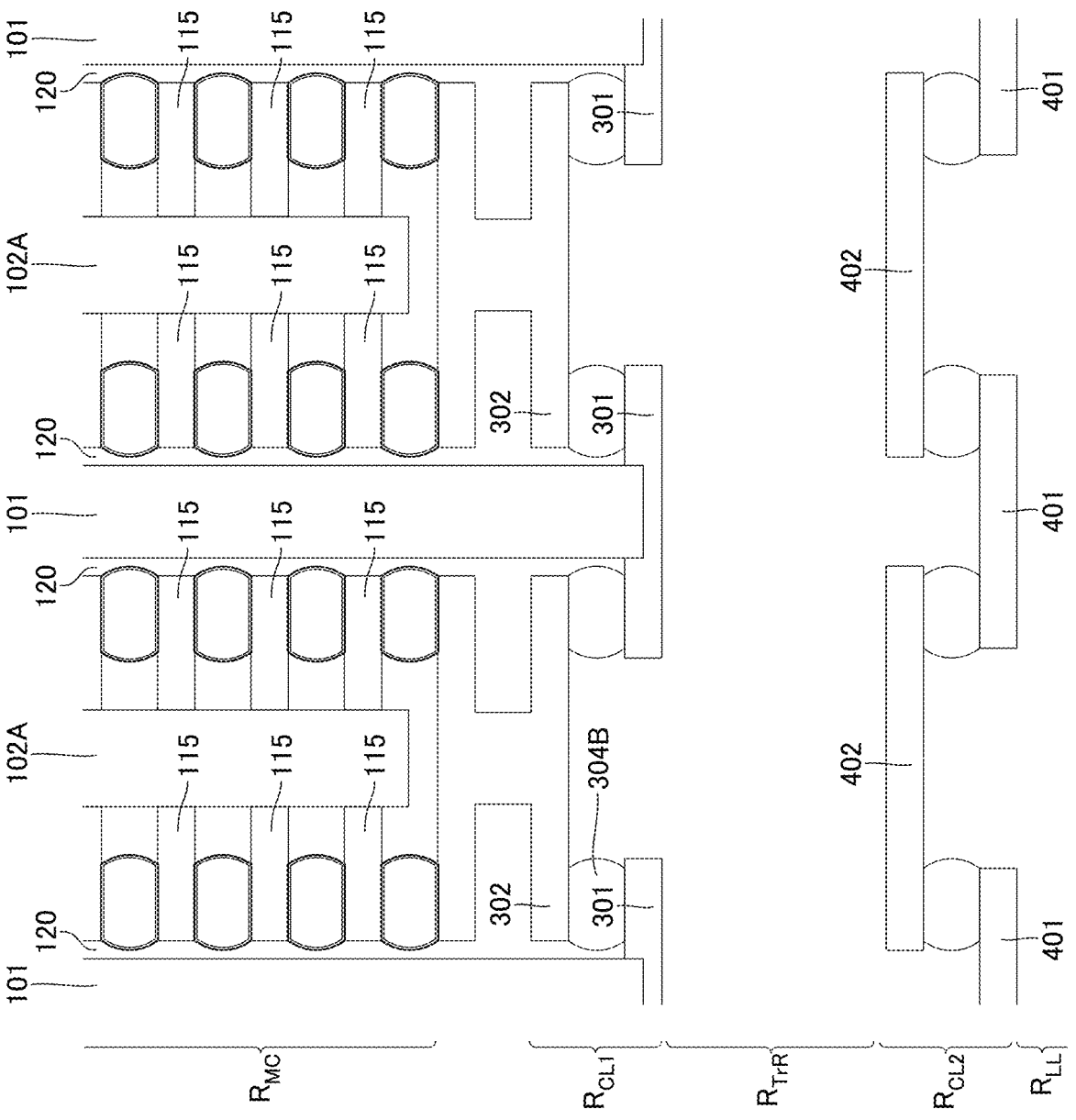
FIG. 44 is a schematic cross-sectional view for describing the manufacturing method.
Figure 45:
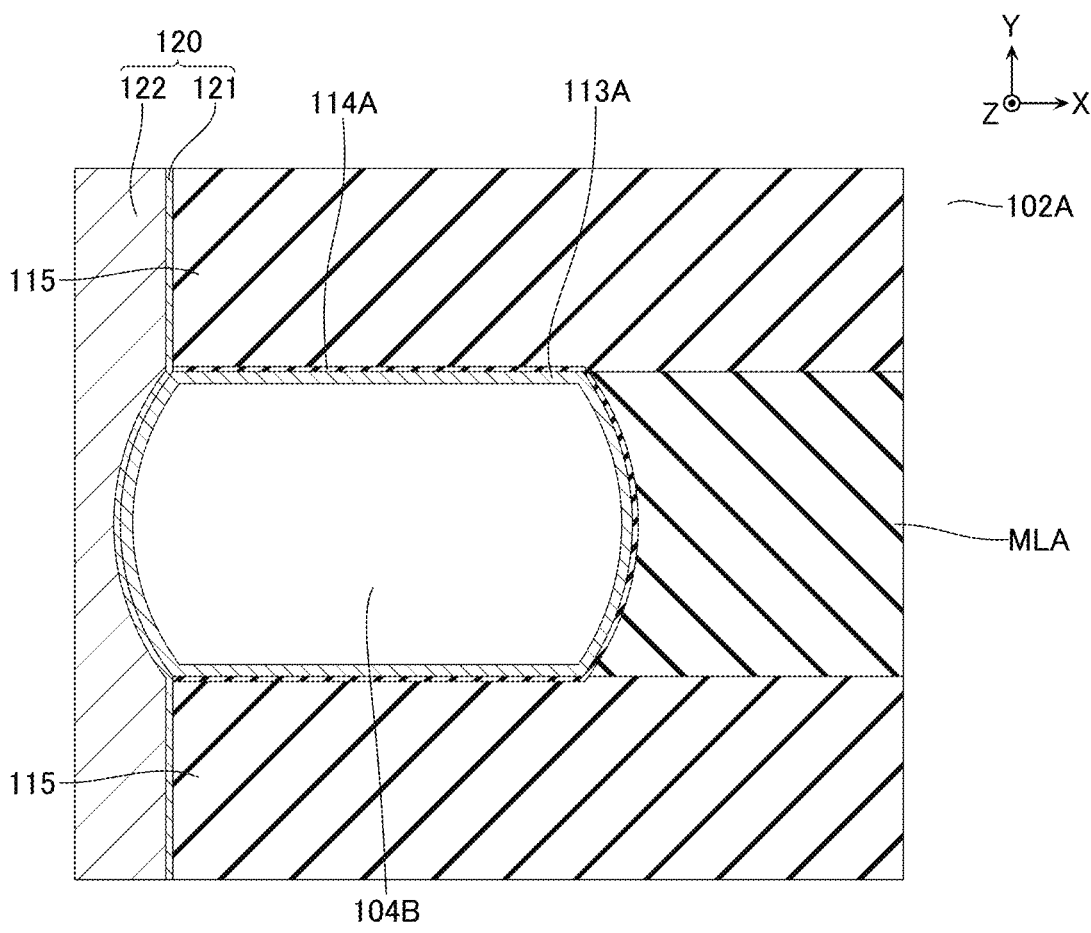
FIG. 45 is a schematic cross-sectional view for describing the manufacturing method.
Figure 46:
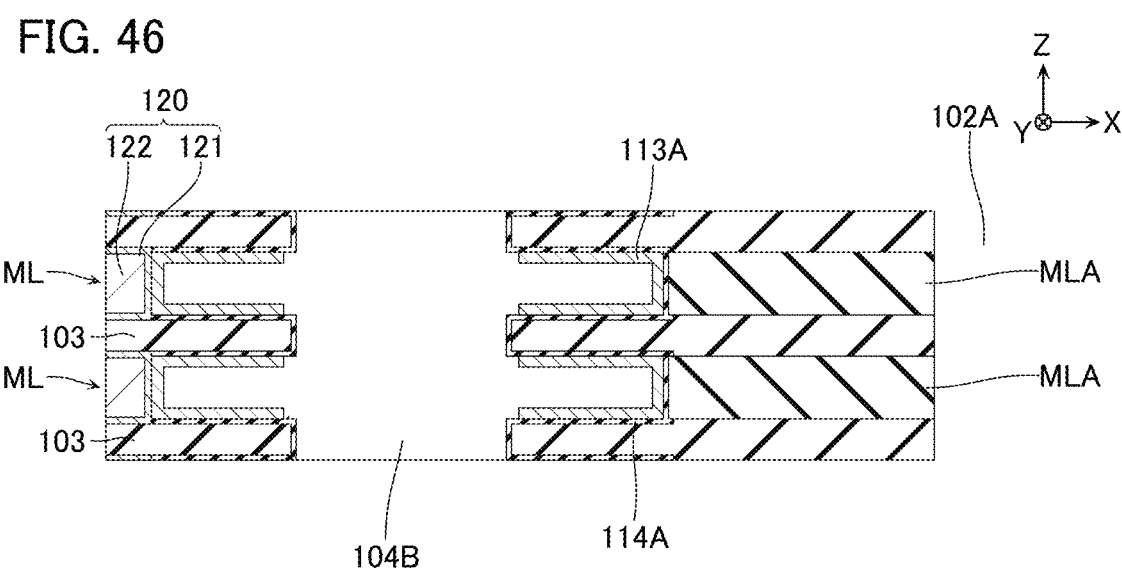
FIG. 46 is a schematic cross-sectional view for describing the manufacturing method.

Next, for example, as illustrated in FIG. 44 to FIG. 46, openings 102A are formed at positions corresponding to the conductive layers 102. The opening 102A extends in the Y-direction and the Z-direction, penetrates the plurality of insulating layers 103 and the plurality of sacrifice layers MLA arranged in the Z-direction and the insulating layers 115, and separates these configurations in the X-direction. This process is performed by, for example, RIE.

Figure 47:
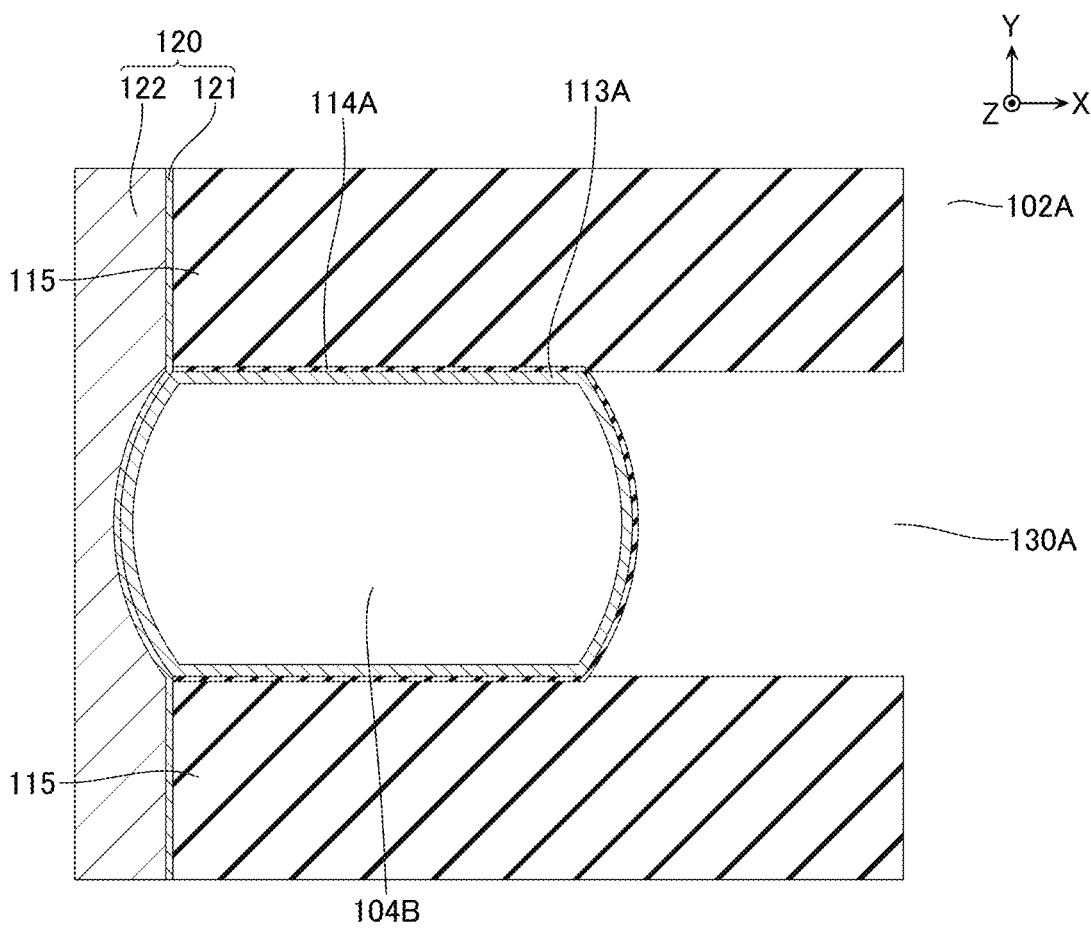
FIG. 47 is a schematic cross-sectional view for describing the manufacturing method.
Figure 48:
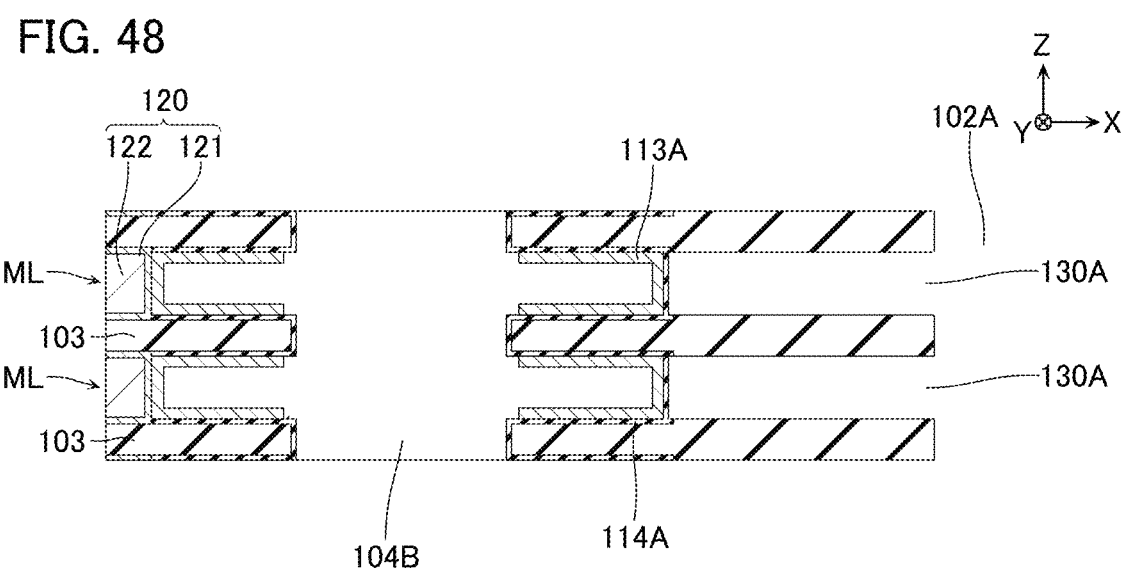
FIG. 48 is a schematic cross-sectional view for describing the manufacturing method.

Next, for example, as illustrated in FIG. 47 and FIG. 48, an opening 130A is formed at a position corresponding to the capacitor structure 130. In this process, the sacrifice layer MLA is removed via the opening 102A. This process is performed by, for example, wet etching.

Figure 49:
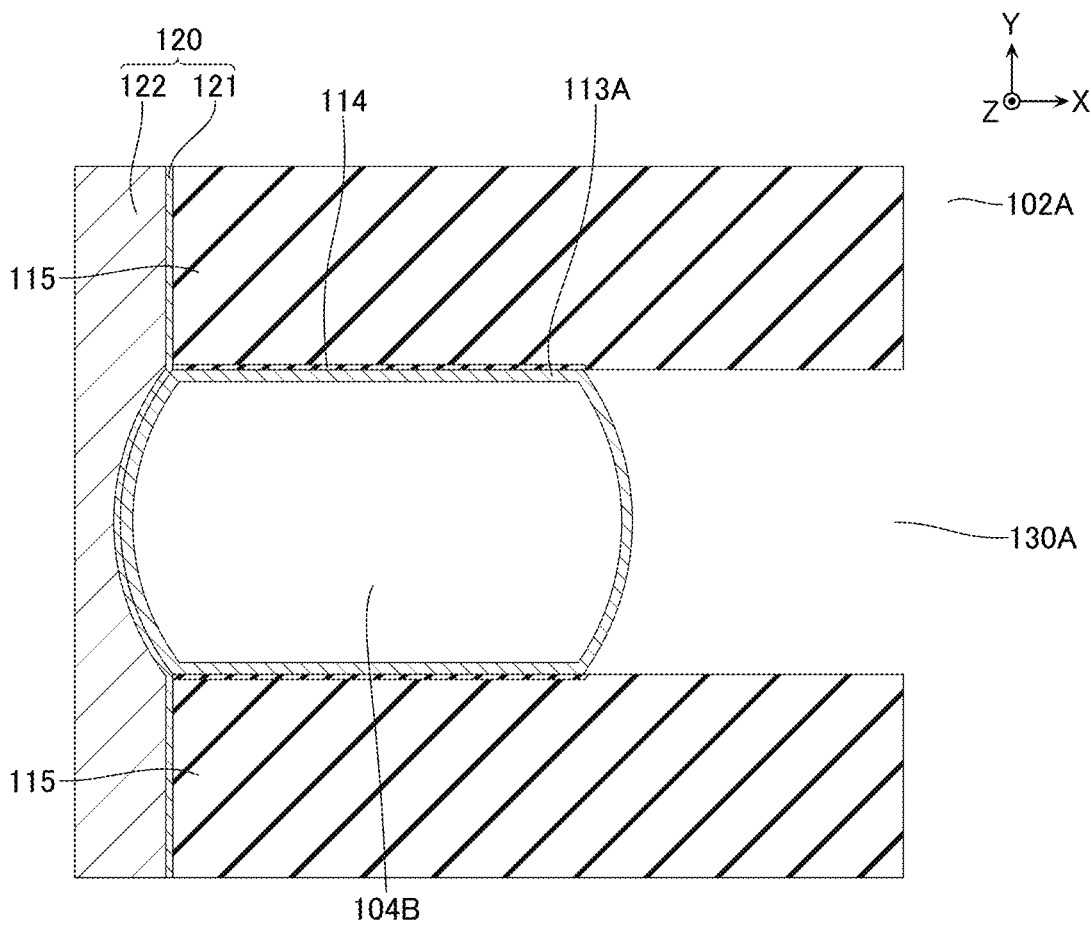
FIG. 49 is a schematic cross-sectional view for describing the manufacturing method.
Figure 50:
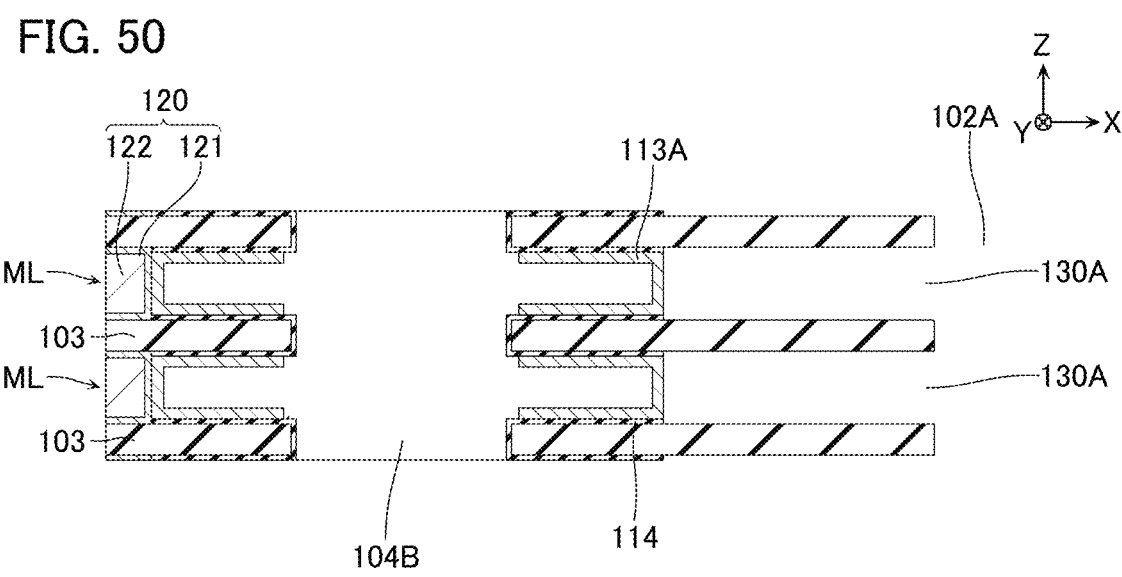
FIG. 50 is a schematic cross-sectional view for describing the manufacturing method.

Next, for example, as illustrated in FIG. 49 and FIG. 50, an insulating layer 114 is formed. In this process, for example, a part of the insulating layer 114A disposed on a side surface of the conductive layer 113A on an opening 102A side in the X-direction is removed via the openings 102A, 130A. This process is performed by, for example, wet etching.

Figure 51:
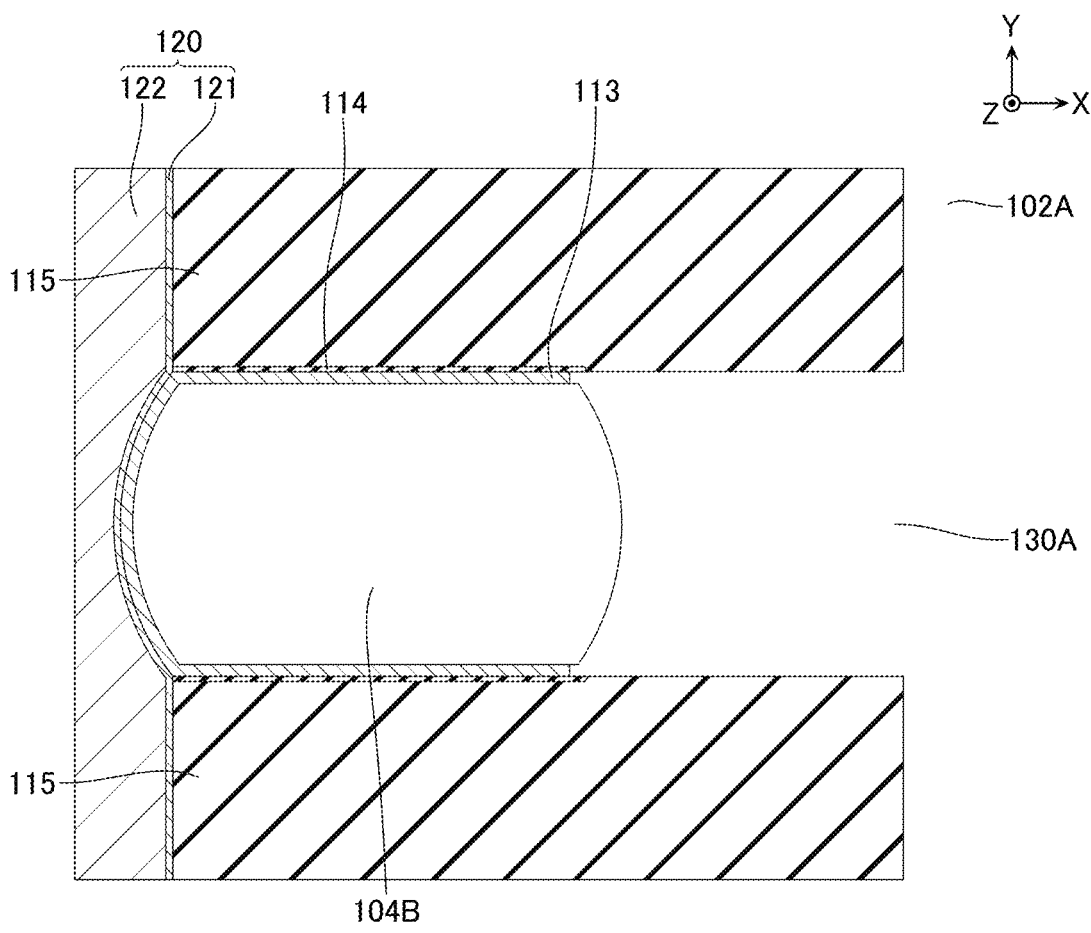
FIG. 51 is a schematic cross-sectional view for describing the manufacturing method.
Figure 52:
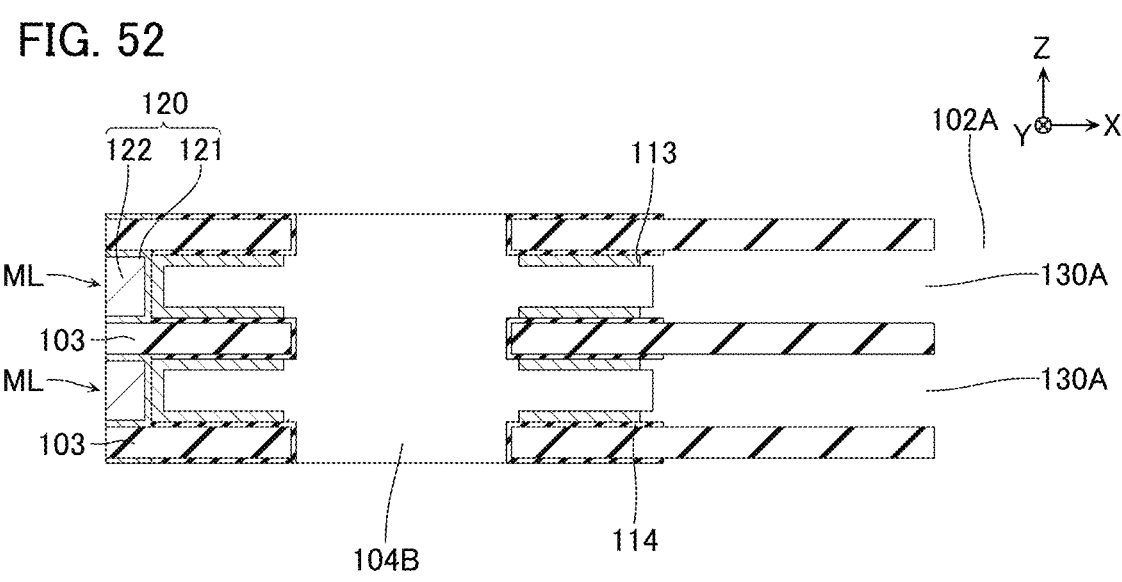
FIG. 52 is a schematic cross-sectional view for describing the manufacturing method.

Next, for example, as illustrated in FIG. 51 and FIG. 52, the conductive layer 113 is formed. In this process, for example, a part of the conductive layer 113A disposed on a side surface of the sacrifice layer 104B on the opening 102A side in the X-direction is removed via the openings 102A, 130A. This process is performed by, for example, wet etching.

Figure 53:
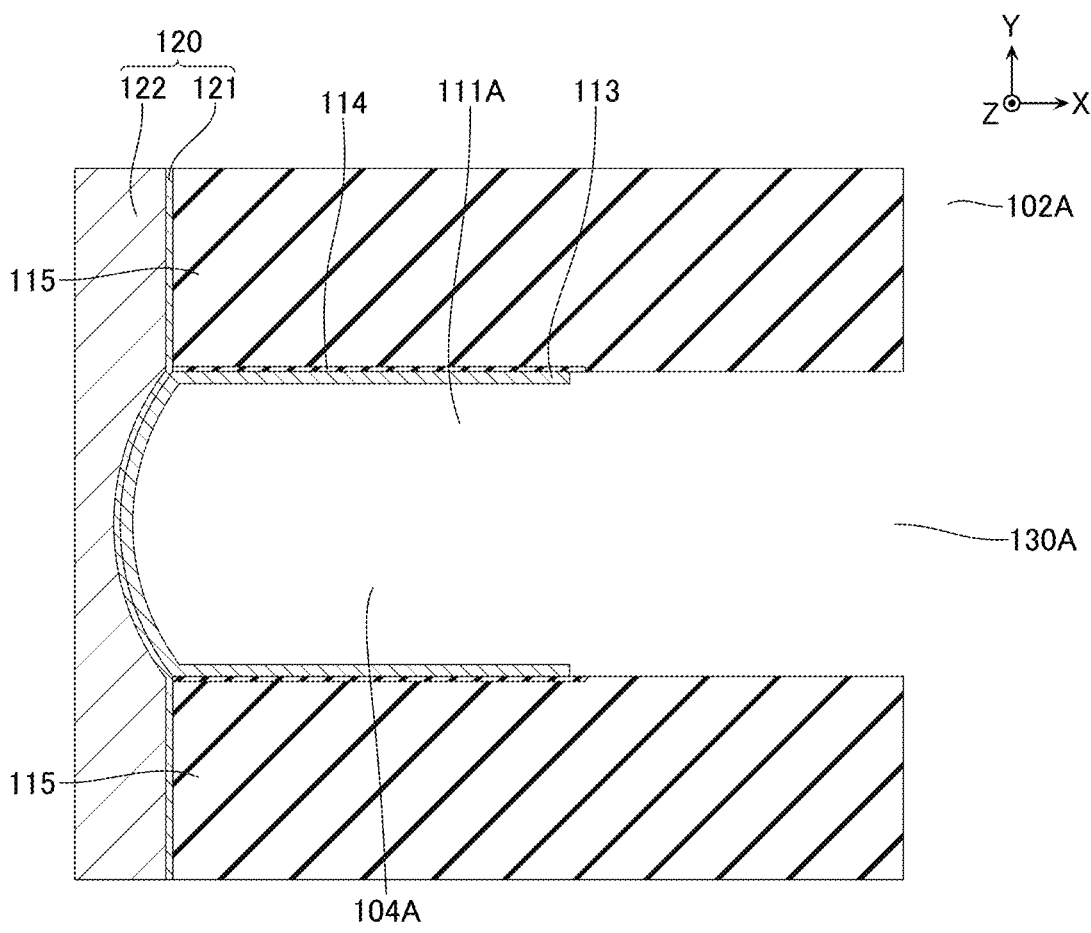
FIG. 53 is a schematic cross-sectional view for describing the manufacturing method.
Figure 54:
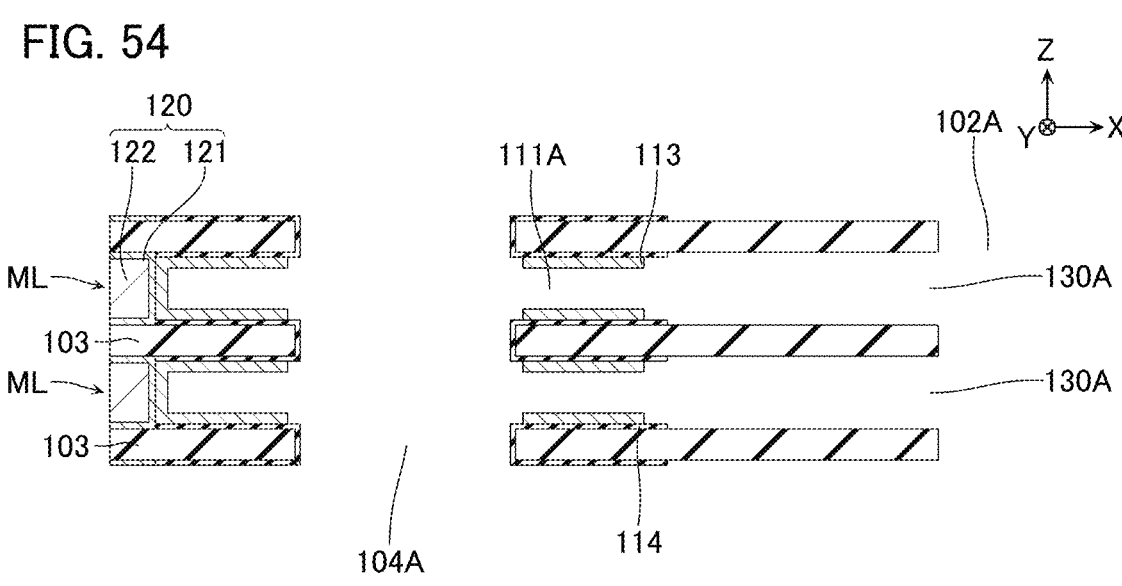
FIG. 54 is a schematic cross-sectional view for describing the manufacturing method.

Next, for example, as illustrated in FIG. 53 and FIG. 54, the sacrifice layer 104B is removed. This process is performed by, for example, wet etching.

Figure 55:
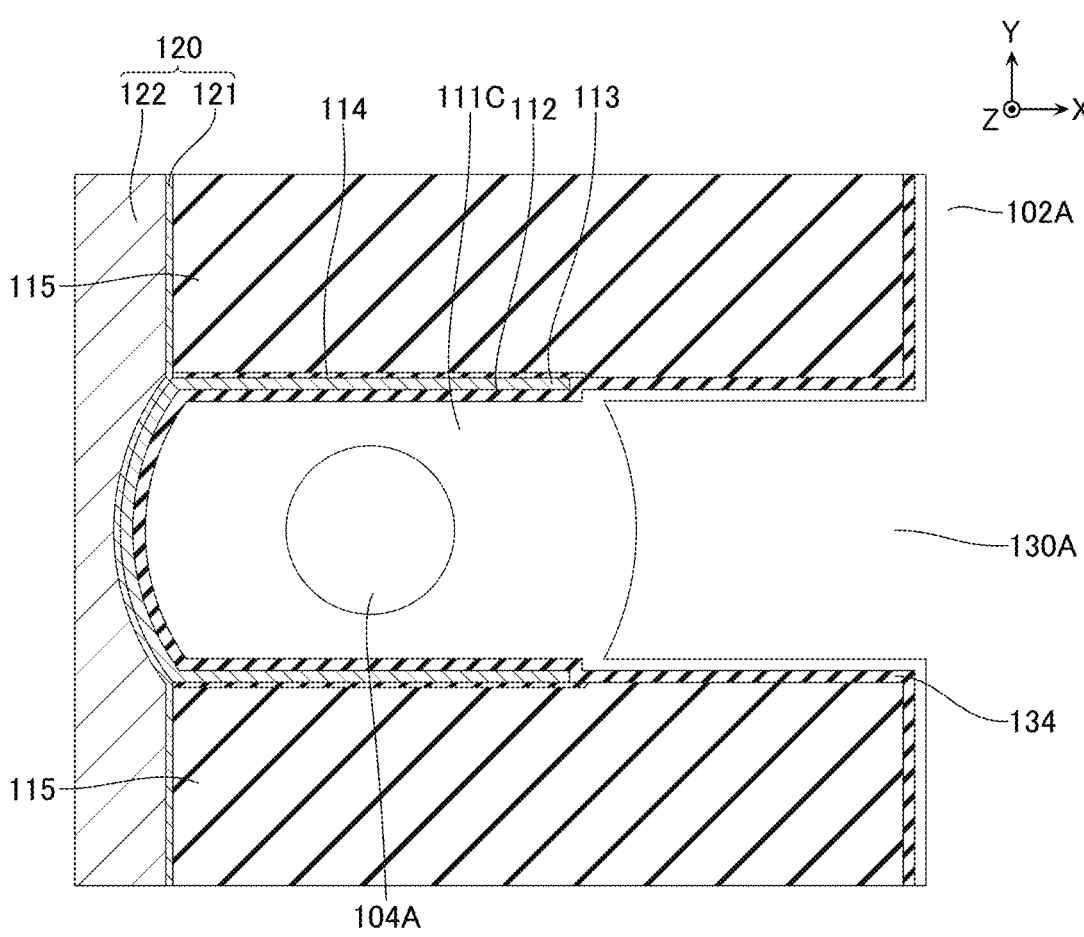
FIG. 55 is a schematic cross-sectional view for describing the manufacturing method.
Figure 56:
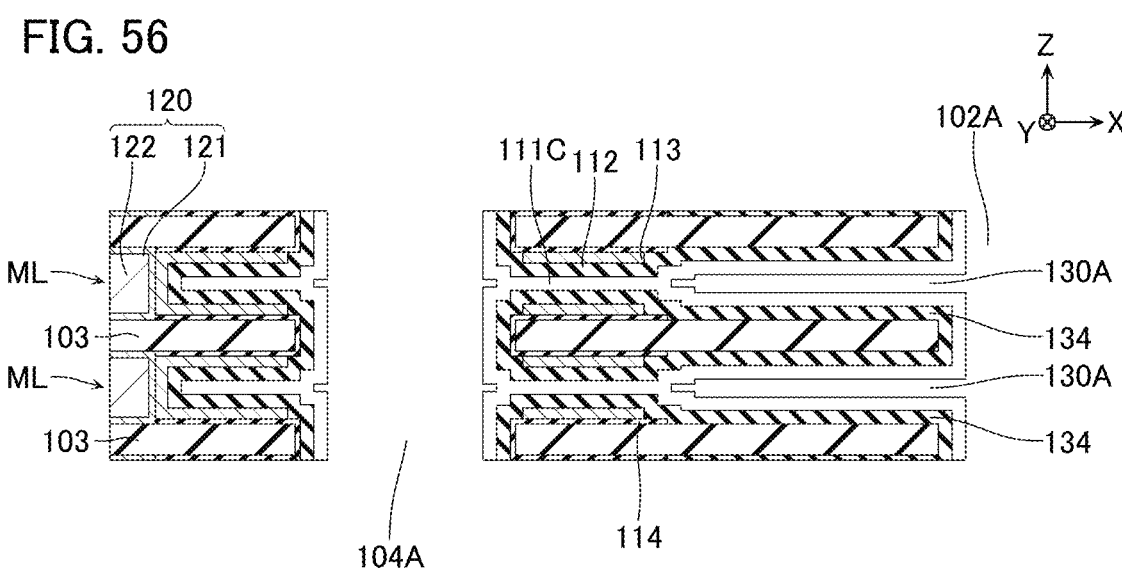
FIG. 56 is a schematic cross-sectional view for describing the manufacturing method.

Next, for example, as illustrated in FIG. 55 and FIG. 56, the insulating layers 112, 134 and a semiconductor layer 111C are formed inside the openings 111A, 104A, 130A, 102A. The insulating layers 112, 134 are formed on an exposed surface of the conductive layer 113 to the opening 111A, a part of an upper surface, a part of a lower surface, and an exposed surface to the opening 102A of the insulating layer 103, an exposed surface of the insulating layer 114 to the opening 104A, and a part of a side surface of the insulating layer 115 in the Y-direction. The opening 111A is filled with the semiconductor layer 111C, and the openings 104A, 130A, 102A are not filled with the semiconductor layer 111C. This process is performed by, for example, CVD.

Figure 57:
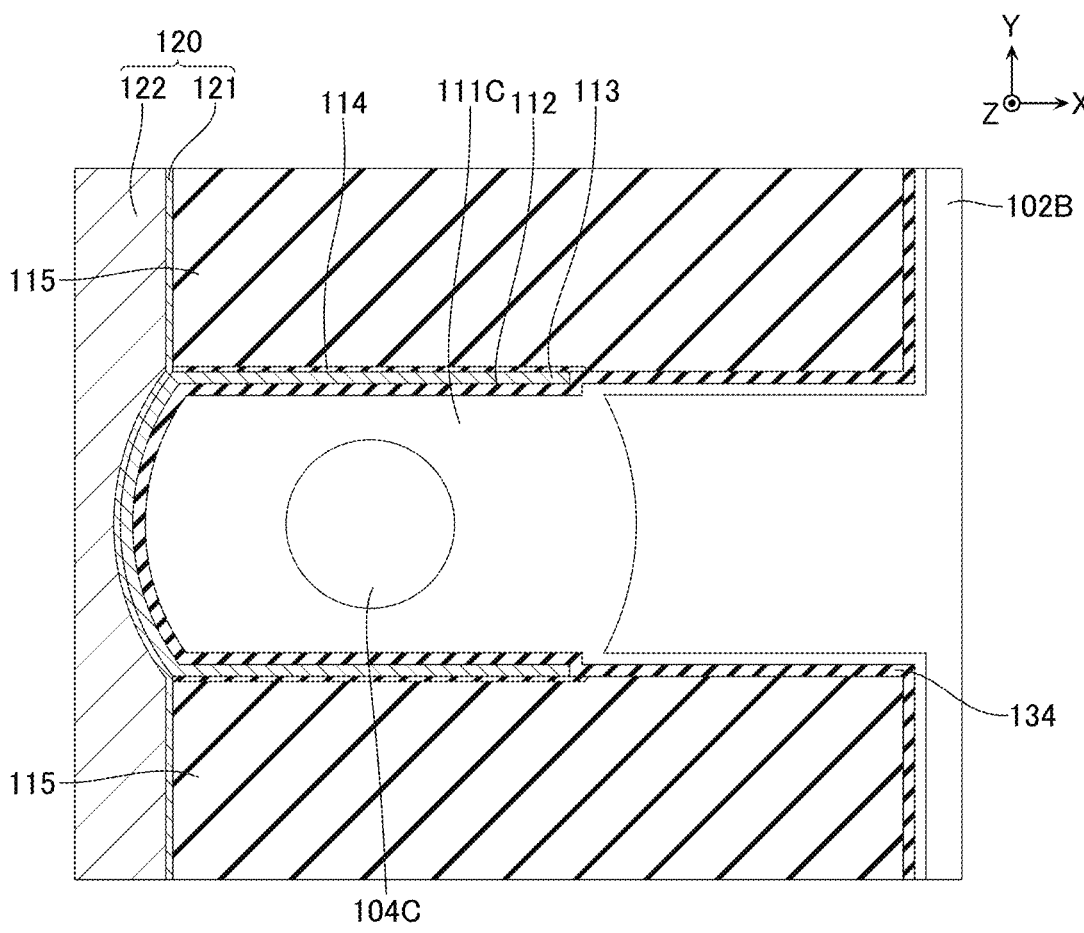
FIG. 57 is a schematic cross-sectional view for describing the manufacturing method.
Figure 58:
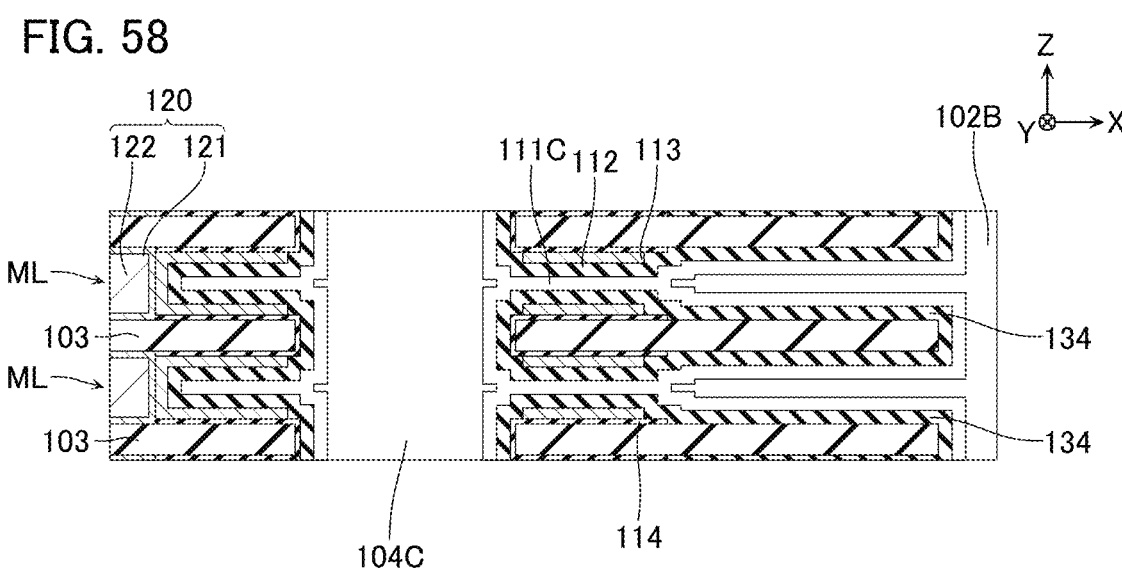
FIG. 58 is a schematic cross-sectional view for describing the manufacturing method.

Next, for example, as illustrated in FIG. 57 and FIG. 58, a sacrifice layer 104C of silicon (Si) or the like is formed inside the opening 104A. A sacrifice layer 102B of silicon (Si) or the like is formed inside the opening 102A. This process is performed by, for example, CVD.

Figures 59, 60:
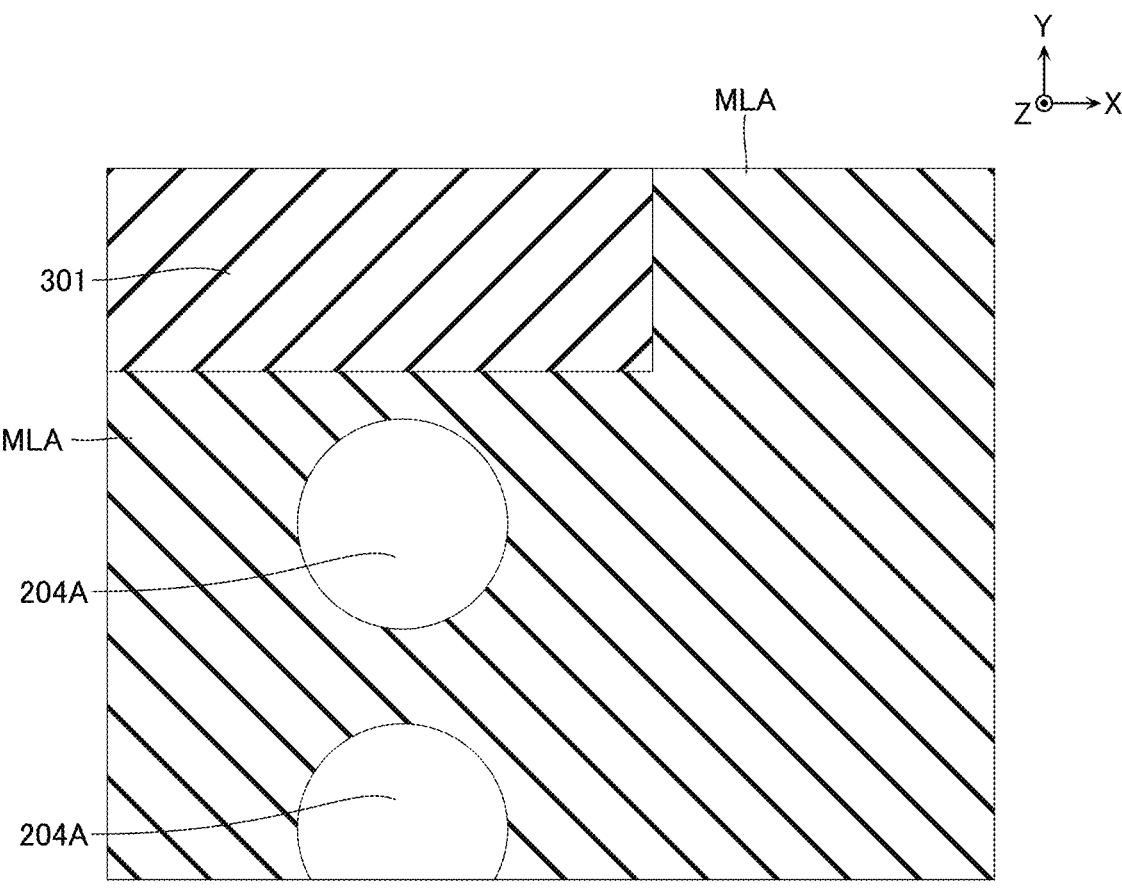
FIG. 59 is a schematic cross-sectional view for describing the manufacturing method.
FIG. 60 is a schematic cross-sectional view for describing the manufacturing method.

Next, for example, as illustrated in FIG. 59 and FIG. 60, openings 204A are formed at positions corresponding to the via-wirings 204. The opening 204A extends in the Z-direction as illustrated in FIG. 60, and penetrates the plurality of insulating layers 103 and the plurality of sacrifice layers MLA arranged in the Z-direction. This process is performed by, for example, RIE.

Figures 61, 62, 63:
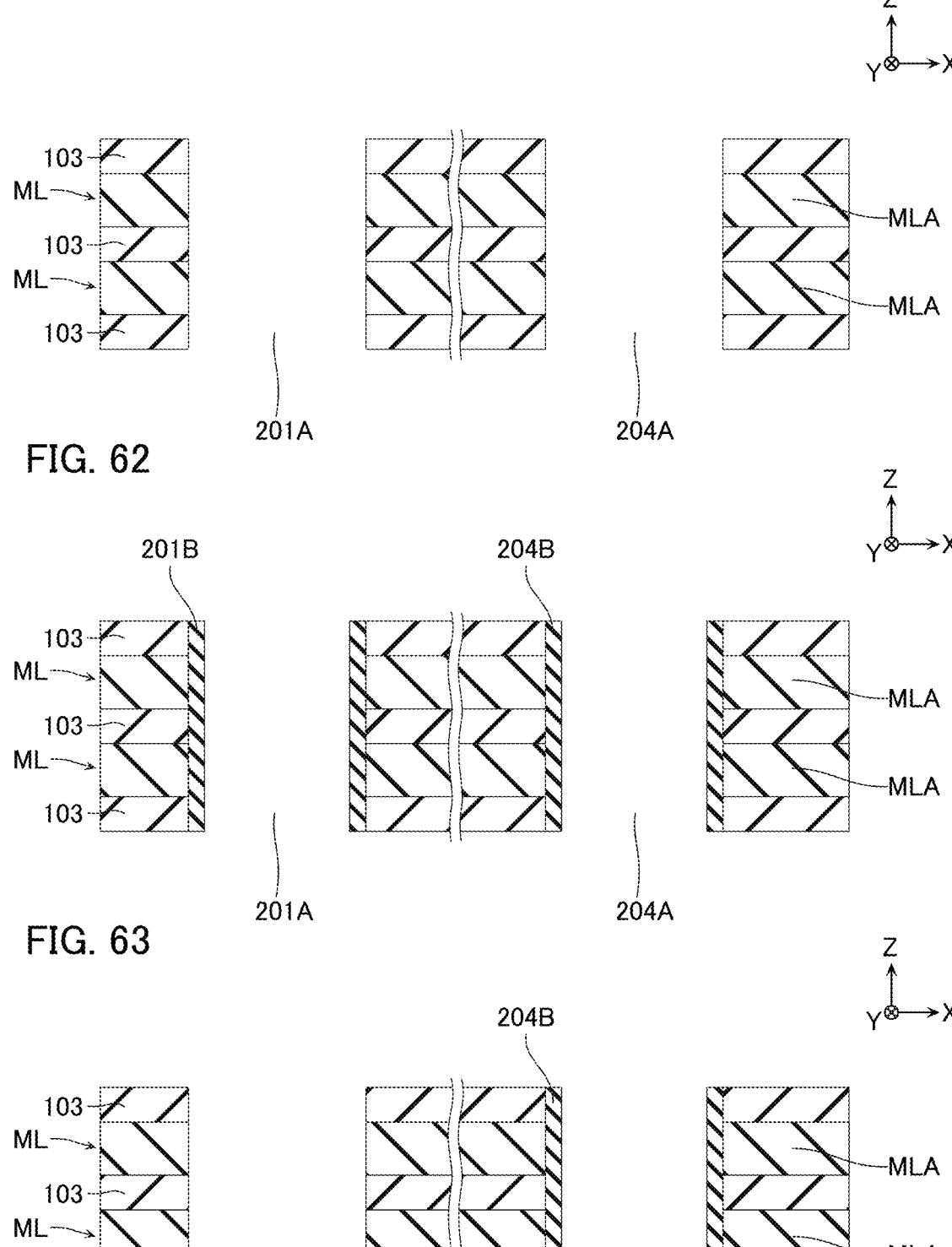
FIG. 61 is a schematic cross-sectional view for describing the manufacturing method.
FIG. 62 is a schematic cross-sectional view for describing the manufacturing method.
FIG. 63 is a schematic cross-sectional view for describing the manufacturing method.

For example, as illustrated in FIG. 61, an opening 201A is formed at a position corresponding to the insulating layer 201. The opening 201A extends in the Y-direction and the Z-direction, penetrates the plurality of insulating layers 103 and the plurality of sacrifice layers MLA arranged in the Z-direction, and separates these configurations in the X-direction. This process is performed by, for example, RIE.

Next, for example, as illustrated in FIG. 62, insulating films 201B, 204B of silicon oxide (SiO$_2$) or the like are formed inside the openings 201A, 204A. The openings 201A, 204A are not filled with the insulating films 201B, 204B. This process is performed by, for example, CVD.

Next, for example, as illustrated in FIG. 63, the insulating film 201B is removed. This process is performed by, for example, wet etching.

Figure 64:
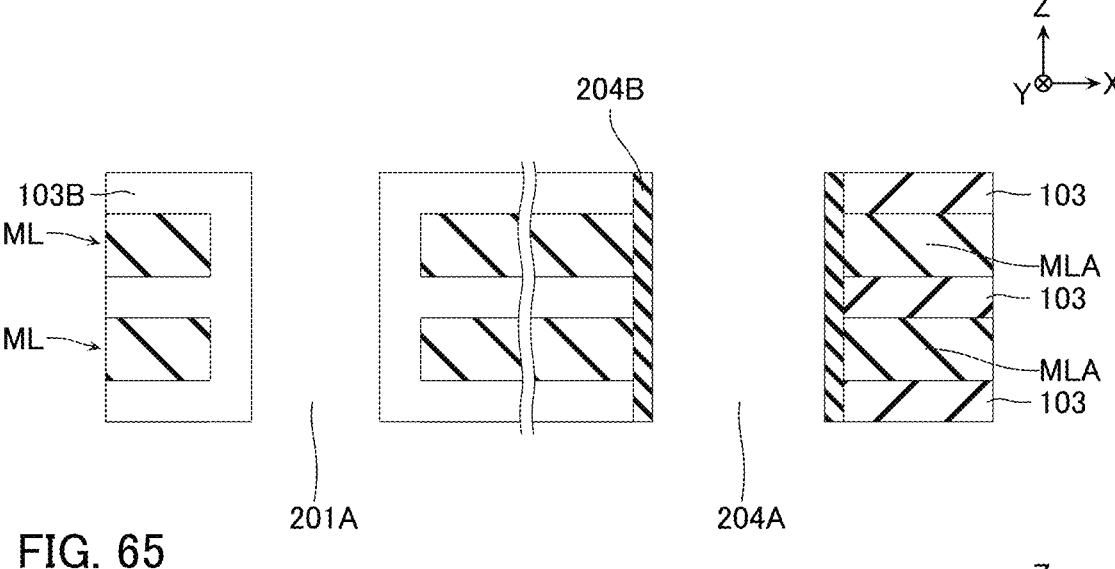
FIG. 64 is a schematic cross-sectional view for describing the manufacturing method.

Next, for example, as illustrated in FIG. 64, a sacrifice layer 103B is formed. The sacrifice layer 103B contains, for example, silicon (Si) containing impurities, such as boron (B). In this process, the insulating layer 103 is partially removed via the opening 201A by a method, such as wet etching. The sacrifice layer 103B is formed on a part of an upper surface, a part of a lower surface, and an exposed surface to the opening 201A of the sacrifice layer MLA, by a method, such as CVD. The opening 201A is not filled with the sacrifice layer 103B.

Figure 65:
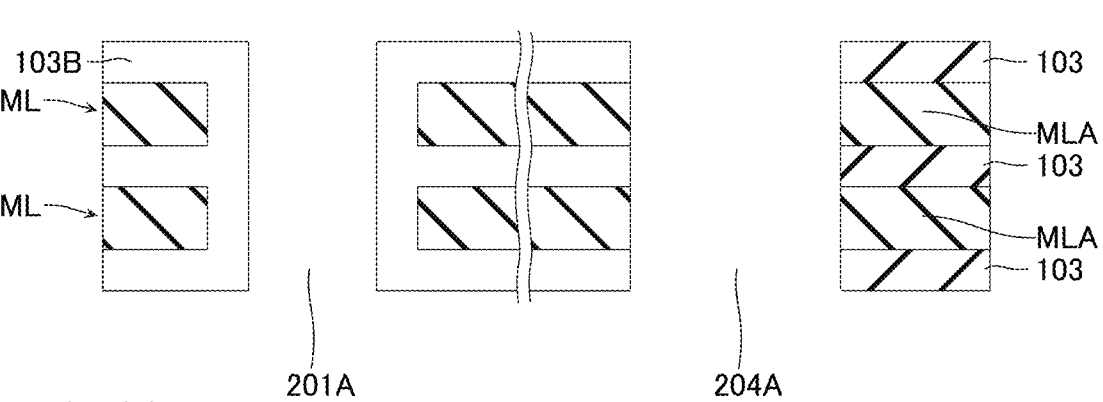
FIG. 65 is a schematic cross-sectional view for describing the manufacturing method.

Next, for example, as illustrated in FIG. 65, the insulating film 204B is removed. This process is performed by, for example, wet etching.

Figure 66:
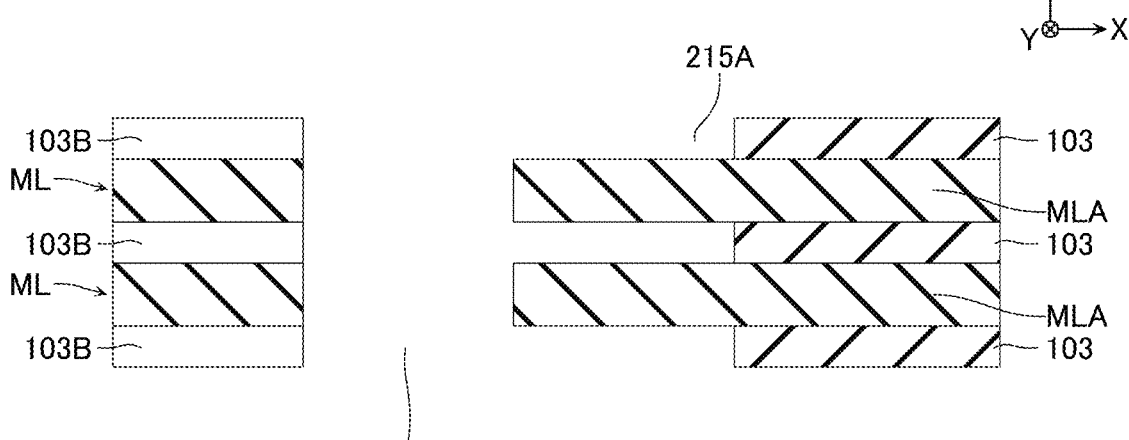
FIG. 66 is a schematic cross-sectional view for describing the manufacturing method.

Next, for example, as illustrated in FIG. 66, an opening 215A is formed at a position corresponding to the conductive layer 215. A part of the upper surface and a part of the lower surface of the sacrifice layer MLA are exposed inside the opening 215A. In this process, for example, a part of the insulating layer 103 is selectively removed via the opening 204A. This process is performed by, for example, wet etching.

Figure 67:
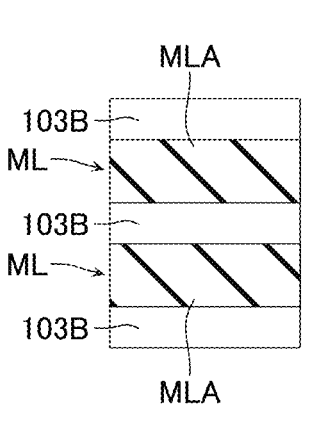
FIG. 67 is a schematic cross-sectional view for describing the manufacturing method.
Figure 67:
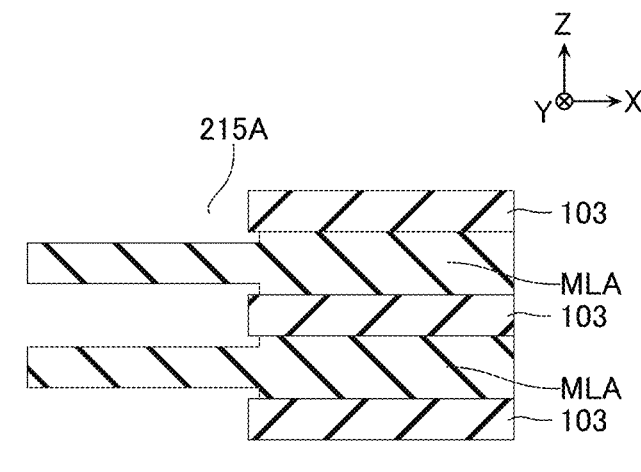

Next, for example, as illustrated in FIG. 67, the insulating layer 103 is partially removed. In this process, a width of the opening 215A in the Z-direction is widened. This process is performed by, for example, wet etching.

Figure 68:
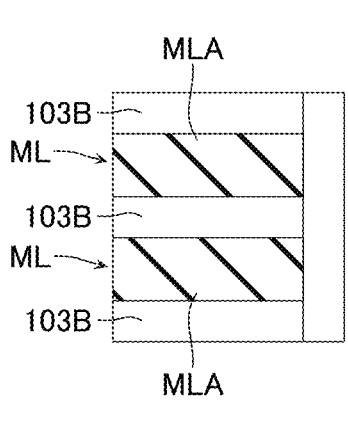
FIG. 68 is a schematic cross-sectional view for describing the manufacturing method.
Figure 68:
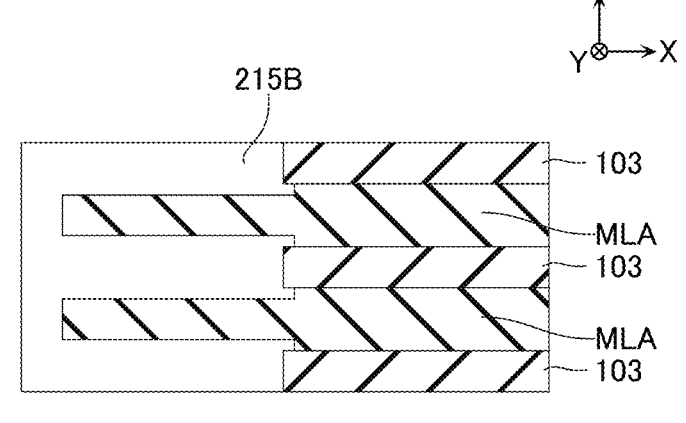

Next, for example, as illustrated in FIG. 68, a sacrifice layer 215B of silicon (Si) or the like is formed inside the opening 215A and the opening 204A. The opening 215A is filled with the sacrifice layer 215B. The opening 204A is not filled with the sacrifice layer 215B. This process is performed by a method, such as CVD.

Figure 69:
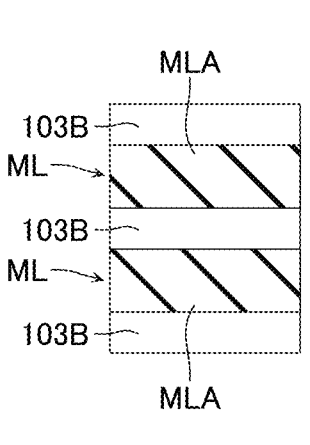
FIG. 69 is a schematic cross-sectional view for describing the manufacturing method.

Next, for example, as illustrated in FIG. 69, the sacrifice layer 215B is partially removed. In this process, the sacrifice layers MLA, 103B are exposed inside the opening 204A. This process is performed by, for example, wet etching.

Figures 70, 71:
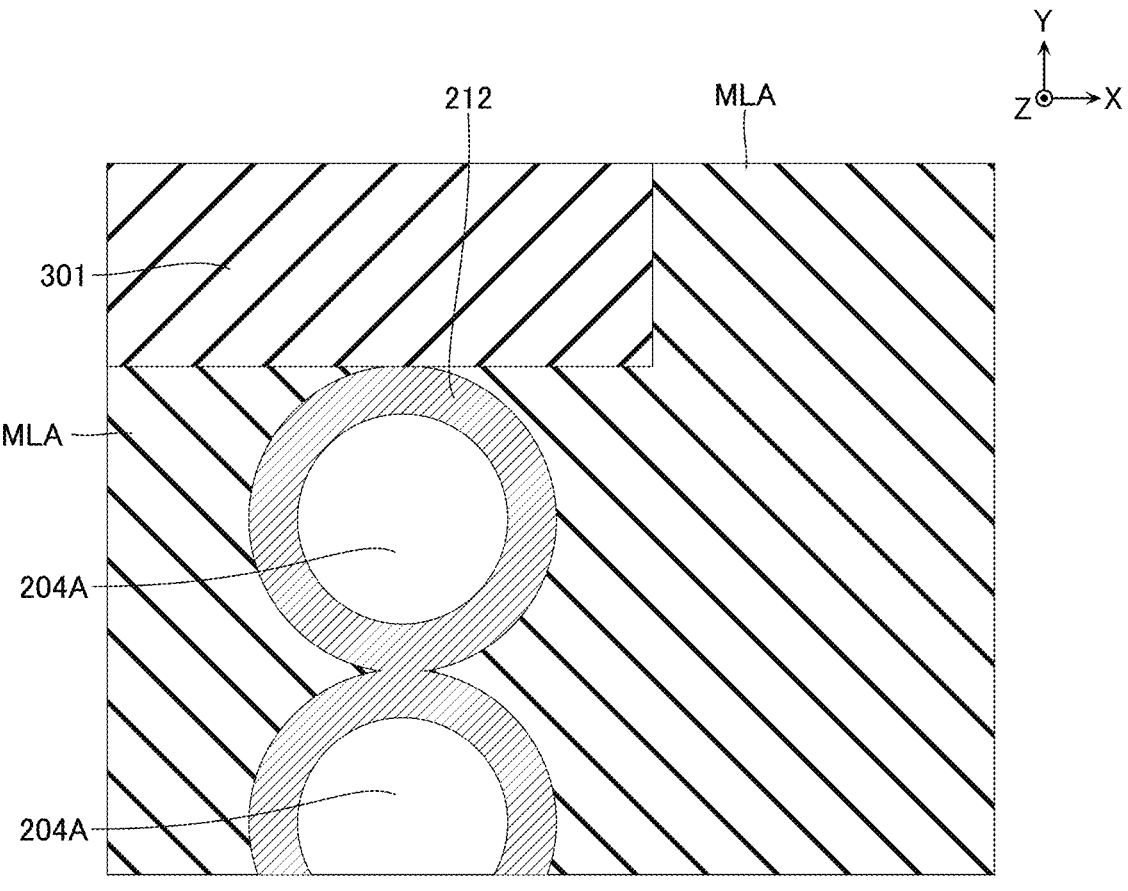
FIG. 70 is a schematic cross-sectional view for describing the manufacturing method.
FIG. 71 is a schematic cross-sectional view for describing the manufacturing method.

Next, for example, as illustrated in FIG. 70 and FIG. 71, the conductive layer 212 is formed. In this process, the sacrifice layer MLA is partially removed by a method, such as wet etching. Further, a conductive layer is formed on a part of upper surfaces, a part of lower surfaces, and exposed surfaces to the opening 204A of the sacrifice layers 103B, 215B by a method, such as Atomic Layer Deposition (ALD) or the like. Subsequently, this conductive layer is partially removed to be separated in the Z-direction by a method, such as wet etching or the like, thus forming a plurality of conductive layers 212 arranged in the Z-direction.

Figures 72, 73, 74:
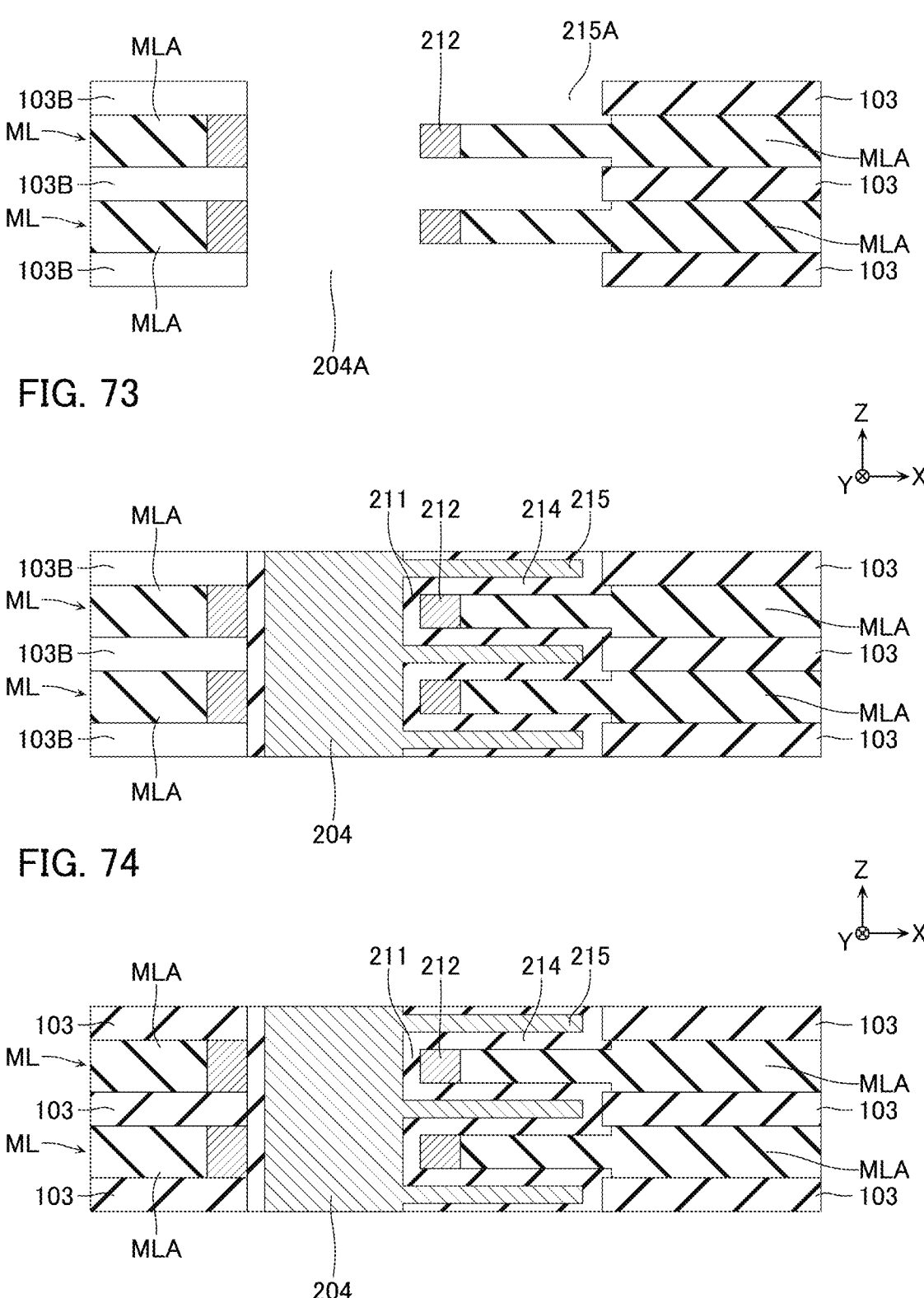
FIG. 72 is a schematic cross-sectional view for describing the manufacturing method.
FIG. 73 is a schematic cross-sectional view for describing the manufacturing method.
FIG. 74 is a schematic cross-sectional view for describing the manufacturing method.
Figure 75:
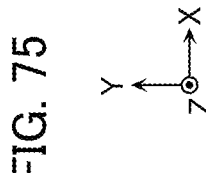
FIG. 75 is a schematic cross-sectional view for describing the manufacturing method.
Figure 76:
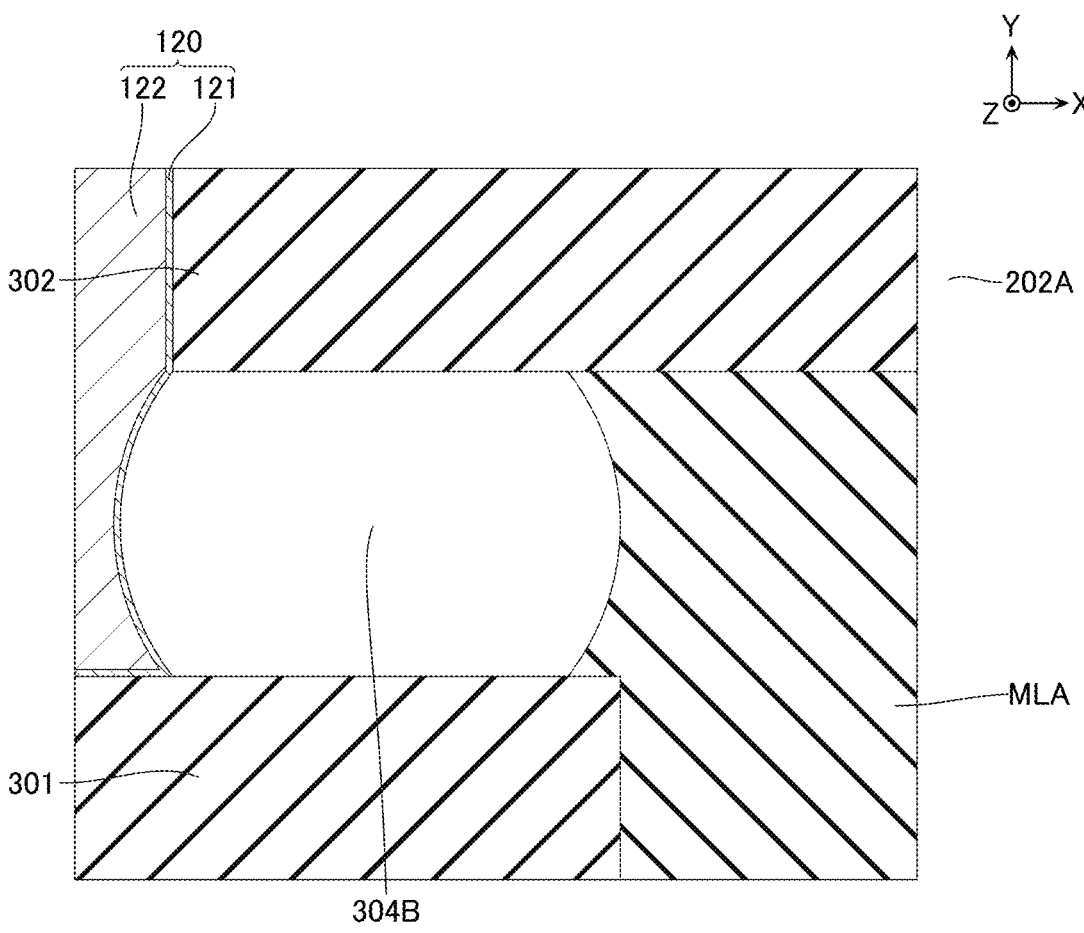
FIG. 76 is a schematic cross-sectional view for describing the manufacturing method.
Figure 77:
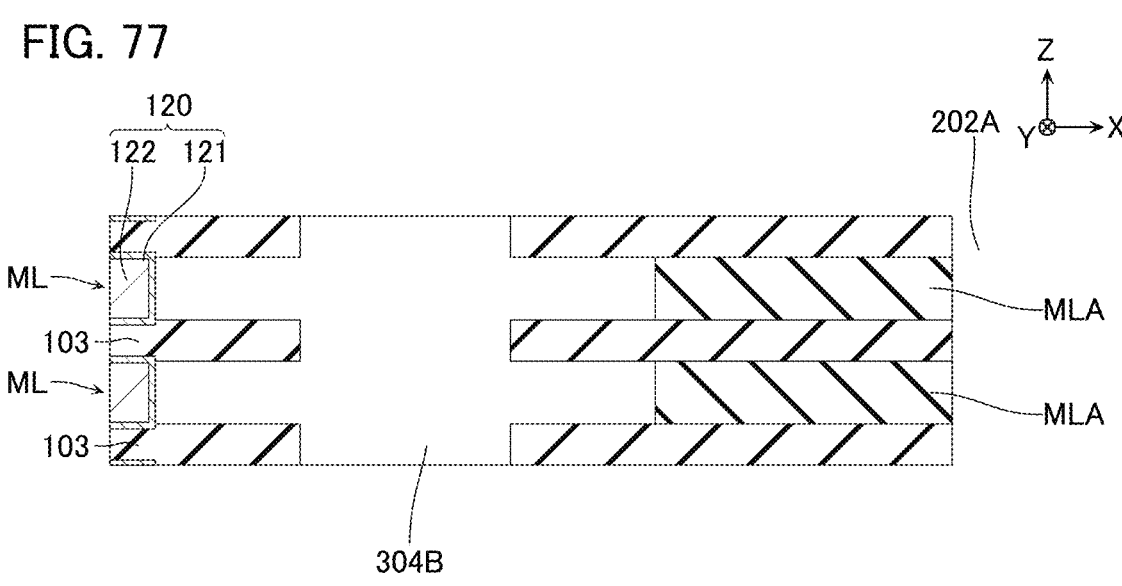
FIG. 77 is a schematic cross-sectional view for describing the manufacturing method.
Figure 78:
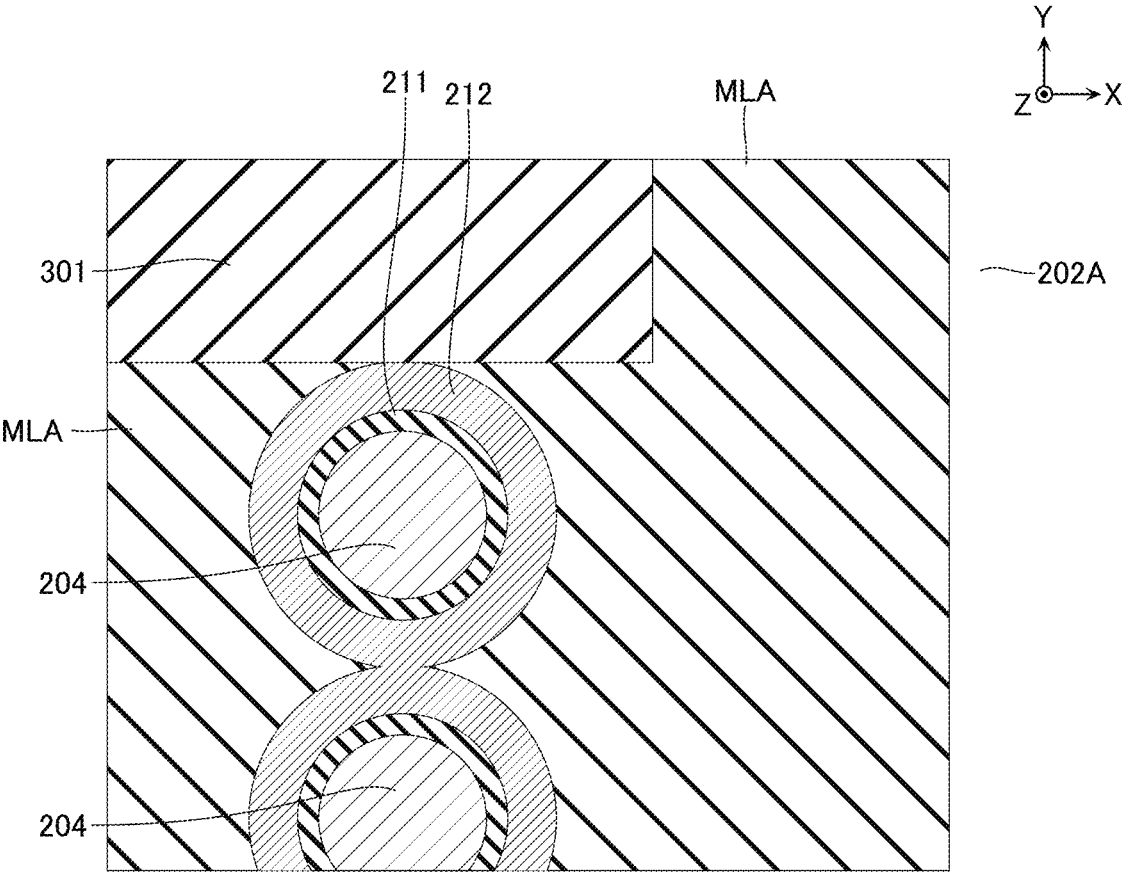
FIG. 78 is a schematic cross-sectional view for describing the manufacturing method.
Figure 79:
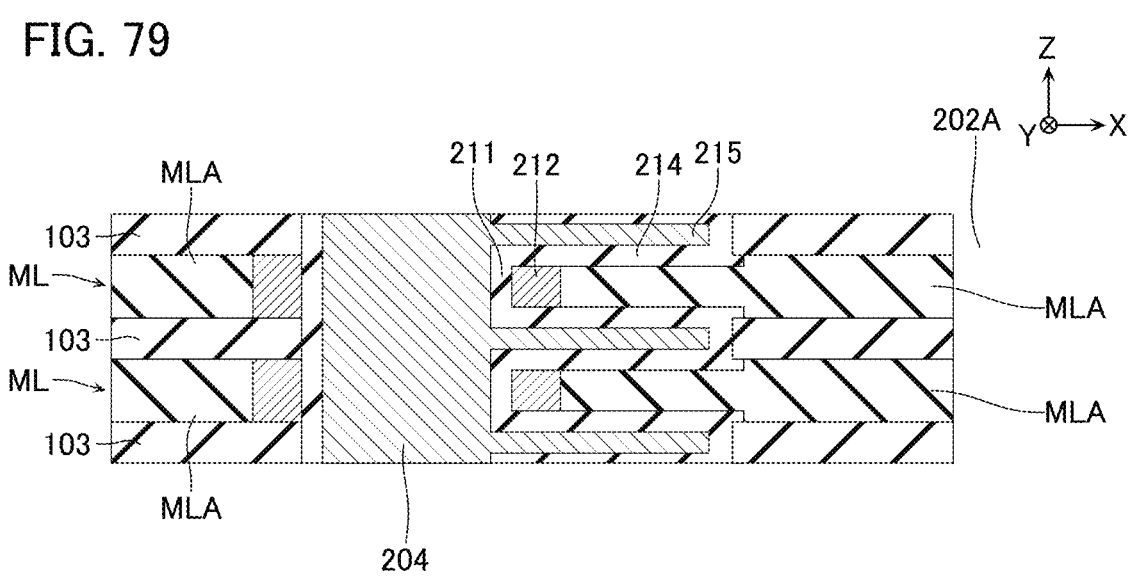
FIG. 79 is a schematic cross-sectional view for describing the manufacturing method.
Figure 80:
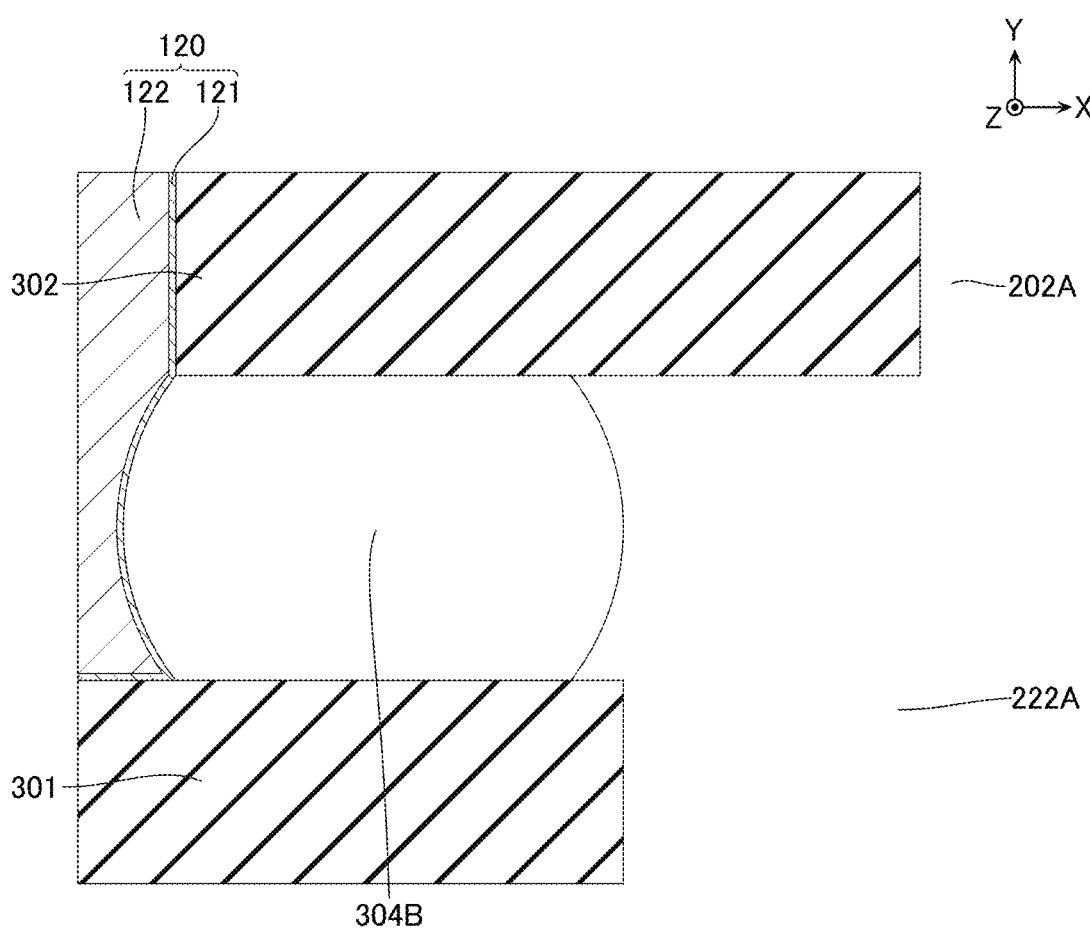
FIG. 80 is a schematic cross-sectional view for describing the manufacturing method.
Figure 81:
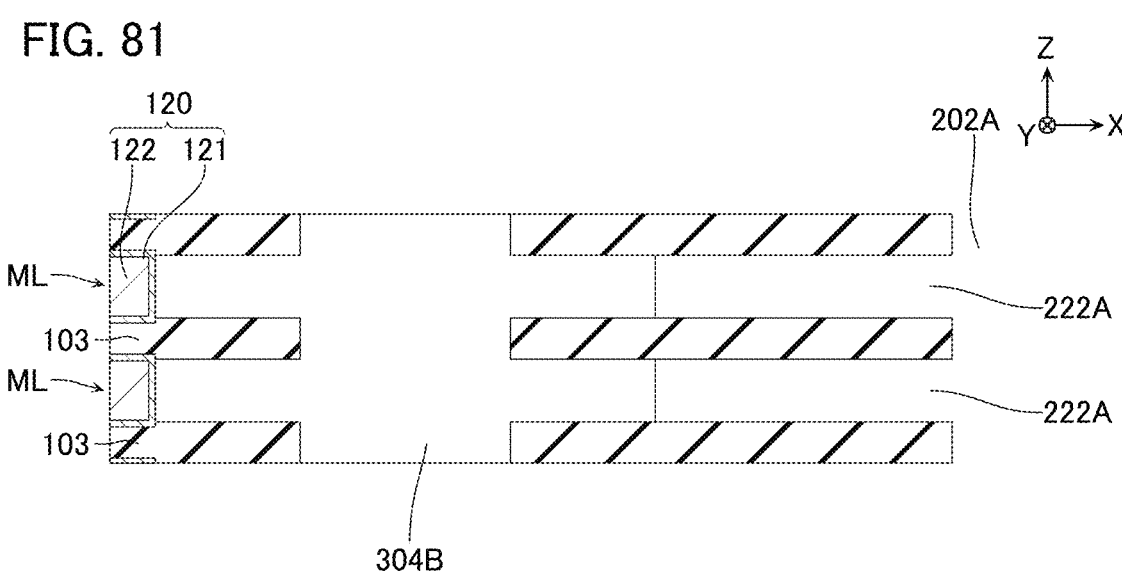
FIG. 81 is a schematic cross-sectional view for describing the manufacturing method.
Figure 82:
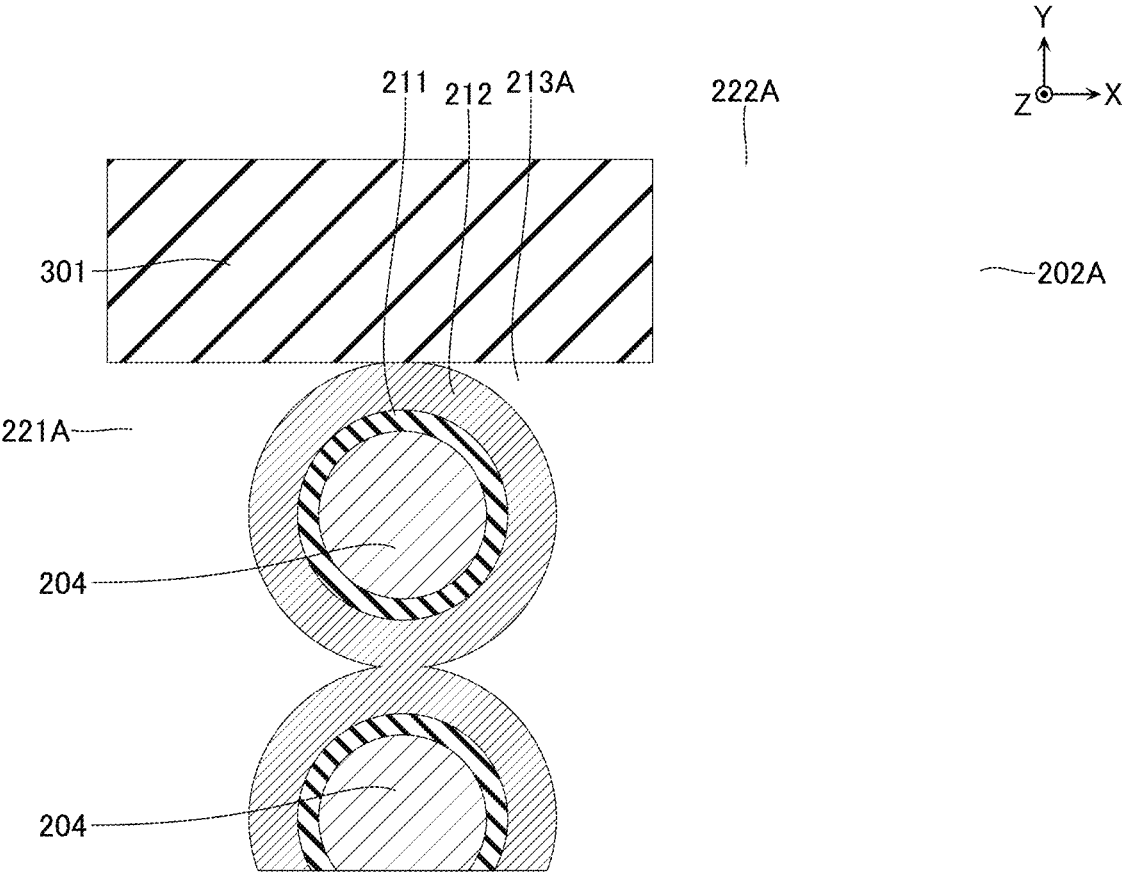
FIG. 82 is a schematic cross-sectional view for describing the manufacturing method.
Figure 83:
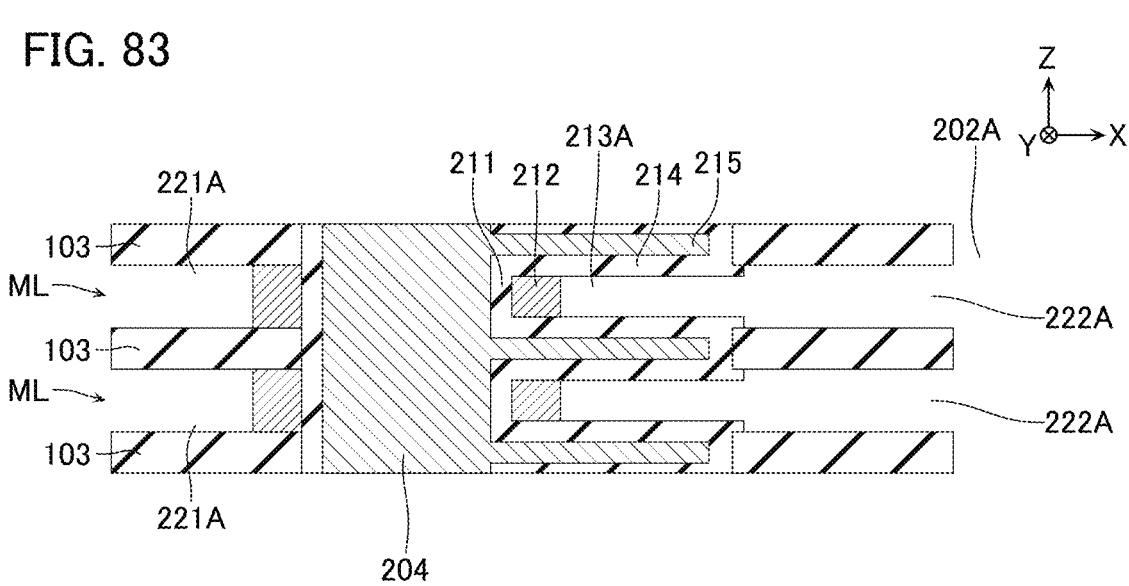
FIG. 83 is a schematic cross-sectional view for describing the manufacturing method.

Next, for example, as illustrated in FIG. 72, the sacrifice layer 215B is removed. This process is performed by, for example, wet etching.

Next, for example, as illustrated in FIG. 73, the insulating layers 211, 214, the conductive layer 215, and the via-wiring 204 are formed inside the openings 215A, 204A. This process is performed by, for example, CVD.

Next, for example, as illustrated in FIG. 74, the insulating layers 103 are formed. In this process, the sacrifice layers 103B are removed by a method, such as wet etching. The insulating layers 103 are formed by a method, such as CVD.

Next, for example, as illustrated in FIG. 75 to FIG. 79, openings 202A are formed at positions corresponding to the insulating layers 202. The opening 202A extends in the Y-direction and the Z-direction, penetrates the plurality of insulating layers 103 and the plurality of sacrifice layers MLA arranged in the Z-direction, and separates these configurations in the X-direction. This process is performed by, for example, RIE.

Next, for example, as illustrated in FIG. 80 to FIG. 83, openings 221A, 222A, 213A are formed at positions corresponding to the conductive layers 221, 222 and the semiconductor layers 213. A part of the upper surface and a part of the lower surface of the insulating layer 103, a side surface of the conductive layer 212 on one side in the X-direction, and a part of side surfaces of the insulating layers 301, 402 on one side in the Y-direction are exposed inside the opening 221A. A part of the upper surface and a part of the lower surface of the insulating layer 103, a side surface of the sacrifice layer 304B on one side in the X-direction, and a part of the side surfaces of the insulating layers 301, 402 on one side in the Y-direction are exposed inside the opening 222A. A part of an upper surface and a part of a lower surface of the insulating layer 214, a side surface of the conductive layer 212 on the other side in the X-direction, and a part of the side surfaces of the insulating layers 301, 402 on one side in the Y-direction are exposed inside the opening 213A. In this process, for example, a part of the sacrifice layer MLA is selectively removed via the openings 201A, 202A. This process is performed by, for example, wet etching.

Figure 84:
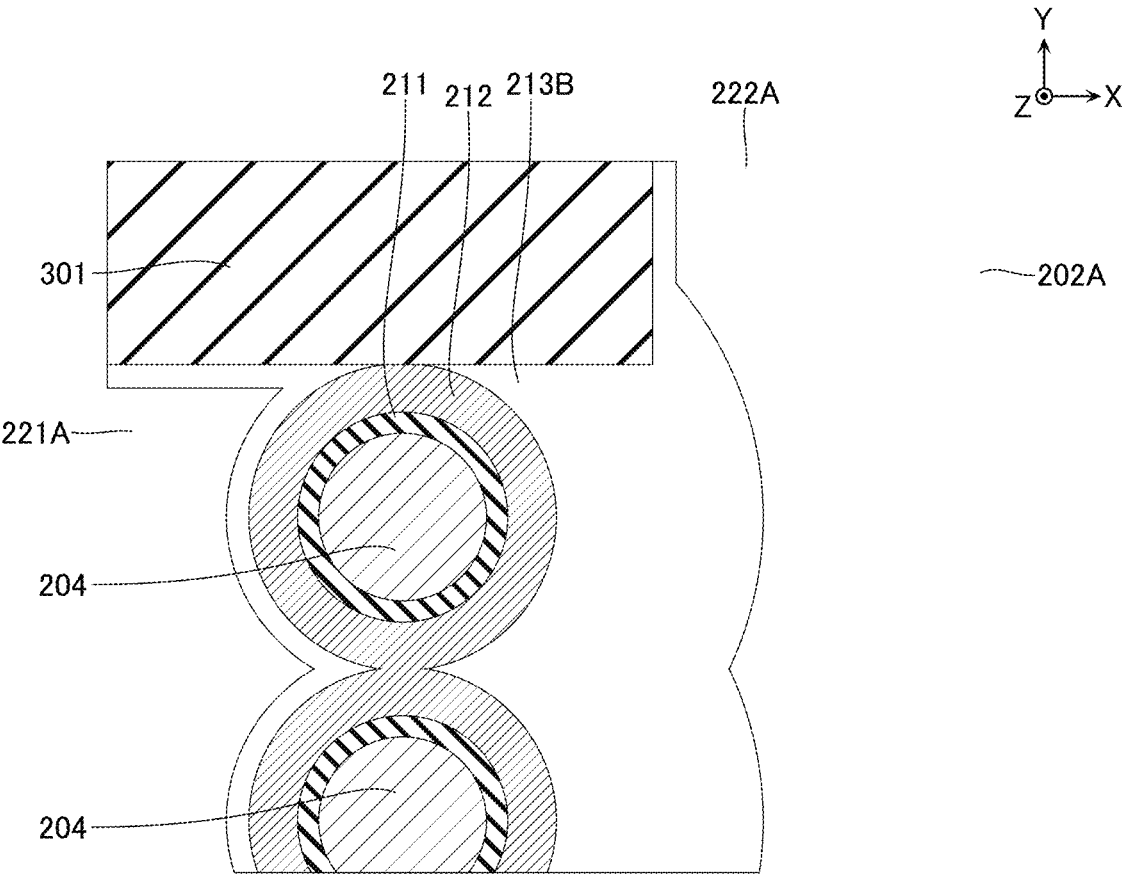
FIG. 84 is a schematic cross-sectional view for describing the manufacturing method.
Figure 85:
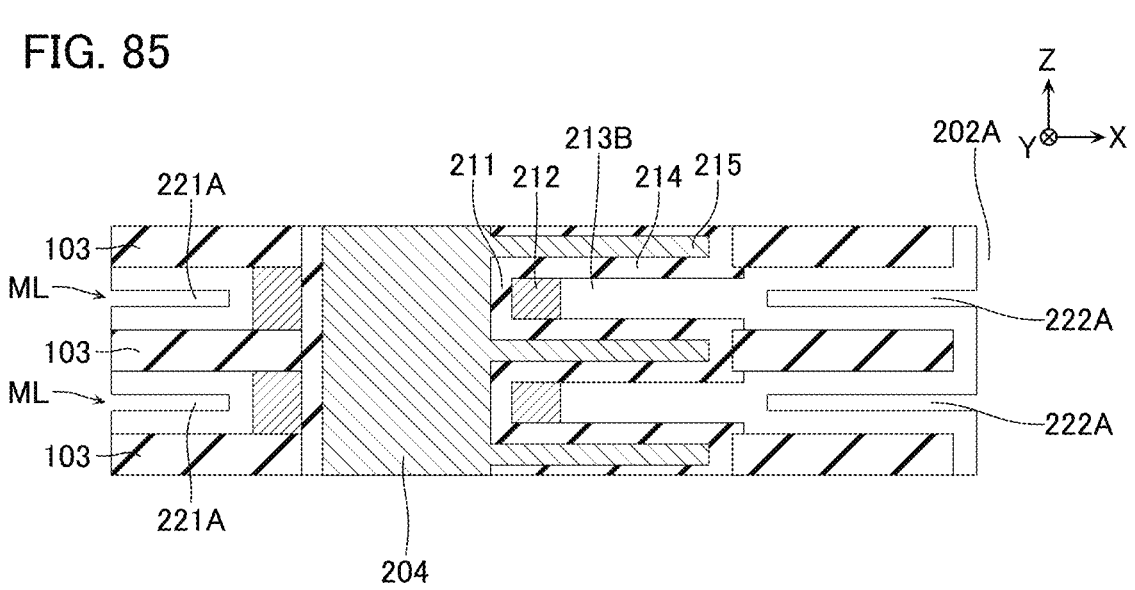
FIG. 85 is a schematic cross-sectional view for describing the manufacturing method.

Next, for example, as illustrated in FIG. 84 and FIG. 85, a semiconductor layer 213B is formed inside the openings 213A, 222A, 202A, 221A, 201A. The opening 213A is filled with the semiconductor layer 213B, and the openings 222A, 221A, 202A, 201A are not filled with the semiconductor layer 213B. This process is performed by, for example, CVD.

Figure 86:
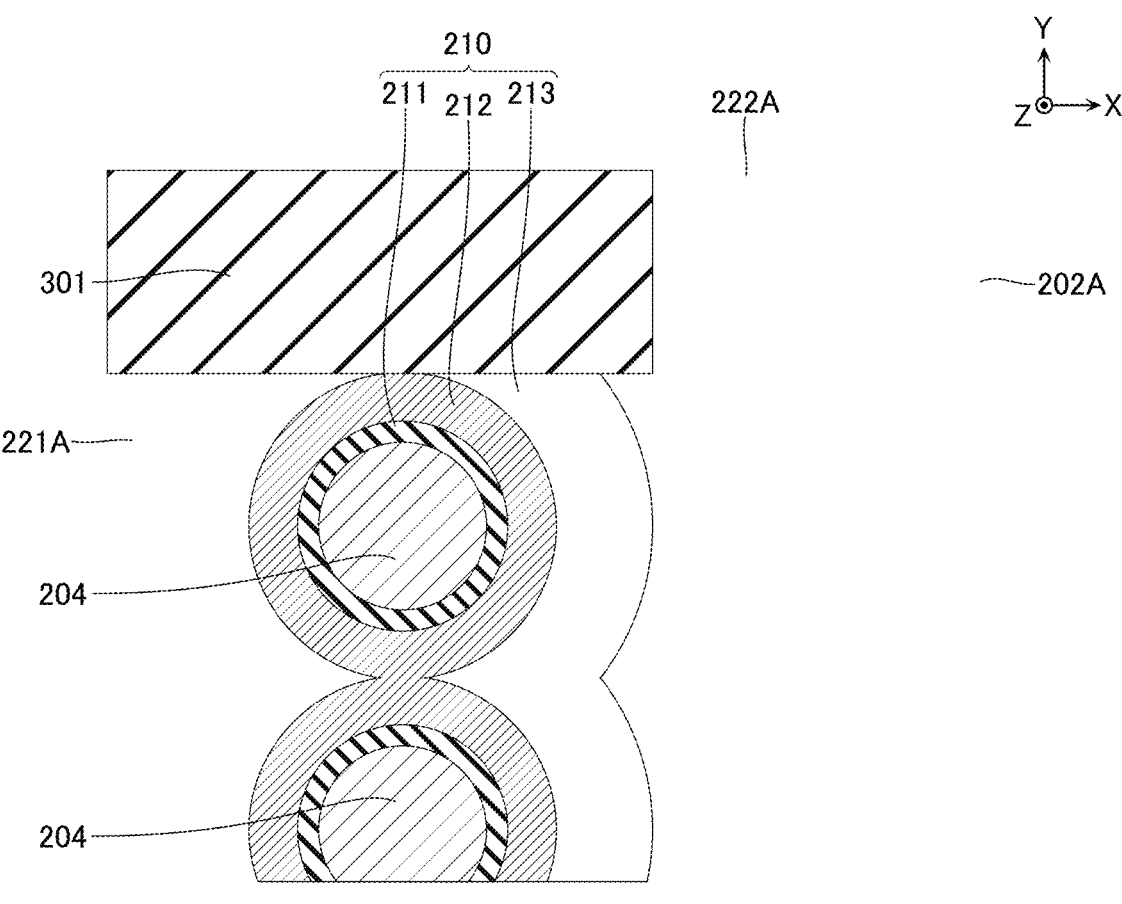
FIG. 86 is a schematic cross-sectional view for describing the manufacturing method.
Figure 87:
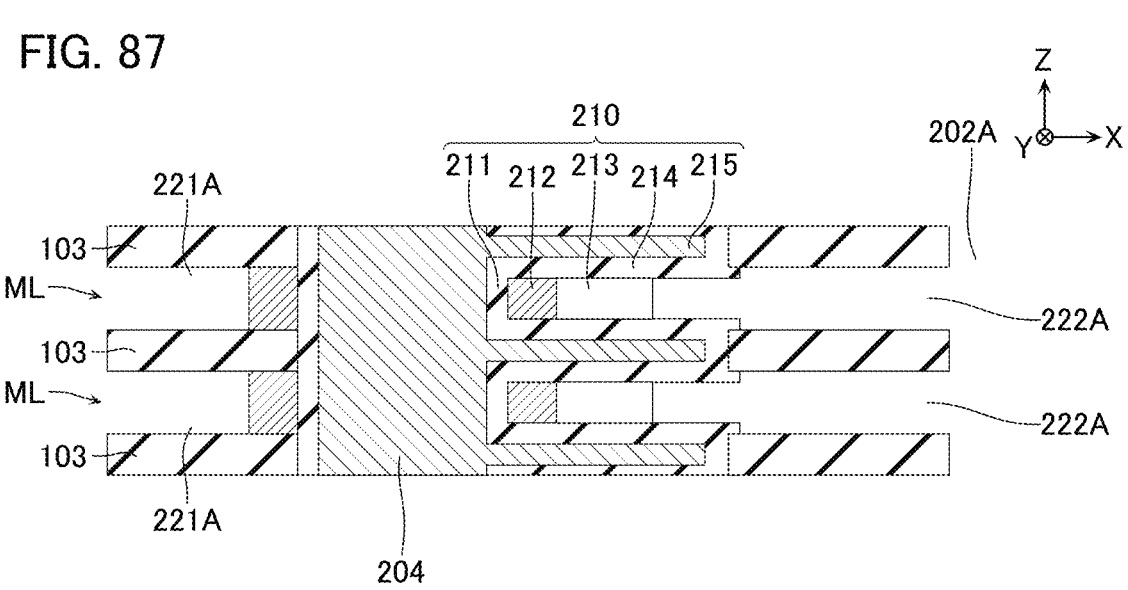
FIG. 87 is a schematic cross-sectional view for describing the manufacturing method.
Figure 88:
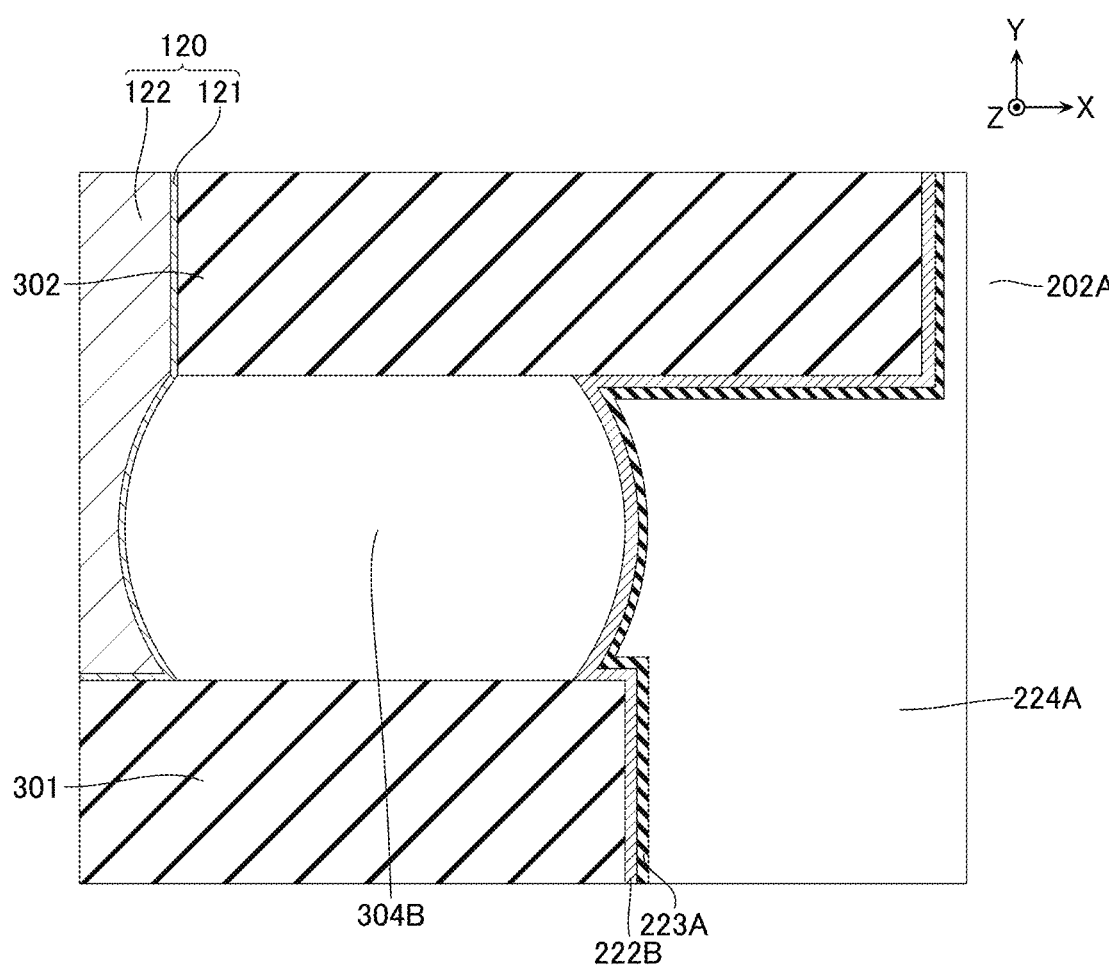
FIG. 88 is a schematic cross-sectional view for describing the manufacturing method.
Figure 89:
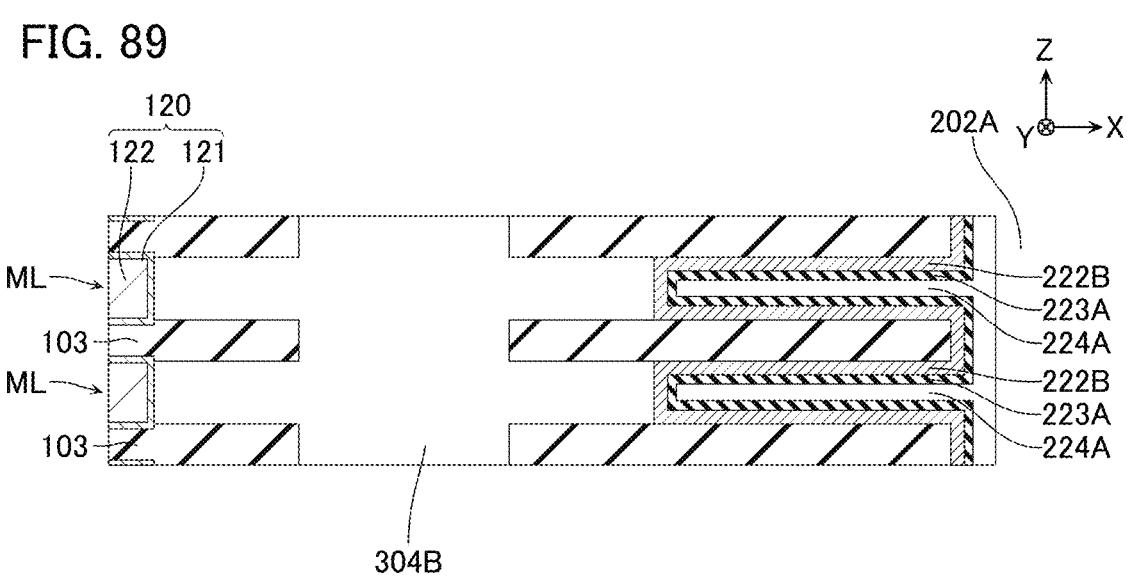
FIG. 89 is a schematic cross-sectional view for describing the manufacturing method.
Figure 90:
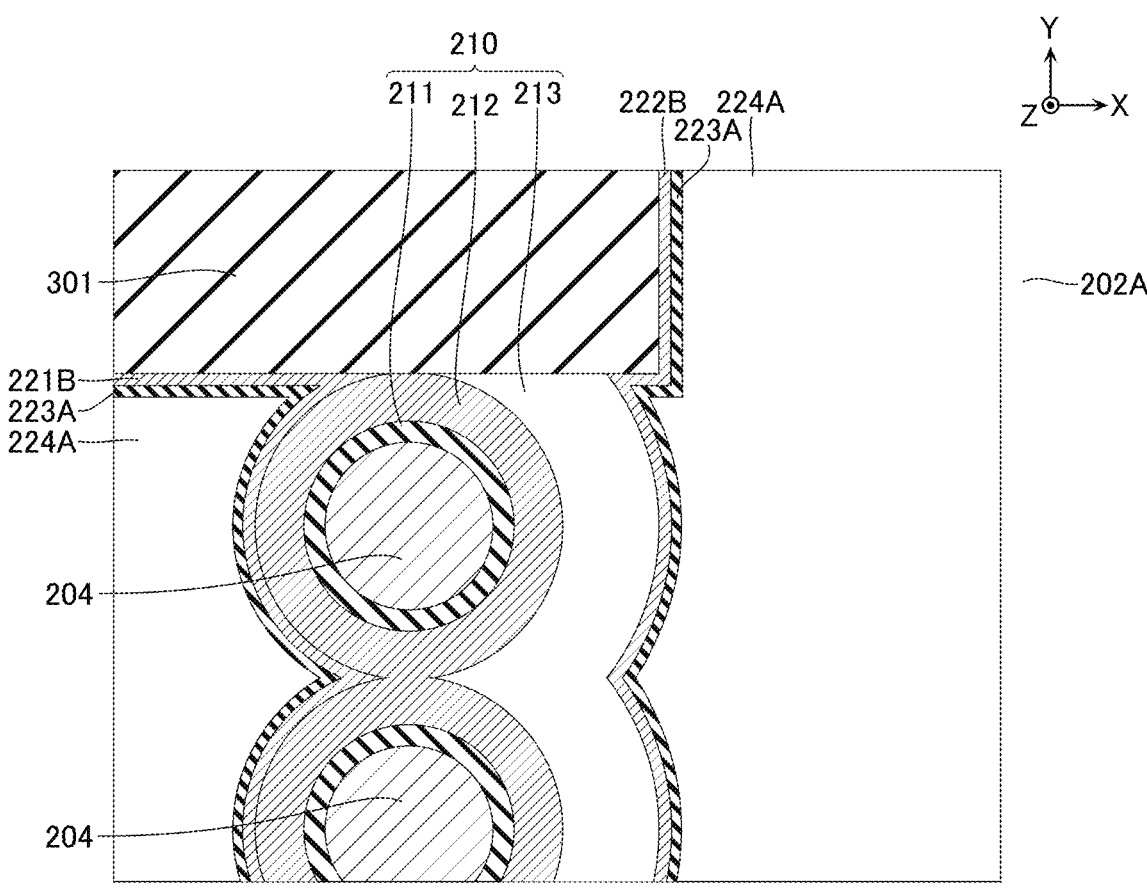
FIG. 90 is a schematic cross-sectional view for describing the manufacturing method.
Figure 91:
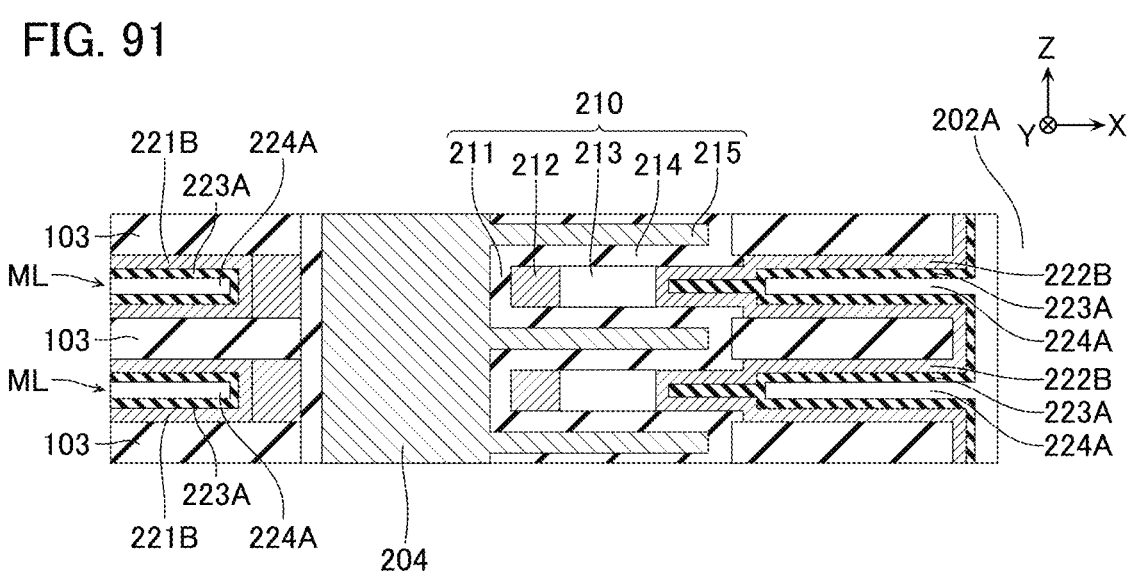
FIG. 91 is a schematic cross-sectional view for describing the manufacturing method.
Figure 92:
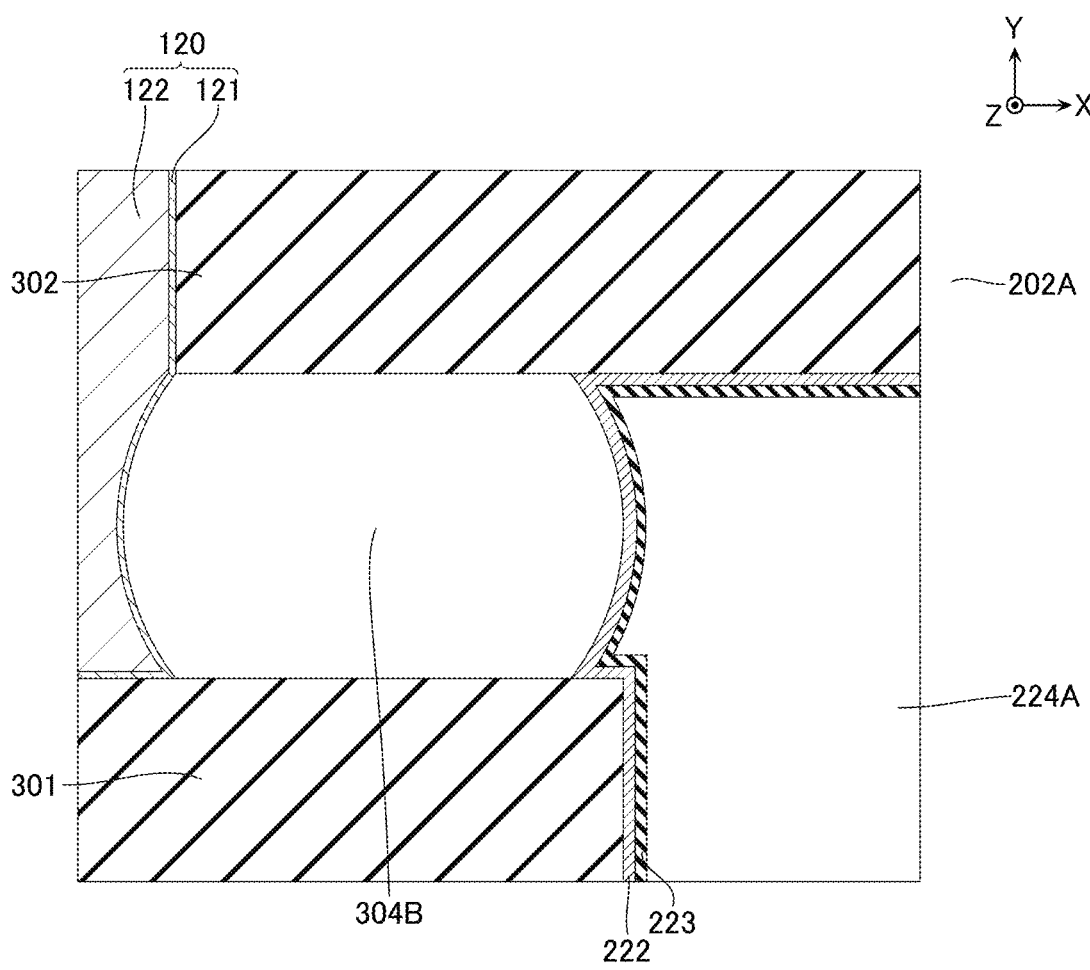
FIG. 92 is a schematic cross-sectional view for describing the manufacturing method.
Figure 93:
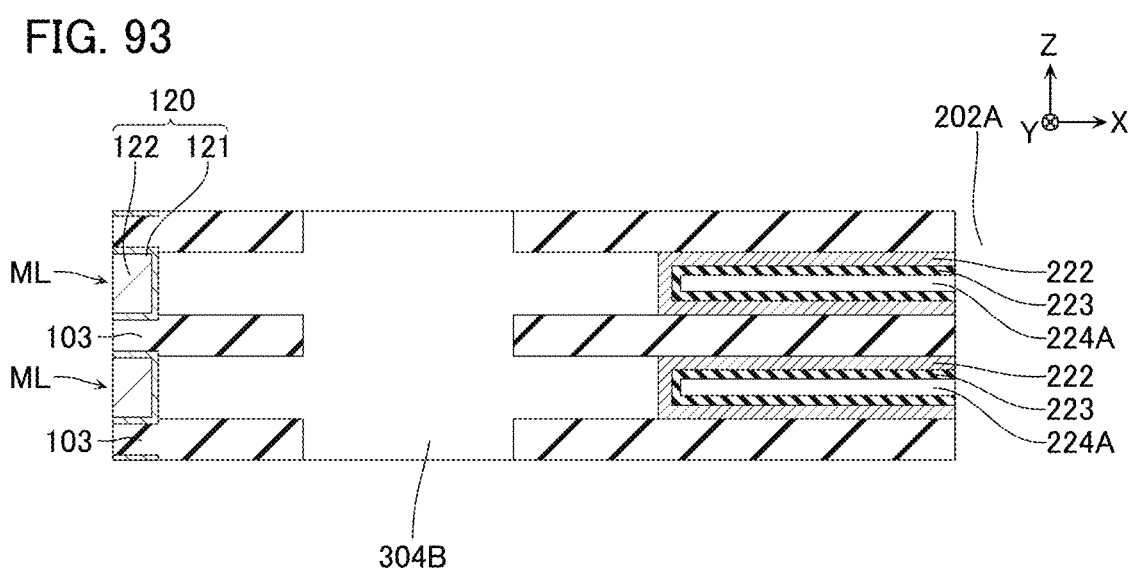
FIG. 93 is a schematic cross-sectional view for describing the manufacturing method.
Figure 94:
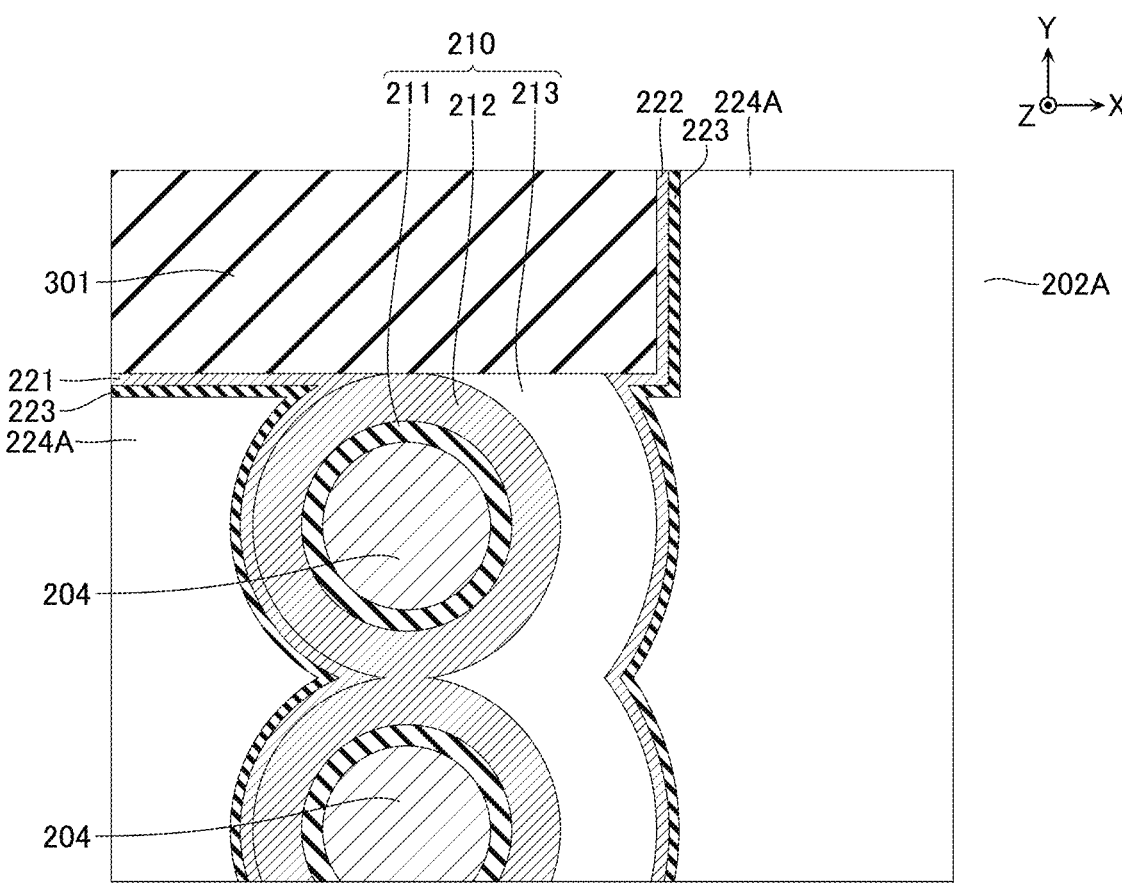
FIG. 94 is a schematic cross-sectional view for describing the manufacturing method.
Figure 95:
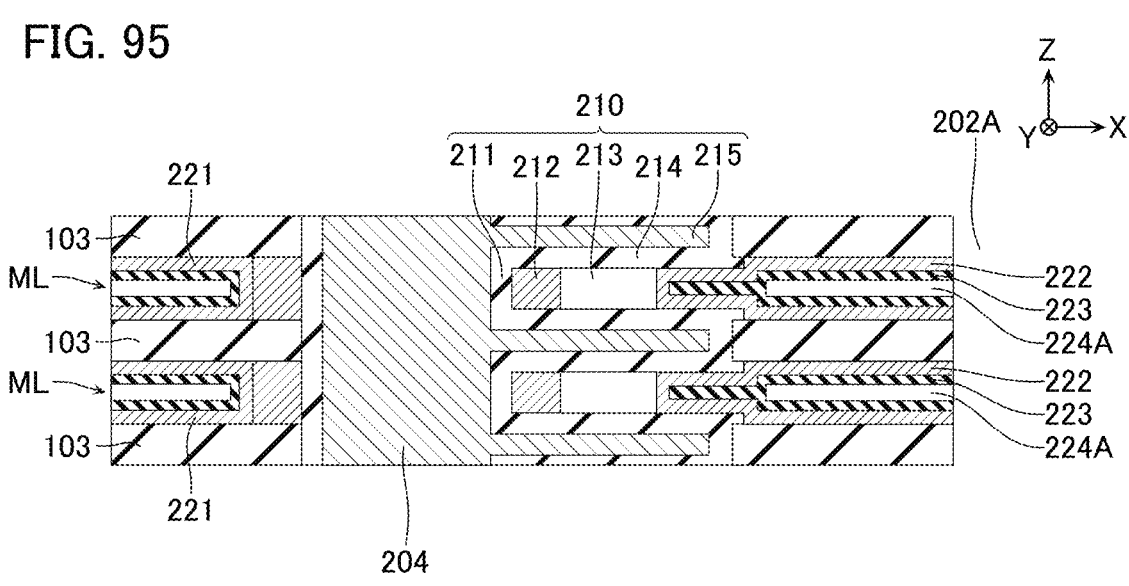
FIG. 95 is a schematic cross-sectional view for describing the manufacturing method.
Figure 96:
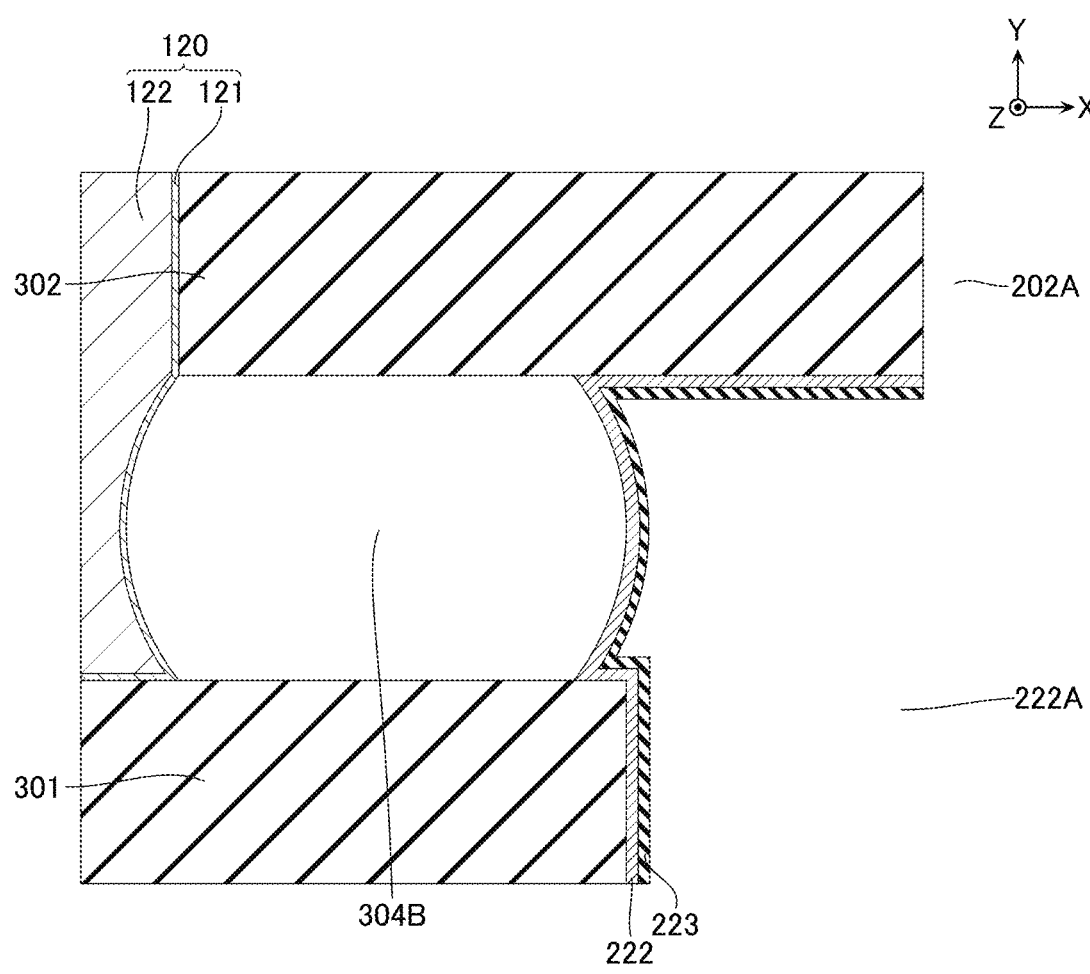
FIG. 96 is a schematic cross-sectional view for describing the manufacturing method.
Figure 97:
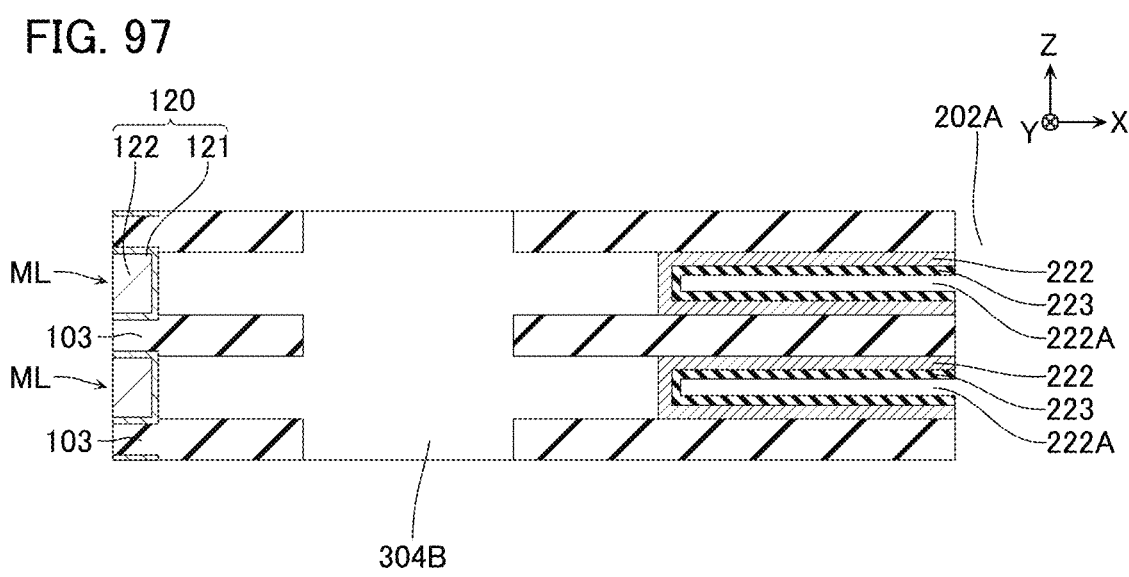
FIG. 97 is a schematic cross-sectional view for describing the manufacturing method.
Figure 98:
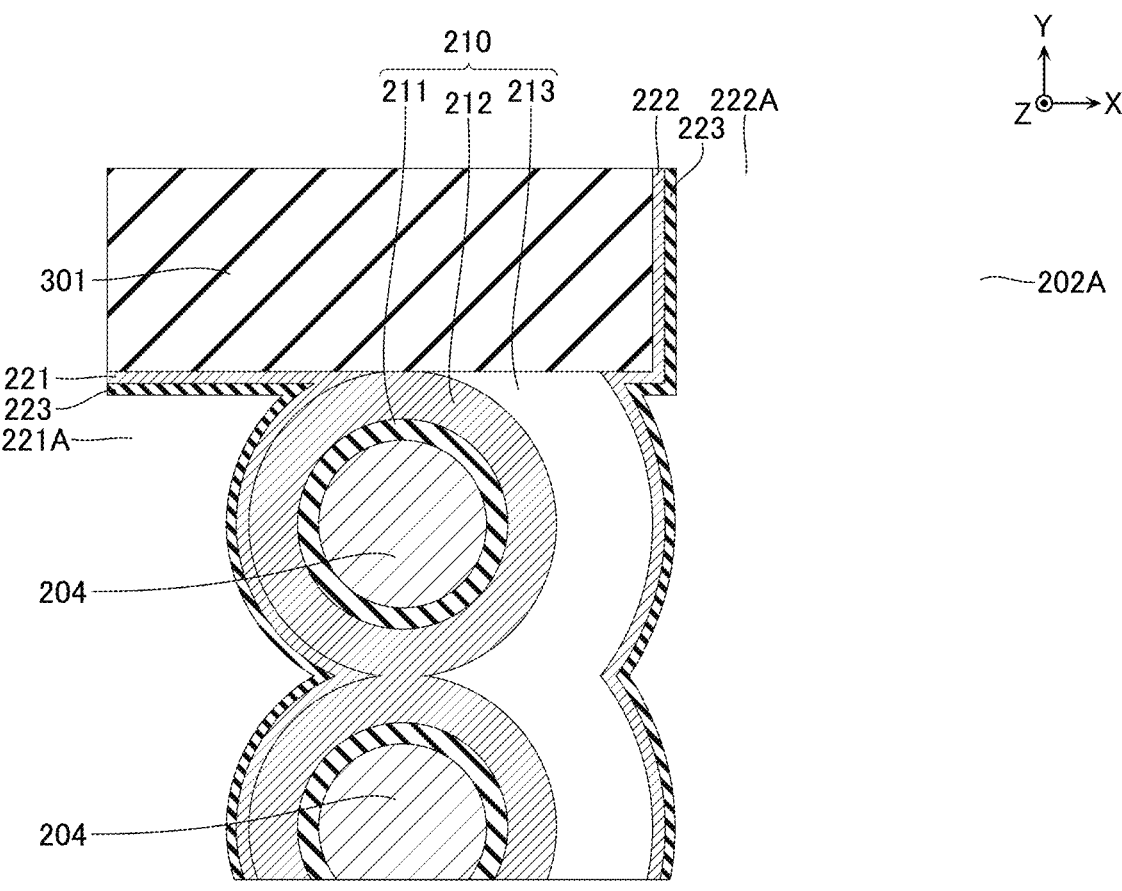
FIG. 98 is a schematic cross-sectional view for describing the manufacturing method.
Figure 99:
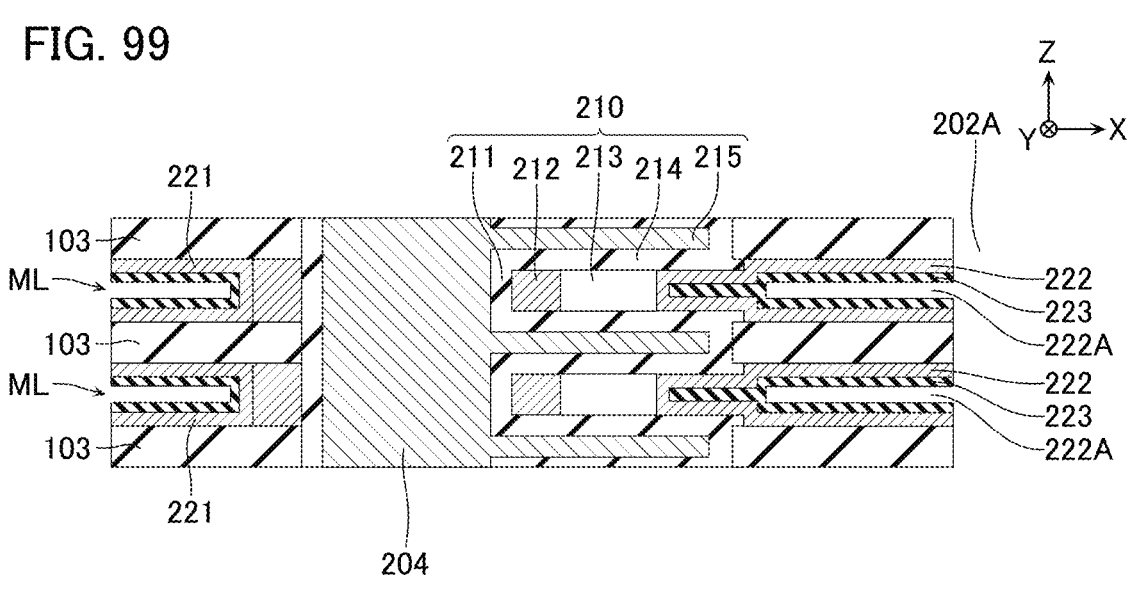
FIG. 99 is a schematic cross-sectional view for describing the manufacturing method.

Next, for example, as illustrated in FIG. 86 and FIG. 87, the semiconductor layer 213 is formed. In this process, the semiconductor layer 213B is partially removed by a method, such as wet etching. Specifically, in the semiconductor layer 213B, a part formed inside the opening 213A is left, and other parts are removed.

Next, for example, as illustrated in FIG. 88 to FIG. 91, a conductive layer 222B, an insulating layer 223A, and a sacrifice layer 224A are formed inside the openings 222A, 202A. The conductive layer 222B is formed on a part of the upper surface, a part of the lower surface, and an exposed surface to the opening 202A of the insulating layer 103, an exposed surface of the sacrifice layer 304B to the opening 222A, a part of the upper surface and a part of the lower surface of the insulating layer 214, the side surface of the semiconductor layer 213 on one side in the X-direction, and the side surfaces of the insulating layers 301, 402 on one side in the Y-direction. The opening 222A is filled with the insulating layer 223A and the sacrifice layer 224A, and the opening 202A is not filled with the insulating layer 223A or the sacrifice layer 224A. This process is performed by, for example, ALD and CVD.

A conductive layer 221B, an insulating layer 223A, and a sacrifice layer 224A are formed inside the openings 221A, 201A. The conductive layer 221B is formed on a part of the upper surface, a part of the lower surface, and an exposed surface to the opening 201A of the insulating layer 103, the side surface of the conductive layer 212 on one side in the X-direction, and the side surfaces of the insulating layers 301, 402 on one side in the Y-direction. The opening 221A is filled with the insulating layer 223A and the sacrifice layer 224A, and the opening 201A is not filled with the insulating layer 223A or the sacrifice layer 224A. This process is performed by, for example, ALD and CVD.

Next, as illustrated in FIG. 92 to FIG. 95, the conductive layers 221, 222 and the insulating layer 223 are formed. In this process, in the conductive layers 221B, 222B, the insulating layer 223A, and the sacrifice layer 224A, parts formed on exposed surfaces of the insulating layer 103 to the openings 201A, 202A are removed to expose the insulating layer 103 to the openings 201A, 202A. Consequently, the conductive layers 221B, 222B and the insulating layer 223A are separated in the Z-direction, and the conductive layers 221, 222 and the insulating layer 223 are formed. This process is performed by, for example, wet etching.

Next, as illustrated in FIG. 96 to FIG. 99, the sacrifice layer 224A is removed. This process is performed by, for example, wet etching. Furthermore, an insulating layer 224 is formed inside the openings 221A, 222A.

Figure 100:
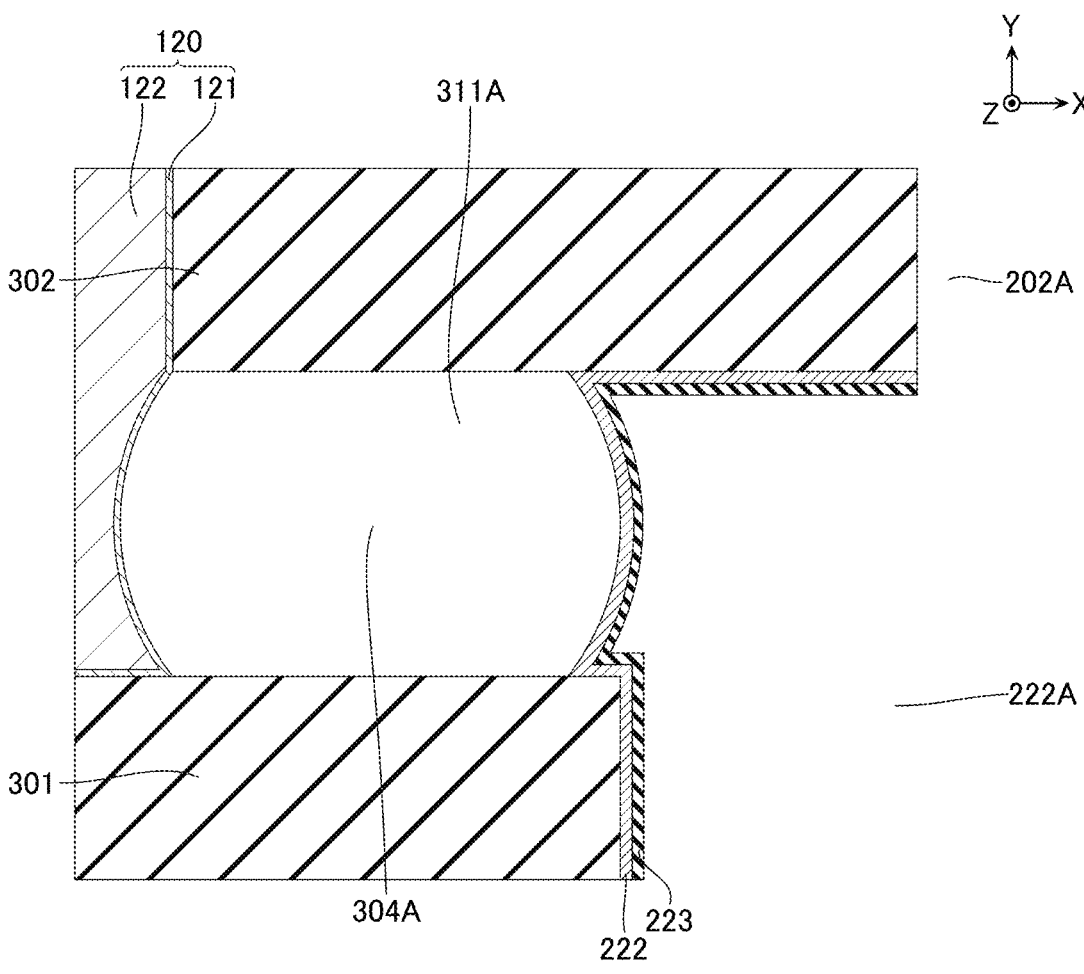
FIG. 100 is a schematic cross-sectional view for describing the manufacturing method.
Figure 101:
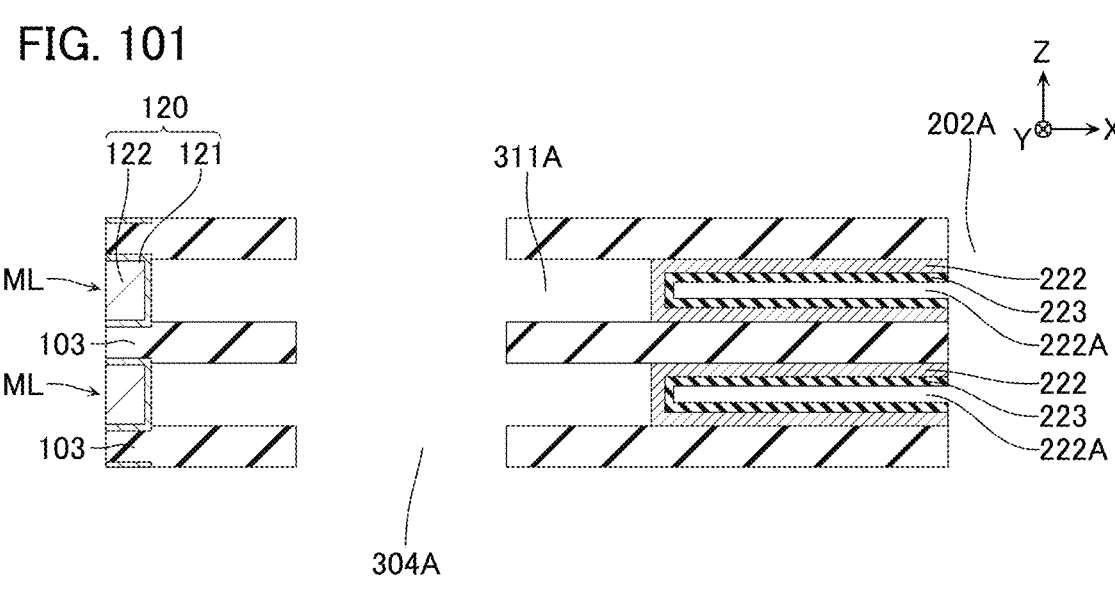
FIG. 101 is a schematic cross-sectional view for describing the manufacturing method.

Next, as illustrated in FIG. 100 and FIG. 101, the sacrifice layer 304B is removed. This process is performed by, for example, wet etching.

Figure 102:
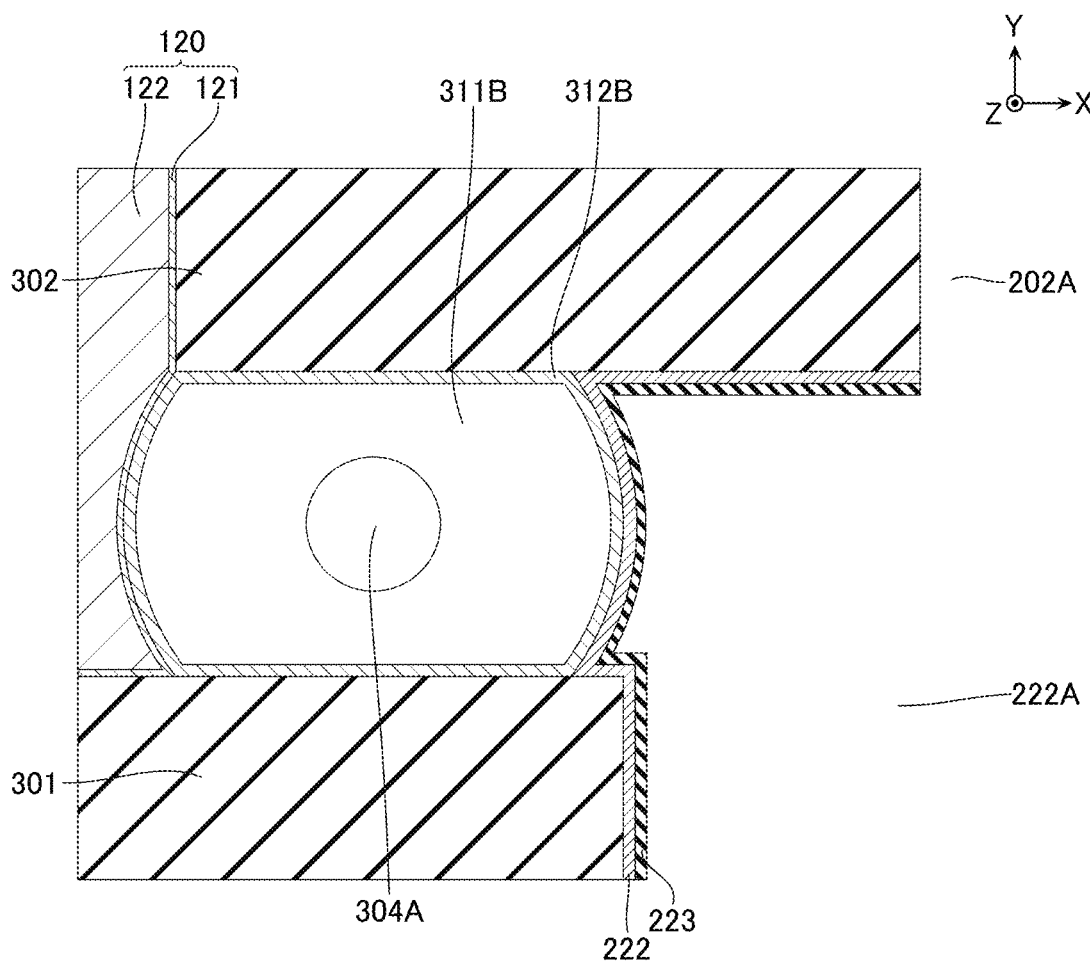
FIG. 102 is a schematic cross-sectional view for describing the manufacturing method.
Figure 103:
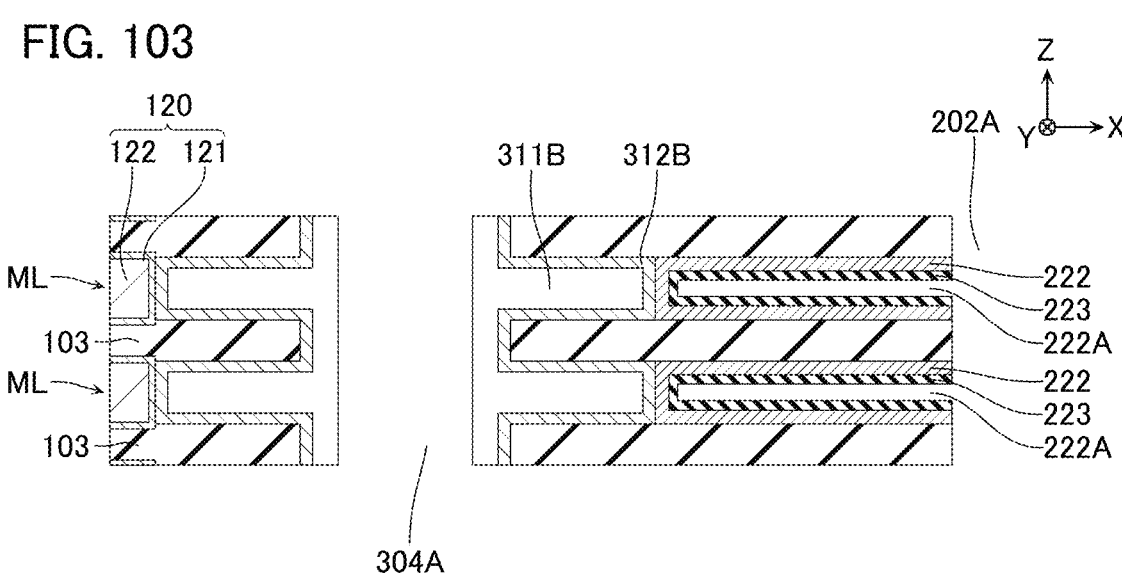
FIG. 103 is a schematic cross-sectional view for describing the manufacturing method.

Next, for example, as illustrated in FIG. 102 and FIG. 103, a conductive layer 312B and a semiconductor layer 311B are formed inside openings 311A, 304A. The conductive layer 312B is formed on a part of the upper surface, a part of the lower surface, and an exposed surface to the opening 304A of the insulating layer 103, a side surface of the conductive layer 222 on one side in the X-direction, and the side surface of the conductive layer 120 on one side in the X-direction. The opening 311A is filled with the semiconductor layer 311B, and the opening 304A is not filled with the semiconductor layer 311B. This process is performed by, for example, CVD.

Figure 104:
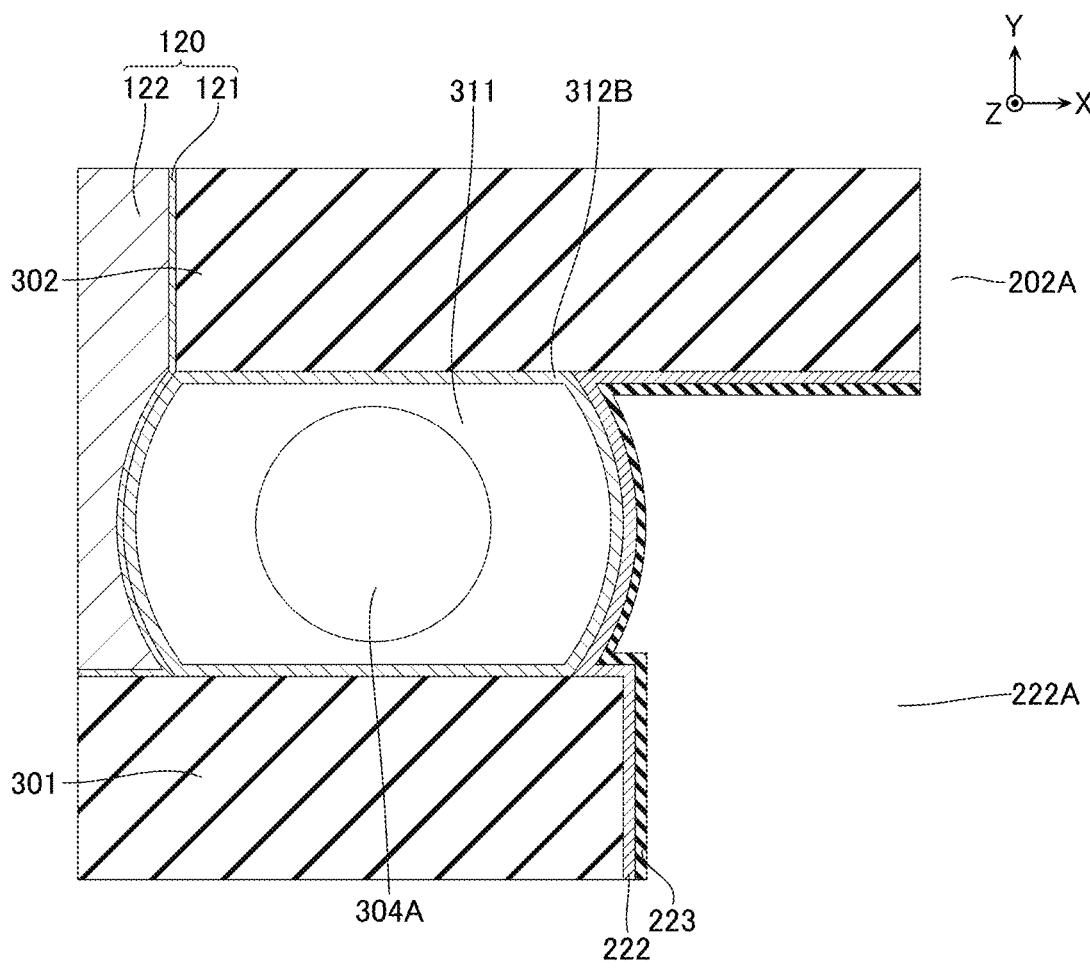
FIG. 104 is a schematic cross-sectional view for describing the manufacturing method.
Figure 105:
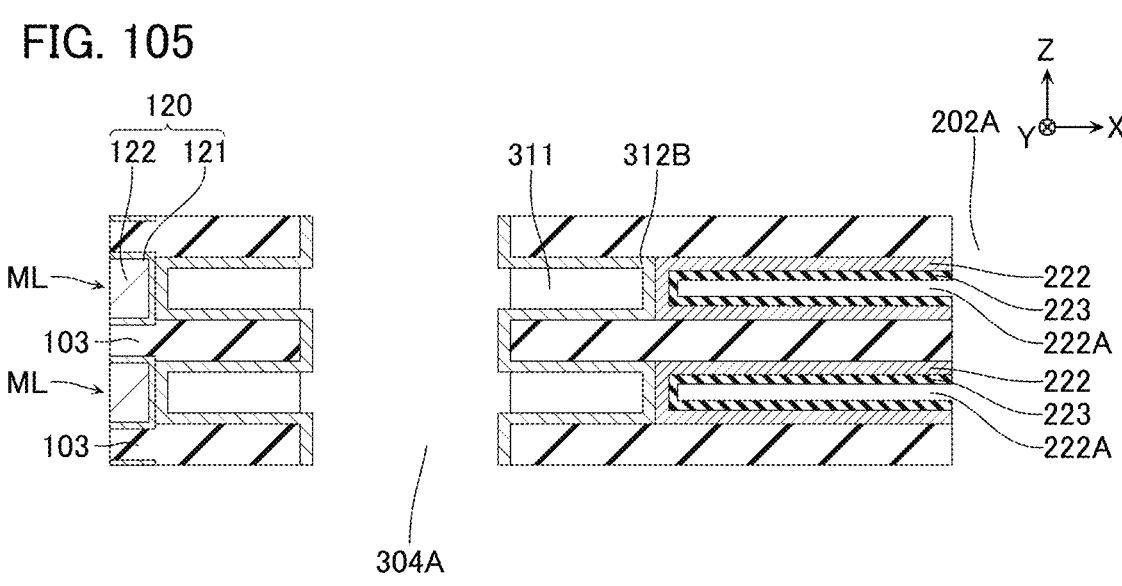
FIG. 105 is a schematic cross-sectional view for describing the manufacturing method.

Next, as illustrated in FIG. 104 and FIG. 105, the semiconductor layer 311 is formed. In this process, in the semiconductor layer 311B, a part formed on an inner peripheral surface of the insulating layer 103 facing the opening 304A is removed to expose a part of the conductive layer 312B to the opening 304A. Consequently, the semiconductor layer 311B is separated in the Z-direction, thus forming the plurality of semiconductor layers 311 arranged in the Z-direction. This process is performed by, for example, wet etching.

Figure 106:
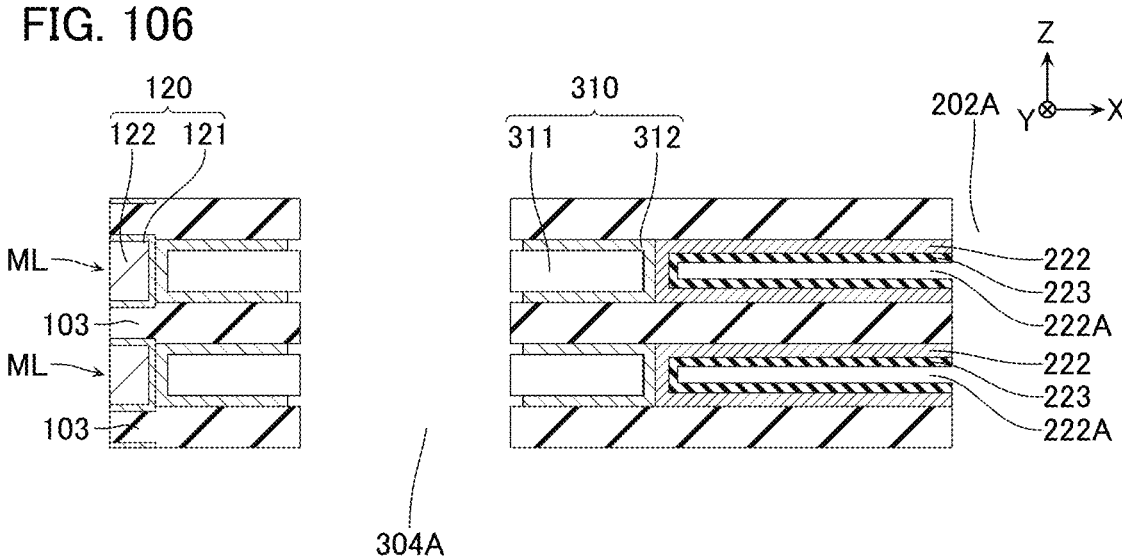
FIG. 106 is a schematic cross-sectional view for describing the manufacturing method.

Next, as illustrated in FIG. 106, the conductive layer 312 is formed. In this process, in the conductive layer 312B, a part formed on the inner peripheral surface of the insulating layer 103 facing the opening 304A is removed to expose the insulating layer 103 to the opening 304A. Consequently, the conductive layer 312B is separated in the Z-direction, thus forming the plurality of conductive layers 312 arranged in the Z-direction. This process is performed by, for example, wet etching. Furthermore, the insulating layer 304 is formed inside the opening 304A.

Figure 107:
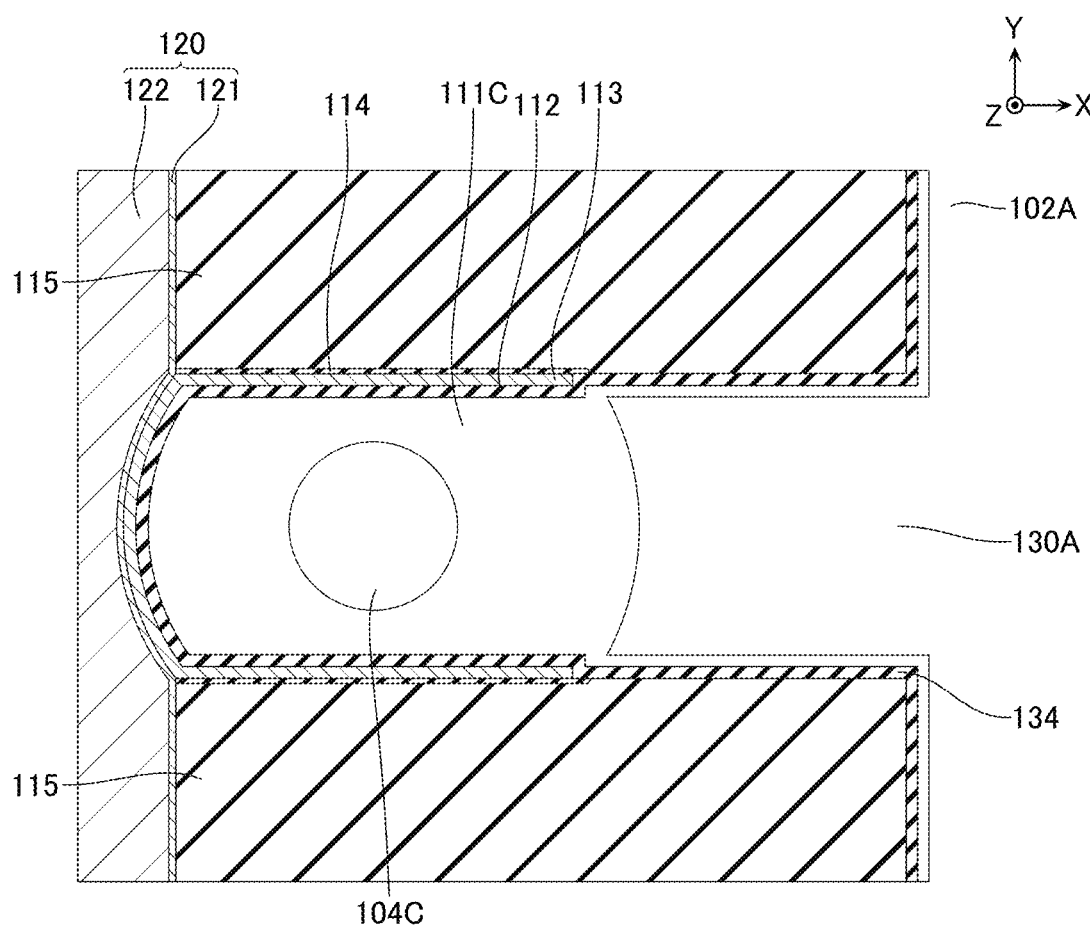
FIG. 107 is a schematic cross-sectional view for describing the manufacturing method.
Figure 108:
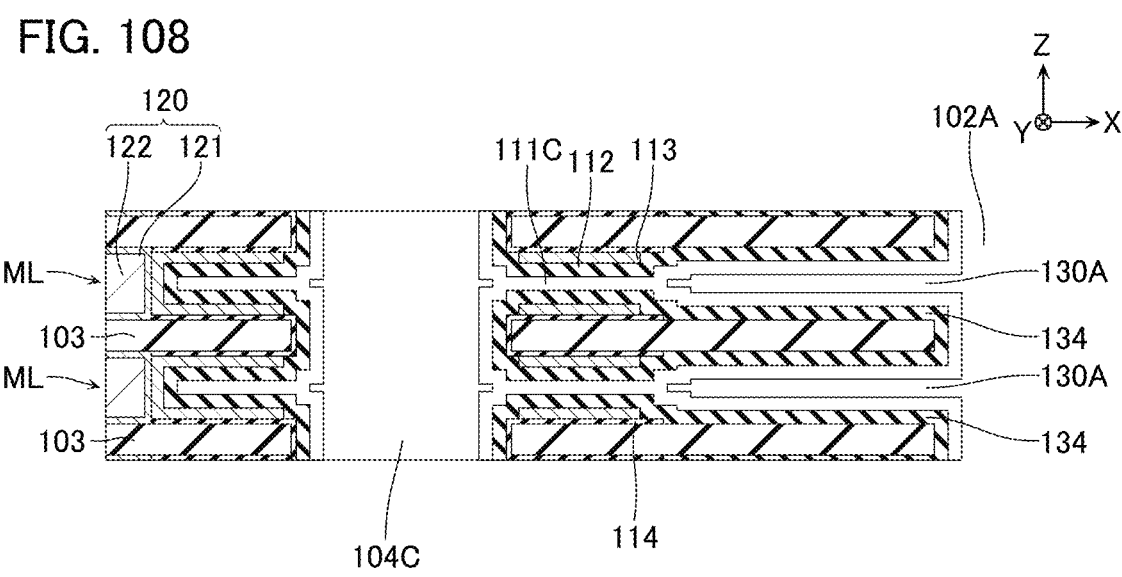
FIG. 108 is a schematic cross-sectional view for describing the manufacturing method.

Next, for example, as illustrated in FIG. 107 and FIG. 108, the sacrifice layer 102B is removed. This process is performed by, for example, wet etching.

Figure 109:
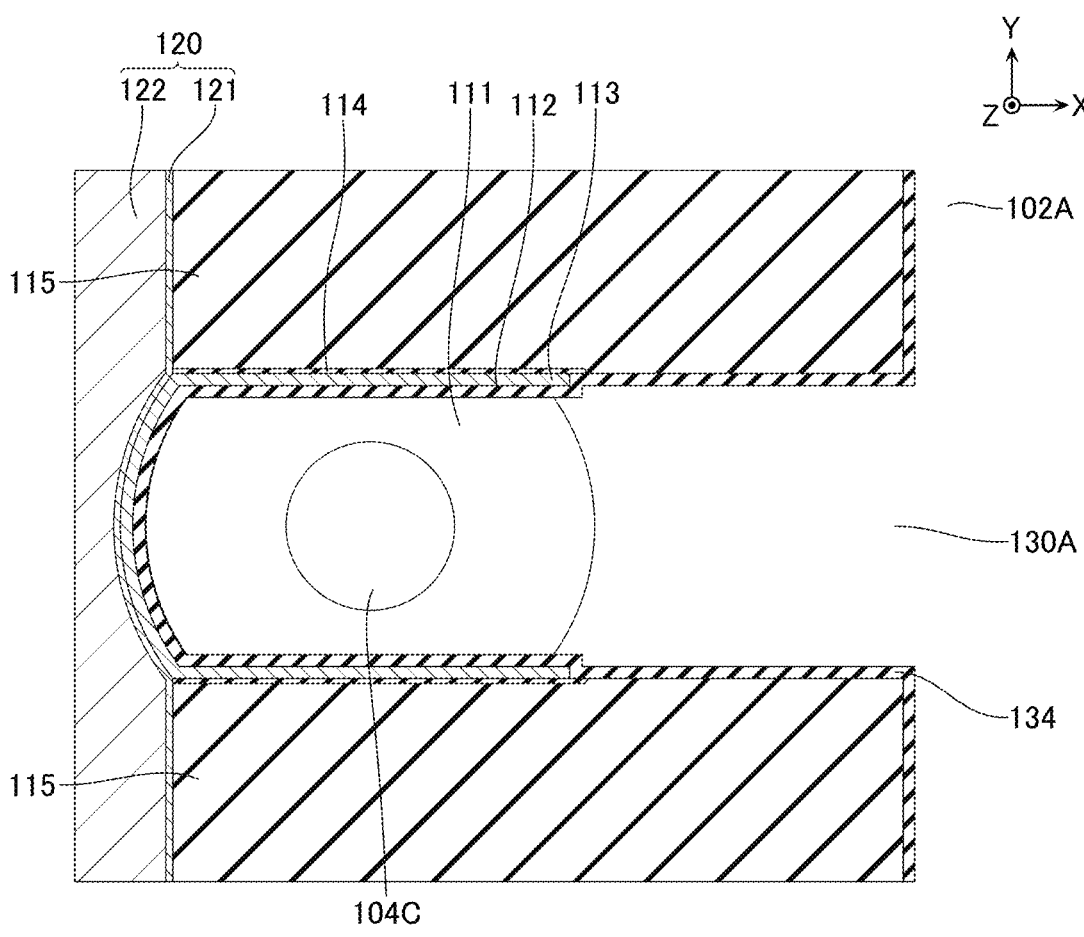
FIG. 109 is a schematic cross-sectional view for describing the manufacturing method.
Figure 110:
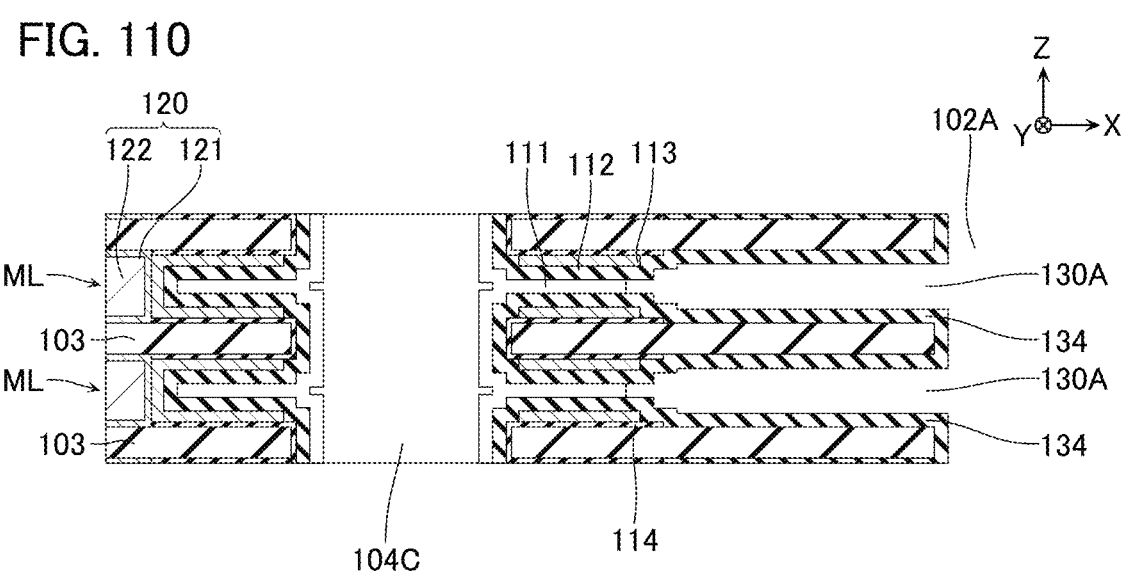
FIG. 110 is a schematic cross-sectional view for describing the manufacturing method.

Next, for example, as illustrated in FIG. 109 and FIG. 110, the semiconductor layer 111 is formed. In this process, a part of the semiconductor layer 111C formed on exposed surfaces of the insulating layer 134 to the openings 130A, 102A is removed, thus separating the semiconductor layer 111C in the Y-direction. This process is performed by, for example, wet etching.

Figure 111:
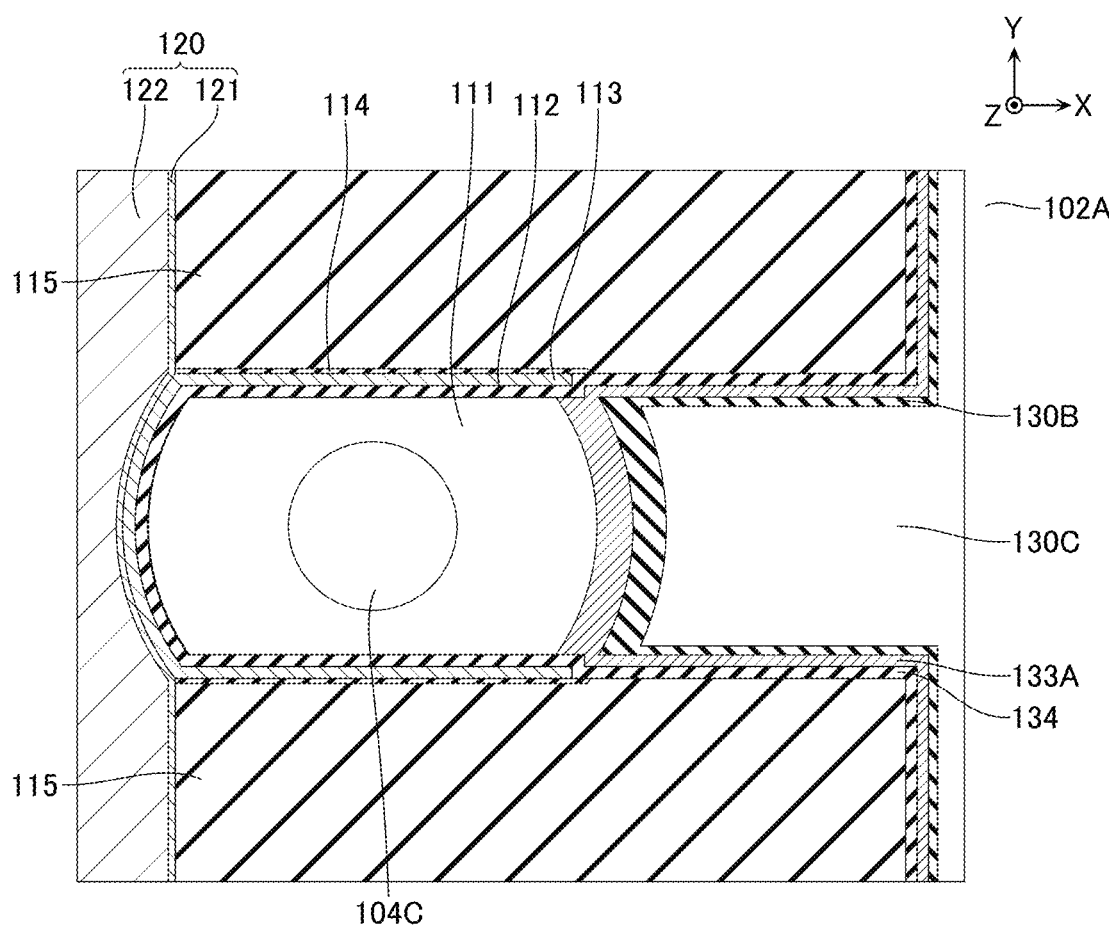
FIG. 111 is a schematic cross-sectional view for describing the manufacturing method.
Figure 112:
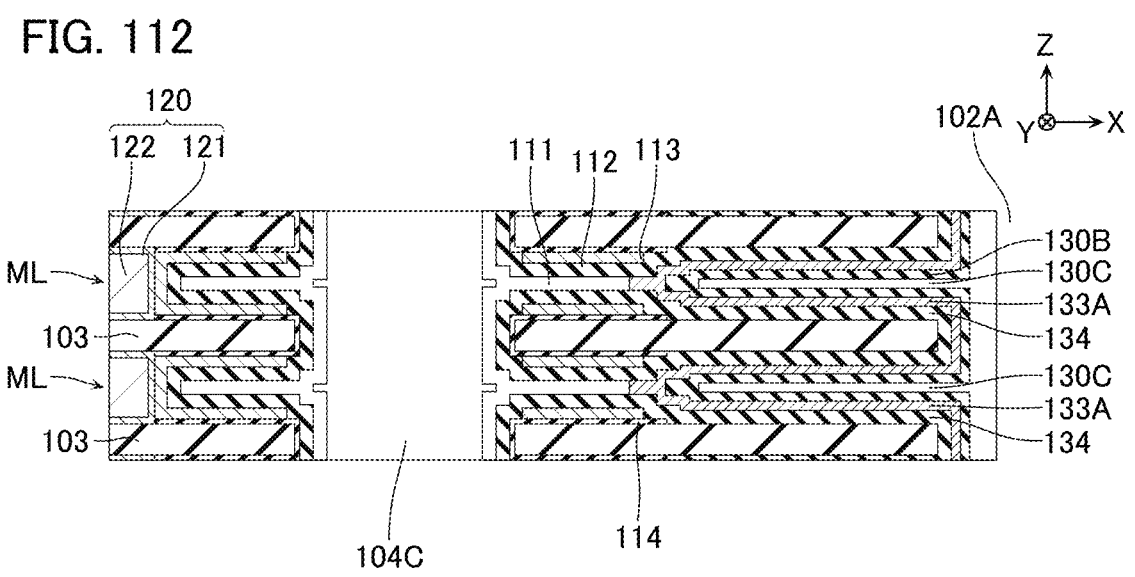
FIG. 112 is a schematic cross-sectional view for describing the manufacturing method.

Next, for example, as illustrated in FIG. 111 and FIG. 112, a conductive layer 133A, an insulating layer 130B, and a sacrifice layer 130C are formed on a side surface on one side in the X-direction (side surface on the opening 102A side) of the semiconductor layer 111 and exposed surfaces of the insulating layer 134 to the openings 130A, 102A. This process is performed by, for example, ALD and CVD.

Figure 113:
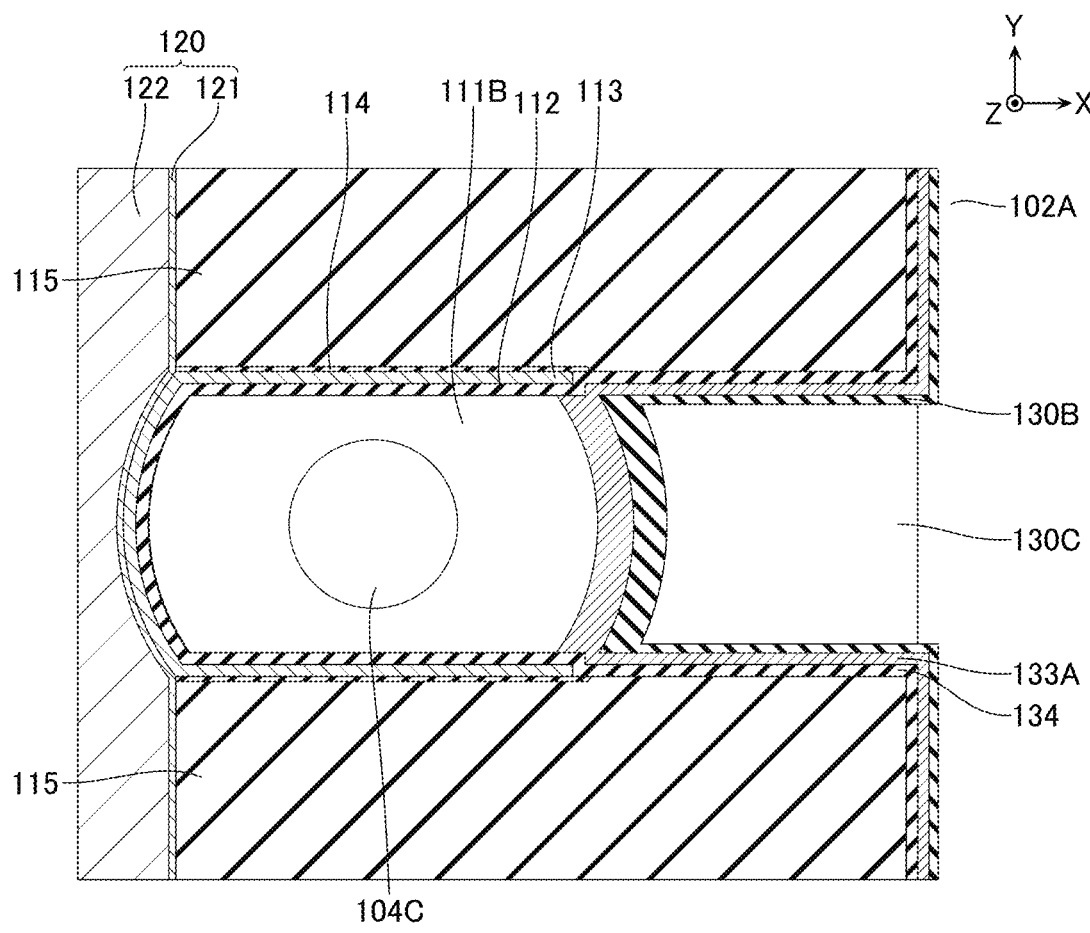
FIG. 113 is a schematic cross-sectional view for describing the manufacturing method.
Figure 114:
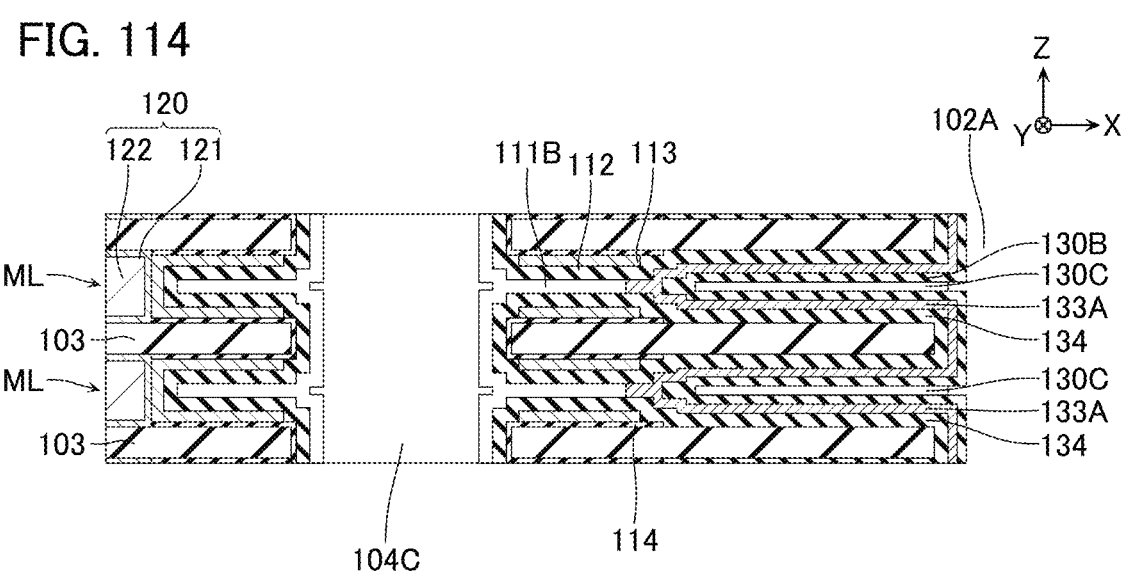
FIG. 114 is a schematic cross-sectional view for describing the manufacturing method.

Next, for example, as illustrated in FIG. 113 and FIG. 114, the sacrifice layer 130C is partially removed via the opening 102A. In this process, a part of the insulating layer 130B corresponding to side surfaces of the insulating layer 115 and the insulating layer 103 in the X-direction is exposed. This process is performed by, for example, wet etching.

Figure 115:
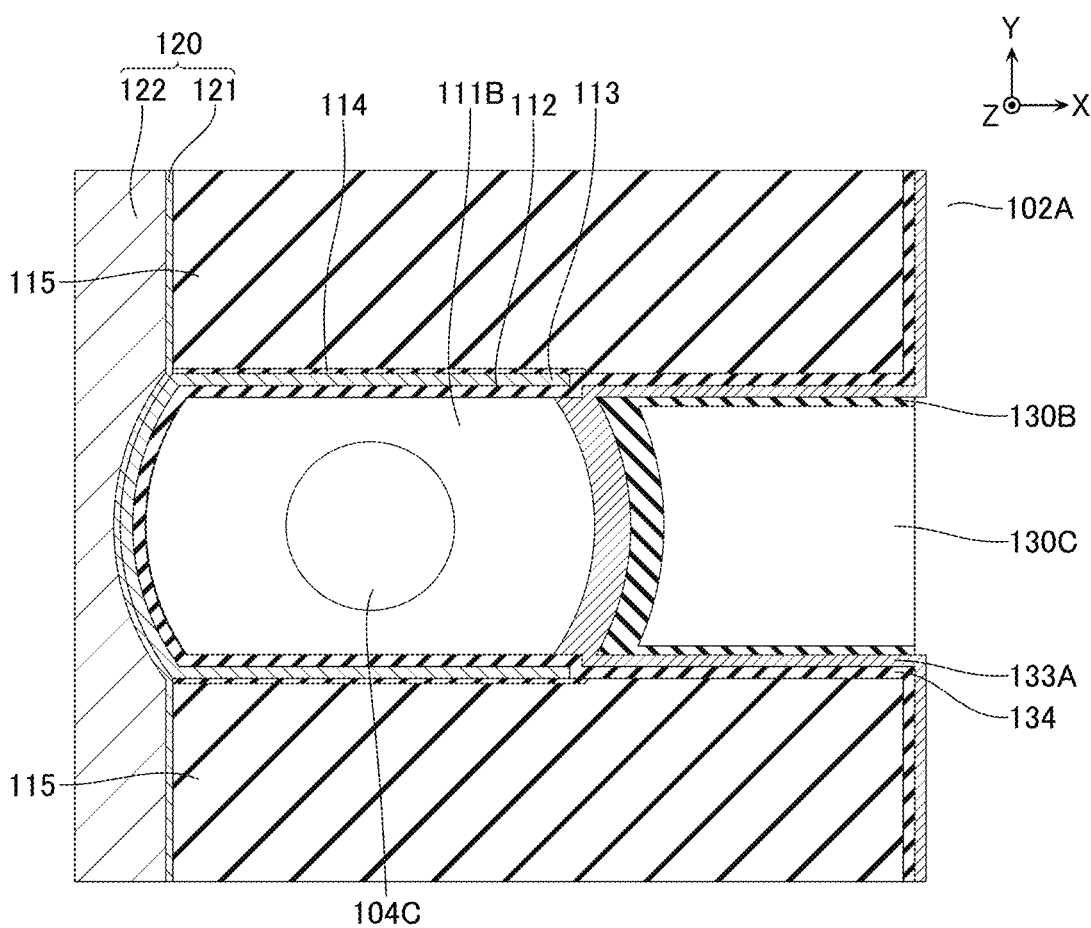
FIG. 115 is a schematic cross-sectional view for describing the manufacturing method.
Figure 116:
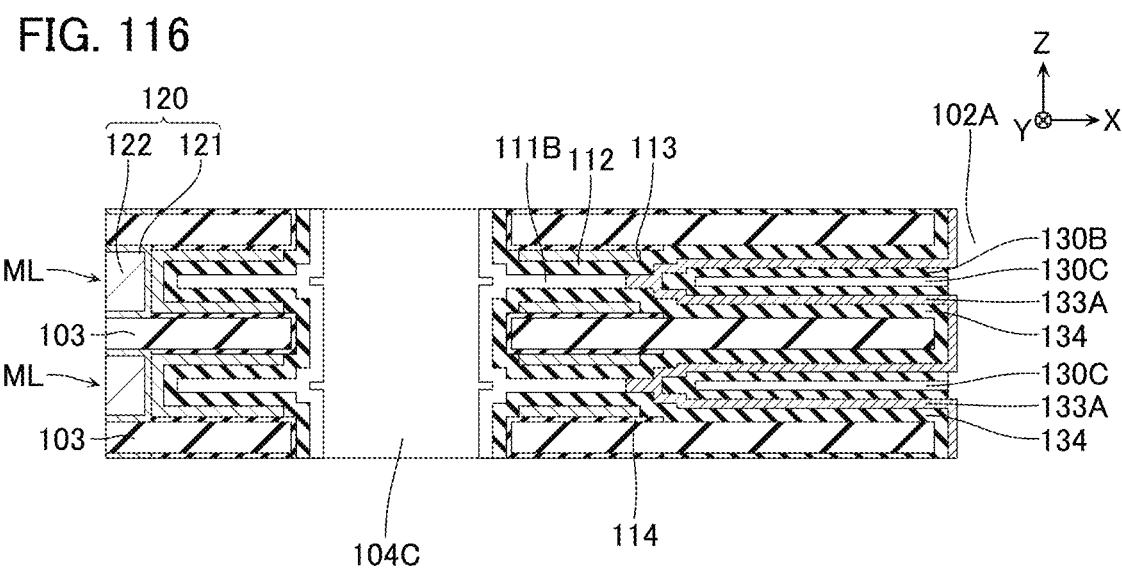
FIG. 116 is a schematic cross-sectional view for describing the manufacturing method.

Next, for example, as illustrated in FIG. 115 and FIG. 116, the insulating layer 130B is partially removed via the opening 102A. In this process, for example, a part of the conductive layer 133A corresponding to the side surfaces of the insulating layer 115 and the insulating layer 103 in the X-direction is exposed. This process is performed by, for example, wet etching.

Figure 117:
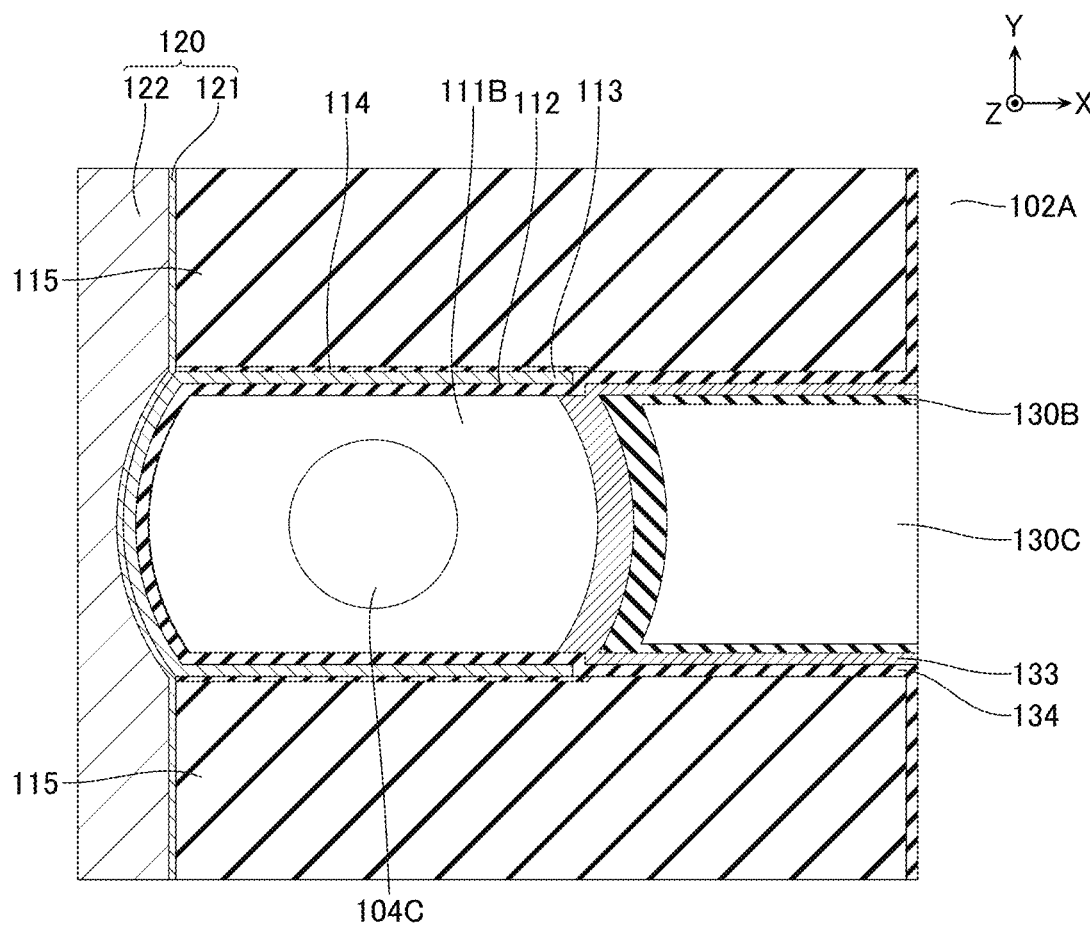
FIG. 117 is a schematic cross-sectional view for describing the manufacturing method.
Figure 118:
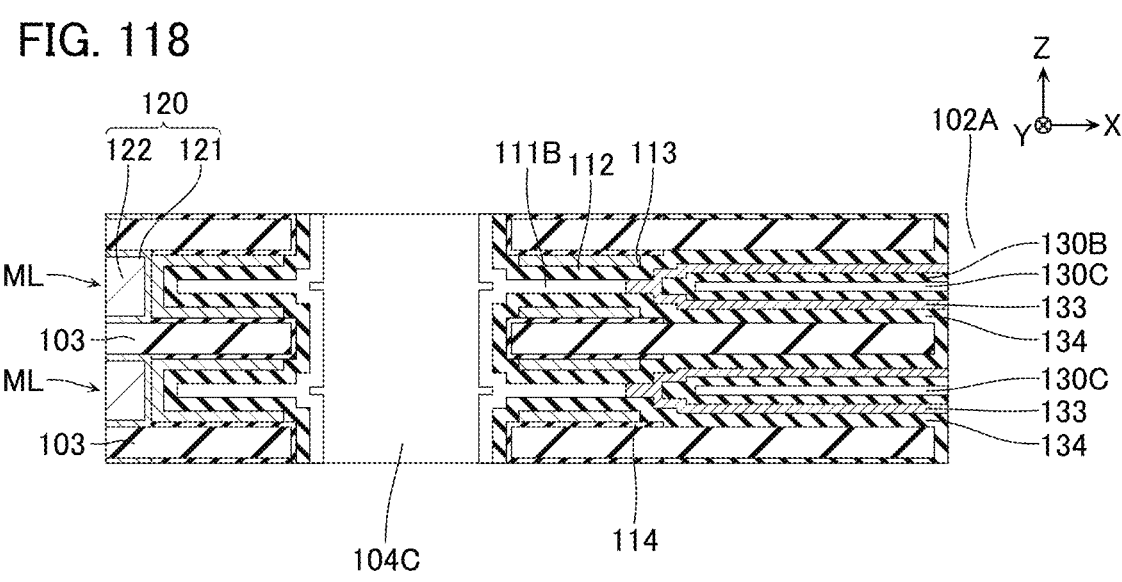
FIG. 118 is a schematic cross-sectional view for describing the manufacturing method.

Next, for example, as illustrated in FIG. 117 and FIG. 118, the conductive layer 133 is formed. In this process, for example, a part of the conductive layer 133A disposed on the side surfaces of the insulating layer 115 and the insulating layer 103 in the X-direction is removed, thus separating the conductive layer 133A in the Y-direction and the Z-direction. This process is performed by, for example, wet etching.

Figure 119:
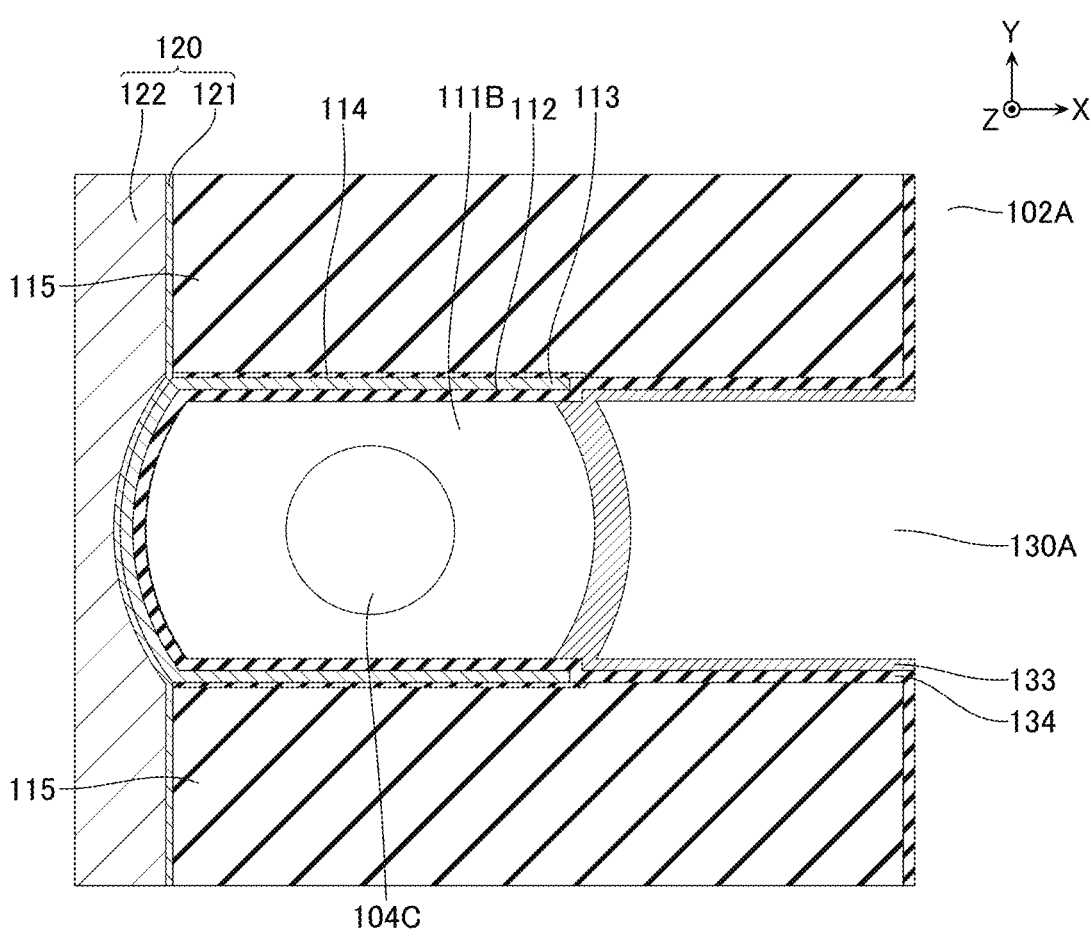
FIG. 119 is a schematic cross-sectional view for describing the manufacturing method.
Figure 120:
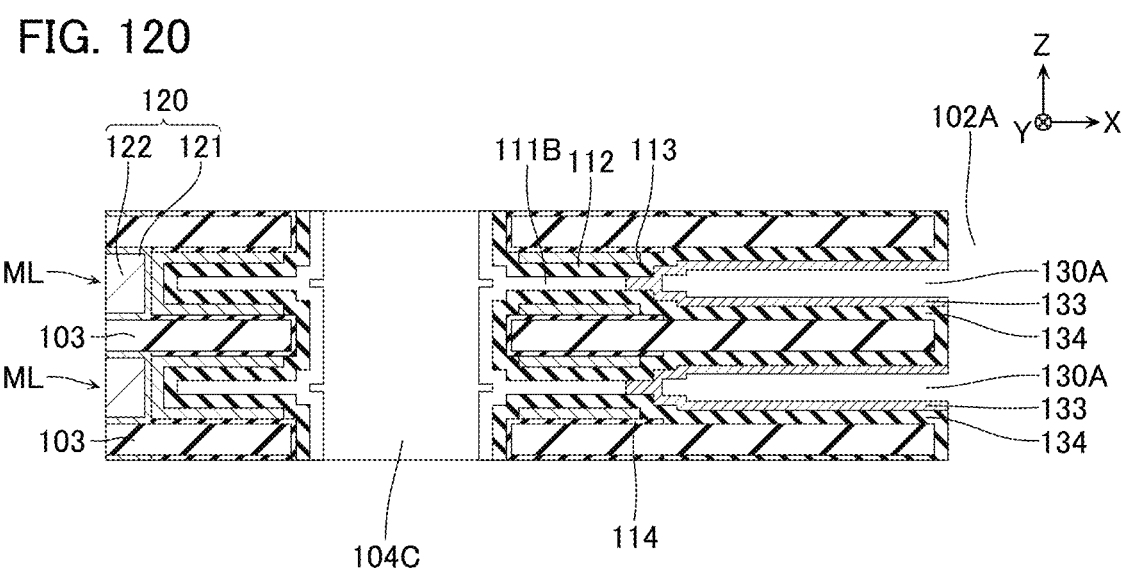

Next, for example, as illustrated in FIG. 119 and FIG. 120, the sacrifice layer 130C and the insulating layer 130B are removed via the opening 102A. This process is performed by, for example, wet etching.

Next, for example, as illustrated in FIG. 121 and FIG. 122, the capacitor structure 130 and the conductive layer 102 are formed. In this process, for example, the insulating layer 132 and the conductive layers 131, 102 are formed on the upper surface, the lower surface, the side surface on one side in the X-direction (the side surface on the opening 102A side), and side surfaces on both sides in the Y-direction of the conductive layer 133, and a side surface of the insulating layer 134 in the X-direction. This process is performed by, for example, CVD.

Then, the sacrifice layer 104C is removed, and the via-wiring 104 and the like are formed, thus manufacturing the semiconductor memory device according to the first embodiment.

COMPARATIVE EXAMPLE

Figure 123:
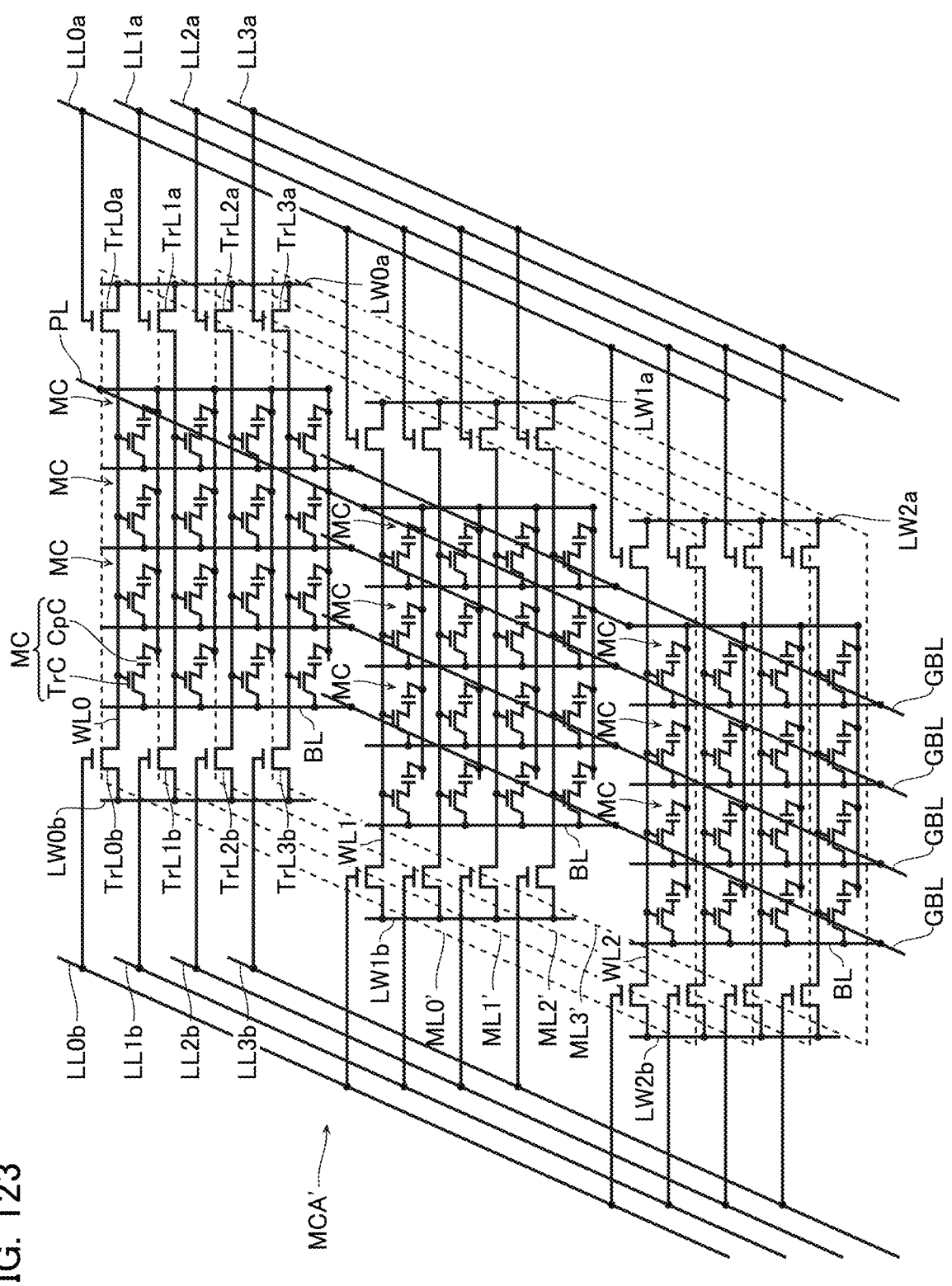

FIG. 123 is a schematic circuit diagram illustrating a part of a configuration of a semiconductor memory device according to a comparative example.

Each of a plurality of memory layers ML0' to ML3' (hereinafter referred to as "memory layers ML'" in some cases) included in a memory cell array MCA' of the semiconductor memory device according to the comparative example does not include the transistor TrR, but includes transistors TrL0a, TrL0b, TrL1a, TrL1b, TrL2a, TrL2b, TrL3a, TrL3b (hereinafter referred to as "transistors TrL" in some cases). The transistor TrL has one electrode connected to any of the word lines WL0 to WL2. The transistor TrL has the other electrode connected to the word line select line LW, respectively. The one electrode and the other electrode of the transistor TrL function as a source electrode or a drain electrode corresponding to a voltage applied to the transistor TrL. Each of gate electrodes of the transistors TrL is connected to the layer select line LL.

Figure 124:
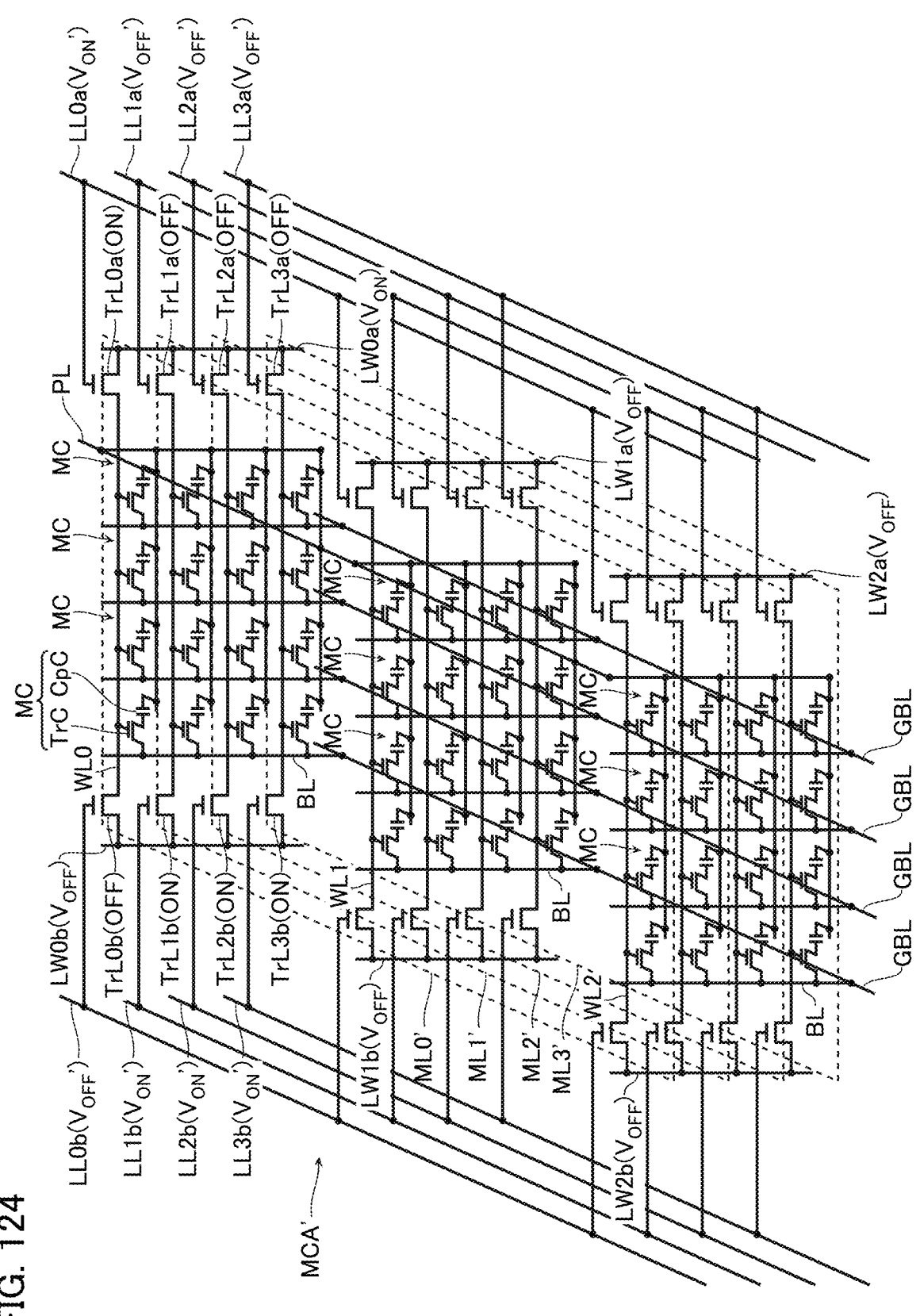

FIG. 124 is a schematic circuit diagram for describing a read operation of the semiconductor memory device according to the comparative example.

In the read operation of the semiconductor memory device according to the comparative example, not a voltage $V_{ON}$, but a voltage $V_{ON}'$ is applied to the layer select line LL0a corresponding to the memory layer ML0' as a target of the read operation among the plurality of layer select lines LL0a, LL1a, LL2a, LL3a. Not a voltage $V_{OFF}$, but a voltage $V_{OFF}'$ is applied to other layer select lines LL1a, LL2a, LL3a. Further, for example, not the voltage $V_{OFF}$, but the voltage $V_{OFF}'$ is applied to the layer select line LL0b corresponding to the memory layer ML0' as a target of the read operation among the plurality of layer select lines LL0b, LL1b, LL2b, LL3b. Not the voltage $V_{OFF}$, but the voltage $V_{ON}'$ is applied to other layer select lines LL1b, LL2b, LL3b.

Not a voltage $V_{ON}'$, but a voltage $V_{ON}$ is applied to the word line select line LW0a corresponding to the word line WL0 as a target of the read operation among the plurality of word line select lines LW0a, LW1a, LW2a. Not a voltage $V_{OFF}'$, but the voltage $V_{OFF}$ is applied to other word line select lines LW1a, LW2a. Further, not the voltage $V_{OFF}'$ or the voltage $V_{ON}'$, but the voltage $V_{OFF}$ is applied to the word line select lines LW0b, LW1b, LW2b.

Here, in the read operation of the semiconductor memory device according to the comparative example, the voltage $V_{ON}$ is applied to the selected word line WL0 via the transistor TrL0a. The voltage $V_{OFF}$ is applied to another unselected word lines WL via the transistor TrL0a.

In the read operation, to transfer the voltage $V_{ON}$ to the selected word line WL at high speed, it is preferred to keep a gate-source voltage of the transistor TrL corresponding to the selected memory cell MC to be sufficiently higher than a threshold voltage of the transistor TrL to increase a current flowing through the transistor TrL. For achieving this, it is considered to set a gate voltage (voltage $V_{ON}'$) of the transistor TrL to a large value.

However, when the gate voltage of the transistor TrL is set to a large value, the gate-source voltages of a part of the transistors TrL increase, causing a need to configure the transistor TrL to withstand a higher voltage. For achieving this, it is considered to thicken the gate insulating film of the transistor TrL. However, since the transistors TrL have the gate voltages different for each memory layer ML', it is necessary to independently dispose the gate electrode for each memory layer ML'. In view of this, when the gate insulating film of the transistor TrL is thickened, the length of the whole memory layer ML' in the Z-direction increases, thus obstructing high integration of the semiconductor memory device.

[Effects]

As described with reference to FIG. 1, in the semiconductor memory device according to the first embodiment, the gate voltages of the transistors TrR are common in the plurality of memory layers ML. With this configuration, as described with reference to FIG. 11, the conductive layer 215 that functions as the gate electrode of the transistor TrR can be disposed at the height position corresponding to the insulating layer 103 so as to be used as a gate electrode common to two transistors TrR adjacent in the Z-direction. This allows thickening the gate insulating film of the transistor TrR without obstructing the high integration of the semiconductor memory device.

In the transistor structure 110 according to the embodiment, the conductive layer 113 is opposed to the upper surface, the lower surface, and both side surfaces in the Y-direction of the semiconductor layer 111.

With this configuration, occurrence of interference of electric field between the plurality of semiconductor layers 111 arranged in the Z-direction can be reduced. Accordingly, even in an attempt of the high integration of the memory cell array MCA in the Z-direction, the semiconductor layer 111 can be appropriately controlled to an ON state or an OFF state, and a semiconductor memory device that appropriately operates can be provided.

When the transistor TrC is turned ON, channels are formed at the upper surface, the lower surface, and both side surfaces in the Y-direction of the semiconductor layer 111. Therefore, the ON current of the transistor TrC can be made relatively large. Accordingly, an operation increased in speed and stability dan be attempted.

In this embodiment, the conductive layer 120 that functions as the word line WL is disposed at the opposite side of the plate line PL with respect to the transistor structure 110, and disposed at the position not overlapping with the transistor structure 110 when viewed in the Z-direction. Therefore, the conductive layer 120 and the transistor structure 110 can be independently formed, and can be relatively easily formed. Additionally, while the width of the memory layer ML in the Z-direction is reduced, the wiring resistance of the conductive layer 120 can be reduced to a relatively small value.

Second Embodiment

[Structure]

Figure 125:
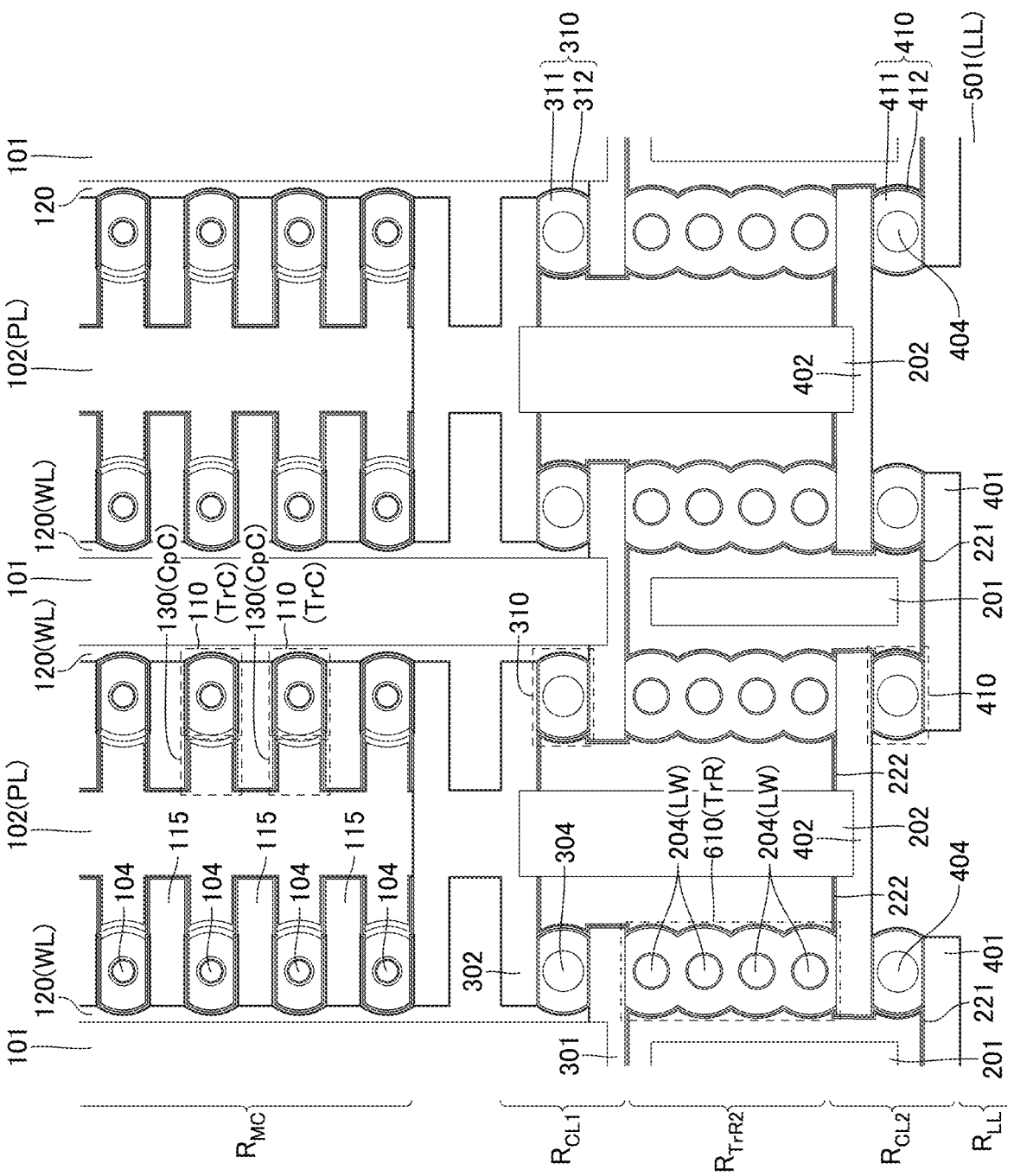
Figure 126:
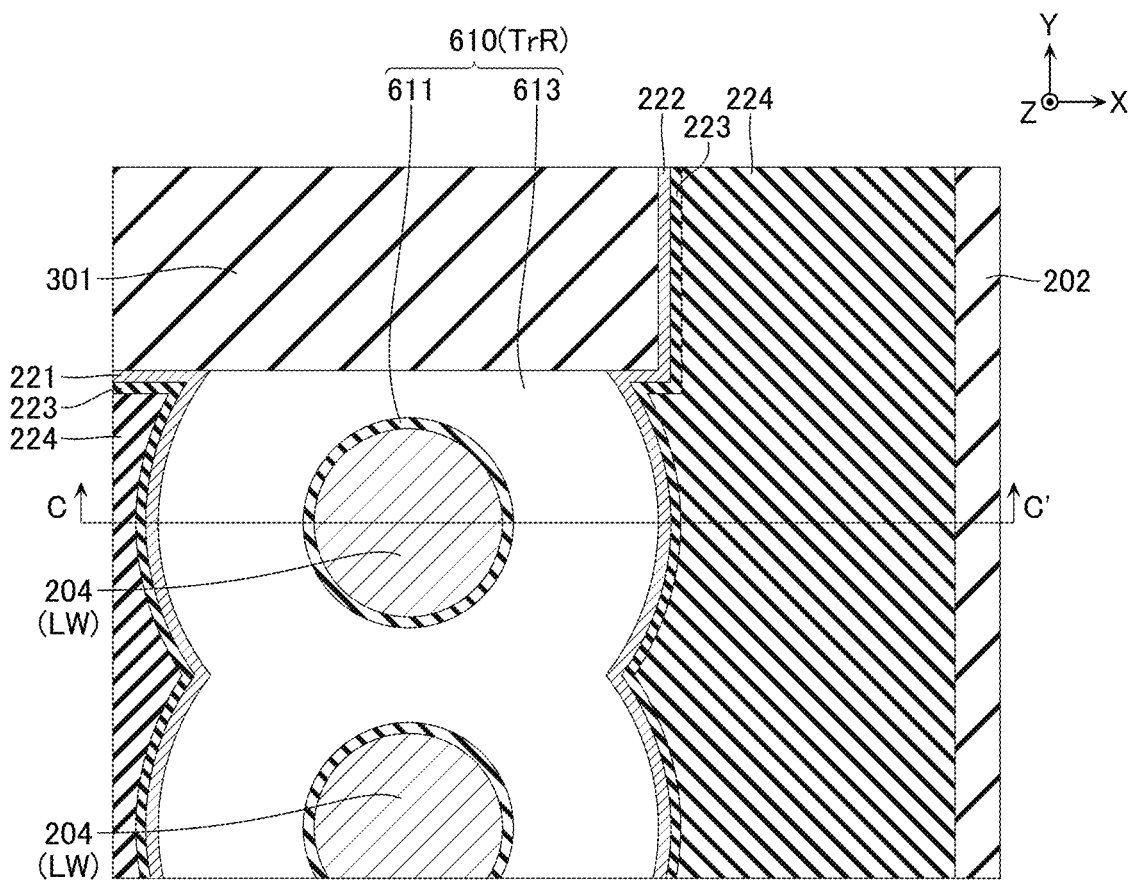
Figure 127:
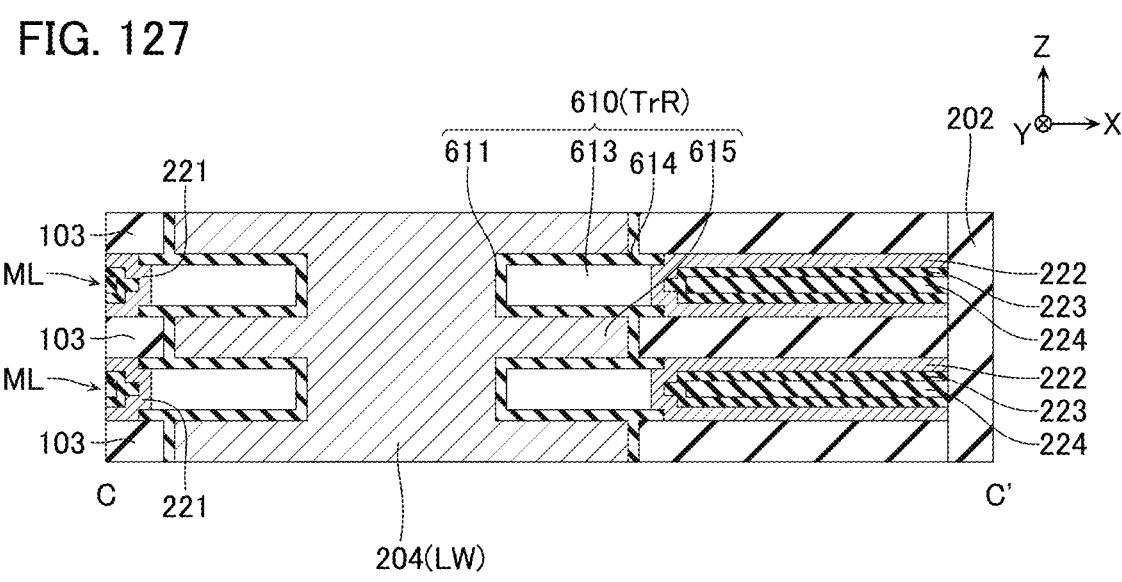

Next, with reference to FIG. 125 to FIG. 127, a semiconductor memory device according to the second embodiment is described. FIG. 125 is a schematic XY cross-sectional view illustrating a part of a configuration of the semiconductor memory device according to the second embodiment. FIG. 126 is a schematic XY cross-sectional view illustrating a part of the configuration of the semiconductor memory device, and illustrates an enlarged part of FIG. 125. FIG. 127 is a schematic cross-sectional view illustrating a part of the configuration of the semiconductor memory device, and illustrates the structure of FIG. 126 taken along the line C-C' and viewed in the arrow direction.

The semiconductor memory device according to the second embodiment is basically configured similarly to the semiconductor memory device according to the first embodiment. However, as illustrated in FIG. 125, the semiconductor memory device according to the second embodiment includes a transistor region R$_{TrR2}$ instead of the transistor region R$_{TrR}$.

The transistor region R$_{TrR2}$ is basically configured similarly to the transistor region R$_{TrR}$. However, in the transistor region R$_{TrR2}$, the memory layer ML includes a part of a transistor structure 610 instead of a part of the transistor structure 210.

As illustrated in FIG. 127, the transistor structure 610 has a part provided in the memory layer ML and a part provided at a height position corresponding to the insulating layer 103. Among them, the part provided in the memory layer ML includes, as illustrated in FIG. 126, a plurality of insulating layers 611 disposed on outer peripheral surfaces of the plurality of via-wirings 204, and a semiconductor layer 613 disposed on outer peripheral surfaces of these plurality of insulating layers 611 and extending in the Y-direction. The part provided at the height position corresponding to the insulating layer 103 includes, as illustrated in FIG. 127, an insulating layer 614 disposed on an upper surface and a lower surface of the semiconductor layer 613, and a conductive layer 615 disposed on an upper surface and a lower surface of the insulating layer 614.

In the XY cross-sectional surface exemplarily illustrated in FIG. 126, side surfaces of the semiconductor layer 613 on both sides in the X-direction may be formed along a plurality of mutually overlapping circles around a plurality of center positions of the plurality of via-wirings 204.

The insulating layer 611 contains, for example, silicon oxide (SiO$_2$). The insulating layer 611 has an approximately cylindrical shape extending in the Z-direction along a part of the outer peripheral surface of the via-wiring 204. The insulating layer 611 is continuous with the insulating layer 614 (FIG. 127).

The semiconductor layer 613 functions as, for example, a channel region of the transistor TrR (FIG. 1). The semiconductor layer 613 may be, for example, a semiconductor containing at least one element of gallium (Ga) or aluminum (Al), and containing indium (In), zinc (Zn), and oxygen (O), or may be another oxide semiconductor.

The insulating layer 614 functions as, for example, a gate insulating film of the transistor TrR (FIG. 1). The insulating layer 614 contains, for example, silicon oxide (SiO$_2$) or the like.

The conductive layer 615 functions as, for example, a gate electrode of the transistor TrR (FIG. 1). The conductive layer 615 includes, for example, a stacked structure of titanium nitride (TiN) and tungsten (W). The conductive layer 615 is connected to the plurality of via-wirings 204 arranged in the Y-direction. With a focus on two semiconductor layers 613 adjacent in the Z-direction, one conductive layer 615 disposed between the two semiconductor layers 613 is opposed to a lower surface of the semiconductor layer 613 disposed above the conductive layer 615 and an upper surface of the semiconductor layer 613 disposed below the conductive layer 615 via the insulating layer 614. A plurality of the conductive layers 615 arranged in the Z-direction are connected to a via-wiring 204 extending in the Z-direction in common.

With a focus on two conductive layers 615 adjacent in the Z-direction, these conductive layers 615 are connected only via the via-wiring 204. That is, both end portions of these two conductive layers 615 in the Y-direction are spaced in the Z-direction. Similarly, both end portions of these two conductive layers 615 in the X-direction are also spaced in the Z-direction.

[Manufacturing Method]

FIG. 128 to FIG. 143 are schematic cross-sectional views for describing a method for manufacturing the semiconductor memory device according to the second embodiment. FIG. 128, FIG. 129, FIG. 131, FIG. 133, FIG. 135, FIG. 137, FIG. 139, FIG. 141, and FIG. 143 illustrate cross-sectional surfaces corresponding to FIG. 127. FIG. 130, FIG. 132, FIG. 134, FIG. 136, FIG. 138, FIG. 140, and FIG. 142 illustrate cross-sectional surfaces corresponding to FIG. 126.

In the manufacturing method, for example, the processes up to the process described with reference to FIG. 59 and FIG. 60 in the manufacturing method of the semiconductor memory device according to the first embodiment are performed.

Figure 128:
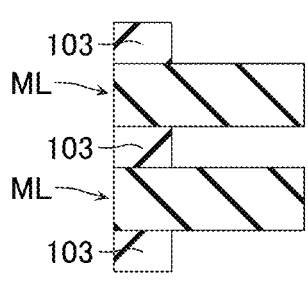
Figure 128:
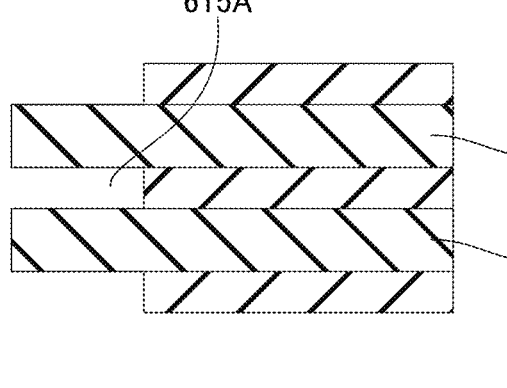

Next, for example, as illustrated in FIG. 128, an opening 615A is formed at a position corresponding to the conductive layer 615. A part of the upper surface and a part of the lower surface of the sacrifice layer MLA are exposed inside the opening 615A. In this process, for example, a part of the insulating layer 103 is selectively removed via the opening 204A. This process is performed by, for example, wet etching.

Figure 129:
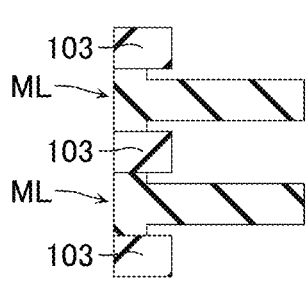
Figure 129:
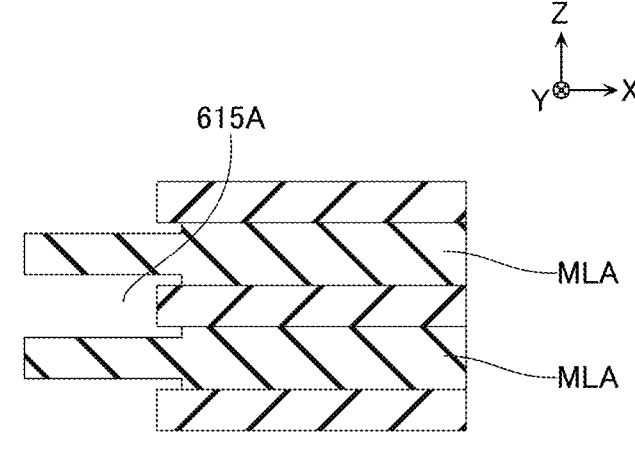

Next, for example, as illustrated in FIG. 129, the insulating layer 103 is partially removed. In this process, a width of the opening 615A in the Z-direction is widened. This process is performed by, for example, wet etching.

Figure 130:
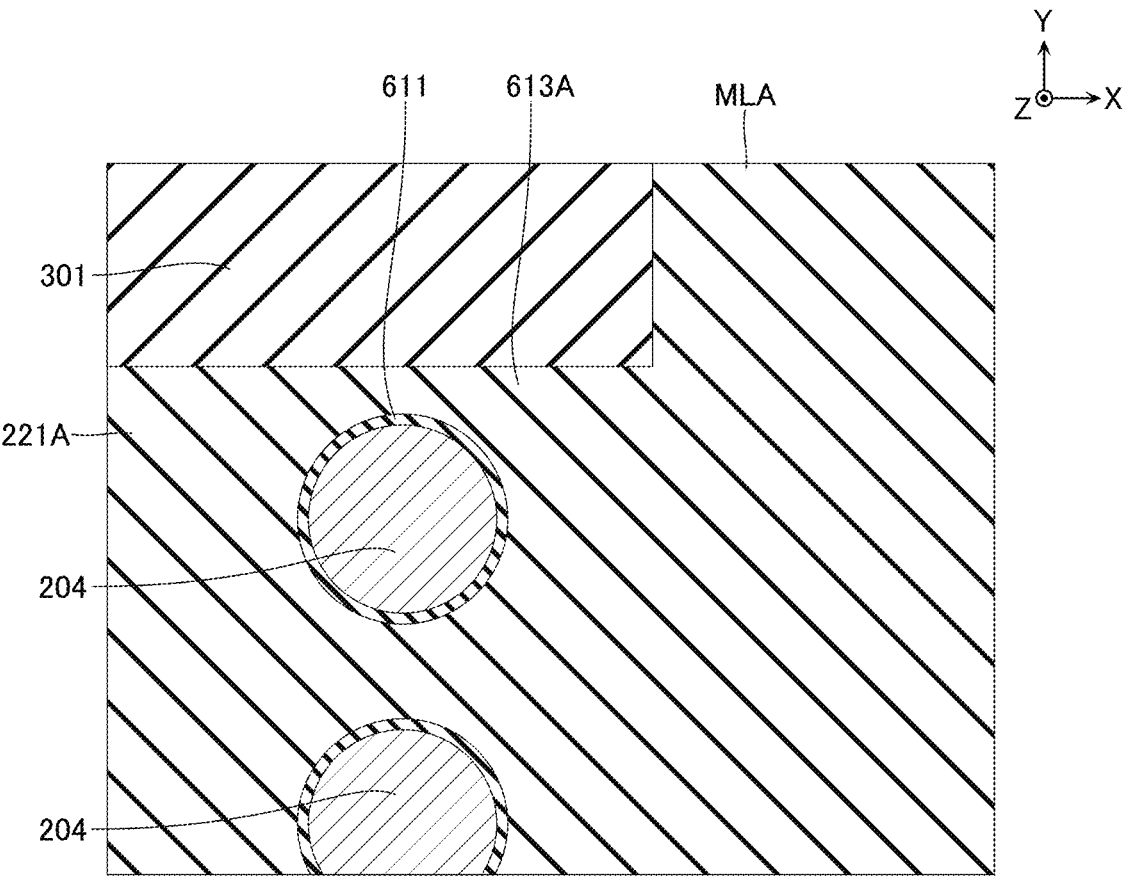
Figure 131:
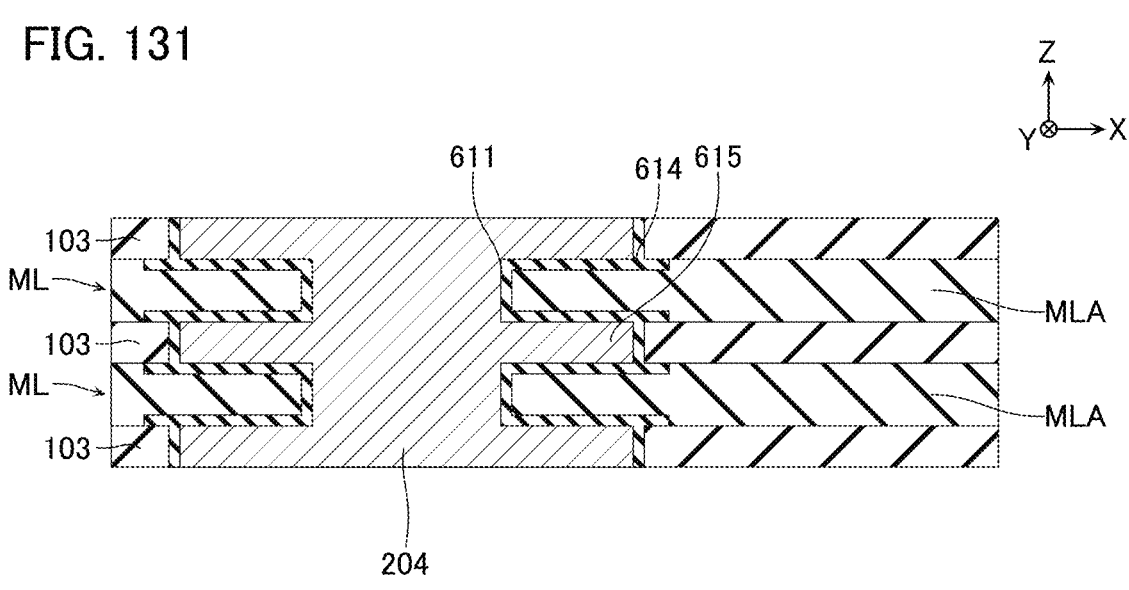

Next, for example, as illustrated in FIG. 130 and FIG. 131, the insulating layers 611, 614, the conductive layer 615, and the via-wiring 204 are formed inside the openings 615A, 204A. This process is performed by, for example, CVD.

Next, for example, as illustrated in FIG. 132 and FIG. 133, openings 221A, 222A, 613A are formed at positions corresponding to the conductive layers 221, 222 and the semiconductor layers 613. A part of the upper surface and a part of the lower surface of the insulating layer 103, and a part of side surfaces of the insulating layers 301, 402 on one side in the Y-direction are exposed inside the opening 221A. A part of the upper surface and a part of the lower surface of the insulating layer 103, and a part of the side surfaces of the insulating layers 301, 402 on one side in the Y-direction are exposed inside the opening 222A. An upper surface and a lower surface of the insulating layer 614, an outer peripheral surface of the insulating layer 611, and a part of the side surfaces of the insulating layers 301, 402 on one side in the Y-direction are exposed inside the opening 613A. In this process, for example, a part of the sacrifice layer MLA is selectively removed via the openings 221A, 222A. This process is performed by, for example, wet etching.

Next, for example, as illustrated in FIG. 134 and FIG. 135, a semiconductor layer 613B is formed inside the openings 613A, 222A, 202A, 221A, 201A. The opening 613A is filled with the semiconductor layer 613B, and the openings 222A, 202A, 221A, 201A are not filled with the semiconductor layer 613B. This process is performed by, for example, CVD.

Next, for example, as illustrated in FIG. 136 and FIG. 137, the semiconductor layer 613 is formed. In this process, the semiconductor layer 613B is partially removed by a method, such as wet etching. Specifically, in the semiconductor layer 613B, a part formed inside the opening 613A is left, and other parts are removed.

Next, for example, as illustrated in FIG. 88, FIG. 89, FIG. 138, and FIG. 139, a conductive layer 222B, an insulating layer 223A, and a sacrifice layer 224A are formed inside the openings 222A, 202A. The conductive layer 222B is formed on a part of the upper surface, a part of the lower surface, and an exposed surface to the opening 202A of the insulating layer 103, a part of the upper surface and a part of the lower surface of the insulating layer 614, an outer peripheral surface of the semiconductor layer 613, and the side surfaces of the insulating layers 301, 402 on one side in the Y-direction. The opening 222A is filled with the insulating layer 223A and the sacrifice layer 224A, and the opening 202A is not filled with the insulating layer 223A or the sacrifice layer 224A. This process is performed by, for example, ALD and CVD.

A conductive layer 221B, an insulating layer 223A, and a sacrifice layer 224A are formed inside the openings 221A,

201A. The conductive layer 221B is formed on a part of the upper surface, a part of the lower surface, and an exposed surface to the opening 201A of the insulating layer 103, a part of the upper surface and a part of the lower surface of the insulating layer 614, the outer peripheral surface of the semiconductor layer 613, and the side surfaces of the insulating layers 301, 402 on one side in the Y-direction. The opening 221A is filled with the insulating layer 223A and the sacrifice layer 224A, and the opening 201A is not filled with the insulating layer 223A or the sacrifice layer 224A. This process is performed by, for example, ALD and CVD.

Next, as illustrated in FIG. 92, FIG. 93, FIG. 140, and FIG. 141, the conductive layers 221, 222 and the insulating layer 223 are formed. This process is performed similarly to the process described with reference to, for example, FIG. 92 to FIG. 95.

Next, as illustrated in FIG. 96, FIG. 97, FIG. 142, and FIG. 143, the sacrifice layer 224A is removed. This process is performed by, for example, wet etching.

Then, for example, the processes following the process described with reference to FIG. 100 and FIG. 101 in the manufacturing method of the semiconductor memory device according to the first embodiment are performed.

Third Embodiment

To connect the plurality of layer select lines LL to the peripheral circuit, for example, it is considered that terrace portions are provided at the plurality of conductive layers 501 (FIG. 5), and via-contact electrodes are connected to the terrace portions. The terrace portion is, for example, a portion in an upper surface of the conductive layer 501 not overlapping with other conductive layers when viewed from above. In the memory cell array MCA, the larger the number of the memory layers ML arranged in the Z-direction is, the more the number of the terrace portions to be required increases.

Here, as described with reference to FIG. 2, in the read operation of the semiconductor memory device according to the first embodiment, the voltage $V_{OFF}$ is applied to the plurality of layer select lines LL0*b*, LL1*b*, LL2*b*, LL3*b* in common. Therefore, for example, by short-circuiting the layer select lines LL0*b*, LL1*b*, LL2*b*, LL3*b*, the terrace portions of the layer select lines LL0*b*, LL1*b*, LL2*b*, LL3*b* can be omitted to reduce the circuit area. Such a configuration is described below as a semiconductor memory device according to third embodiment.

FIG. 144 is a schematic circuit diagram illustrating a part of a configuration of a semiconductor memory device according to the third embodiment.

The semiconductor memory device according to the third embodiment is basically configured similarly to the semiconductor memory device according to the first embodiment. However, as illustrated in the drawing, the semiconductor memory device according to the third embodiment includes a wiring LLc instead of the layer select lines LL0*b*, LL1*b*, LL2*b*, LL3*b*. The wiring LLC is connected to the transistors TrR0*b*, TrR1*b*, TrR2*b*, TrR3*b* corresponding to the word lines WL0, WL1, WL2 in common.

FIG. 145 is a schematic XY cross-sectional view illustrating a part of the configuration of the semiconductor memory device according to the third embodiment. FIG. 146 is a schematic cross-sectional view illustrating a part of the configuration of the semiconductor memory device, and illustrates the structure of FIG. 145 taken along the line D-D' and viewed in the arrow direction.

The structure of the semiconductor memory device according to the third embodiment is basically similar to the structure of the semiconductor memory device according to the first embodiment. However, as illustrated in FIG. 145, the semiconductor memory device according to the third embodiment includes a wiring region $R_{LLc}$ instead of the wiring region $R_{LL}$. The wiring region $R_{LLc}$ is formed over two memory cell arrays MCA adjacent in the Y-direction.

Although not illustrated, in a region on an opposite side of the wiring region $R_{LLc}$ in the Y-direction with respect to the memory cell region $R_{MC}$, the wiring region Ru is provided similarly to the first embodiment.

In the wiring region $R_{LLc}$, a conductive layer 503 is disposed. The conductive layer 503 extends in the X-direction and the Z-direction, and as illustrated in FIG. 146, separates the plurality of memory layers ML in the Y-direction. The conductive layer 503 includes, for example, a stacked structure of titanium nitride (TiN) and tungsten (W). The conductive layer 503 functions as, for example, the wiring LLC (FIG. 144).

In the wiring region $R_{LLc}$, the memory layer ML includes conductive layers 502 extending in the X-direction. The conductive layers 502 are each connected to the plurality of conductive layers 412 (FIG. 145) arranged in the X-direction. The conductive layers 502 are connected to the conductive layer 503. The conductive layer 502 includes, for example, a stacked structure of titanium nitride (TiN) and tungsten (W).

The semiconductor memory device according to the third embodiment may include the transistor region $R_{TrR2}$ (FIG. 125) according to the second embodiment instead of the transistor region $R_{TrR}$ according to the first embodiment.

Fourth Embodiment

As described with reference to FIG. 2, in the read operation of the semiconductor memory device according to the first embodiment, the voltage $V_{OFF}$ is applied to the plurality of layer select lines LL0b, LL1b, LL2b, LL3b in common. In this configuration, for example, not only the layer select lines LL0b, LL1b, LL2b, LL3b, but also the transistors TrR0b, TrR1b, TrR2b, TrR3b can be omitted to further reduce the circuit area. Such a configuration is described below as a semiconductor memory device according to the fourth embodiment.

FIG. 147 is a schematic circuit diagram illustrating a part of a configuration of a semiconductor memory device according to the fourth embodiment.

The semiconductor memory device according to the fourth embodiment is basically configured similarly to the semiconductor memory device according to the third embodiment. However, as illustrated in the drawing, the semiconductor memory device according to the fourth embodiment includes resistors R instead of the transistors TrR0b, TrR1b, TrR2b, TrR3b. The resistors R are disposed at current paths between the plurality of word lines WL and the wiring LLC.

FIG. 148 is a schematic XY cross-sectional view illustrating a part of the configuration of the semiconductor memory device according to the fourth embodiment. FIG. 149 is a schematic cross-sectional view illustrating a part of the configuration of the semiconductor memory device, and illustrates the structure of FIG. 148 taken along the line D-D' and viewed in the arrow direction.

The structure of the semiconductor memory device according to the fourth embodiment is basically similar to the structure of the semiconductor memory device according to the third embodiment. However, as illustrated in FIG. 148, the semiconductor memory device according to the fourth embodiment includes a wiring region $R_{LLc2}$ instead of the transistor region $R_{TrR}$, the wiring region $R_{LLc}$, and the connection wiring regions $R_{CL1}$, $R_{CL2}$. The wiring region $R_{LLc2}$ is formed over two memory cell arrays MCA adjacent in the Y-direction.

Although not illustrated, in a region on an opposite side of the wiring region $R_{LLc}$ in the Y-direction with respect to the memory cell region $R_{MC}$, the transistor region $R_{TrR}$, the wiring region $R_{LL}$, and the connection wiring regions $R_{CL1}$, $R_{CL2}$ are provided similarly to the first embodiment.

In the wiring region $R_{LLc2}$, a conductive layer 513 is disposed. The conductive layer 513 extends in the X-direction and the Z-direction, and as illustrated in FIG. 149, separates the plurality of memory layers ML in the Y-direction. The conductive layer 513 includes, for example, a stacked structure of titanium nitride (TiN) and tungsten (W). The conductive layer 513 functions as, for example, the wiring LLC (FIG. 147).

In the wiring region $R_{LLc2}$, semiconductor layers 514 are disposed. The semiconductor layers 514 are connected to the conductive layer 513 and the plurality of conductive layers 120. The semiconductor layers 514 function as, for example, the resistors R (FIG. 147). The semiconductor layer 514 may include, for example, as illustrated in FIG. 149, a part provided in the memory layer ML. Further, the semiconductor layer 514 may include, for example, as illustrated in FIG. 149, a part extending in the Z-direction. However, the configuration of the semiconductor layer 514 can be adjusted as necessary. For example, in the semiconductor layer 514, one of the part provided in the memory layer ML and the part extending in the Z-direction can be omitted.

The semiconductor memory device according to the fourth embodiment may include the transistor region $R_{TrR2}$ (FIG. 125) according to the second embodiment instead of the transistor region $R_{TrR}$ according to the first embodiment.

OTHER EMBODIMENTS

The semiconductor memory devices according to the first embodiment to the fourth embodiment are described above. However, the semiconductor memory devices according to these embodiments are merely examples, and the specific configuration and the like can be adjusted as necessary.

For example, in the semiconductor memory devices according to the first embodiment to the fourth embodiment, the via-wiring 104 that functions as a bit line contains a conductive oxide, such as indium tin oxide (ITO). However, the conductive oxide may be contained in not the via-wiring 104 extending in the Z-direction but the transistor structure 110. The via-wiring 104 and the transistor structure 110 may contain another material and the like.

In the semiconductor memory devices according to the first embodiment to the fourth embodiment, the conductive layers 113, 215, 615 that function as the gate electrodes of the transistors TrC, TrR may be opposed to only one of the upper surfaces and the lower surfaces of the semiconductor layers 111, 213, 613 that function as the channel regions of the transistors TrC, TrR.

In the semiconductor memory devices according to the first embodiment to the fourth embodiment, the semiconductor layers 111, 213, 613 that function as the channel regions of the transistors TrC, TrR may be opposed to the upper surfaces and the lower surfaces of the conductive layers 113, 215, 615 that function as the gate electrodes of the transistors TrC, TrR.

In the above description, an example in which the capacitor CpC is employed as a memory portion connected to the transistor structure 110 is described. However, the memory portion does not need to be the capacitor CpC. For example, the memory portion may contain a ferroelectric material, a ferromagnet material, a chalcogen material such as GeSbTe, or another material and may store data using the characteristics of these materials. For example, in any of the structures described above, any of these materials may be contained in the insulating layer between the electrodes forming the capacitor CpC.

The methods for manufacturing the semiconductor memory devices according to the first embodiment to the fourth embodiment also can be adjusted as necessary. For example, the order of any two processes in the above-described processes may be changed, or any two processes in the above-described processes may be simultaneously performed.

Others

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
   a substrate;
   a first via-wiring extending in a first direction intersecting with a surface of the substrate;
   a plurality of first semiconductor layers arranged in the first direction and electrically connected to the first via-wiring;
   a plurality of memory portions arranged in the first direction and electrically connected to the plurality of first semiconductor layers;
   a plurality of first gate electrodes arranged in the first direction and opposed to the plurality of first semiconductor layers;
   a plurality of first wirings arranged in the first direction, extending in a second direction intersecting with the first direction, and electrically connected to the plurality of first gate electrodes;
   a plurality of second semiconductor layers arranged in the first direction and electrically connected to the plurality of first wirings;
   a plurality of second gate electrodes arranged in the first direction and opposed to the plurality of second semiconductor layers;
   a second via-wiring extending in the first direction and electrically connected to the plurality of second gate electrodes; and
   a plurality of second wirings arranged in the first direction, extending in a third direction intersecting with the first direction and the second direction, and electrically connected to the plurality of second semiconductor layers.

2. The semiconductor memory device according to claim 1, wherein

32 two second gate electrodes adjacent in the first direction among the plurality of second gate electrodes have both end portions in the second direction spaced in the first direction.

3. The semiconductor memory device according to claim 1, comprising
   a plurality of insulating layers alternately arranged with the plurality of second semiconductor layers in the first direction, wherein
   the respective plurality of second gate electrodes are disposed at positions in the first direction corresponding to the plurality of insulating layers.

4. The semiconductor memory device according to claim 1, wherein
   one of the plurality of second gate electrodes is disposed between two second semiconductor layers adjacent in the first direction among the plurality of second semiconductor layers and opposed to the two second semiconductor layers.

5. The semiconductor memory device according to claim 1, wherein
   the second semiconductor layer contains at least one element of gallium (Ga) or aluminum (Al), and contains indium (In), zinc (Zn), and oxygen (O).

6. The semiconductor memory device according to claim 1, wherein
   the first gate electrode is opposed to surfaces of the first semiconductor layer on one side and the other side in the first direction, and opposed to surfaces on one side and the other side in the second direction.

7. The semiconductor memory device according to claim 1, wherein
   the memory portion includes:
   a first electrode electrically connected to the first semiconductor layer;
   a second electrode opposed to the first electrode; and
   an insulating layer disposed between the first electrode and the second electrode.

8. The semiconductor memory device according to claim 1, wherein
   the first semiconductor layer contains at least one element of gallium (Ga) or aluminum (Al), and contains indium (In), zinc (Zn), and oxygen (O).

9. The semiconductor memory device according to claim 1, comprising:
   a plurality of third semiconductor layers arranged in the first direction and electrically connected to the plurality of first wirings;
   a plurality third gate electrodes arranged in the first direction and opposed to the plurality of third semiconductor layers; and
   a third via-wiring extending in the first direction and electrically connected to the plurality of third gate electrodes, wherein
   a position of the first via-wiring in the second direction is between a position of the second via-wiring in the second direction and a position of the third via-wiring in the second direction.

10. The semiconductor memory device according to claim 9, comprising
    a plurality of third wirings arranged in the first direction, extending in the third direction, and electrically connected to the plurality of third semiconductor layers.

11. The semiconductor memory device according to claim 9, comprising a fourth wiring extending in the first direction and the third direction and electrically connected to the plurality of third semiconductor layers.

12. The semiconductor memory device according to claim 9, wherein two third gate electrodes adjacent in the first direction among the plurality of third gate electrodes have both end portions in the second direction spaced in the first direction.

13. The semiconductor memory device according to claim 9, comprising a plurality of insulating layers alternately arranged with the plurality of third semiconductor layers in the first direction, wherein the respective plurality of third gate electrodes are disposed at positions in the first direction corresponding to the plurality of insulating layers.

14. The semiconductor memory device according to claim 9, wherein one of the plurality of third gate electrodes is disposed between two third semiconductor layers adjacent in the first direction among the plurality of third semiconductor layers and opposed to the two third semiconductor layers.

15. The semiconductor memory device according to claim 9, wherein the third semiconductor layer contains at least one element of gallium (Ga) or aluminum (Al), and contains indium (In), zinc (Zn), and oxygen (O).

16. The semiconductor memory device according to claim 1, comprising:

a fifth wiring extending in the first direction and the third direction and electrically connected to the plurality of first wirings; and resistors disposed at current paths between the plurality of first wirings and the fifth wiring, wherein a position of the first via-wiring in the second direction is between a position of the second via-wiring in the second direction and a position of the fifth wiring in the second direction.

* * * * *